(12) United States Patent
Han et al.

(10) Patent No.: US 12,319,706 B2
(45) Date of Patent: Jun. 3, 2025

(54) ORGANOMETALLIC COMPOUND, LIGHT-EMITTING DEVICE INCLUDING THE SAME, AND ELECTRONIC APPARATUS INCLUDING THE LIGHT-EMITTING DEVICE

(71) Applicant: Samsung Display Co., Ltd., Yongin-si (KR)

(72) Inventors: Junghoon Han, Yongin-si (KR); Soobyung Ko, Yongin-si (KR); Sungbum Kim, Yongin-si (KR); Eunsoo Ahn, Yongin-si (KR); Jaesung Lee, Yongin-si (KR); Hyunjung Lee, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 956 days.

(21) Appl. No.: 17/329,880

(22) Filed: May 25, 2021

(65) Prior Publication Data
US 2022/0112231 A1   Apr. 14, 2022

(30) Foreign Application Priority Data
Oct. 13, 2020   (KR) .................... 10-2020-0131816

(51) Int. Cl.
| | | |
|---|---|---|
| *H01L 51/54* | (2006.01) | |
| *C07F 15/00* | (2006.01) | |
| *H10K 85/30* | (2023.01) | |

(52) U.S. Cl.
CPC ....... *C07F 15/0086* (2013.01); *H10K 85/346* (2023.02)

(58) Field of Classification Search
None
See application file for complete search history.

(56) References Cited

U.S. PATENT DOCUMENTS

| | | |
|---|---|---|
| 7,381,479 B2 | 6/2008 | Lamansky et al. |
| 7,393,599 B2 | 7/2008 | Thompson et al. |
| 7,585,573 B2 | 9/2009 | Lee et al. |
| 7,776,458 B2 | 8/2010 | Ragini et al. |
| 8,106,199 B2 | 1/2012 | Jabbour et al. |
| 8,389,725 B2 | 3/2013 | Li et al. |
| 8,669,364 B2 | 3/2014 | Li et al. |
| 8,680,760 B2 | 3/2014 | Cheng et al. |
| 8,816,080 B2 | 8/2014 | Li et al. |
| 8,846,940 B2 | 9/2014 | Li et al. |
| 8,946,417 B2 | 2/2015 | Jian et al. |
| 9,051,344 B2 | 6/2015 | Lin et al. |
| 9,076,974 B2 | 7/2015 | Li et al. |
| 9,203,039 B2 | 12/2015 | Li et al. |
| 9,221,857 B2 | 12/2015 | Li et al. |
| 9,224,963 B2 | 12/2015 | Li et al. |
| 9,238,668 B2 | 1/2016 | Li et al. |
| 9,312,502 B2 | 4/2016 | Li et al. |
| 9,324,957 B2 | 4/2016 | Li et al. |
| 9,382,273 B2 | 7/2016 | Li et al. |
| 9,425,415 B2 | 8/2016 | Li et al. |
| 9,461,254 B2 | 10/2016 | Tsai et al. |
| 9,698,359 B2 | 7/2017 | Li et al. |
| 9,899,614 B2 | 2/2018 | Li et al. |
| 10,873,038 B2 | 12/2020 | Wu et al. |
| 11,515,489 B2 | 11/2022 | Wolohan et al. |
| 2005/0287394 A1 | 12/2005 | Yang et al. |
| 2008/0018221 A1 | 1/2008 | Egen et al. |
| 2014/0309428 A1 | 10/2014 | Egen et al. |
| 2017/0117480 A1* | 4/2017 | Oh ................ H10K 50/11 |
| 2018/0375036 A1* | 12/2018 | Chen ............... C09K 11/06 |
| 2019/0393431 A1 | 12/2019 | Layek et al. |
| 2020/0099001 A1 | 3/2020 | Kim et al. |

(Continued)

FOREIGN PATENT DOCUMENTS

| | | |
|---|---|---|
| CN | 104370974 | 2/2015 |
| CN | 111233836 | 6/2020 |
| JP | 2007-45742 | 2/2007 |
| KR | 10-0730115 | 6/2007 |
| KR | 10-2015-0043225 | 4/2015 |
| KR | 10-2019-0022958 | 3/2019 |
| KR | 10-2020-0000370 | 1/2020 |
| KR | 10-2020-0034900 | 4/2020 |
| WO | 2012/121936 | 9/2012 |

*Primary Examiner* — Andrew K Bohaty
(74) *Attorney, Agent, or Firm* — KILE PARK REED & HOUTTEMAN PLLC

(57) ABSTRACT

Provided is an organometallic compound, a light-emitting device including the same, and an electronic apparatus including the light-emitting device. The organometallic compound is represented by Formula 1, which is defined in the specification:

[Formula 1]

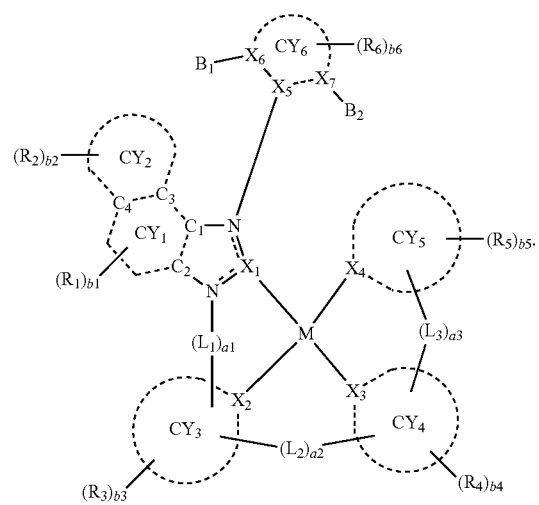

20 Claims, 4 Drawing Sheets

(56) References Cited

U.S. PATENT DOCUMENTS

2020/0140471 A1 5/2020 Chen et al.
2020/0152891 A1 5/2020 Li et al.

* cited by examiner

ORGANOMETALLIC COMPOUND, LIGHT-EMITTING DEVICE INCLUDING THE SAME, AND ELECTRONIC APPARATUS INCLUDING THE LIGHT-EMITTING DEVICE

CROSS-REFERENCE TO RELATED APPLICATION(S)

This application claims priority to and benefits of Korean Patent Application No. 10-2020-0131816 under 35 U.S.C. § 119, filed on Oct. 13, 2020 in the Korean Intellectual Property Office, the entire contents of which are incorporated herein by reference.

BACKGROUND

1. Technical Field

Embodiments relate to an organometallic compound, a light-emitting device including the same, and an electronic apparatus including the light-emitting device.

2. Description of the Related Art

Self-emission devices among light-emitting devices have wide viewing angles, high contrast ratios, and excellent characteristics in terms of brightness, driving voltage, and response speed.

In a light-emitting device, a first electrode is located on a substrate, and a hole transport region, an emission layer, an electron transport region, and a second electrode are sequentially formed on the first electrode. Holes provided from the first electrode may move toward the emission layer through the hole transport region, and electrons provided from the second electrode may move toward the emission layer through the electron transport region. Carriers, such as the holes and the electrons, recombine in the emission layer to produce excitons. These excitons transit from an excited state to a ground state to thereby generate light.

SUMMARY

Provided are an organometallic compound, a light-emitting device including the same, and an electronic apparatus including the light-emitting device.

Additional aspects will be set forth in part in the description which follows and, in part, will be apparent from the description, or may be learned by practice of the embodiments of the disclosure.

According to an embodiment, an organometallic compound may be represented by Formula 1.

[Formula 1]

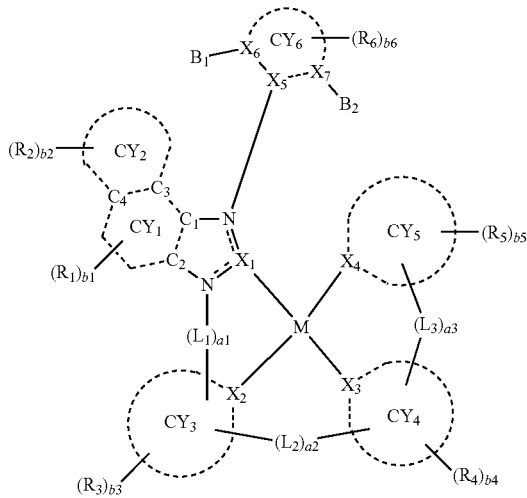

In Formula 1,

M may be platinum (Pt), palladium (Pd), copper (Cu), silver (Ag), gold (Au), rhodium (Rh), iridium (Ir), ruthenium (Ru), osmium (Os), titanium (Ti), zirconium (Zr), hafnium (Hf), europium (Eu), terbium (Tb), or thulium (Tm), $X_1$ may be C, and $X_2$ to $X_7$ may each independently be C or N, $C_1$ to $C_4$ may each indicate a carbon atom, $CY_1$ to $CY_6$ may each independently be a $C_3$-$C_{60}$ carbocyclic group or a $C_1$-$C_{60}$ heterocyclic group, $L_1$ may be a single bond, *—O—*', *—S—*, *—Se—*', *—S(=O)$_2$—*', *—C($R_7$)($R_8$)—*', *—C($R_7$)=*', *=C($R_7$)—*', *—C($R_7$)=C($R_8$)—*', *—C(=O)—*', *—C(=S)—*', *—C≡C—*', *—B($R_7$)—*', N($R_7$)—*', *—P($R_7$)—*', *—Si($R_7$)($R_8$)—*', *—P(=O)($R_7$)—*', or *—Ge($R_7$)($R_8$)—*', $L_2$ may be a single bond, *—O—*', *—S—*', *—Se—*', *—S(=O)$_2$—*', *—C($R_9$)($R_{10}$)—*', *—C($R_9$)=*', *=C($R_9$)—*', *—C($R_9$)=C($R_{10}$)—*', *—C(=O)—*', *—C(=S)—*', *—C≡C—*', *—B($R_9$)—*, *—N($R_9$)—*', *—P($R_9$)—*', *—Si($R_9$)($R_{10}$)—*', *—P(=O)($R_9$)—*', or *—Ge($R_9$)($R_{10}$)—*', $L_3$ may be a single bond, *—O—*', *—S—*', *—Se—*', *—S(=O)$_2$—*', *—C($R_{11}$)($R_{12}$)—*', *—C($R_{11}$)=*', *=C($R_{11}$)—*', *—C($R_{11}$)=C($R_{12}$)—*', *—C(=O)—*', *—C(=S)—*', *—C≡C—*', *—B($R_{11}$)—*', *—N($R_{11}$)—*', *—P($R_{11}$)—*', *—Si($R_{11}$)($R_{12}$)—*', *—P(=O)($R_{11}$)—*', or *—Ge($R_{11}$)($R_{12}$)—*', a1 to a3 may each independently be an integer from 1 to 3, $B_1$ and $B_2$ may each independently be a $C_1$-$C_{60}$alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$alkoxy group unsubstituted or substituted with at least one $R_{10a}$, a $C_3$-$C_{60}$ carbocyclic group unsubstituted or substituted with at least one $R_{10a}$, or a $C_1$-$C_{60}$ heterocyclic group unsubstituted or substituted with at least one $R_{10a}$, $R_1$ to $R_{12}$ may each independently be hydrogen, deuterium, —F, —Cl, —Br, —I, a hydroxyl group, a cyano group, a nitro group, a $C_1$-$C_{60}$alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$alkoxy group unsubstituted or substituted with at least one $R_{10a}$, a $C_3$-$C_{60}$ carbocyclic group unsubstituted or substituted with at least one $R_{10a}$, a $C_1$-$C_6O$ heterocyclic group unsubstituted or substituted with at least one $R_{10a}$, a $C_6$-$C_{60}$ aryloxy group unsubstituted or substituted with at least one $R_{10a}$, a $C_6$-$C_{60}$ arylthio group unsubstituted or substituted with at least one $R_{10a}$, —Si($Q_1$)($Q_2$)($Q_3$), —N($Q_1$)($Q_2$), —B($Q_1$)($Q_2$), —C(=O)($Q_1$), —S(=O)$_2$($Q_1$), or —P(=O)($Q_1$)($Q_2$), b1 to b6 may each independently be an integer from 1 to 10, two or more groups of $R_1$ to $R_{12}$ may optionally be bonded to each other to form a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$,

* and *' each indicates a binding site to a neighboring atom, and $R_{10a}$ may be deuterium, —F, —Cl, —Br, —I, a hydroxyl group, a cyano group, or a nitro group, a $C_1$-$C_{60}$ alkyl group, a $C_2$-$C_{60}$ alkenyl group, a $C_2$-$C_{60}$ alkynyl group, or a $C_1$-$C_{60}$ alkoxy group, each unsubstituted or substituted with deuterium, —F, —Cl, —Br, —I, a hydroxyl group, a cyano group, a nitro group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, —Si($Q_{11}$)($Q_{12}$)($Q_{13}$), —N($Q_{11}$)($Q_{12}$), —B($Q_{11}$)($Q_{12}$), —C(=O)($Q_{11}$), —S(=O)$_2$($Q_{11}$), —P(=O)($Q_{11}$)($Q_{12}$), or any combination thereof, a $C_3$-$C_{60}$ carbocyclic group, a $C_1$-$C_{60}$ heterocyclic group, a $C_6$-$C_{60}$ aryloxy group, or a $C_6$-$C_{60}$ arylthio group, each unsubstituted or substituted with deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, —Si($Q_{21}$)($Q_{22}$)($Q_{23}$), —N($Q_{21}$)($Q_{22}$), —B($Q_{21}$)($Q_{22}$), —C(=O)($Q_{21}$), —S(=O)$_2$($Q_{21}$), —P(=O)($Q_{21}$)($Q_{22}$), or any combination thereof, or —Si($Q_{31}$)($Q_{32}$)($Q_{33}$), —N($Q_{31}$)($Q_{32}$), —B($Q_{31}$)($Q_{32}$), —C(=O)($Q_{31}$), —S(=O)$_2$($Q_{31}$), or —P(=O)($Q_{31}$)($Q_{32}$), wherein $Q_1$ to $Q_3$, $Q_{11}$ to $Q_{13}$, $Q_{21}$ to $Q_{23}$, and $Q_{31}$ to $Q_{33}$ may each independently be: hydrogen; deuterium; —F; —Cl; —Br; —I; a hydroxyl group; a cyano group; a nitro group; a $C_1$-$C_{60}$ alkyl group; a $C_2$-$C_{60}$ alkenyl group; a $C_2$-$C_{60}$ alkynyl group; a $C_1$-$C_{60}$ alkoxy group; or a $C_3$-$C_{60}$ carbocyclic group or a $C_1$-$C_{60}$ heterocyclic group, each unsubstituted or substituted with deuterium, —F, a cyano group, a $C_1$-$C_{60}$ alkyl group, a $C_1$-$C_{60}$ alkoxy group, a phenyl group, a biphenyl group, or any combination thereof.

According to another aspect, provided is a light-emitting device that may include a first electrode, a second electrode facing the first electrode, and an interlayer disposed between the first electrode and the second electrode and including an emission layer, wherein the emission layer includes the organometallic compound.

In an embodiment, the first electrode may be an anode, the second electrode may be a cathode, and the interlayer may further include a hole transport region disposed between the first electrode and the emission layer and an electron transport region disposed between the emission layer and the second electrode. The hole transport region may include a hole injection layer, a hole transport layer, an emission auxiliary layer, an electron blocking layer, or any combination thereof. The electron transport region may include a buffer layer, a hole blocking layer, an electron control layer, an electron transport layer, an electron injection layer, or any combination thereof.

In an embodiment, the emission layer may include a host and a dopant, and the dopant may include the organometallic compound.

In an embodiment, the buffer layer, the hole blocking layer, the electron control layer, the electron transport layer, the electron injection layer, or any combination thereof may include a silicon-containing compound, a phosphine oxide-containing compound, or any combination thereof.

In an embodiment, the emission layer may emit blue light having a maximum emission wavelength in a range of about 410 nm to about 500 nm.

In an embodiment, the light-emitting device may further include at least one of a first capping layer disposed outside the first electrode and a second capping layer disposed outside the second electrode. The at least one of the first capping layer and the second capping layer may have a refractive index equal to or greater than about 1.6 at a wavelength of about 589 nm.

According to another aspect, provided is a light-emitting device that may include a first pixel electrode, a second pixel electrode, and a third pixel electrode respectively disposed in a first emission area, a second emission area, and a third emission area, an opposite electrode facing the first pixel electrode, the second pixel electrode, and the third pixel electrode, and an interlayer disposed between the opposite electrode and the first pixel electrode, the second pixel electrode, and the third pixel electrode and including an emission layer. The emission layer may include a first emission layer disposed to correspond to the first emission area and emitting first-color light, a second emission layer disposed to correspond to the second emission area and emitting second-color light, and a third emission layer disposed to correspond to the third emission area and emitting third-color light. A maximum emission wavelength of the first-color light, a maximum emission wavelength of the second-color light, and a maximum emission wavelength of the third-color light may be different from each other. A maximum emission wavelength of the first-color light and a maximum emission wavelength of the second-color light may each be greater than a maximum emission wavelength of the third-color light. The third emission layer may include the organometallic compound.

According to another aspect, provided is an electronic apparatus that may include the light-emitting device.

In an embodiment, the electronic apparatus may further include a color filter, a color conversion layer, a touch screen layer, a polarizing layer, or any combination thereof.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION OF THE EMBODIMENTS

Figure 1:
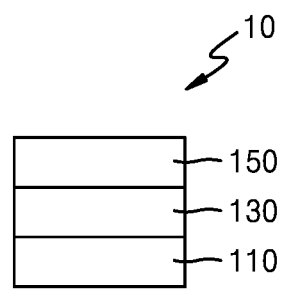
FIG. 1 is a schematic cross-sectional view illustrating a structure of a light-emitting device according to an embodiment.

The disclosure will now be described more fully hereinafter with reference to the accompanying drawings, in which embodiments are shown. This disclosure may, however, be embodied in different forms and should not be construed as limited to the embodiments set forth herein. Rather, these embodiments are provided so that this disclosure will be thorough and complete, and will fully convey the scope of the disclosure to those skilled in the art.

In the drawings, the sizes, thicknesses, ratios, and dimensions of the elements may be exaggerated for ease of description and for clarity. Like numbers refer to like elements throughout.

In the description, it will be understood that when an element (or region, layer, part, etc.) is referred to as being "on", "connected to", or "coupled to" another element, it can be directly on, connected to, or coupled to the other element, or one or more intervening elements may be present therebetween. In a similar sense, when an element (or region, layer, part, etc.) is described as "covering" another element, it can directly cover the other element, or one or more intervening elements may be present therebetween.

In the description, when an element is "directly on," "directly connected to," or "directly coupled to" another element, there are no intervening elements present. For example, "directly on" may mean that two layers or two elements are disposed without an additional element such as an adhesion element therebetween.

It will be understood that, although the terms "first," "second," etc. may be used herein to describe various elements, these elements should not be limited by these terms. These terms are only used to distinguish one element from another element. Thus, a first element could be termed a second element without departing from the teachings of the invention. Similarly, a second element could be termed a first element, without departing from the scope of the embodiments of the inventive concept.

As used herein, the expressions used in the singular such as "a," "an," and "the," are intended to include the plural forms as well, unless the context clearly indicates otherwise.

As used herein, the term "and/or" includes any and all combinations of one or more of the associated listed items. For example, "A and/or B" may be understood to mean "A, B, or A and B." The terms "and" and "or" may be used in the conjunctive or disjunctive sense and may be understood to be equivalent to "and/or".

The term "at least one of" is intended to include the meaning of "at least one selected from" for the purpose of its meaning and interpretation. For example, "at least one of A and B" may be understood to mean "A, B, or A and B." When preceding a list of elements, the term, "at least one of," modifies the entire list of elements and does not modify the individual elements of the list.

The spatially relative terms "below", "beneath", "lower", "above", "upper", or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

The terms "about" or "approximately" as used herein is inclusive of the stated value and means within an acceptable range of deviation for the recited value as determined by one of ordinary skill in the art, considering the measurement in question and the error associated with measurement of the recited quantity (i.e., the limitations of the measurement system). For example, "about" may mean within one or more standard deviations, or within ±20%, 10%, or 5% of the stated value.

It should be understood that the terms "comprises," "comprising," "includes," "including," "have," "having," "contains," "containing," and the like are intended to specify the presence of stated features, integers, steps, operations, elements, components, or combinations thereof in the disclosure, but do not preclude the presence or addition of one or more other features, integers, steps, operations, elements, components, or combinations thereof.

Unless otherwise defined or implied herein, all terms (including technical and scientific terms) used have the same meaning as commonly understood by those skilled in the art to which this disclosure pertains. It will be further understood that terms, such as those defined in commonly used dictionaries, should be interpreted as having a meaning that is consistent with their meaning in the context of the relevant art and should not be interpreted in an ideal or excessively formal sense unless clearly defined in the specification.

An organometallic compound in an embodiment may be represented by Formula 1:

[Formula 1]

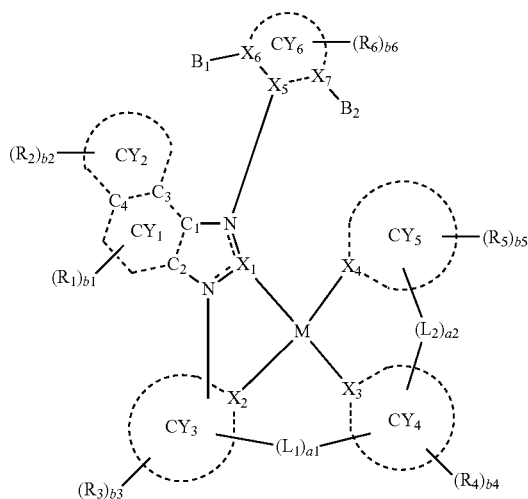

In Formula 1, M may be platinum (Pt), palladium (Pd), copper (Cu), silver (Ag), gold (Au), rhodium (Rh), iridium (Ir), ruthenium (Ru), osmium (Os), titanium (Ti), zirconium (Zr), hafnium (Hf), europium (Eu), terbium (Tb), or thulium (Tm).

In an embodiment, in Formula 1, M may be platinum (Pt), palladium (Pd), copper (Cu), silver (Ag), gold (Au), rhodium (Rh), or iridium (Ir).

In Formula 1, $X_1$ may be C, and $X_2$ to $X_7$ may each independently be C or N.

In an embodiment, in Formula 1, $X_2$ and $X_3$ may each be C and $X_4$ may be N, or $X_2$ to $X_4$ may each be C.

In Formula 1, a bond between $X_1$ and M, a bond between $X_2$ and M, a bond between $X_3$ and M, and a bond between $X_4$ and M may each independently be a coordinate bond or a covalent bond.

In an embodiment, in Formula 1, $X_2$ and $X_3$ may each be C and $X_4$ may be N, or $X_2$ to $X_4$ may each be C, and a bond between $X_1$ and M and a bond between $X_4$ and M may each be a coordinate bond, and a bond between $X_2$ and M and a bond between $X_3$ and M may each be a covalent bond.

In Formula 1, $C_1$ to $C_4$ may each represent a carbon atom.

In Formula 1, $CY_1$ to $CY_6$ may each independently be a $C_3$-$C_{60}$ carbocyclic group or a $C_1$-$C_{60}$ heterocyclic group.

In an embodiment, $CY_1$ to $CY_6$ may each independently be a benzene group, a naphthalene group, an anthracene group, a phenanthrene group, a triphenylene group, a pyrene group, a chrysene group, a cyclopentadiene group, a 1,2,3,4-tetrahydronaphthalene group, a thiophene group, a furan group, an indole group, a benzoborole group, a benzophosphole group, an indene group, a benzosilole group, a benzogermole group, a benzothiophene group, a benzoselenophene group, a benzofuran group, a carbazole group, a dibenzoborole group, a dibenzophosphole group, a fluorene group, a dibenzosilole group, a dibenzogermole group, a dibenzothiophene group, a dibenzoselenophene group, a dibenzofuran group, a dibenzothiophene 5-oxide group, a 9H-fluorene-9-one group, a dibenzothiophene 5,5-dioxide group, an azaindole group, an azabenzoborole group, an azabenzophosphole group, an azaindene group, an azabenzosilole group, an azabenzogermole group, an azabenzothiophene group, an azabenzoselenophene group, an azabenzofuran group, an azacarbazole group, an azadibenzoborole group, an azadibenzophosphole group, an azafluorene group, an azadibenzosilole group, an azadibenzogermole group, an azadibenzothiophene group, an azadibenzoselenophene group, an azadibenzofuran group, an azadibenzothiophene 5-oxide group, an aza-9H-fluorene-9-one group, an azadibenzothiophene 5,5-dioxide group, a pyridine group, a pyrimidine group, a pyrazine group, a pyridazine group, a triazine group, a quinoline group, an isoquinoline group, a quinoxaline group, a quinazoline group, a phenanthroline group, a pyrrole group, a pyrazole group, an imidazole group, a triazole group, an oxazole group, an isoxazole group, a thiazole group, an isothiazole group, an oxadiazole group, a thiadiazole group, a tetrazole group, a benzopyrazole group, a benzimidazole group, a benzotriazole, a benzoxazole group, a benzothiazole group, a benzoxadiazole group, a benzothiadiazole group, an indazole group, an imidazopyridine group, an imidazopyrimidine group, an imidazopyrazine group, an imidazopyridazine group, a pyrazolopyridine group, a pyrazolopyrimidine group, a pyrazolopyrazine group, a pyrazolopyridazine group, a 5,6,7,8-tetrahydroisoquinoline group, or a 5,6,7,8-tetrahydroquinoline group.

In embodiments, in Formula 1, $CY_1$ may be a benzene group, and $CY_2$ may be a benzene group, a pyridine group, a pyrimidine group, a pyrazine group, a pyridazine group, an indole group, an indene group, a benzosilole group, a benzothiophene group, a benzofuran group, an azaindole group, an azaindene group, an azabenzosilole group, an azabenzothiophene group, or an azabenzofuran group.

In an embodiment, in Formula 1, a moiety represented by

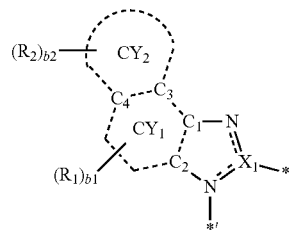

may be a group represented by one of Formulae 2-1 to 2-3:

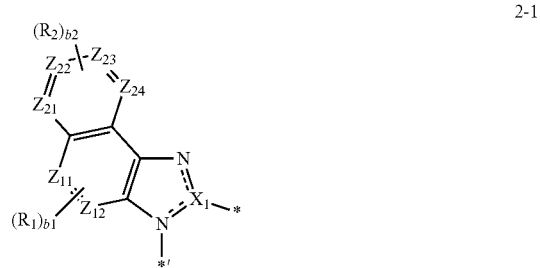

2-1

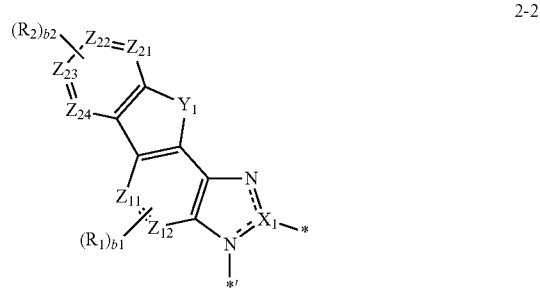

2-2

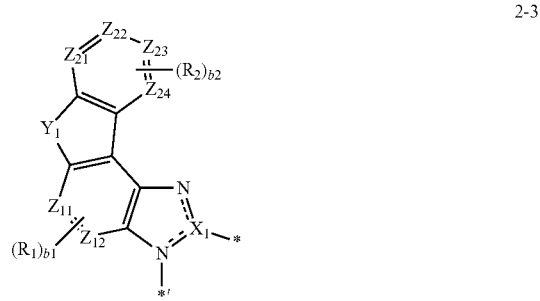

2-3

In Formulae 2-1 to 2-3, $Y_1$ may be O, S, $N(R_{21})$, $C(R_{21})(R_{22})$, or $Si(R_{21})(R_{22})$, $Z_{11}$, $Z_{12}$, and $Z_{21}$ to $Z_{24}$ may each independently be C or N, $R_{21}$ and $R_{22}$ may each independently be the same as described in connection with $R_2$ in Formula 1, b1 may be 1 or 2, b2 may be an integer from 1 to 4, $X_1$, $R_1$, and $R_2$ may be the same as described in connection with Formula 1, \* indicates a binding site to M, and
\*' indicates a binding site to a neighboring atom.
In an embodiment, in Formula 1, a moiety represented by
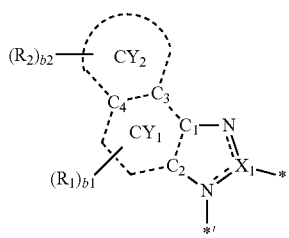
may be a group represented by one of Formulae 2-11 to 2-26:
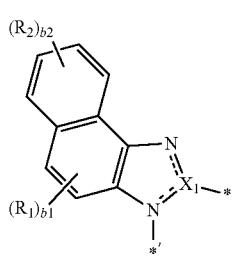
2-11
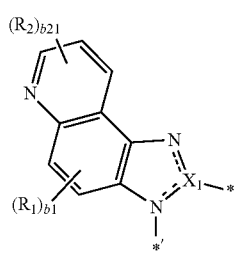
2-12
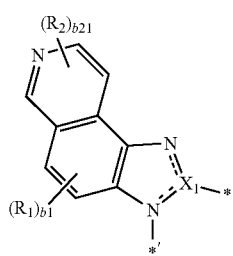
2-13
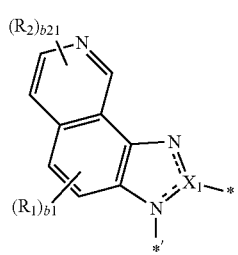
2-14
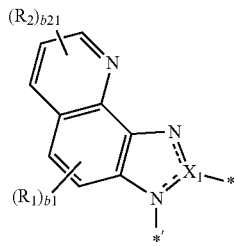
2-15
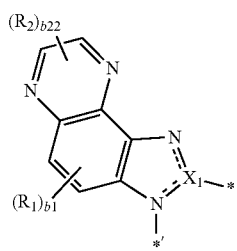
2-16
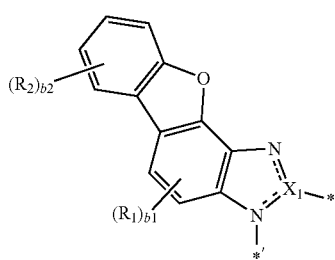
2-17
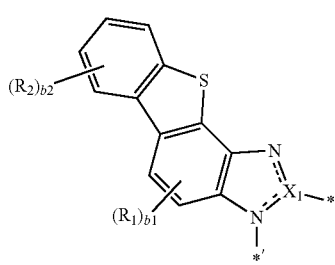
2-18
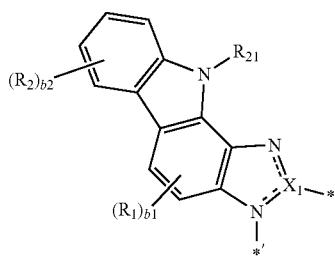
2-19
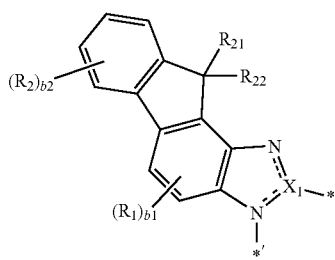
2-20

2-21

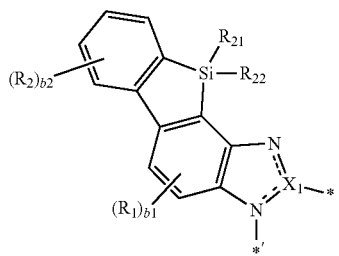

2-22

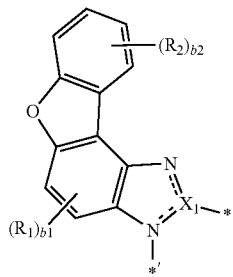

2-23

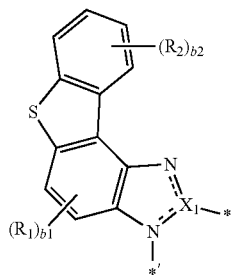

2-24

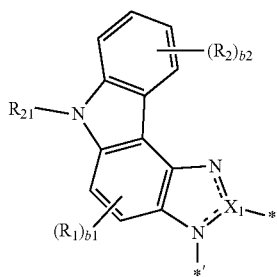

2-25

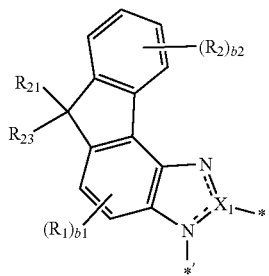

2-26

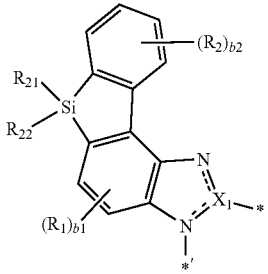

In Formulae 2-11 to 2-26,
$R_{21}$ and $R_{22}$ may each independently be the same as described in connection with $R_2$ in Formula 1,
b1 and b22 may each independently be 1 or 2,
b21 may be an integer from 1 to 3,
b2 may be an integer from 1 to 4,
$X_1$, $R_1$, and $R_2$ may be the same as described in connection with Formula 1,
* indicates a binding site to M, and
*' indicates a binding site to a neighboring atom.

In an embodiment, in Formula 1, $CY_3$ may be a group represented by one of Formulae 3-1 to 3-9:

3-1

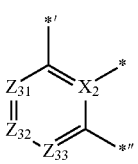

3-2

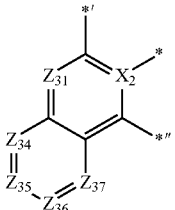

3-3

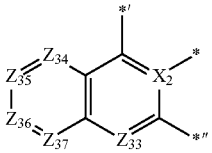

3-4

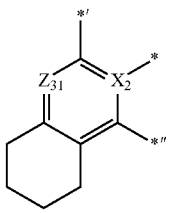

3-5

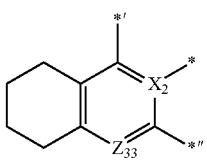

-continued 3-6
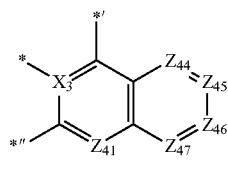

3-7

3-8

3-9

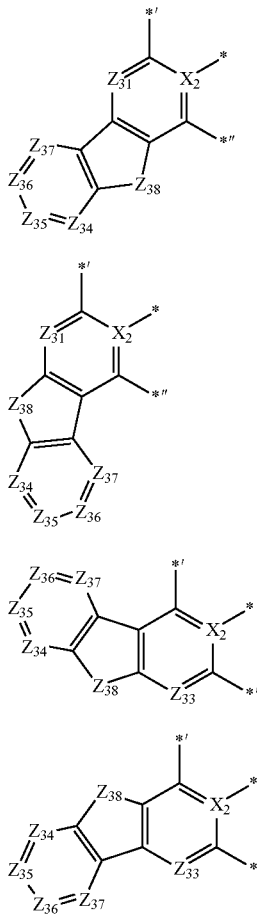

In Formulae 3-1 to 3-9,
$Z_{31}$ to $Z_{37}$ may each independently be C or N,
$Z_{38}$ may be O, S, N, C, or Si,
$X_2$ may be the same as described in connection with Formula 1,
* indicates a binding site to M, and
*' and *" each indicates a binding site to a neighboring atom.

In an embodiment, in Formula 1, $CY_4$ may be a group represented by one of Formulae 4-1 to 4-9:

4-1
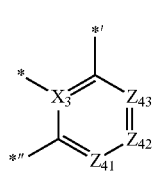

4-2
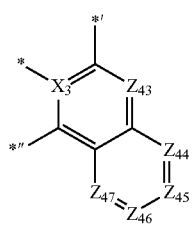

4-3
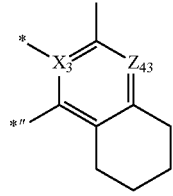

4-4

4-5
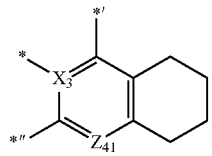

4-6
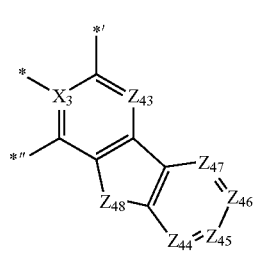

4-7
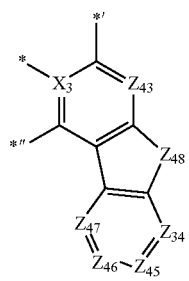

4-8
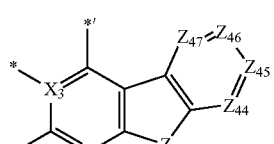

4-9
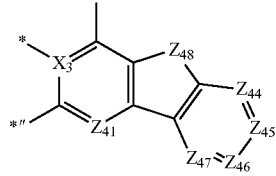

In Formulae 4-1 to 4-9,
$Z_{41}$ to $Z_{47}$ may each independently be C or N,
$Z_{48}$ may be O, S, N, C, or Si,
$X_3$ may be the same as described in connection with Formula 1,
* indicates a binding site to M, and
*' and *" each indicates a binding site to a neighboring atom.

In an embodiment, in Formula 1, $CY_5$ may be a group represented by one of Formulae 5-1 to 5-5:
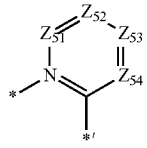
5-1
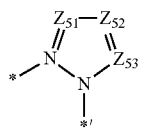
5-2
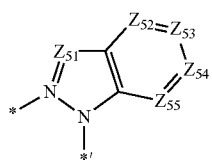
5-3
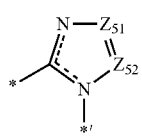
5-4
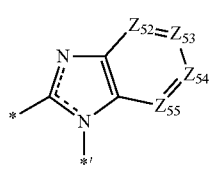
5-5
In Formulae 5-1 to 5-5,
$Z_{51}$ to $Z_{55}$ may each independently be C or N,
*indicates a binding site to M, and
*' indicates a binding site to a neighboring atom.
In embodiments, in Formula 1, $CY_5$ may be a group represented by one of Formulae 5-11 to 5-40:
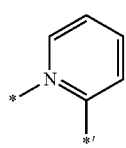
5-11
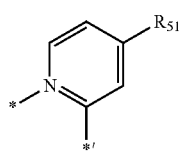
5-12
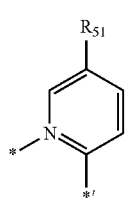
5-13
-continued
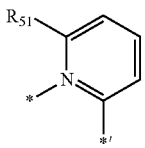
5-14
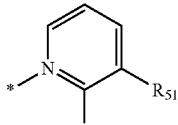
5-15
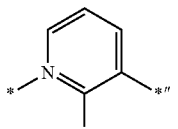
5-16
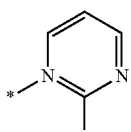
5-17
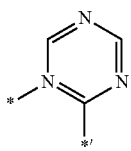
5-18
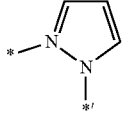
5-19
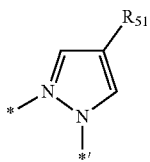
5-20
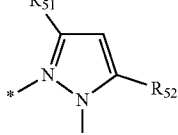
5-21
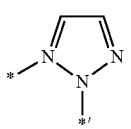
5-22
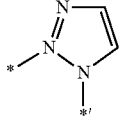
5-23

-continued
5-24 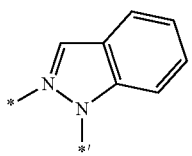
5-25 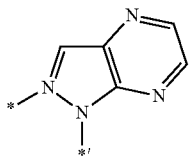
5-26 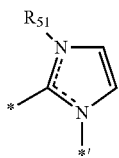
5-27 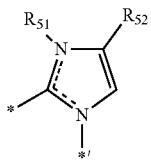
5-28 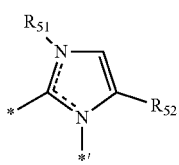
5-29 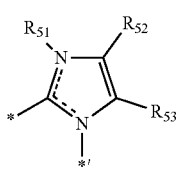
5-30 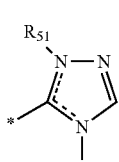
5-31 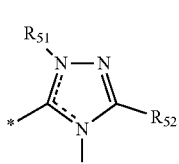
5-32 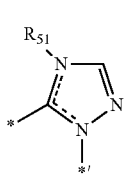
-continued
5-33 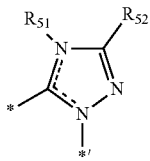
5-34 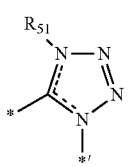
5-35 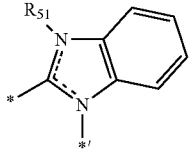
5-36 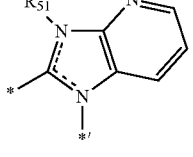
5-37 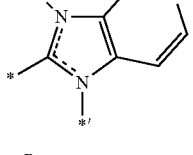
5-38 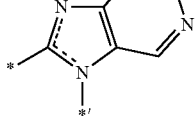
5-39 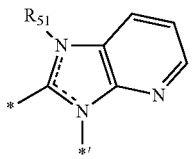
5-40 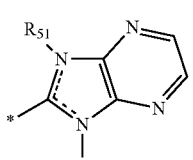
In Formulae 5-11 to 5-40,
$R_{51}$ to $R_{53}$ may be the same as described in connection with $R_5$ in Formula 1,
* indicates a binding site to M, and
*' and *'' each indicates a binding site to a neighboring atom.
In Formula 1, $L_1$ may be a single bond, *—O—*', *—S—*', *—Se—*', *—S(=O)$_2$—*', *—C($R_7$)($R_8$)—*', *—C($R_7$)=*', *=C($R_7$)—*', *—C($R_7$)=C($R_8$)—*', *—C(=O)—*', *—C(=S)—*', *—C≡C—*', *—B($R_7$)—*', *—N($R_7$)—*', *—P($R_7$)—*', *—Si($R_7$)($R_8$)—*', *—P(=O)($R_7$)—*', or *—Ge($R_7$)($R_8$)—*', $L_2$ may be a single bond, *—O—*', *—S—*', *—Se—*', *—S(=O)$_2$—*', *—C(R$_9$)(R$_{10}$)—*', *—C(R$_9$)=*', *=C(R$_9$)—*', *—C(R$_9$)=C(R$_{10}$)—*', *—C(=O)—*', *—C(=S)—*', *—C≡C—*', *—B(R$_9$)—*', *—N(R$_9$)—*', *—P(R$_9$)—*', *—Si(R$_9$)(R$_{10}$)—*', *—P(=O)(R$_9$)—*', or *—Ge(R$_9$)(R$_{10}$)—*', and $L_3$ may be a single bond, *—O—*', *—S—*', *—Se—*', *—S(=O)$_2$—*', *—C(R$_{11}$)(R$_{12}$)—*', *—C(R$_{11}$)=*', *=C(R$_{11}$)—*', *—C(R$_{11}$)=C(R$_{12}$)—*', *—C(=O)—*', *—C(=S)—*', *—C≡C—*', *—B(R$_9$)—*', *—N(R$_{11}$)—*', *—P(R$_{11}$)—*', *—Si(R$_{11}$)(R$_{12}$)—*', *—P(=O)(R$_{11}$)—*', or *—Ge(R$_{11}$)(R$_{12}$)—*'

In Formula 1, a1 to a3 may respectively indicate numbers of $L_1$ to $L_3$, and may each independently be an integer from 1 to 3.

In an embodiment, in Formula 1, a1 to a3 may each be 1, $L_1$ may be a single bond, $L_2$ may be *—O—*', *—S—*', *—Se—*', *—C(R$_9$)(R$_{10}$)—*', *—B(R$_9$)—*', *—N(R$_9$)—*', or *—Si(R$_9$)(R$_{10}$)—*', and $L_3$ may be a single bond, *—O—*', *—S—*', *—C(R$_{11}$)(R$_{12}$)—*', *—N(R$_{11}$)—*', or Si(R$_{11}$)(R$_{12}$)—*'.

In an embodiment, in Formula 1, a moiety represented by

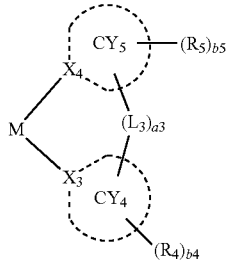

may be a group represented by Formula L2-1 or L2-2:

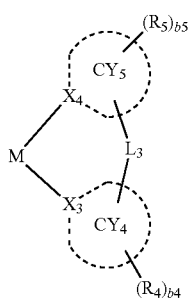

L2-1

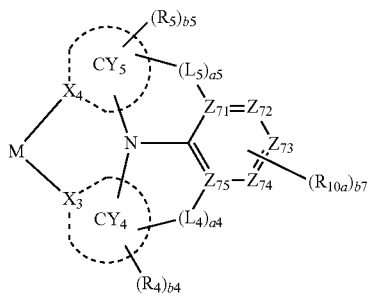

L2-2

In Formulae L2-1 to L2-2,
$L_3$ may be a single bond, *—*', *—S—*', *—C(R$_{11}$)(R$_{12}$)—*', *—N(R$_{11}$)—*', or *—Si(R$_{11}$)(R$_{12}$)—*', $Z_{71}$ to $Z_{75}$ may each independently be C*', C, or N, $L_4$ may be a single bond or *—C(R$_{101}$)(R$_{102}$)—*', $L_5$ may be a single bond or *—C(R$_{103}$)(R$_{104}$)—*', a4 and a5 may each independently be an integer from 0 to 3, wherein a sum of a4 and a5 may be 1 or more, when a4 is 0, -(L$_4$)$_{a4}$- may not be present, and when a4 is 1 or 2, $Z_{75}$ may be C—*', when a5 is 0, -(L$_5$)$_{a5}$- may not be present, and when a5 is 1 or 2, $Z_{71}$ may be C—*', $R_{101}$ to $R_{104}$ may each independently be hydrogen or a $C_1$-$C_{10}$ alkyl group, b7 may be an integer from 0 to 5, $X_3$, $X_4$, $CY_4$, $CY_5$, $R_4$, $R_5$, $R_{11}$, $R_{12}$, b4, b5, and $R_{10a}$ may each be the same as described in connection with Formula 1, and

* and *' each indicates a binding site to a neighboring atom.

In embodiments, in Formula 1, a moiety represented by

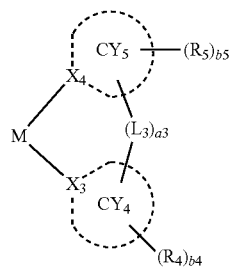

may be a group represented by one of Formulae L2-11 to L2-22:

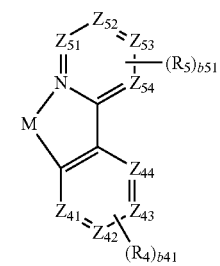

L2-11

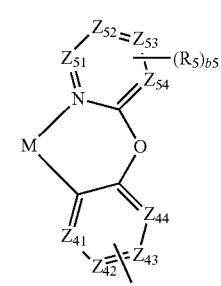

L2-12

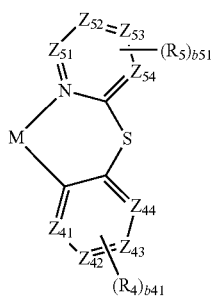
L2-13
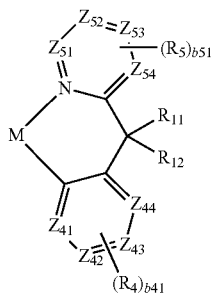
L2-14
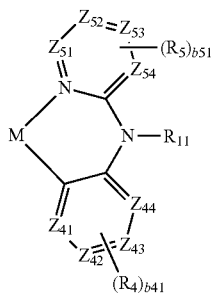
L2-15
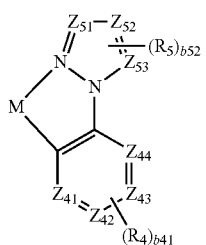
L2-16
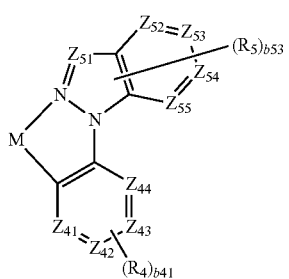
L2-17
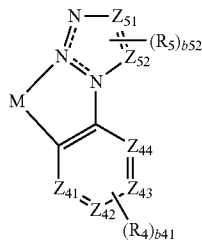
L2-18
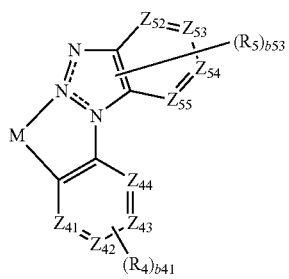
L2-19
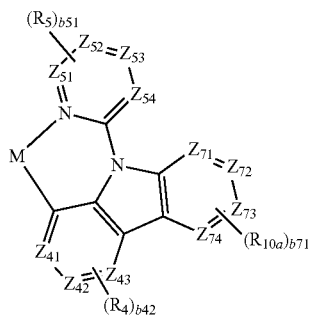
L2-20
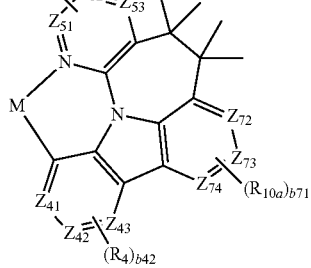
L2-21
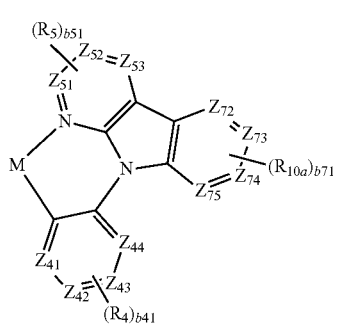
L2-22
In Formulae L2-11 to L2-22,
$Z_{41}$ to $Z_{44}$, $Z_{51}$ to $Z_{54}$, and $Z_{71}$ to $Z_{75}$ may each independently be C or N,
b41 and b51 may each independently be an integer from 1 to 4, b42 and b52 may each independently be an integer from 1 to 3, b53 may be an integer from 1 to 5, b71 may be an integer from 0 to 4, b72 may be an integer from 0 to 3, and $R_4$, $R_5$, $R_{11}$, $R_{12}$, and $R_{10a}$ may each be the same as described in connection with Formula 1.

In an embodiment, in Formula 1, a moiety represented by

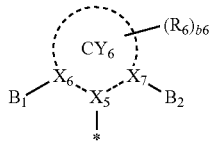

may be a group represented by Formula 6-1:

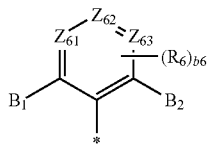

[Formula 6-1]

In Formula 6-1, $Z_{61}$ to $Z_{63}$ may each independently be C or N, b6 may be an integer from 0 to 3, $B_1$, $B_2$, and $R_6$ may each be the same as described in connection with Formula 1, and

* indicates a binding site to a neighboring atom.

In Formula 1, $B_1$ and $B_2$ may each independently be a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_3$-$C_{60}$ carbocyclic group unsubstituted or substituted with at least one $R_{10a}$, or a $C_1$-$C_{60}$ heterocyclic group unsubstituted or substituted with at least one $R_{10a}$.

In an embodiment, in Formula 1, $B_1$ and $B_2$ may each independently be:

a $C_1$-$C_{20}$ alkyl group, a $C_2$-$C_{20}$ alkenyl group, a $C_2$-$C_{20}$ alkynyl group or a $C_1$-$C_{20}$ alkoxy group, each unsubstituted or substituted with deuterium, —F, —Cl, —Br, —I, —CD$_3$, —CD$_2$H, —CDH$_2$, —CF$_3$, —CF$_2$H, —CFH$_2$, a hydroxyl group, a cyano group, a nitro group, a cyclopentyl group, a cyclohexyl group, a cycloheptyl group, a cyclooctyl group, an adamantyl group, a norbornyl group, a norbornenyl group, a cyclopentenyl group, a cyclohexenyl group, a cycloheptenyl group, a phenyl group, a naphthyl group, a pyridinyl group, a pyrimidinyl group, —Si(Q$_{31}$)(Q$_{32}$)(Q$_{33}$), —N(Q$_{31}$)(Q$_{32}$), —B(Q$_{31}$)(Q$_{32}$), —C(=O)(Q$_{31}$), —S(=O)$_2$(Q$_{31}$), —P(=O)(Q$_{31}$)(Q$_{32}$), or any combination thereof; or a cyclopentyl group, a cyclohexyl group, a cycloheptyl group, a cyclooctyl group, an adamantyl group, a norbornyl group, a norbornenyl group, a cyclopentenyl group, a cyclohexenyl group, a cycloheptenyl group, a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, a benzoisothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, or an imidazopyrimidinyl group, each unsubstituted or substituted with deuterium, —F, —Cl, —Br, —I, —CD$_3$, —CD$_2$H, —CDH$_2$, —CF$_3$, —CF$_2$H, —CFH$_2$, a hydroxyl group, a cyano group, a nitro group, a $C_1$-$C_{20}$ alkyl group, a $C_2$-$C_{20}$ alkenyl group, a $C_2$-$C_{20}$ alkynyl group, a $C_1$-$C_{20}$ alkoxy group, a cyclopentyl group, a cyclohexyl group, a cycloheptyl group, a cyclooctyl group, an adamantyl group, a norbornyl group, a norbornenyl group, a cyclopentenyl group, a cyclohexenyl group, a cycloheptenyl group, a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, a benzoisothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, an imidazopyrimidinyl group, —Si(Q$_{31}$)(Q$_{32}$)(Q$_{33}$), —N(Q$_{31}$)(Q$_{32}$), —B(Q$_{31}$)(Q$_{32}$), —C(=O)(Q$_{31}$), —S(=O)$_2$(Q$_{31}$), —P(=O)(Q$_{31}$)(Q$_{32}$), or any combination thereof.

In Formula 1, $R_1$ to $R_{12}$ may each independently be hydrogen, deuterium, —F, —Cl, —Br, —I, a hydroxyl group, a cyano group, a nitro group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, a $C_6$-$C_{60}$ aryloxy group unsubstituted or substituted with at least one $R_{10a}$, a $C_6$-$C_{60}$ arylthio group unsubstituted or substituted with at least one $R_{10a}$, —Si(Q$_1$)(Q$_2$)(Q$_3$), —N(Q$_1$)(Q$_2$), —B(Q$_1$)(Q$_2$), —C(=O)(Q$_1$), —S(=O)$_2$(Q$_1$), or —P(=O)(Q$_1$)(Q$_2$), and two or more groups of $R_1$ to $R_{12}$ may optionally be bonded to each other to form a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$.

In an embodiment, in Formula 1, $R_1$ to $R_{12}$ may each independently be:

hydrogen, deuterium, —F, —Cl, —Br, —I, a hydroxyl group, a cyano group, or a nitro group;

a $C_1$-$C_{20}$ alkyl group, a $C_2$-$C_{20}$ alkenyl group, a $C_2$-$C_{20}$ alkynyl group or a $C_1$-$C_{20}$ alkoxy group, each unsubstituted or substituted with deuterium, —F, —Cl, —Br, —I, —CD$_3$, —CD$_2$H, —CDH$_2$, —CF$_3$, —CF$_2$H, —CFH$_2$, a hydroxyl group, a cyano group, a nitro group, a cyclopentyl group, a cyclohexyl group, a cycloheptyl group, a cyclooctyl group, an adamantyl group, a norbornyl group, a norbornenyl group, a cyclopentenyl group, a cyclohexenyl group, a cycloheptenyl group, a phenyl group, a naphthyl group, a pyridinyl group, a pyrimidinyl group, —Si(Q$_{31}$)(Q$_{32}$)(Q$_{33}$), —N(Q$_{31}$)(Q$_{32}$), —B(Q$_{31}$)(Q$_{32}$), —C(=O)(Q$_{31}$), —S(=O)$_2$(Q$_{31}$), —P(=O)(Q$_{31}$)(Q$_{32}$), or any combination thereof;

a cyclopentyl group, a cyclohexyl group, a cycloheptyl group, a cyclooctyl group, an adamantyl group, a norbornyl group, a norbornenyl group, a cyclopentenyl group, a cyclohexenyl group, a cycloheptenyl group, a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, a benzoisothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, or an imidazopyrimidinyl group, each unsubstituted or substituted with deuterium, —F, —Cl, —Br, —I, —CD$_3$, —CD$_2$H, —CDH$_2$, —CF$_3$, —CF$_2$H, —CFH$_2$, a hydroxyl group, a cyano group, a nitro group, a $C_1$-$C_{20}$ alkyl group, a $C_2$-$C_{20}$ alkenyl group, a $C_2$-$C_{20}$ alkynyl group, a $C_1$-$C_{20}$ alkoxy group, a cyclopentyl group, a cyclohexyl group, a cycloheptyl group, a cyclooctyl group, an adamantyl group, a norbornyl group, a norbornenyl group, a cyclopentenyl group, a cyclohexenyl group, a cycloheptenyl group, a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, a benzoisothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, an imidazopyrimidinyl group, —Si(Q$_{31}$)(Q$_{32}$)(Q$_{33}$), —N(Q$_{31}$)(Q$_{32}$), —B(Q$_{31}$)(Q$_{32}$), —C(=O)(Q$_{31}$), —S(=O)$_2$(Q$_{31}$), —P(=O)(Q$_{31}$)(Q$_{32}$), or any combination thereof; or a cyclopentyl group, a cyclohexyl group, a cycloheptyl group, a cyclooctyl group, an adamantyl group, a norbornyl group, a norbornenyl group, a cyclopentenyl group, a cyclohexenyl group, a cycloheptenyl group, a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, a benzoisothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, or an imidazopyrimidinyl group, each substituted with a phenyl group substituted with deuterium, —F, —Cl, —Br, —I, —CD$_3$, —CD$_2$H, —CDH$_2$, —CF$_3$, —CF$_2$H, —CFH$_2$, a hydroxyl group, a cyano group, a nitro group, a $C_1$-$C_{20}$ alkyl group, a $C_2$-$C_{20}$ alkenyl group, a $C_2$-$C_{20}$ alkynyl group, a $C_1$-$C_{20}$ alkoxy group, —N(Q$_{31}$)(Q$_{32}$), —B(Q$_{31}$)(Q$_{32}$), or any combination thereof; or —Si(Q$_1$)(Q$_2$)(Q$_3$), —N(Q$_1$)(Q$_2$), —B(Q$_1$)(Q$_2$), —C(=O)(Q$_1$), —S(=O)$_2$(Q$_1$), or —P(=O)(Q$_1$)(Q$_2$).

In embodiments, in Formula 1, $L_2$ may be *—O—*', *—S—*', *—Se—*', *—C(R$_9$)(R$_{10}$)—*', *—B(R$_9$)—*', *—N(R$_9$)—*', or *—Si(R$_9$)(R$_{10}$)—*', and a2 may be 1, and $R_9$ and $R_{10}$ may each independently be a $C_1$-$C_{20}$ alkyl group, a $C_2$-$C_{20}$ alkenyl group, a $C_2$-$C_{20}$ alkynyl group or a $C_1$-$C_{20}$ alkoxy group, each unsubstituted or substituted with deuterium, —F, —Cl, —Br, —I, —CD$_3$, —CD$_2$H, —CDH$_2$, —CF$_3$, —CF$_2$H, —CFH$_2$, a hydroxyl group, a cyano group, a nitro group, a cyclopentyl group, a cyclohexyl group, a cycloheptyl group, a cyclooctyl group, an adamantyl group, a norbornyl group, a norbornenyl group, a cyclopentenyl group, a cyclohexenyl group, a cycloheptenyl group, a phenyl group, a naphthyl group, a pyridinyl group, a pyrimidinyl group, —Si(Q$_{31}$)(Q$_{32}$)(Q$_{33}$), —N(Q$_{31}$)(Q$_{32}$), —B(Q$_{31}$)(Q$_{32}$), —C(=O)(Q$_{31}$), —S(=O)$_2$(Q$_{31}$), —P(=O)(Q$_{31}$)(Q$_{32}$), or any combination thereof; or a group represented by Formula 8-1:

[Formula 8-1]

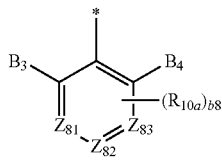

In Formula 8-1, $Z_{81}$ to $Z_{83}$ may each independently be C or N, $B_3$ and $B_4$ may each independently be: hydrogen, deuterium, —F, —Cl, —Br, —I, —CD$_3$, —CD$_2$H, —CDH$_2$, —CF$_3$, —CF$_2$H, —CFH$_2$, a hydroxyl group, a cyano group, a nitro group, a C$_1$-C$_{20}$ alkyl group, a C$_2$-C$_{20}$ alkenyl group, a C$_2$-C$_{20}$ alkynyl group, a C$_1$-C$_{20}$ alkoxy group, a cyclopentyl group, a cyclohexyl group, a cycloheptyl group, a cyclooctyl group, an adamantyl group, a norbornyl group, a norbornenyl group, a cyclopentenyl group, a cyclohexenyl group, a cycloheptenyl group, a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, a benzoisothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, or an imidazopyrimidinyl group;

a phenyl group substituted with deuterium, —F, —Cl, —Br, —I, —CD$_3$, —CD$_2$H, —CDH$_2$, —CF$_3$, —CF$_2$H, —CFH$_2$, a hydroxyl group, a cyano group, a nitro group, a C$_1$-C$_{20}$ alkyl group, a C$_2$-C$_{20}$ alkenyl group, a C$_2$-C$_{20}$ alkynyl group, a C$_1$-C$_{20}$ alkoxy group, —N(Q$_{31}$)(Q$_{32}$), —B(Q$_{31}$)(Q$_{32}$), or any combination thereof; or —Si(Q$_1$)(Q$_2$)(Q$_3$), —N(Q$_1$)(Q$_2$), —B(Q$_1$)(Q$_2$), —C(=O)(Q$_1$), —S(=O)$_2$(Q$_1$), or —P(=O)(Q$_1$)(Q$_2$), R$_{10a}$ may be the same as described in the specification, b8 may be an integer from 0 to 3, and

* indicates a binding site to a neighboring atom.

In Formula 1, b1 to b6 may respectively indicate numbers of R$_1$ to R$_6$, and may each independently be an integer from 1 to 10.

In Formula 1, * and *' each indicate a binding site to a neighboring atom.

In the specification, R$_{10a}$ may be:

deuterium, —F, —Cl, —Br, —I, a hydroxyl group, a cyano group, or a nitro group;

a C$_1$-C$_{60}$ alkyl group, a C$_2$-C$_{60}$ alkenyl group, a C$_2$-C$_{60}$ alkynyl group, or a C$_1$-C$_{60}$ alkoxy group, each unsubstituted or substituted with deuterium, —F, —Cl, —Br, —I, a hydroxyl group, a cyano group, a nitro group, a C$_3$-C$_{60}$ carbocyclic group, a C$_1$-C$_{60}$ heterocyclic group, a C$_6$-C$_{60}$ aryloxy group, a C$_6$-C$_{60}$ arylthio group, —Si(Q$_{11}$)(Q$_{12}$)(Q$_{13}$), —N(Q$_{11}$)(Q$_{12}$), —B(Q$_{11}$)(Q$_{12}$), —C(=O)(Q$_{11}$), —S(=O)$_2$(Q$_{11}$), —P(=O)(Q$_{11}$)(Q$_{12}$), or any combination thereof;

a C$_3$-C$_{60}$ carbocyclic group, a C$_1$-C$_{60}$ heterocyclic group, a C$_6$-C$_{60}$ aryloxy group, or a C$_6$-C$_{60}$ arylthio group, each unsubstituted or substituted with deuterium, —F, —Cl, —Br, —I, a hydroxyl group, a cyano group, a nitro group, a C$_1$-C$_{60}$ alkyl group, a C$_2$-C$_{60}$ alkenyl group, a C$_2$-C$_{60}$ alkynyl group, a C$_1$-C$_{60}$ alkoxy group, a C$_3$-C$_{60}$ carbocyclic group, a C$_1$-C$_{60}$ heterocyclic group, a C$_6$-C$_{60}$ aryloxy group, a C$_6$-C$_{60}$ arylthio group, —Si(Q$_{21}$)(Q$_{22}$)(Q$_{23}$), —N(Q$_{21}$)(Q$_{22}$), —B(Q$_{21}$)(Q$_{22}$), —C(=O)(Q$_{21}$), —S(=O)$_2$(Q$_{21}$), —P(=O)(Q$_{21}$)(Q$_{22}$), or any combination thereof; or —Si(Q$_{31}$)(Q$_{32}$)(Q$_{33}$), —N(Q$_{31}$)(Q$_{32}$), —B(Q$_{31}$)(Q$_{32}$), —C(=O)(Q$_{31}$), —S(=O)$_2$(Q$_{31}$), or —P(=O)(Q$_{31}$)(Q$_{32}$).

In the specification, Q$_1$ to Q$_3$, Q$_{11}$ to Q$_{13}$, Q$_{21}$ to Q$_{23}$, and Q$_{31}$ to Q$_{33}$ may each independently be: hydrogen; deuterium; —F; —Cl; —Br; —I; a hydroxyl group; a cyano group; a nitro group; a C$_1$-C$_{60}$ alkyl group; a C$_2$-C$_{60}$ alkenyl group; a C$_2$-C$_{60}$ alkynyl group; a C$_1$-C$_{60}$ alkoxy group; or a C$_3$-C$_{60}$ carbocyclic group or a C$_1$-C$_{60}$ heterocyclic group, each unsubstituted or substituted with deuterium, —F, a cyano group, a C$_1$-C$_{60}$ alkyl group, a C$_1$-C$_{60}$ alkoxy group, a phenyl group, a biphenyl group, or any combination thereof.

In an embodiment, the organometallic compound may be one of Compounds 1 to 120:

1

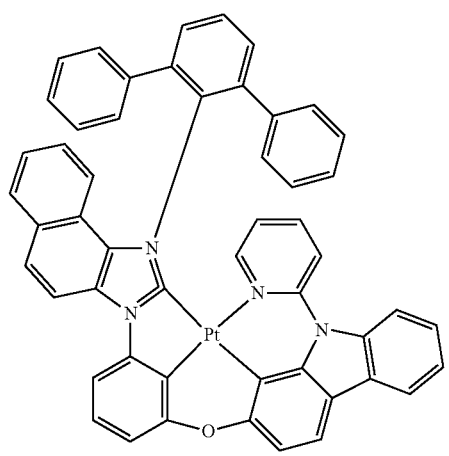

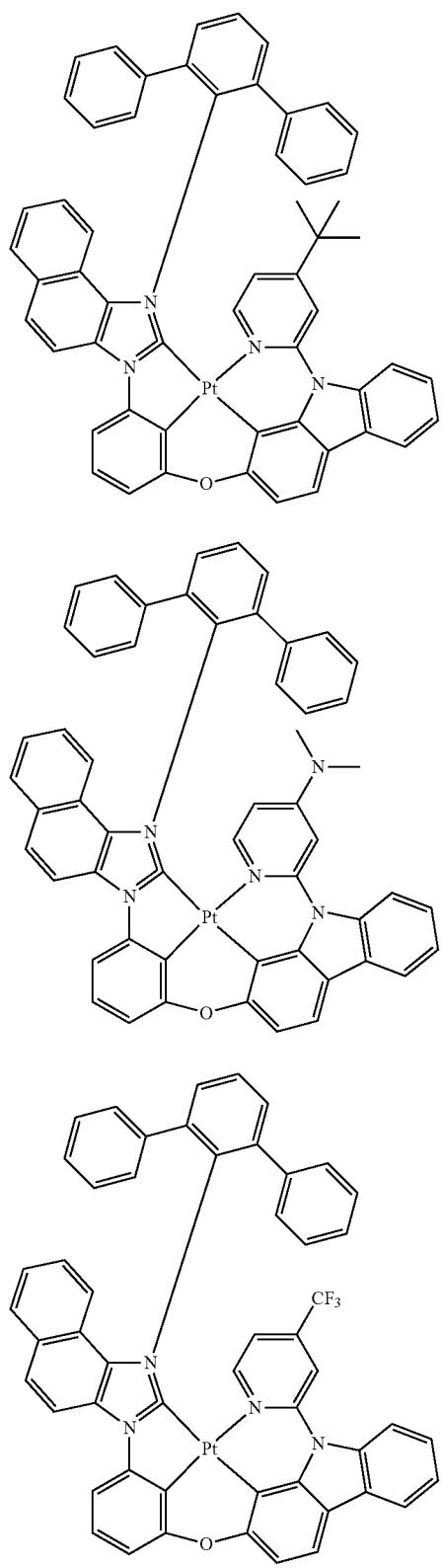
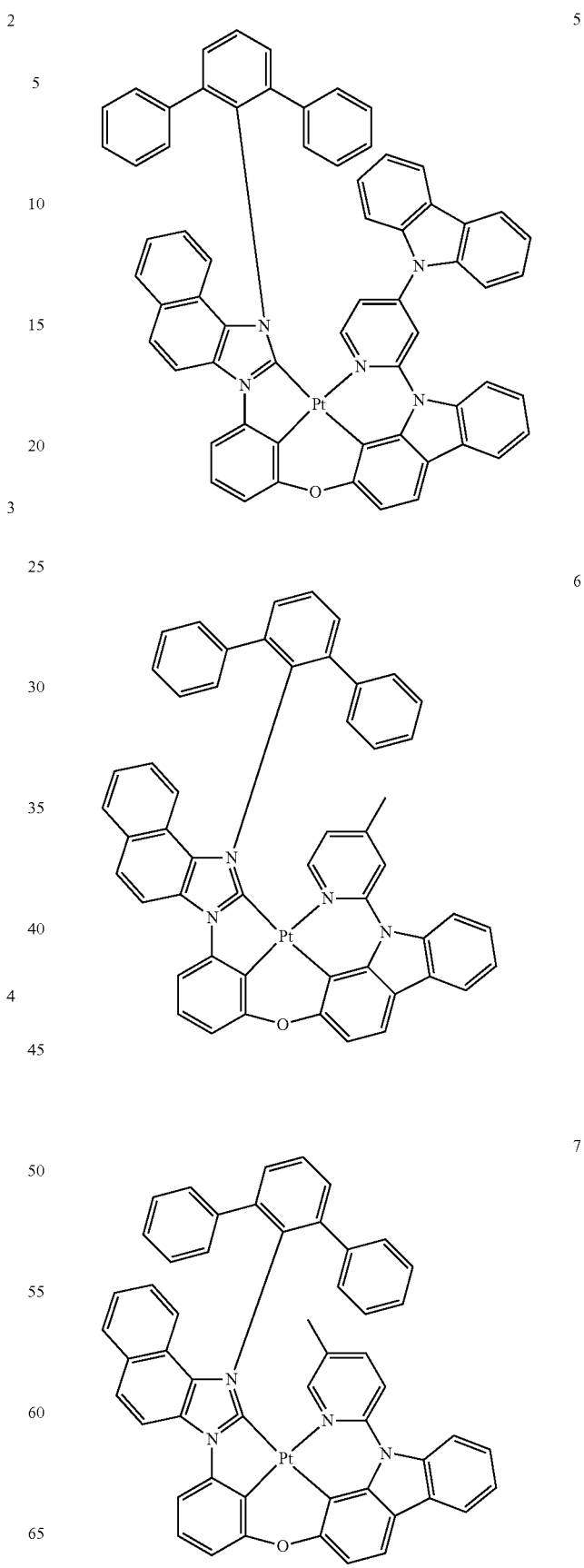

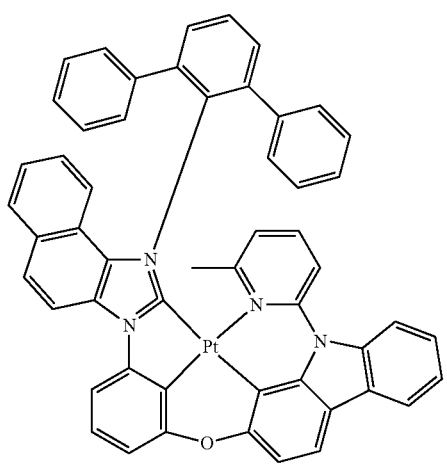
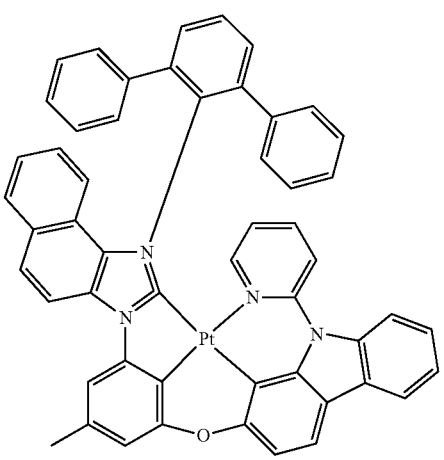
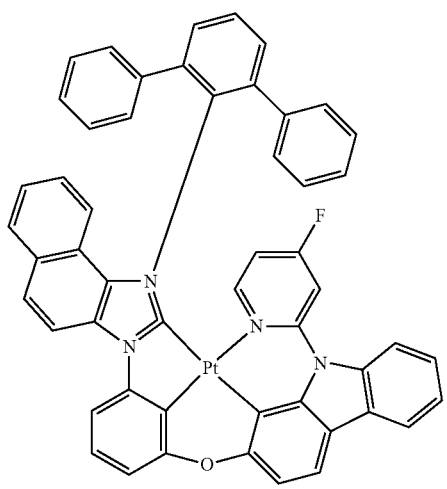
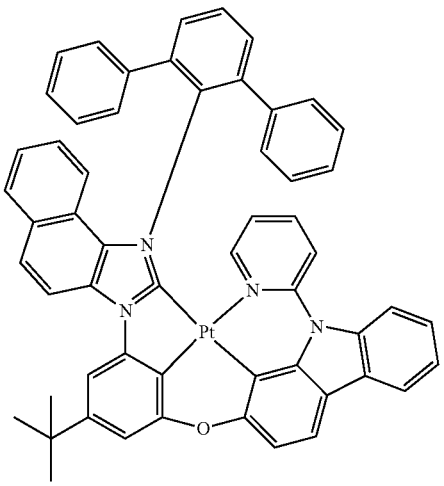
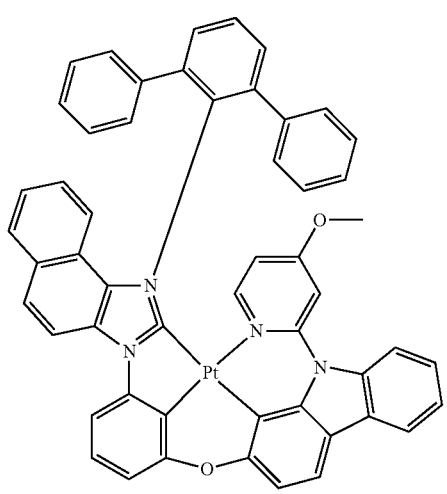
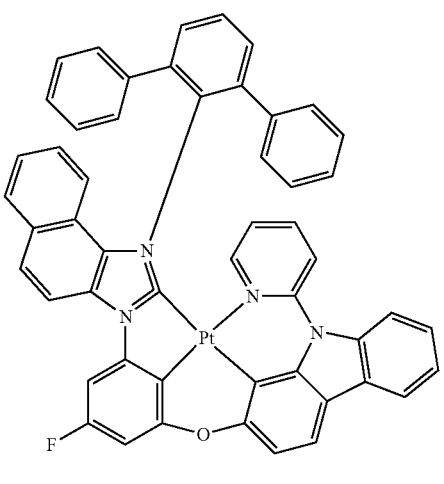

14
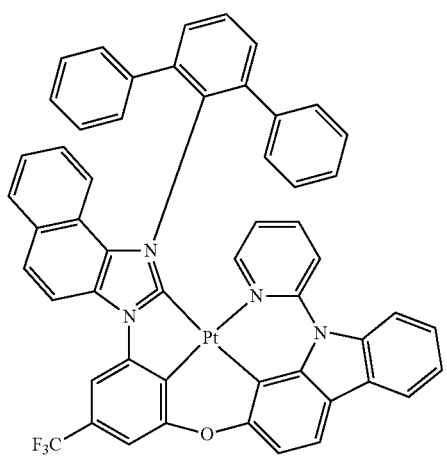
15
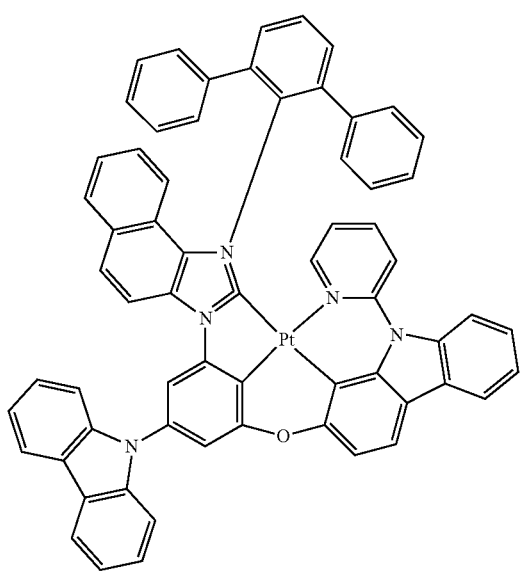
16
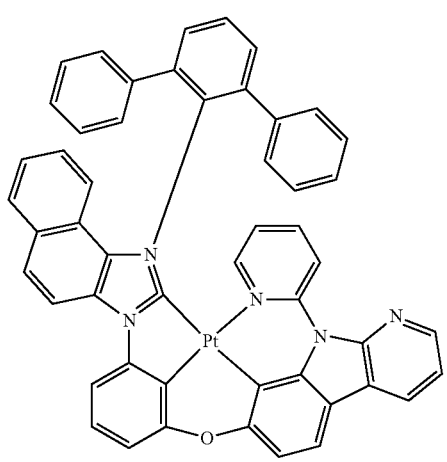
17
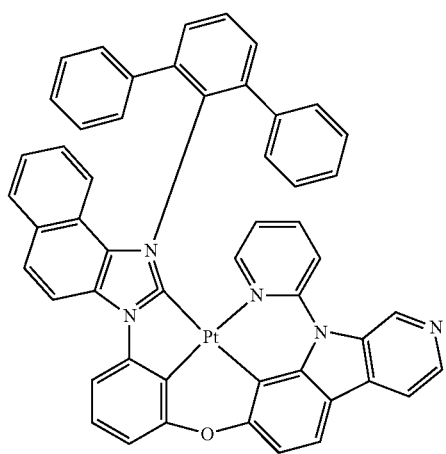
18
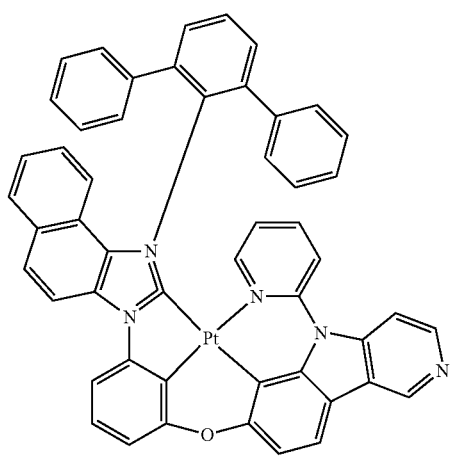
19
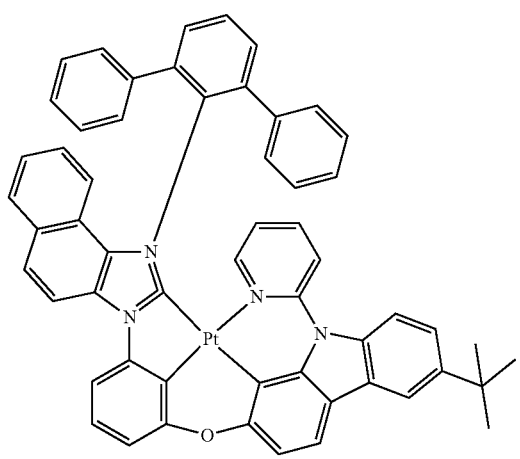

20
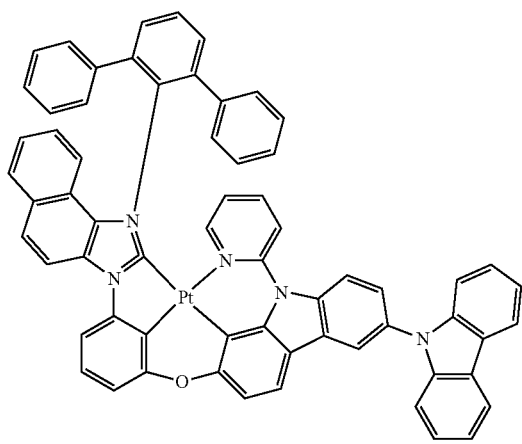
21
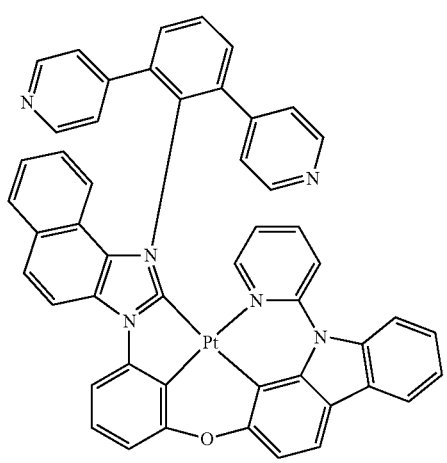
22
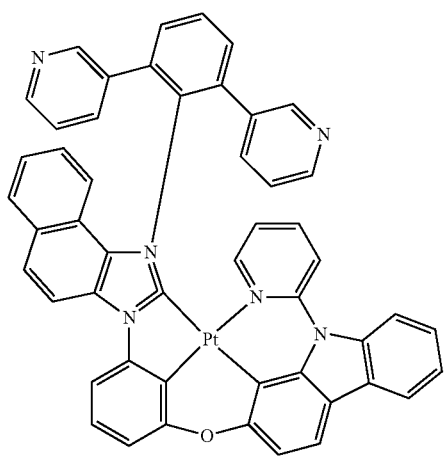
23
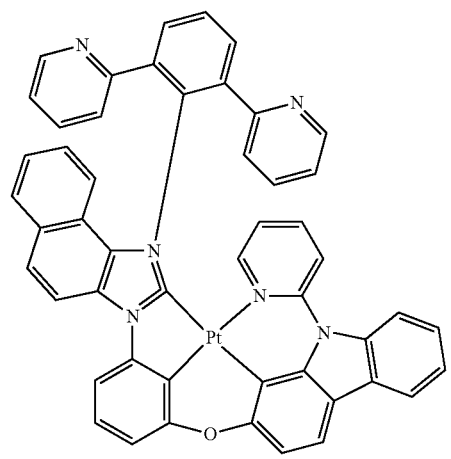
24
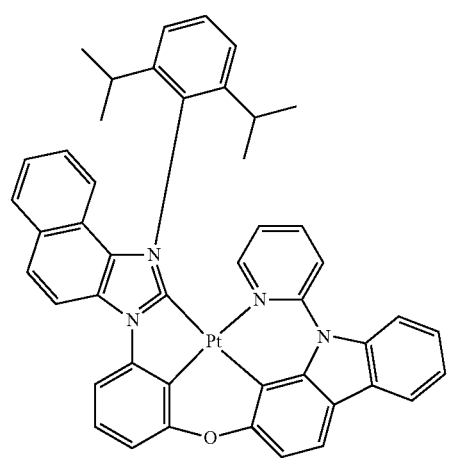
25
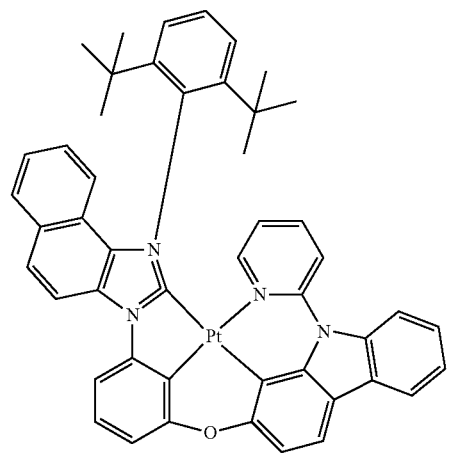

26
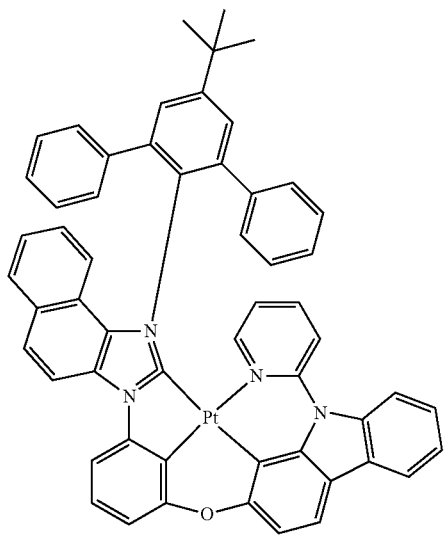
27
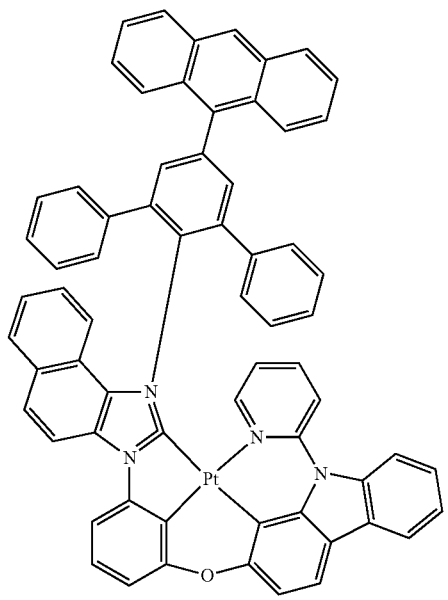
28
29
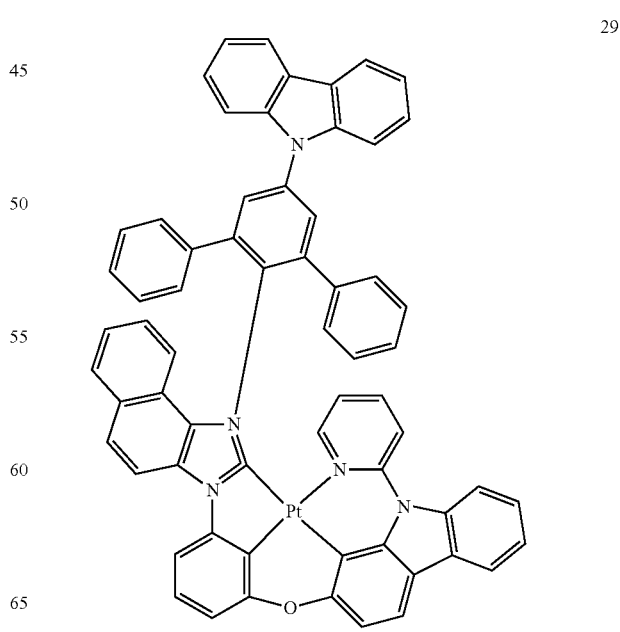

-continued
30
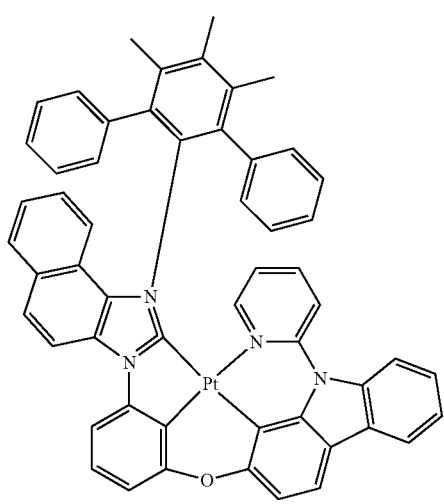
31
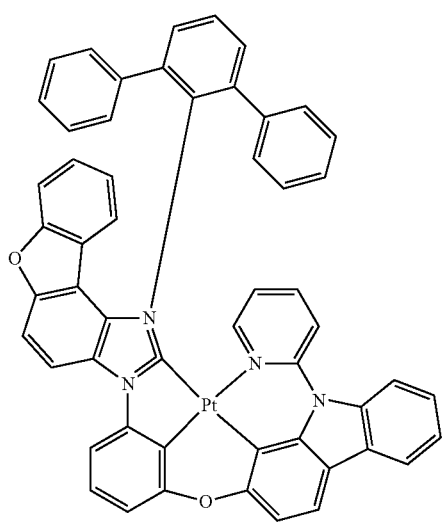
32
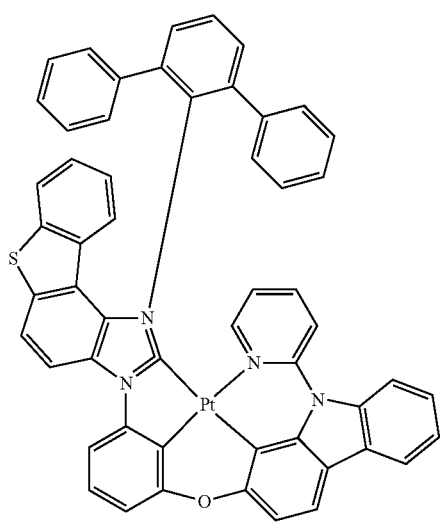
-continued
33
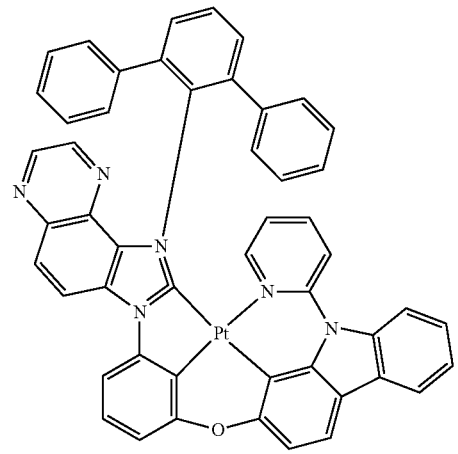
34
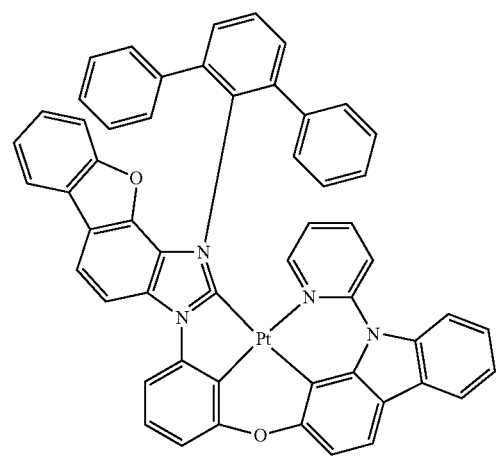
35
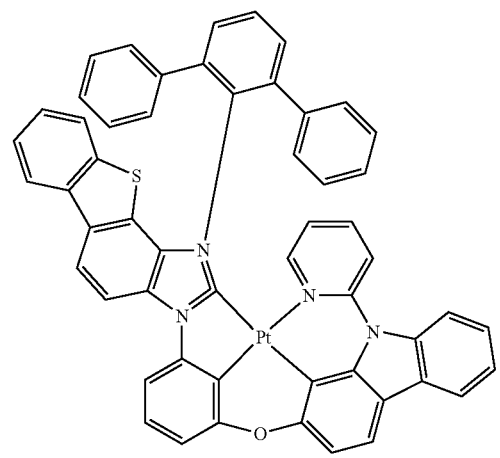

36
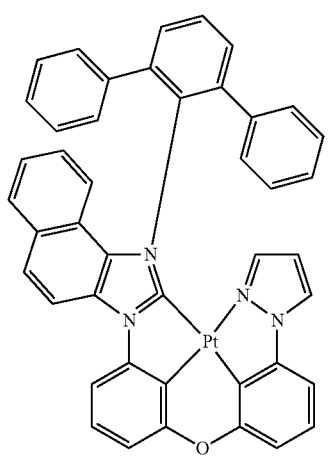
37
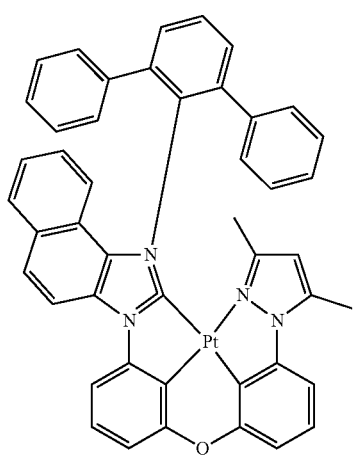
38
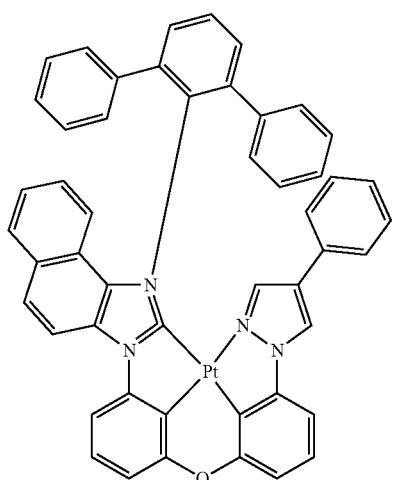
39
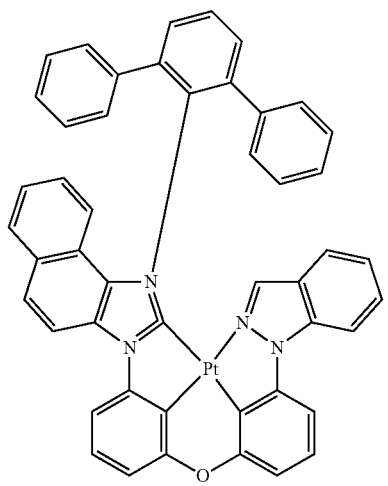
40
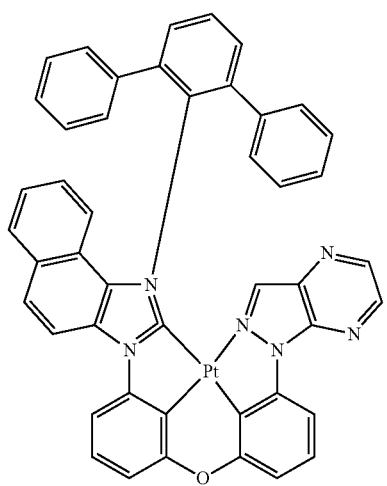
41
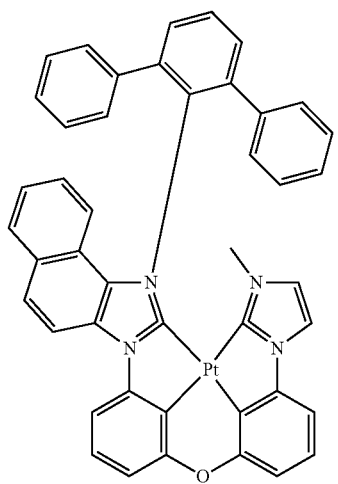

42
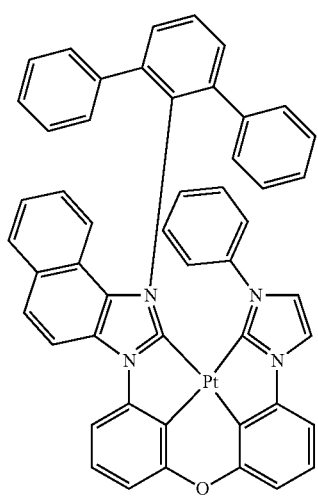
43
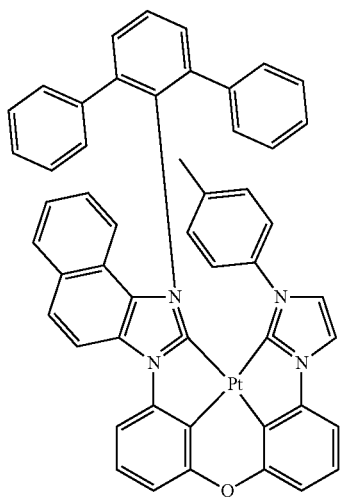
44
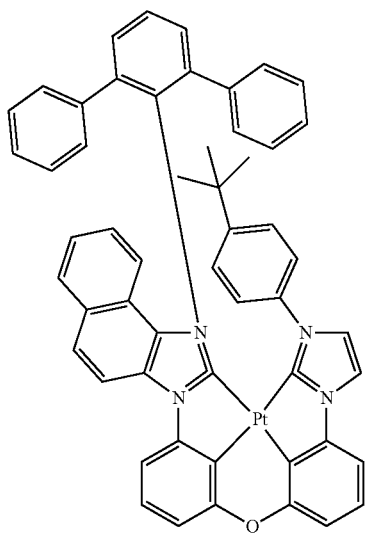
45
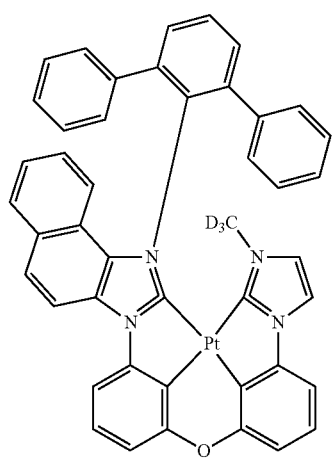
46
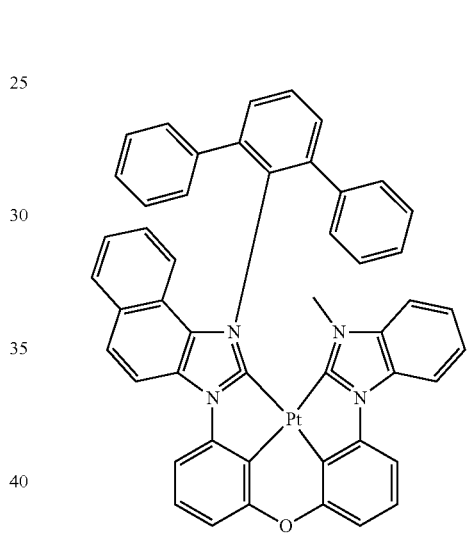
47
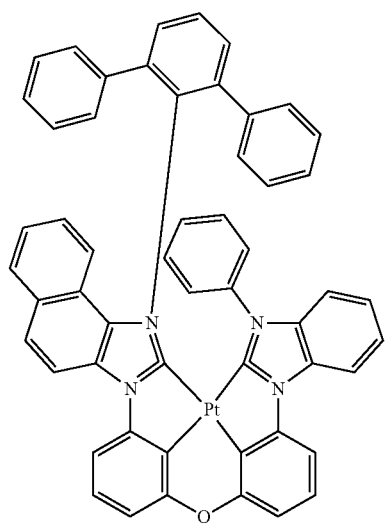

48
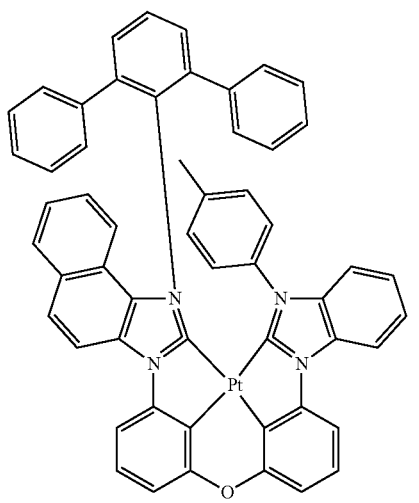
49
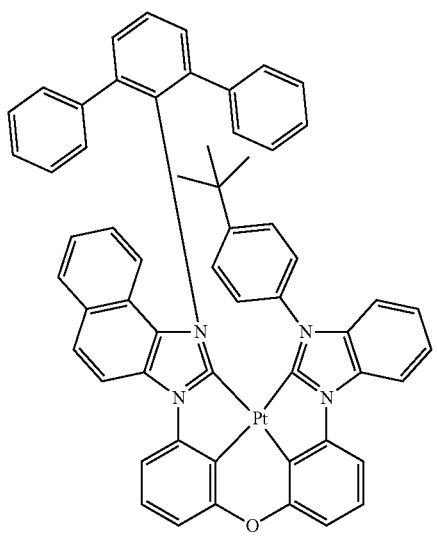
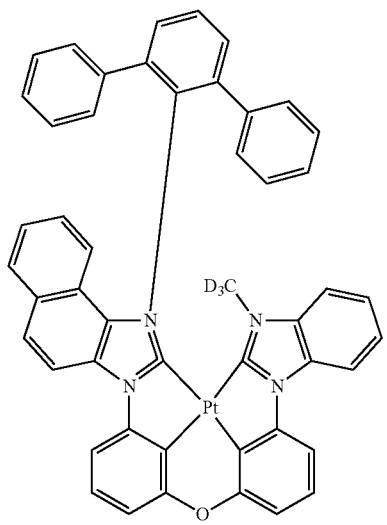
51
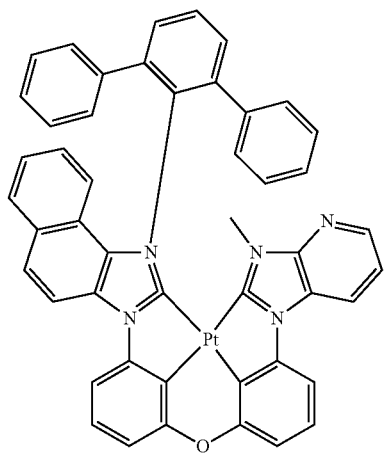
52
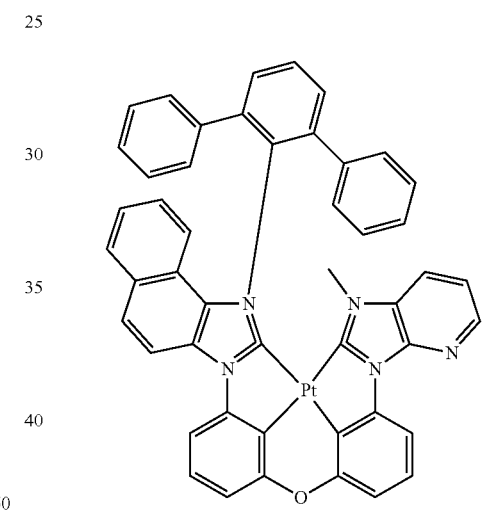
53
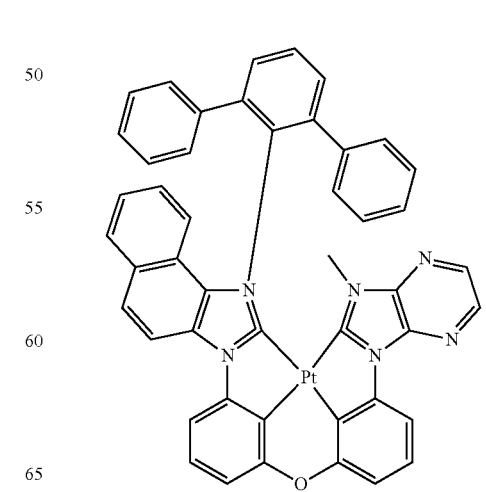

54
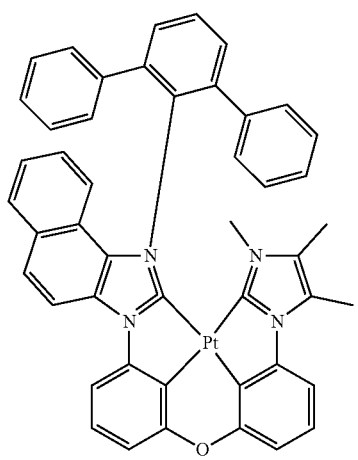
55
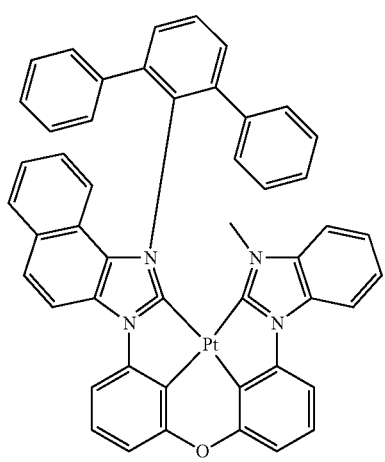
56
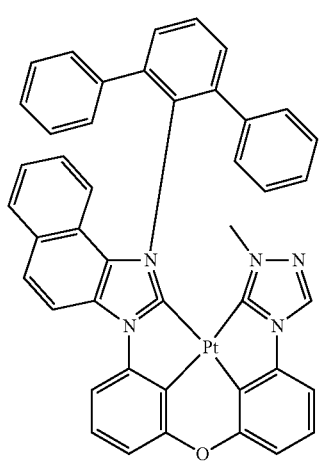
57
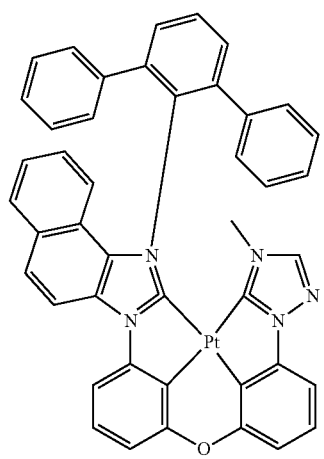
58
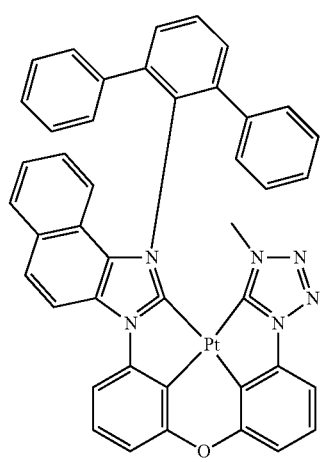
59
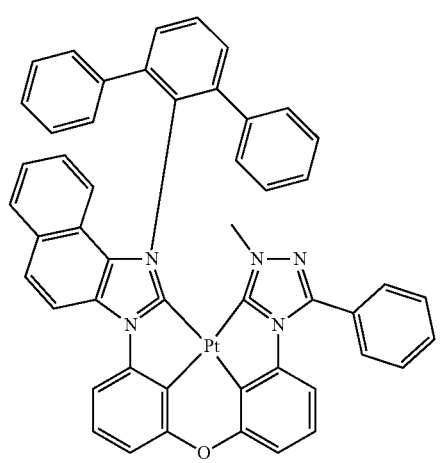

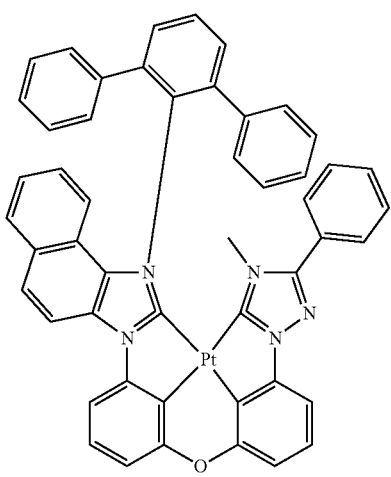
60
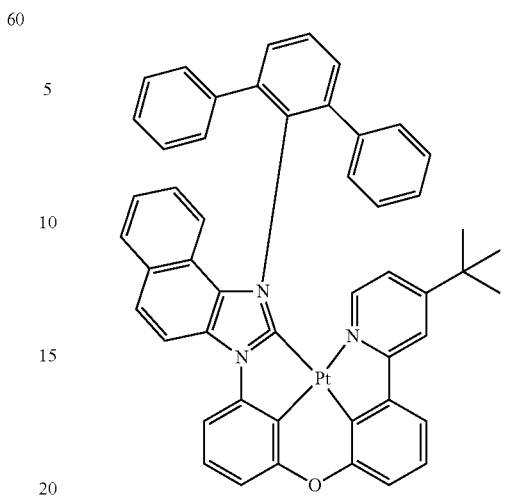
63
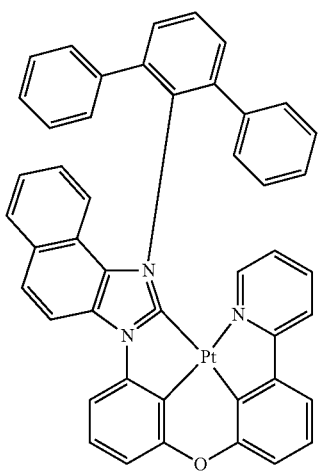
61
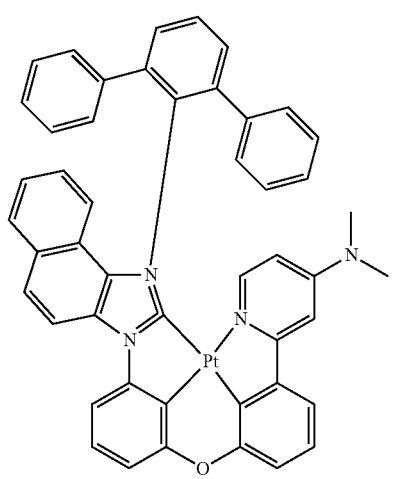
64
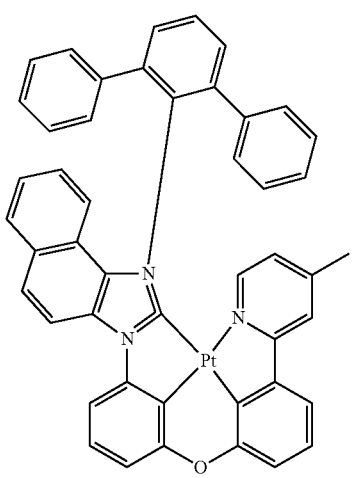
62
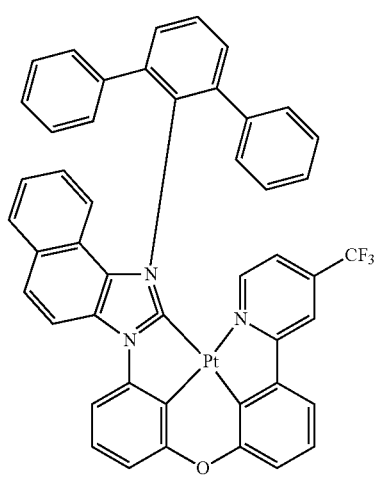
65

66
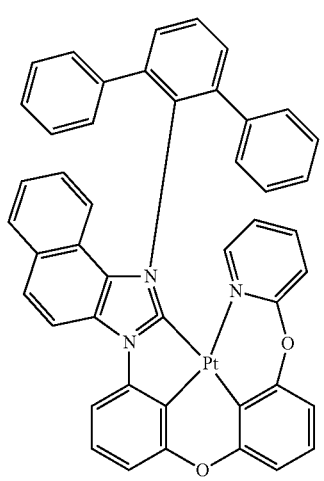
67
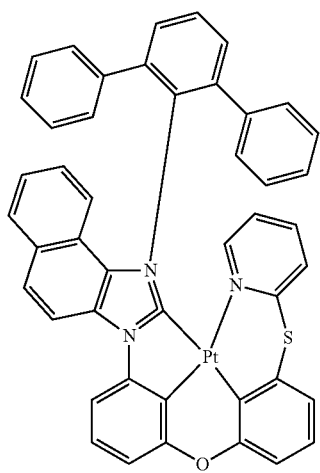
68
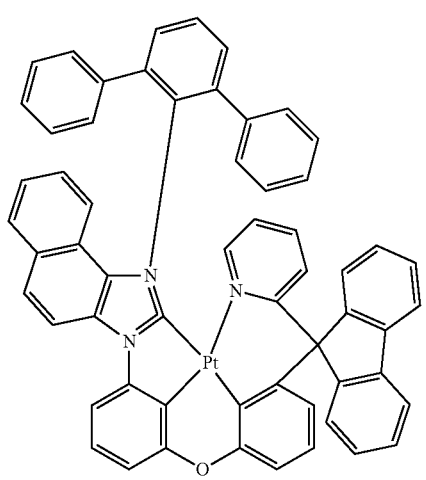
69
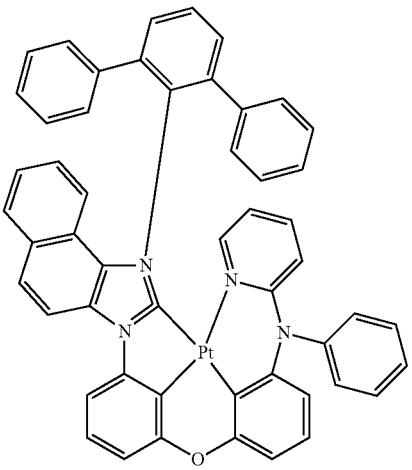
70
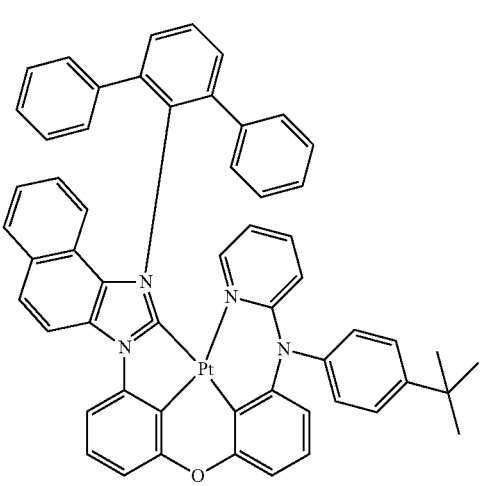
71
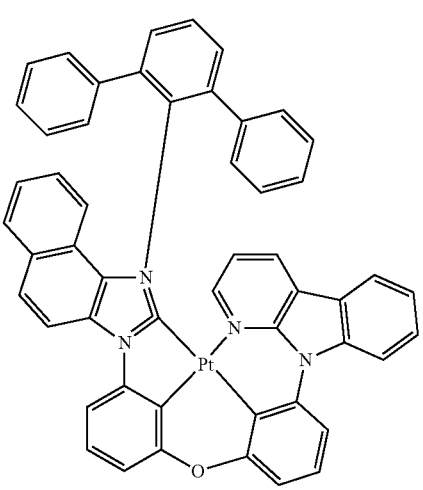

72
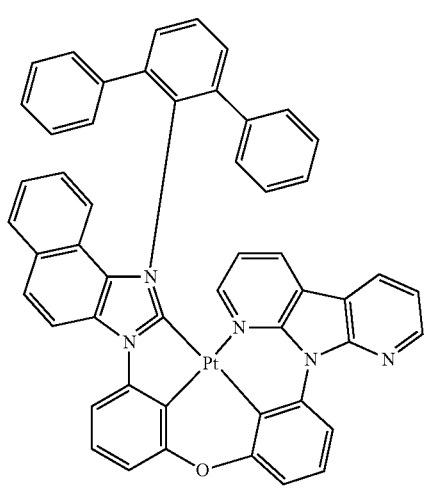
73
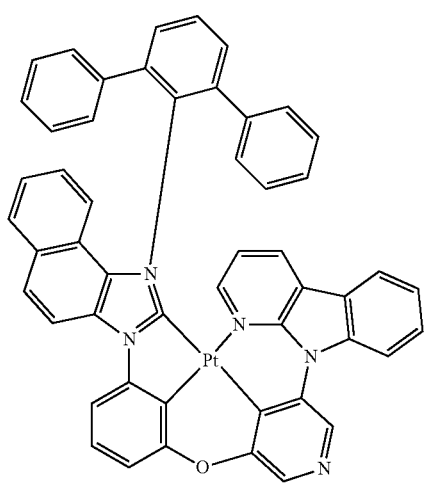
74
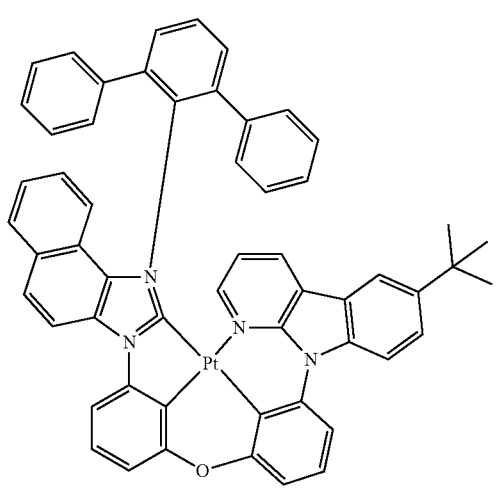
75
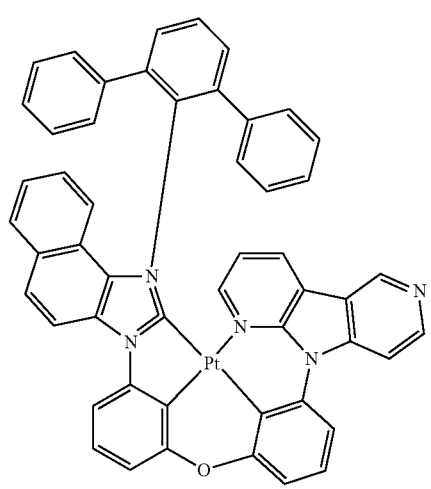
76
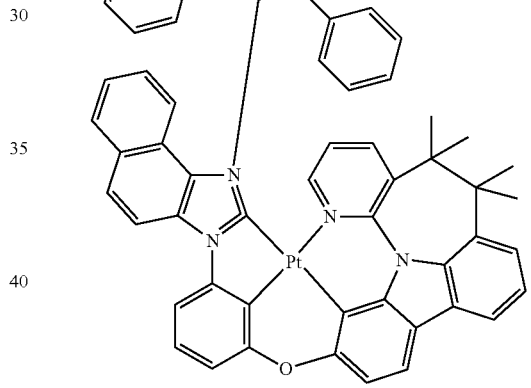
77
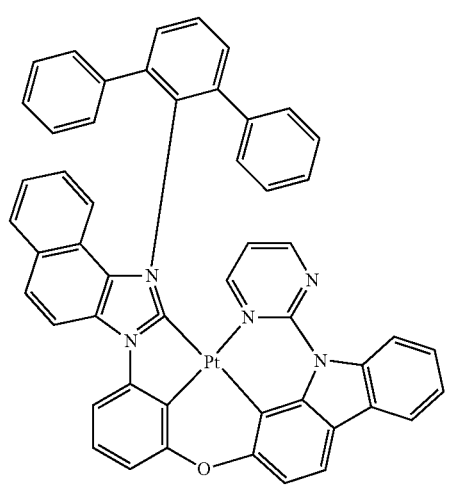

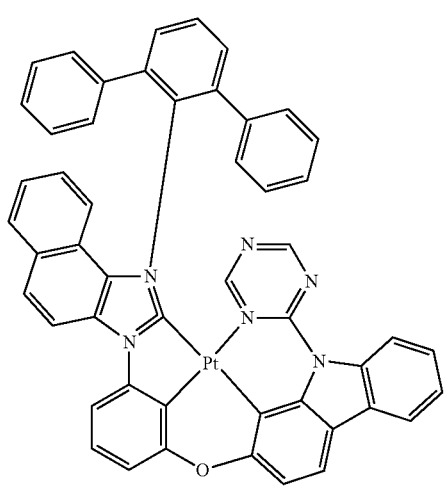
78
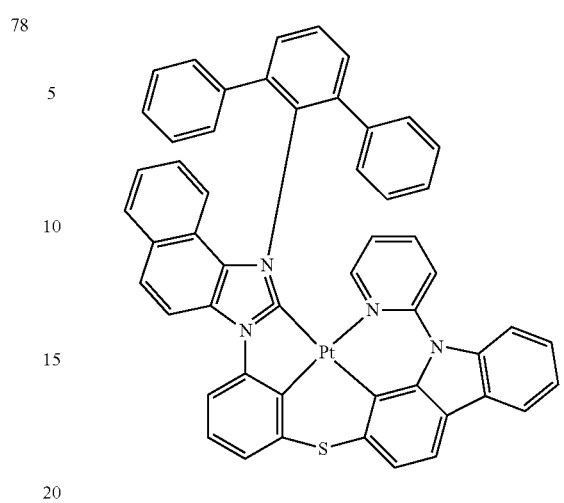
81
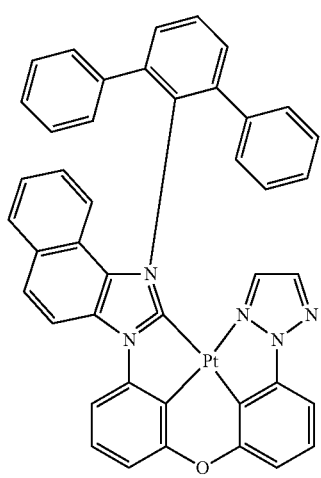
79
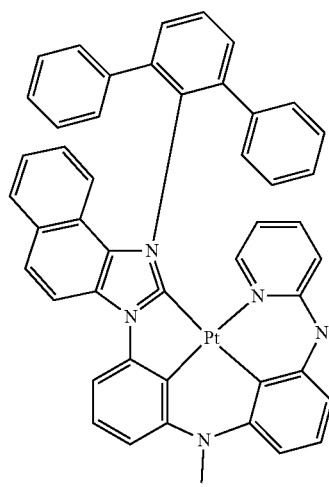
82
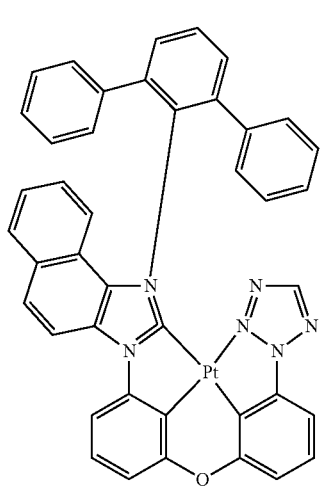
80
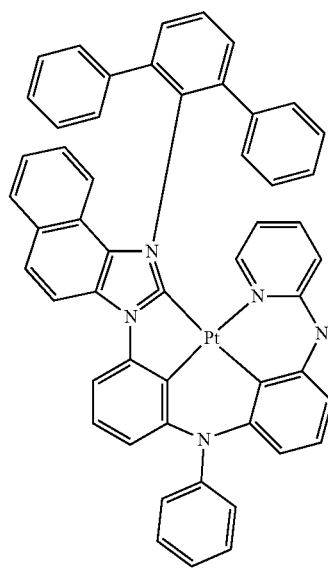
83

84
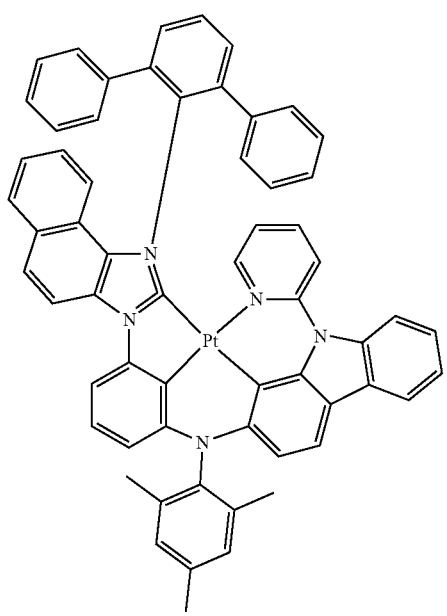
85
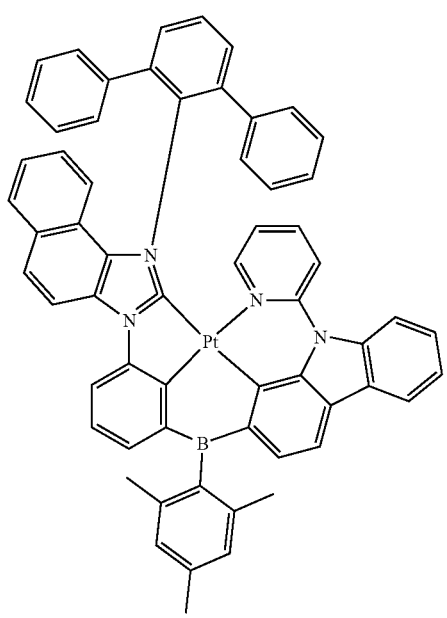
86
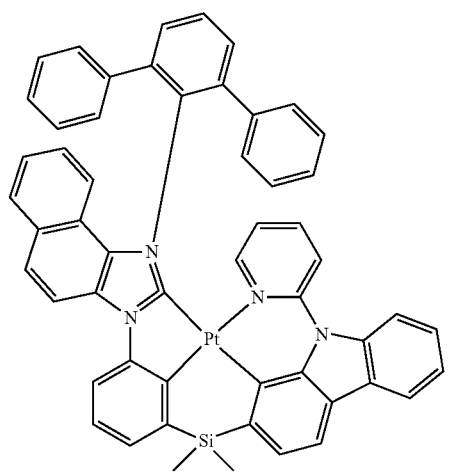
87
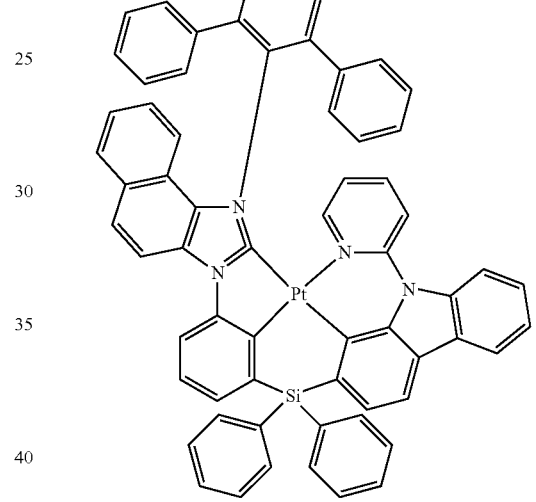
88
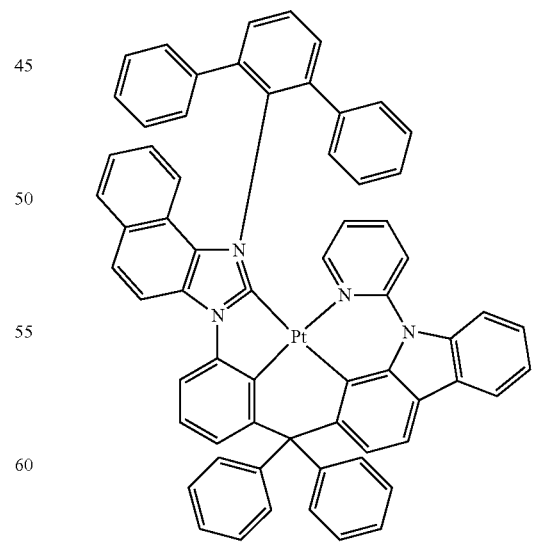

89
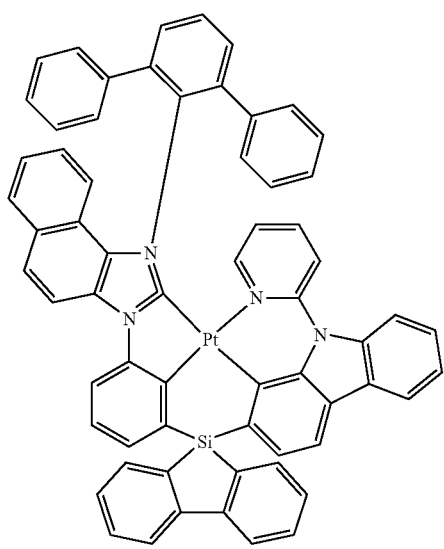
90
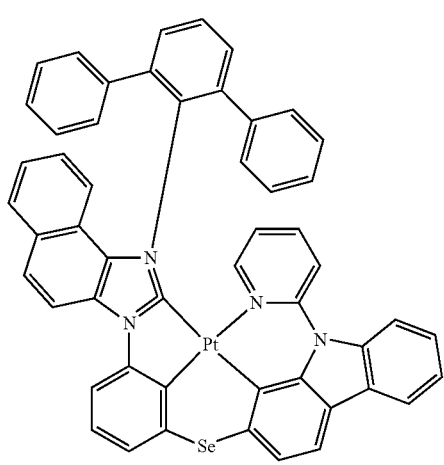
91
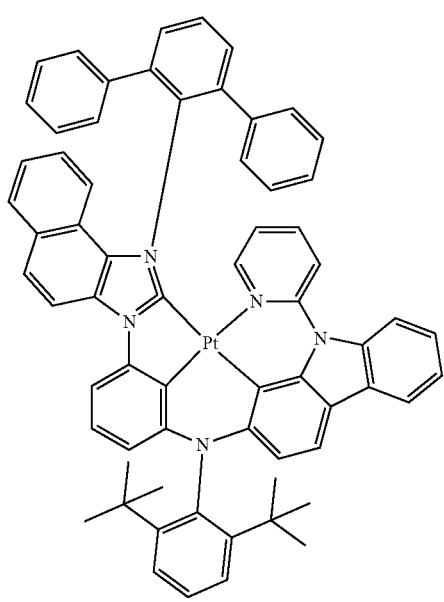
92
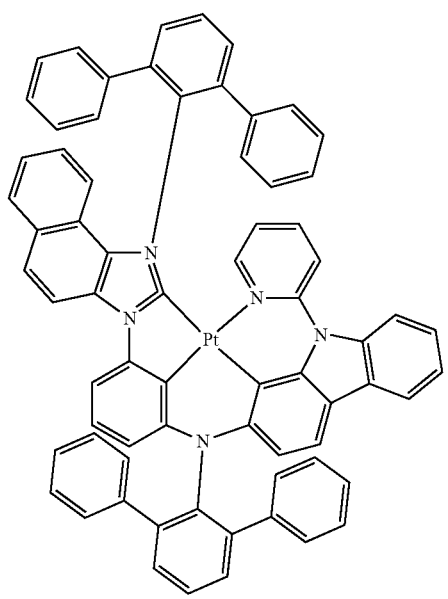
93
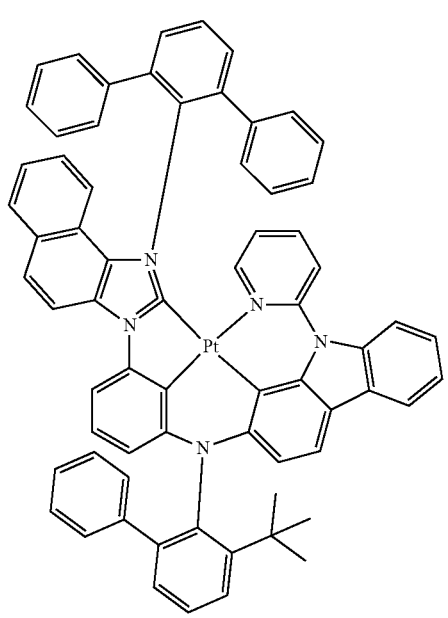

61
94
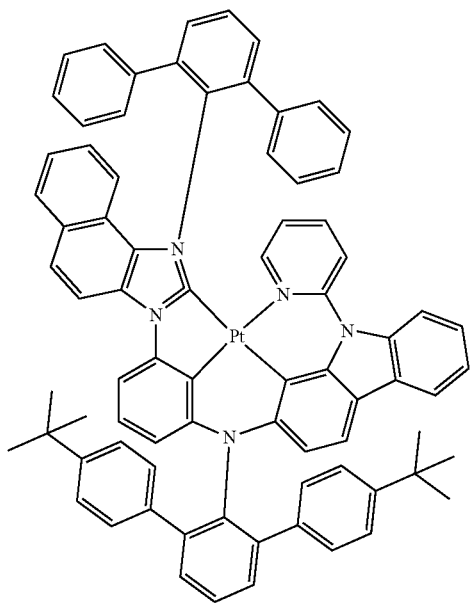
95
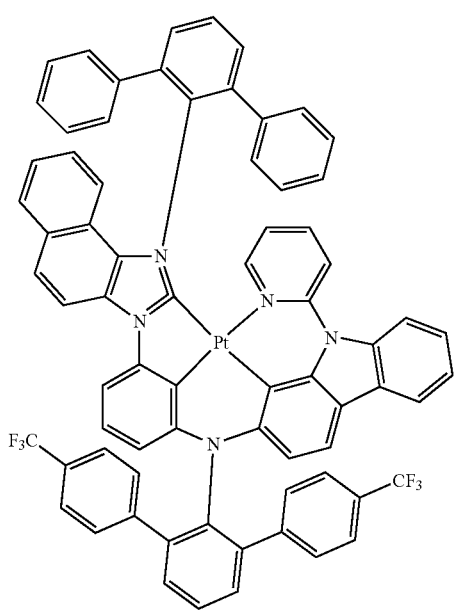
62
96
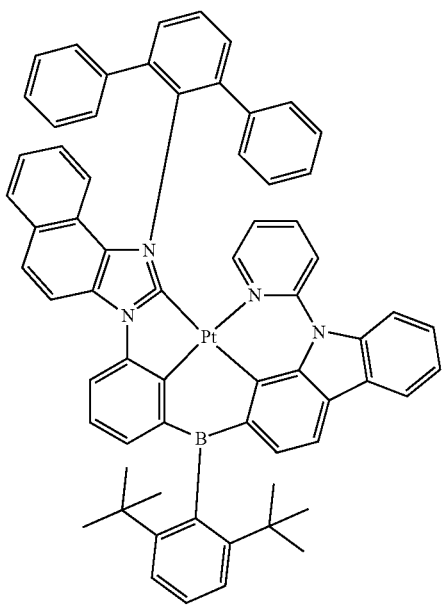
97
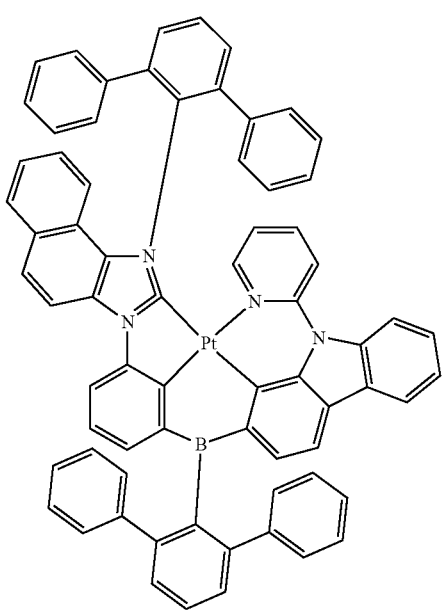

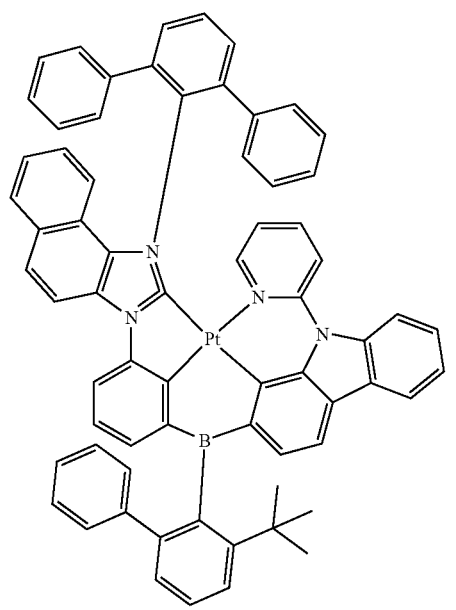
98
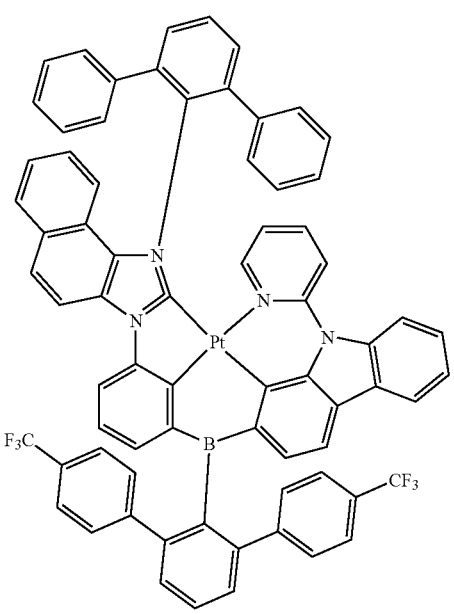
100
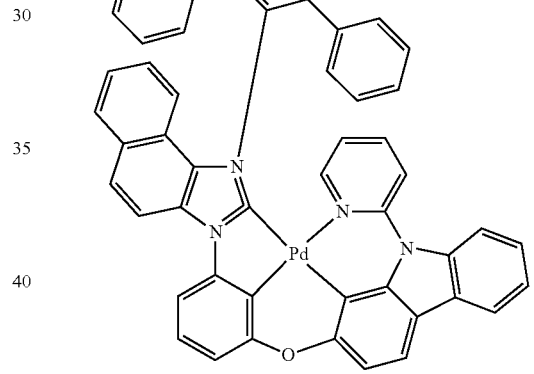
101
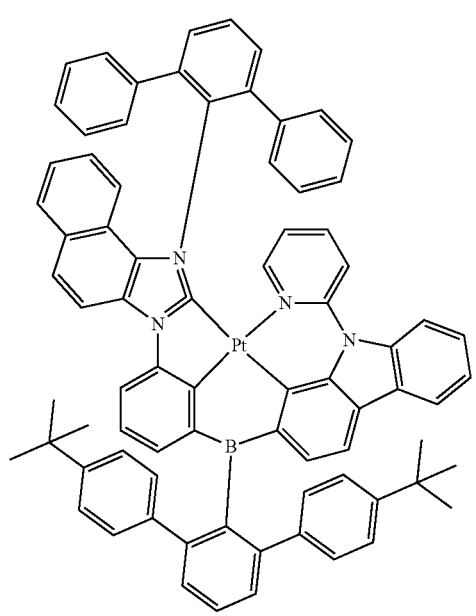
99
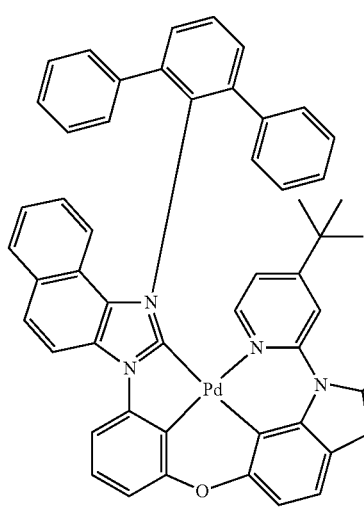
102

103
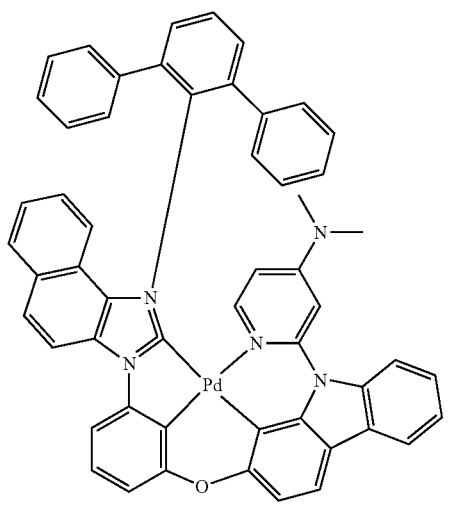
104
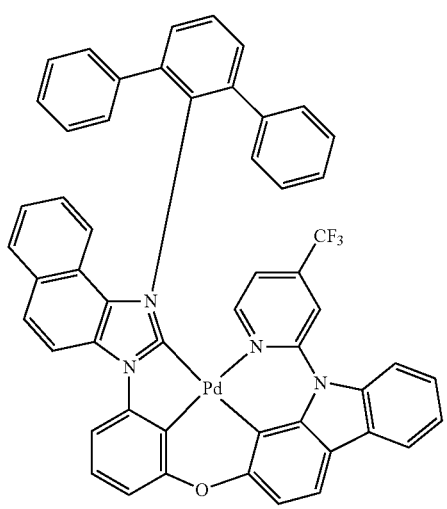
105
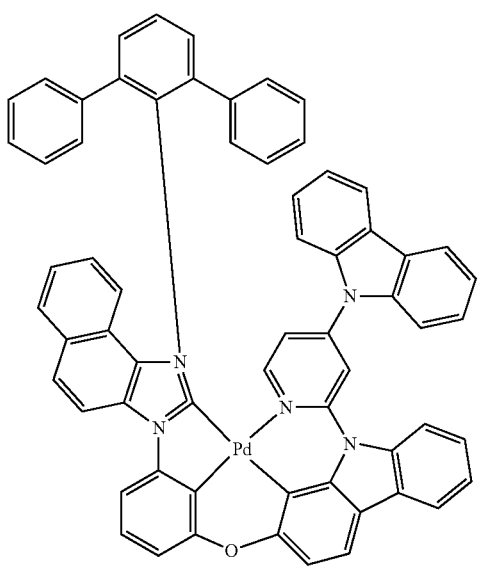
106
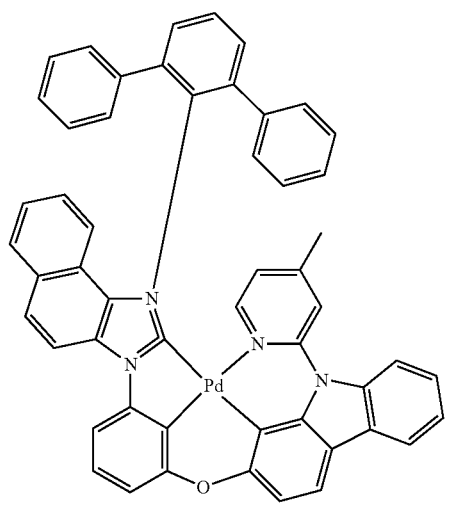
107
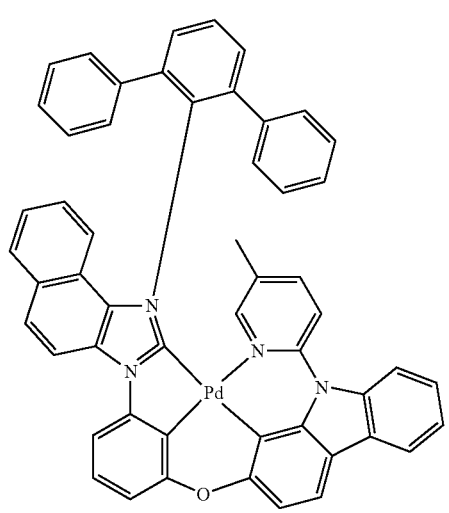
108

109
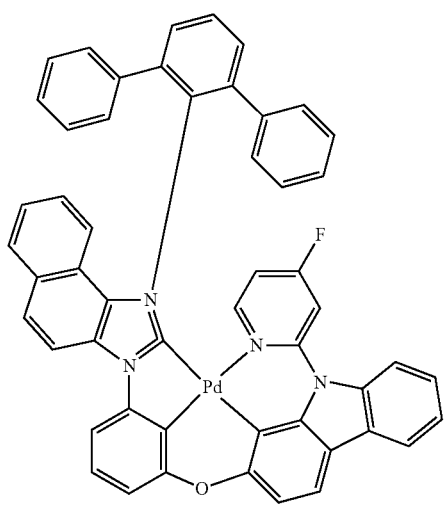
110
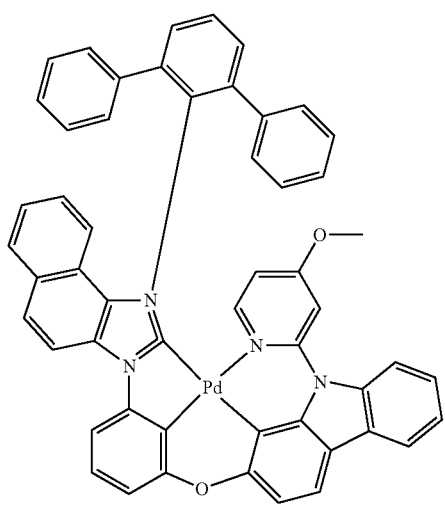
111
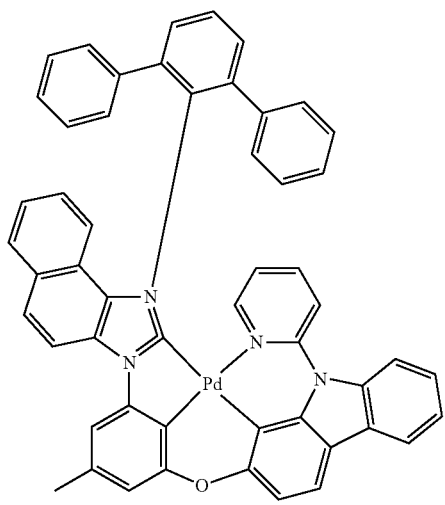
112
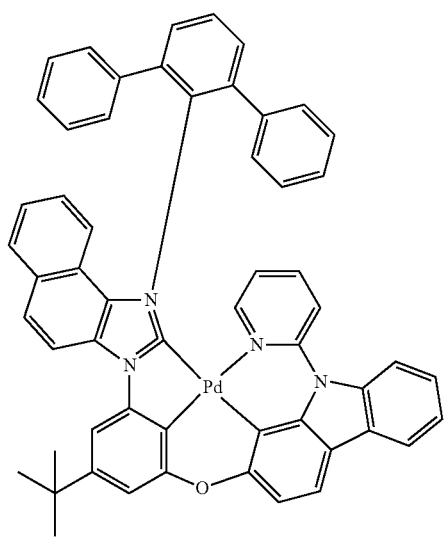
113
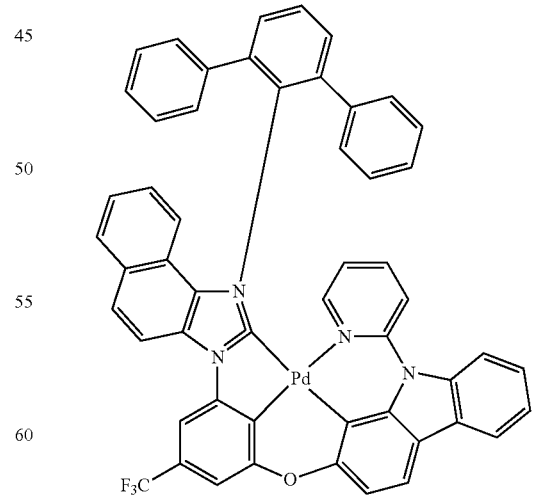
114

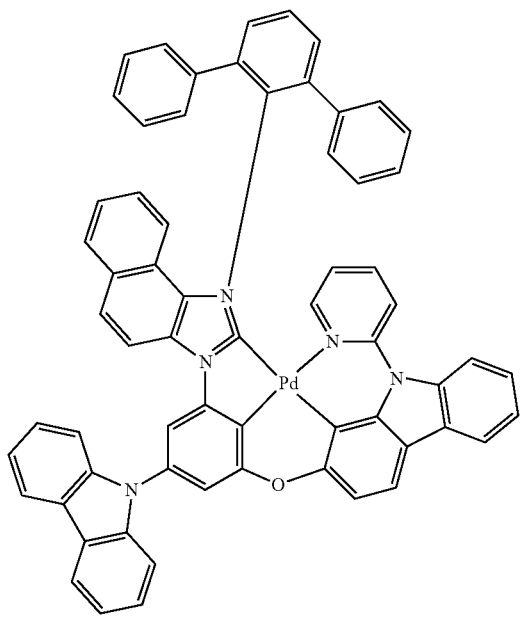
115
116
117
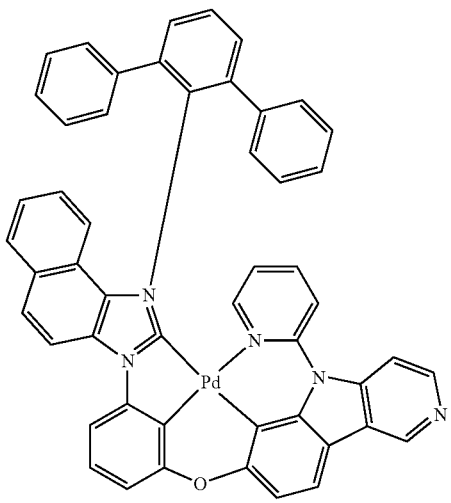
118
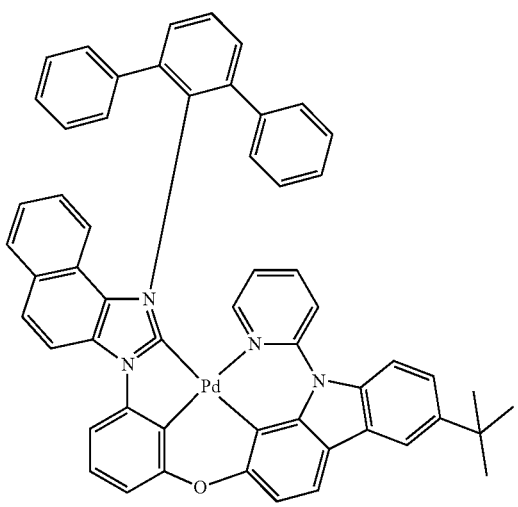
119
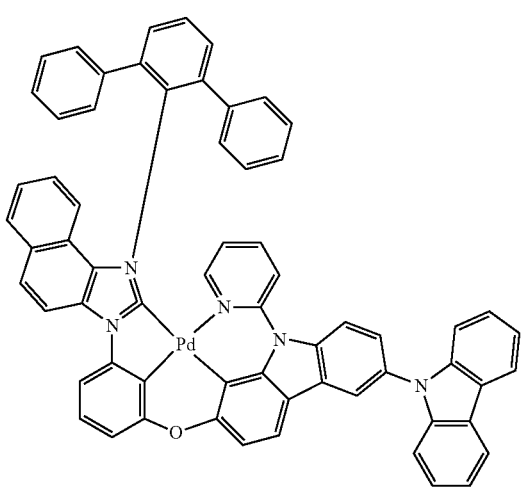
120

In the organometallic compound according to an embodiment, a

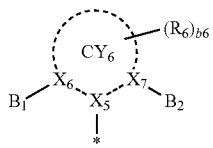

substituent capable of physically shielding a d-orbital of a central metal is introduced to a ligand, and thus, intermolecular interaction with a homogeneous or heterogeneous compound in an organic layer may be reduced. Accordingly, a light-emitting device including the organometallic compound has excellent luminescence efficiency, and color purity of the light-emitting device may be improved. Also, excellent processability may be secured during the deposition process.

In the organometallic compound, ring $CY_2$ and $B_1$ and $B_2$ in a group represented by

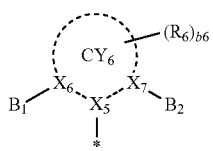

cause steric hindrance, and thus, a group represented by

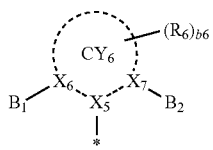

is not only located in a direction vertical to a ligand plane of the organometallic compound, but also may fix a substituent orientation by suppressing substituent rotation. Accordingly, when the organometallic compound is included in a light-emitting device, it is possible to suppress vibrational relaxation, which is one of causes of non-luminescence transition, and due to an effect in which conjugation between the ligand plane and a group represented by

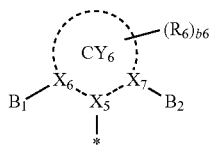

is broken, luminescence efficiency and color purity of the light-emitting device may be improved.

The ligand of the organometallic compound includes an imidazole moiety whose coordination atom is carbene carbon. Because a bond energy between carbene carbon and a central metal is greater than a bond energy between nitrogen and a central metal, and the carbene carbon acts as a strong electron donor to inhibit d-d* transition, the organometallic compound may be optically and/or electrically more stable and may suppress non-luminescence transition, and thus, a light-emitting device having long lifespan and high efficiency may be embodied.

The organometallic compound may have an effect in which the conjugation is broken or reduced due to a strengthened vertical structure between a carbene-containing core and a group represented by

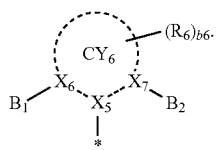

Accordingly, the emission wavelength is shortened, and thus when the organometallic compound is applied to a light-emitting device, deep-blue color may be emitted. Accordingly, color purity and color reproducibility of the light-emitting device may be improved.

Accordingly, an electronic device including the organometallic compound. for example, a light-emitting device, may have low driving voltage, high efficiency, long lifespan, and/or high color purity.

Synthesis methods of the organometallic compound represented by Formula 1 may be recognizable by one of ordinary skill in the art by referring to Synthesis Examples and/or Examples provided below.

At least one organometallic compound represented by Formula 1 may be used in a light-emitting device (for example, an organic light-emitting device).

Accordingly, provided is a light-emitting device that may include a first electrode; a second electrode facing the first electrode; and an interlayer disposed between the first electrode and the second electrode and including an emission layer, wherein the light-emitting device may include an organometallic compound represented by Formula 1.

In an embodiment, the first electrode of the light-emitting device may be an anode, and the second electrode of the light-emitting device may be a cathode. The interlayer may further include a hole transport region disposed between the first electrode and the emission layer, and an electron transport region disposed between the emission layer and the second electrode. The hole transport region may include a hole injection layer, a hole transport layer, an emission auxiliary layer, an electron blocking layer, or any combination thereof. The electron transport region may include a buffer layer, a hole blocking layer, an electron control layer, an electron transport layer, an electron injection layer, or any combination thereof.

In an embodiment, the organometallic compound may be included in the interlayer of the light-emitting device, for example, in the emission layer.

In an embodiment, the emission layer may include a host and a dopant, and the dopant may include the organometallic compound. For example, the organometallic compound may act as the dopant in the emission layer. An amount of the dopant in the emission layer may be in a range of about 0.01 parts by weight to about 49.99 parts by weight, based on 100 parts by weight of the emission layer.

The emission layer may emit red light, green light, blue light, and/or white light. In an embodiment, the emission layer may emit blue light. Blue light having a maximum emission wavelength in a range of about 410 nm to about 500 nm may be emitted from the emission layer. In an embodiment, regarding the bottom emission of blue light, $CIE_x$ color coordinates may be in a range of about 0.13 to about 0.14, and $CIE_y$ color coordinates may be in a range of about 0.06 to about 0.25, but embodiments of the disclosure are not limited thereto.

In an embodiment, the electron transport region may include a silicon-containing compound, a phosphine oxide-containing compound, or any combination thereof. In an embodiment, the buffer layer, the hole blocking layer, the electron control layer, the electron transport layer, the electron injection layer, or any combination thereof may include a silicon-containing compound, a phosphine oxide-containing compound, or any combination thereof.

In an embodiment, the light-emitting device may further include at least one of a first capping layer disposed outside the first electrode and a second capping layer disposed outside the second electrode. In an embodiment, at least one of the first capping layer and the second capping layer may include the organometallic compound represented by Formula 1.

In an embodiment, at least one of the first capping layer and the second capping layer may have a refractive index equal to or greater than about 1.6 at a wavelength of about 589 nm.

More details on the first capping layer and/or the second capping layer are the same as described in the specification.

The wording "(interlayer and/or capping layer) includes an organometallic compound" as used herein may be understood as "(interlayer and/or capping layer) may include one kind of organometallic compound represented by Formula 1 or at least two different kinds of organometallic compounds, each represented by Formula 1."

In an embodiment, the interlayer may include, as the organometallic compound, only Compound 1. In this regard, Compound 1 may exist in the emission layer of the light-emitting device. In embodiments, the interlayer may include, as the organometallic compound, Compound 1 and Compound 2. In this regard, Compound 1 and Compound 2 may exist in an identical layer (for example, Compound 1 and Compound 2 may all exist in an emission layer), or different layers (for example, Compound 1 may exist in an emission layer and Compound 2 may exist in an electron transport region).

The term "interlayer" as used herein refers to a single layer and/or all layers located between the first electrode and the second electrode of the light-emitting device.

According to another aspect, provided is a light-emitting device that may include a first pixel electrode, a second pixel electrode, and a third pixel electrode, respectively disposed in a first emission area, a second emission area, and a third emission area; an opposite electrode facing the first pixel electrode, the second pixel electrode, and the third pixel electrode; and an interlayer disposed between the opposite electrode and the first pixel electrode, the second pixel electrode, and the third pixel electrode and including an emission layer. The emission layer may include a first emission layer disposed to correspond to the first emission area and emitting first-color light, a second emission layer arranged to correspond to the second emission area and emitting second-color light, and a third emission layer arranged to correspond to the third emission area and emitting third-color light. A maximum emission wavelength of the first-color light, a maximum emission wavelength of the second-color light, and a maximum emission wavelength of the third-color light may be different from each other. A maximum emission wavelength of the first-color light and a maximum emission wavelength of the second-color light may each be greater than a maximum emission wavelength of the third-color light. The third emission layer may include the organometallic compound.

The first pixel electrode, the second pixel electrode, and the third pixel electrode may be the same as described in connection with the first electrode in the specification.

The opposite electrode may be the same as described in connection with the second electrode in the specification.

According to another aspect, an electronic apparatus that may include the light-emitting device is provided. The electronic apparatus may further include a thin-film transistor. In embodiments, the electronic apparatus may further include a thin-film transistor including a source electrode and a drain electrode, and the first electrode of the light-emitting device may be electrically connected to the source electrode or the drain electrode. In an embodiment, the electronic apparatus may further include a color filter, a color conversion layer, a touch screen layer, a polarizing layer, or any combination thereof. More details on the electronic apparatus are the same as described in the specification.

[Description of FIG. 1]

FIG. 1 is a schematic cross-sectional view of a light-emitting device 10 according to an embodiment. The light-emitting device 10 includes a first electrode 110, an interlayer 130, and a second electrode 150.

Hereinafter, a structure of the light-emitting device 10 according to an embodiment and a method of manufacturing the light-emitting device 10 will be described in connection with FIG. 1.

[First Electrode 110]

In FIG. 1, a substrate may be additionally located under the first electrode 110 or above the second electrode 150. The substrate may be a glass substrate or a plastic substrate. The substrate may be a flexible substrate. In embodiments, the substrate may include plastics with excellent heat resistance and durability, such as polyimide, polyethylene terephthalate (PET), polycarbonate, polyethylene naphthalate, polyarylate (PAR), polyetherimide, or any combination thereof.

The first electrode 110 may be formed by, for example, depositing or sputtering a material for forming the first electrode 110 on the substrate. When the first electrode 110 is an anode, a high work function material that can easily inject holes may be used as a material for forming the first electrode 110.

The first electrode 110 may be a reflective electrode, a semi-transmissive electrode, or a transmissive electrode. When the first electrode 110 is a transmissive electrode, a material for forming the first electrode 110 may include indium tin oxide (ITO), indium zinc oxide (IZO), tin oxide ($SnO_2$), zinc oxide (ZnO), or any combination thereof. In embodiments, when the first electrode 110 is a semi-transmissive electrode or a reflective electrode, magnesium (Mg), silver (Ag), aluminum (Al), aluminum-lithium (Al—Li), calcium (Ca), magnesium-indium (Mg—In), magnesium-silver (Mg—Ag), or any combination thereof may be used as a material for forming the first electrode 110.

The first electrode 110 may have a single-layered structure consisting of a single layer or a multi-layered structure including multiple layers. In an embodiment, the first electrode 110 may have a three-layered structure of ITO/Ag/ITO.

[Interlayer 130]

The interlayer 130 is located on the first electrode 110. The interlayer 130 may include an emission layer.

The interlayer 130 may further include a hole transport region between the first electrode 110 and the emission layer and an electron transport region between the emission layer and the second electrode 150.

The interlayer 130 may further include metal-containing compounds such as organometallic compounds, inorganic materials such as quantum dots, and the like, in addition to various organic materials.

In embodiments, the interlayer 130 may include, i) two or more emitting units sequentially stacked between the first electrode 110 and the second electrode 150 and ii) a charge generation layer between the two emitting units. When the interlayer 130 includes the emitting unit and the charge generation layer as described above, the light-emitting device 10 may be a tandem light-emitting device.

[Hole transport region in interlayer 130]

The hole transport region may have i) a single-layered structure consisting of a single layer consisting of a single material, ii) a single-layered structure consisting of a single layer including different materials, or iii) a multi-layered structure including multiple layers including different materials.

The hole transport region may include a hole injection layer, a hole transport layer, an emission auxiliary layer, an electron blocking layer, or any combination thereof.

In an embodiment, the hole transport region may have a multi-layered structure including a hole injection layer/hole transport layer structure, a hole injection layer/hole transport layer/emission auxiliary layer structure, a hole injection layer/emission auxiliary layer structure, a hole transport layer/emission auxiliary layer structure, or a hole injection layer/hole transport layer/electron blocking layer structure, wherein, in each structure, layers are stacked sequentially from the first electrode 110.

The hole transport region may include a compound represented by Formula 201, a compound represented by Formula 202, or any combination thereof:

[Formula 201]

$$R_{201}\text{—}(L_{201})_{xa1}\text{—}N\begin{array}{c}(L_{202})_{xa2}\text{—}R_{202}\\ \\ (L_{203})_{xa3}\text{—}R_{203}\end{array}$$

[Formula 202]

$$R_{201}\text{—}(L_{201})_{xa1}\diagdown\phantom{xxx}\left[\begin{array}{c}(L_{203})_{xa3}\text{—}R_{203}\\ \diagup\\ N\text{—}(L_{205})_{xa5}\text{—}N\\ \diagup\phantom{xxxxxx}\diagdown\\ R_{202}\text{—}(L_{202})_{xa2}\phantom{xxxxx}(L_{204})_{xa4}\text{—}R_{204}\end{array}\right]_{na1}$$

In Formulae 201 and 202, $L_{201}$ to $L_{204}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, $L_{205}$ may be *—O—*', *—S—*', *—N($Q_{201}$)-*', a $C_1$-$C_{20}$ alkylene group unsubstituted or substituted with at least one $R_{10a}$, a $C_2$-$C_{20}$ alkenylene group unsubstituted or substituted with at least one $R_{10a}$, a $C_3$-$C_{60}$ carbocyclic group unsubstituted or substituted with at least one $R_{10a}$, or a $C_1$-$C_{60}$ heterocyclic group unsubstituted or substituted with at least one $R_{10a}$, xa1 to xa4 may each independently be an integer from 0 to 5, xa5 may be an integer from 1 to 10, $R_{201}$ to $R_{204}$ and $Q_{201}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, $R_{201}$ and $R_{202}$ may optionally be linked to each other via a single bond, a $C_1$-$C_5$ alkylene group unsubstituted or substituted with at least one $R_{10a}$, or a $C_2$-$C_5$ alkenylene group unsubstituted or substituted with at least one $R_{10a}$, to form a $C_8$-$C_{60}$ polycyclic group unsubstituted or substituted with at least one $R_{10a}$ (for example, a carbazole group) (for example, see Compound HT16 or the like), $R_{203}$ and $R_{204}$ may optionally be linked to each other via a single bond, a $C_1$-$C_5$ alkylene group unsubstituted or substituted with at least one $R_{10a}$, or a $C_2$-$C_5$ alkenylene group unsubstituted or substituted with at least one $R_{10a}$, to form a $C_8$-$C_{60}$ polycyclic group unsubstituted or substituted with at least one $R_{10a}$, and na1 may be an integer from 1 to 4.

In an embodiment, Formulae 201 and 202 may each include at least one of the groups represented by Formulae CY201 to CY217:

CY201

CY202

CY203

CY204

CY205

CY206

-continued

CY207 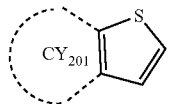

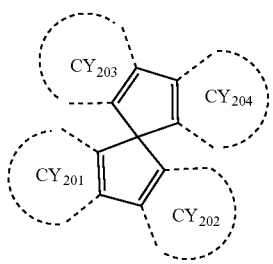

CY208 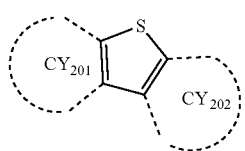

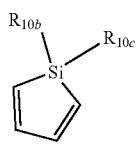

CY209

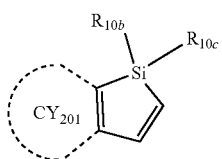

CY210

Regarding Formulae CY201 to CY217, $R_{10b}$ and $R_{10c}$ are the same as described in connection with $R_{10a}$, ring $CY_{201}$ to ring $CY_{204}$ may each independently be a $C_3$-$C_{20}$ carbocyclic group or a $C_1$-$C_{20}$ heterocyclic group, and at least one hydrogen in Formula CY201 to CY217 may be unsubstituted or substituted with at least one $R_{10a}$ described herein.

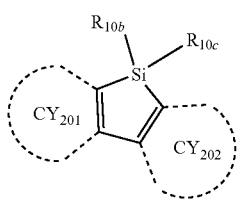

In an embodiment, ring $CY_{201}$ to ring $CY_{204}$ in Formulae CY201 to CY217 may each independently be a benzene group, a naphthalene group, a phenanthrene group, or an anthracene group.

CY211

In an embodiment, Formulae 201 and 202 may each include at least one of the groups represented by Formulae CY201 to CY203.

In an embodiment, Formula 201 may include at least one of the groups represented by Formulae CY201 to CY203 and at least one of the groups represented by Formulae CY204 to CY217.

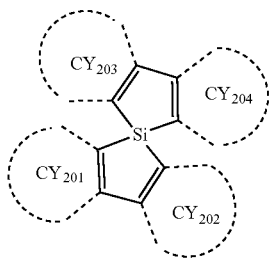

In embodiments, in Formula 201, xa1 is 1, $R_{201}$ is a group represented by one of Formulae CY201 to CY203, xa2 is 0, and $R_{202}$ is a group represented by one of Formulae CY204 to CY207.

CY212

In embodiments, each of Formulae 201 and 202 may not include groups represented by Formulae CY201 to CY203.

CY213

In embodiments, each of Formulae 201 and 202 may not include groups represented by Formulae CY201 to CY203 and may include at least one of the groups represented by Formulae CY204 to CY217.

CY214

In an embodiment, each of Formulae 201 and 202 may not include groups represented by Formulae CY201 to CY217.

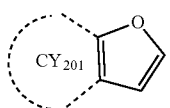

In an embodiment, the hole transport region may include one of Compounds HT1 to HT46, m-MTDATA, TDATA, 2-TNATA, NPB(NPD), β-NPB, TPD, Spiro-TPD, Spiro-NPB, methylated-NPB, TAPC, HMTPD, 4,4′,4″-tris(N-carbazolyl)triphenylamine (TCTA), polyaniline/dodecylbenzenesulfonic acid (PANI/DBSA), poly(3,4-ethylenedioxythiophene)/poly(4-styrenesulfonate) (PEDOT/PSS), polyaniline/camphor sulfonic acid (PANI/CSA), polyaniline/poly(4-styrenesulfonate) (PANI/PSS), or any combination thereof:

CY215

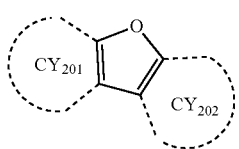

79 80
HT1
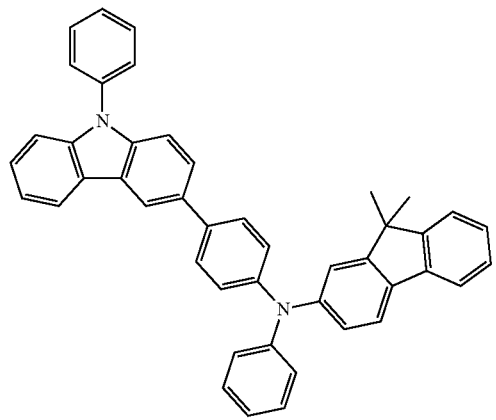
HT2
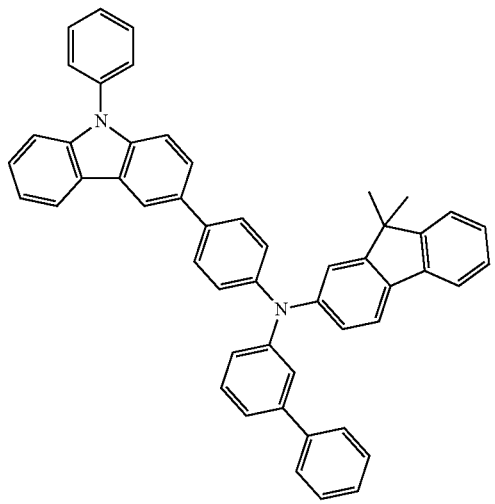
HT3
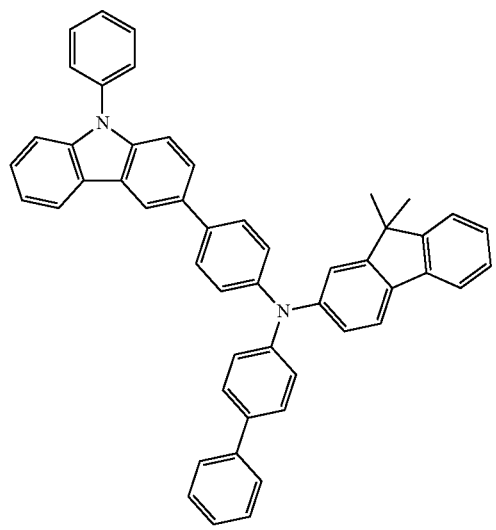
HT4
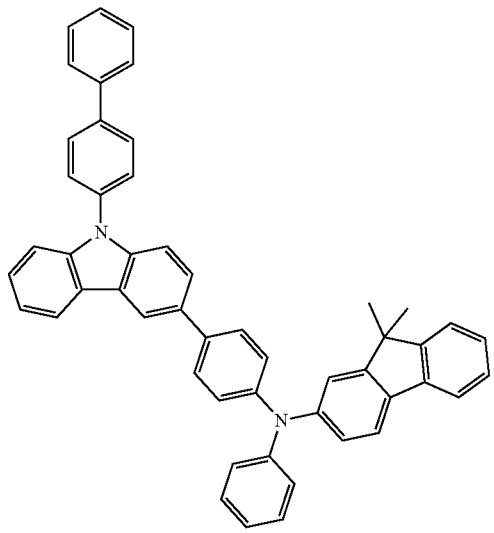
HT5
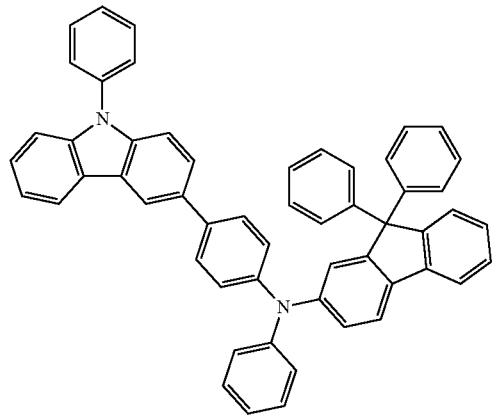
HT6
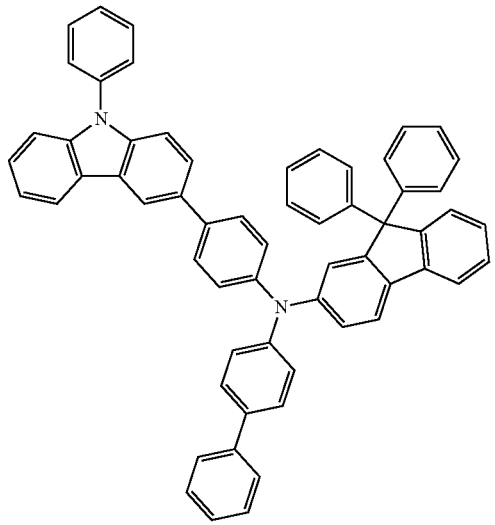

-continued
HT7
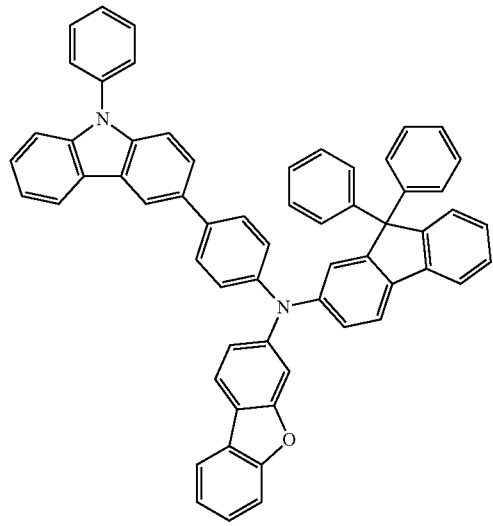
HT8
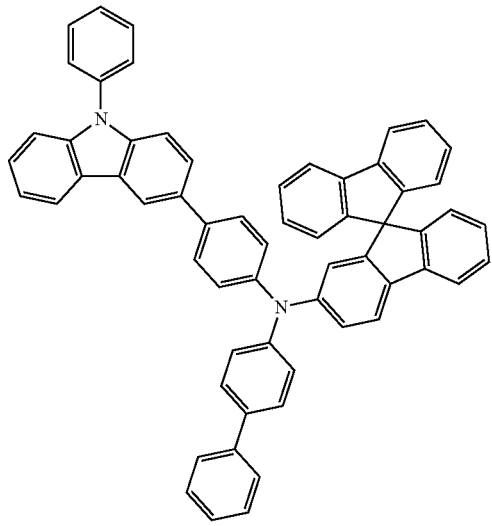
HT9
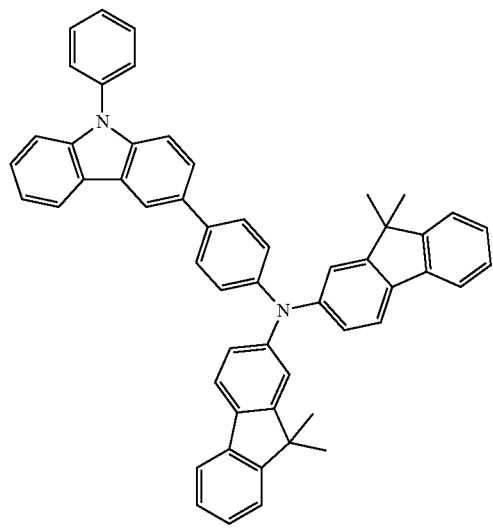
HT10
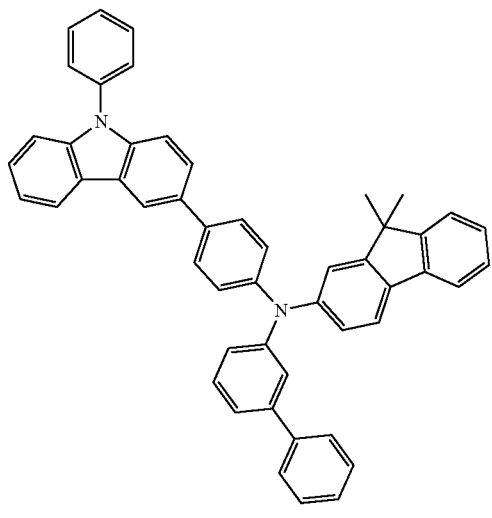
HT11
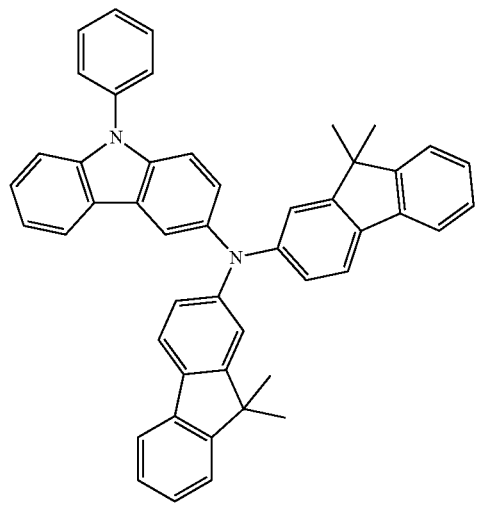
HT12
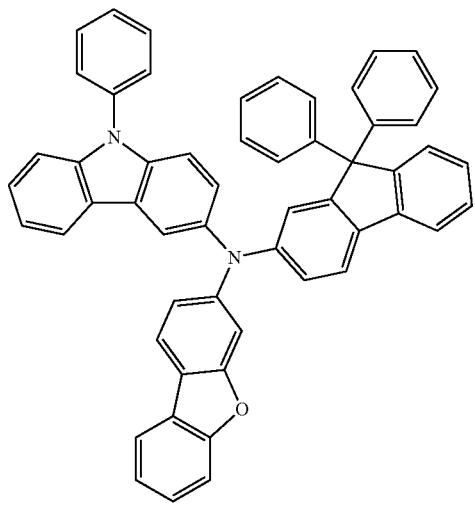

-continued
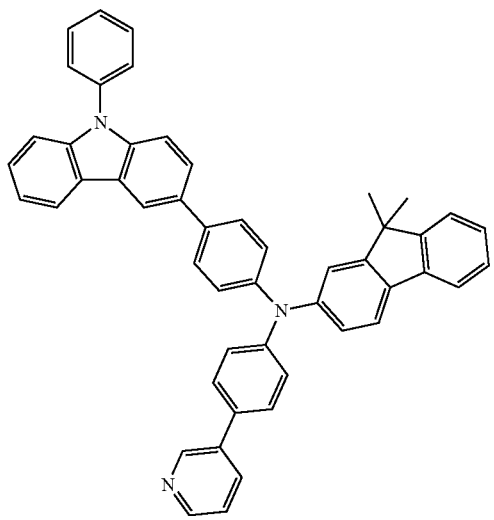
HT13
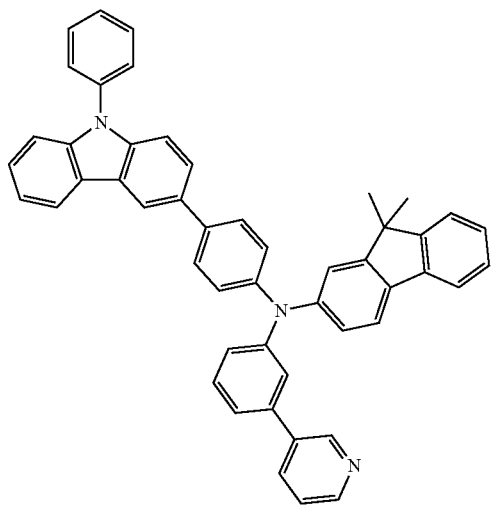
HT14
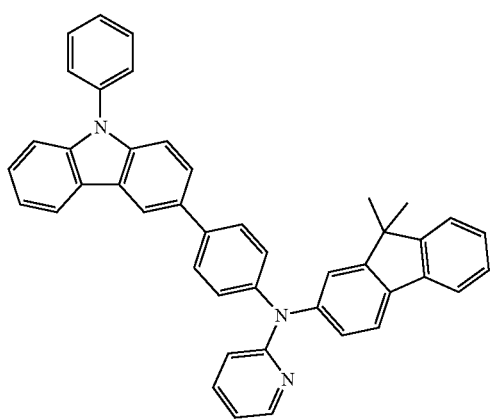
HT15
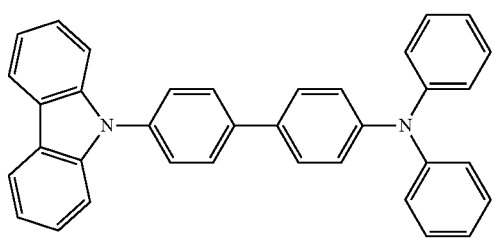
HT16
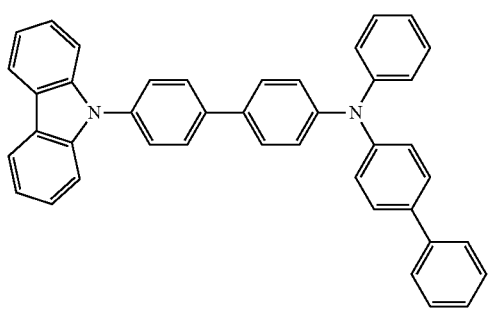
HT17
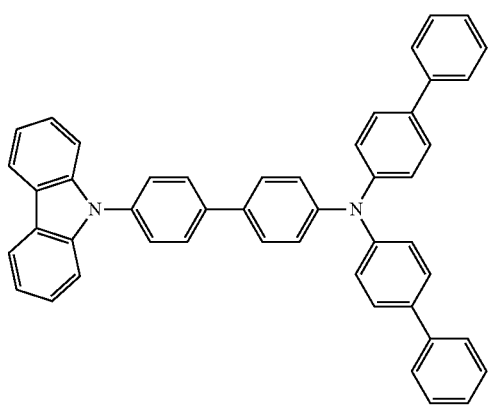
HT18

-continued
HT19
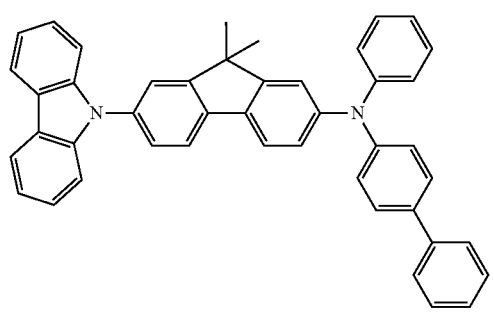
HT20
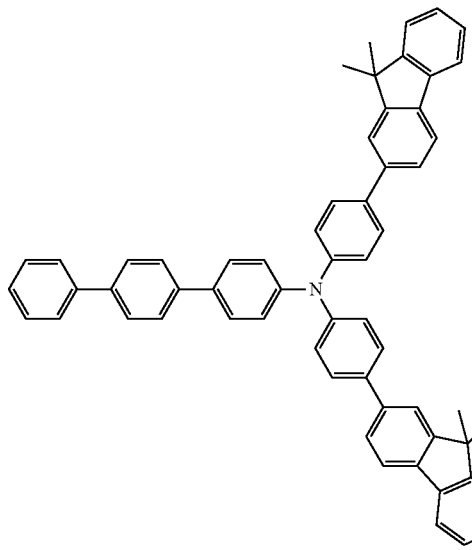
HT21
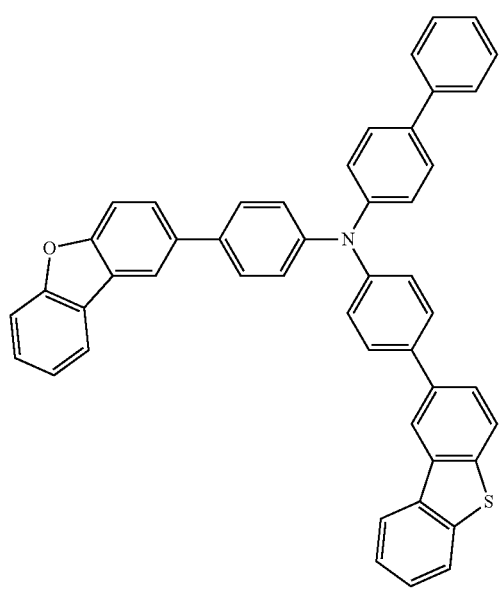
HT22
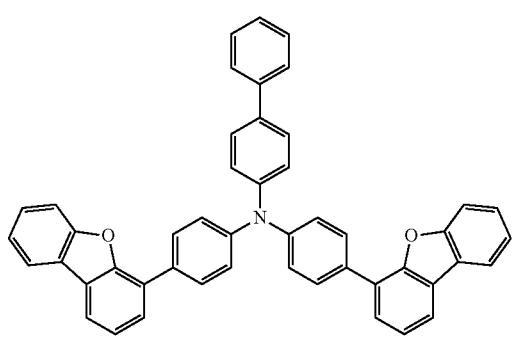
HT23
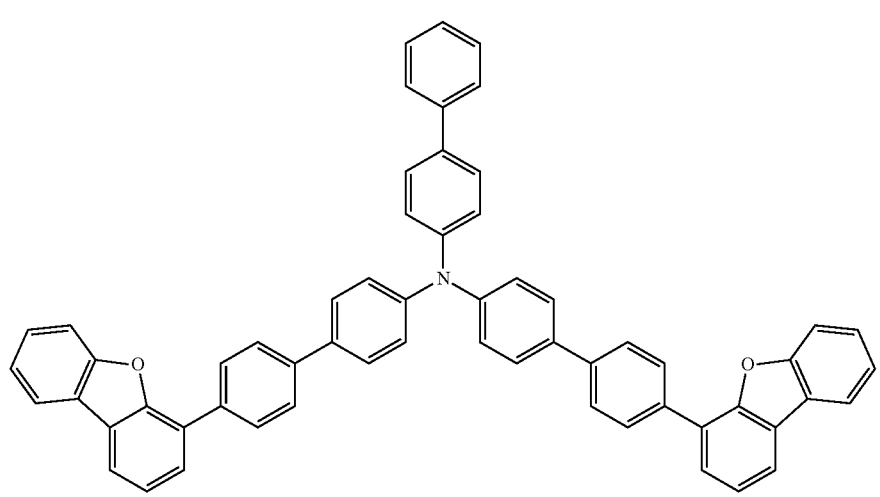

-continued
HT24
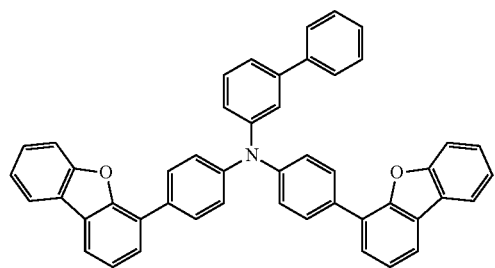
HT25
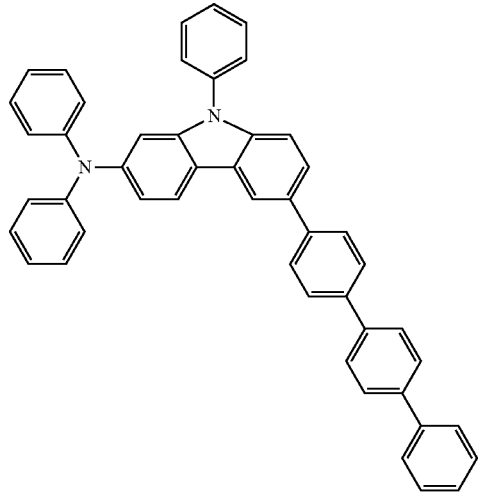
HT26
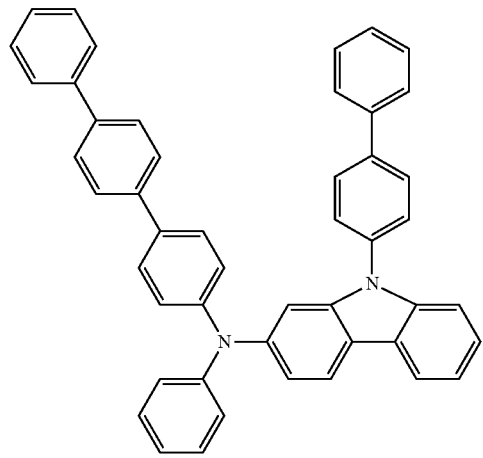
HT27
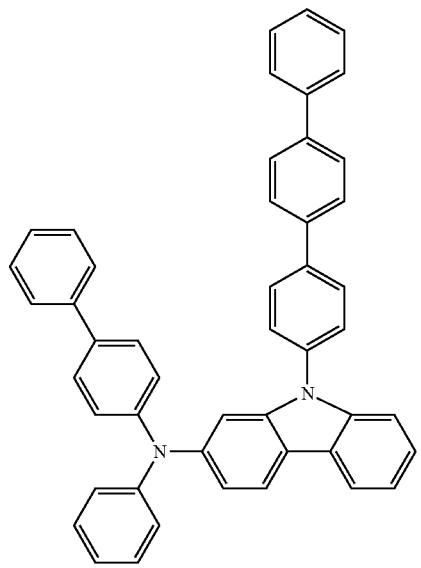
HT28
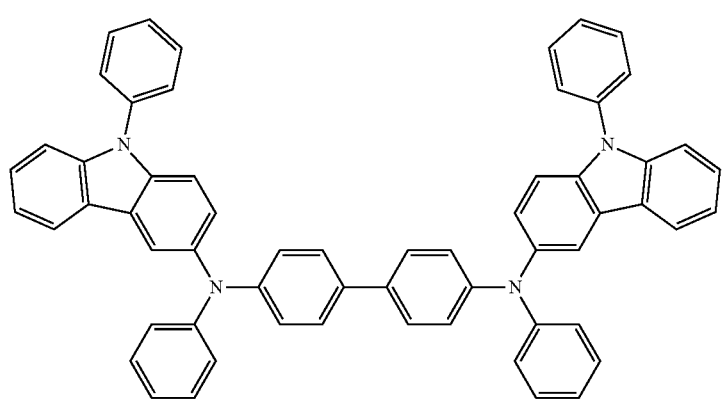

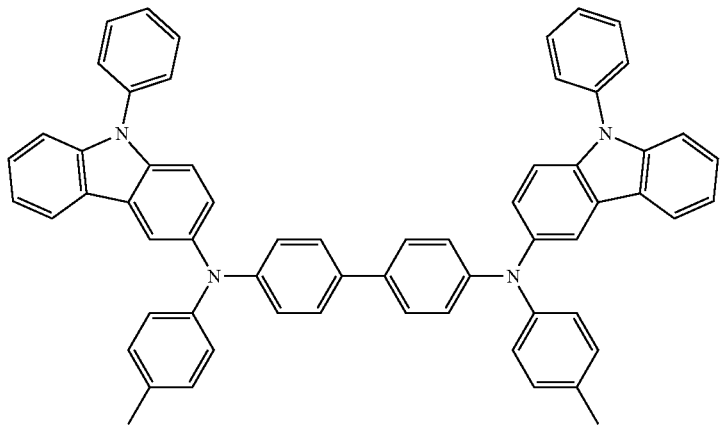
HT29
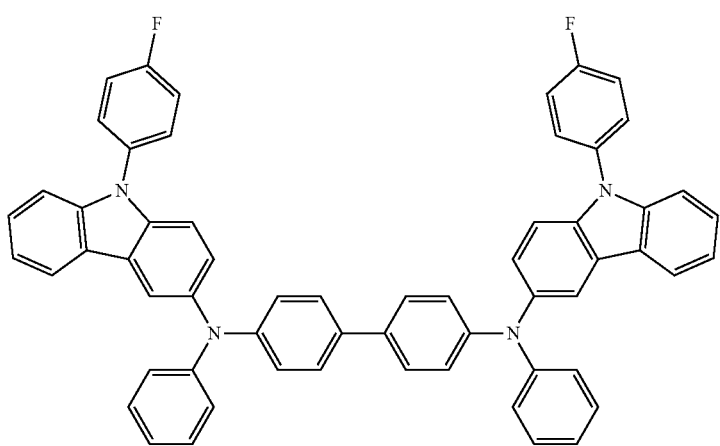
HT30
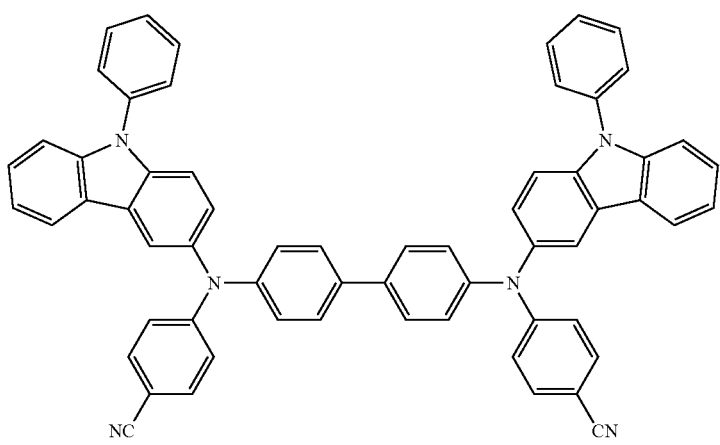
HT31

-continued
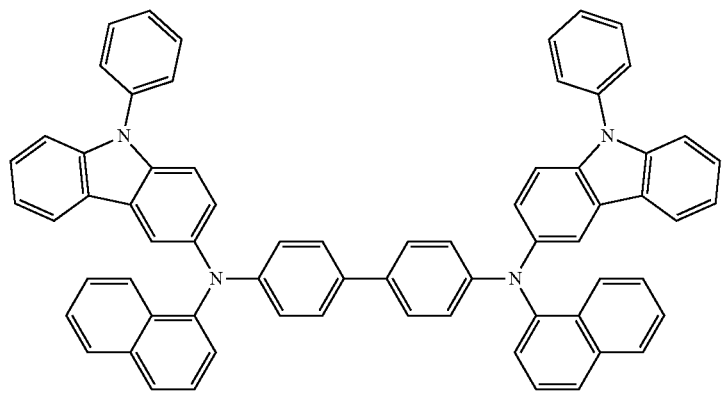
HT32
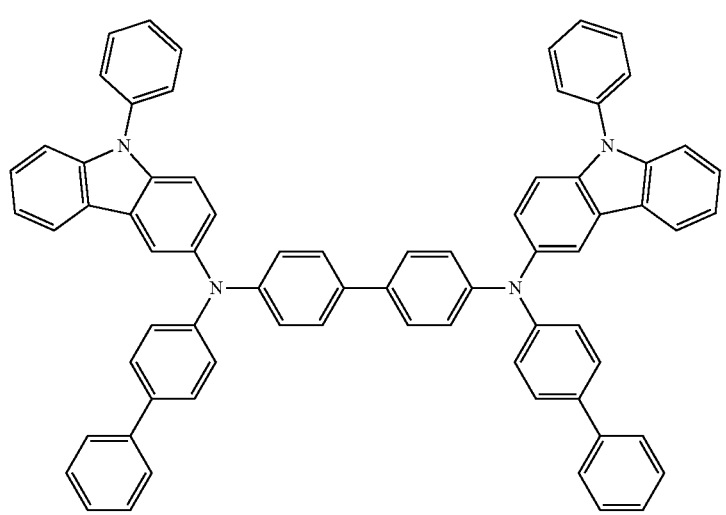
HT33
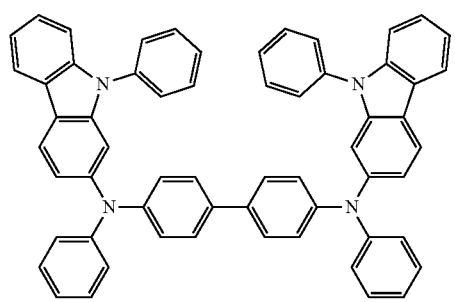
HT34
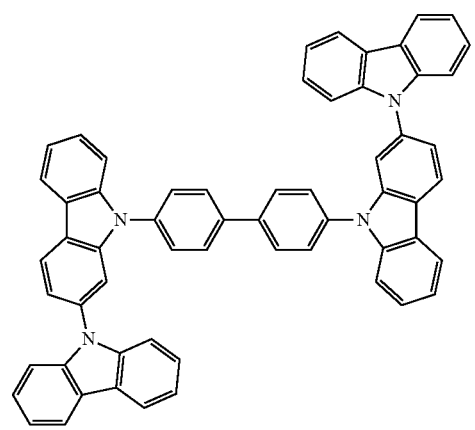
HT35

-continued
HT36
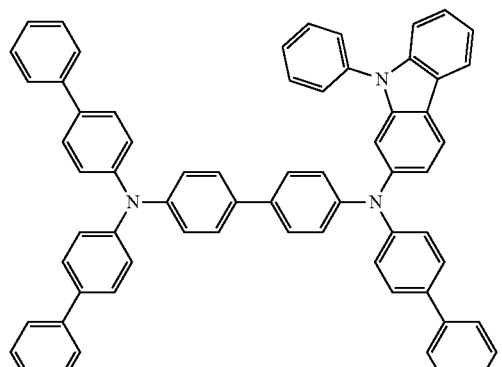
HT37
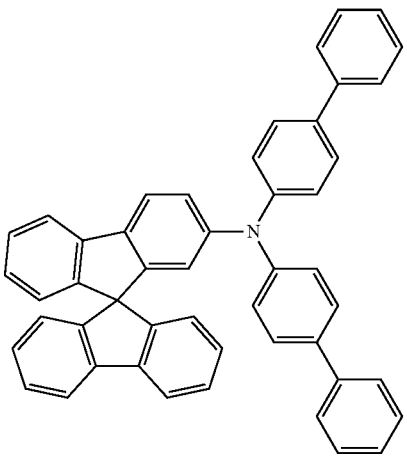
HT38
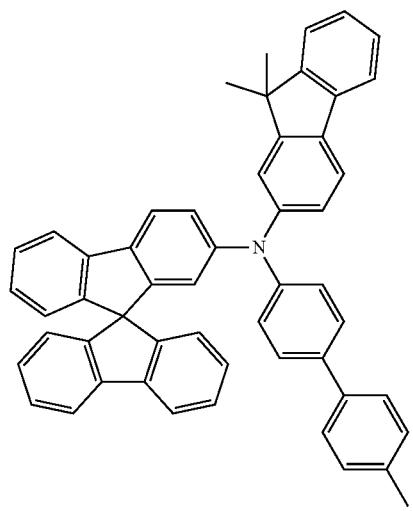
HT39
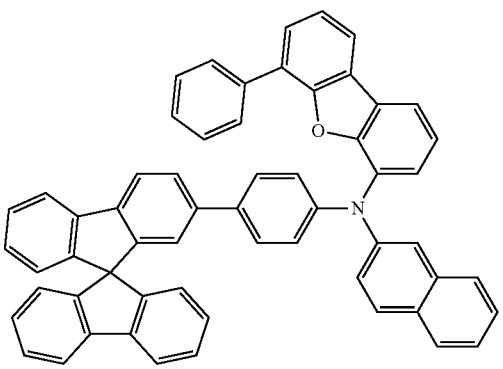
HT40
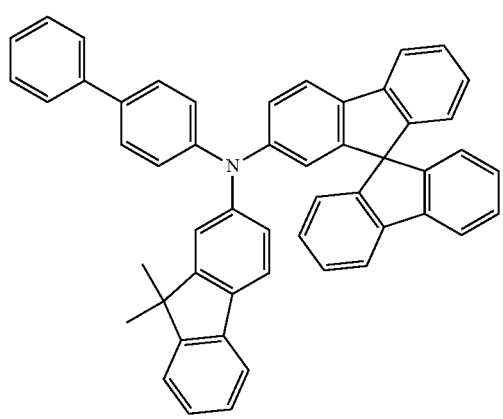

-continued
HT41
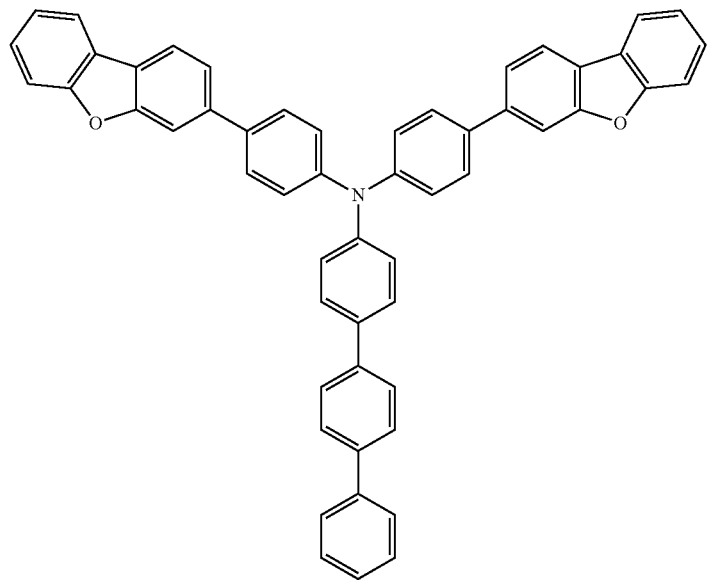
HT42
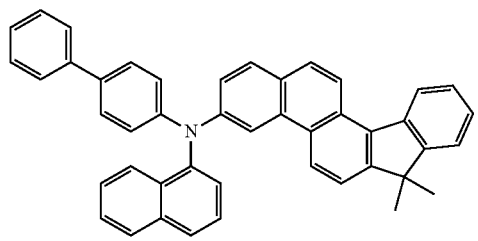
HT43
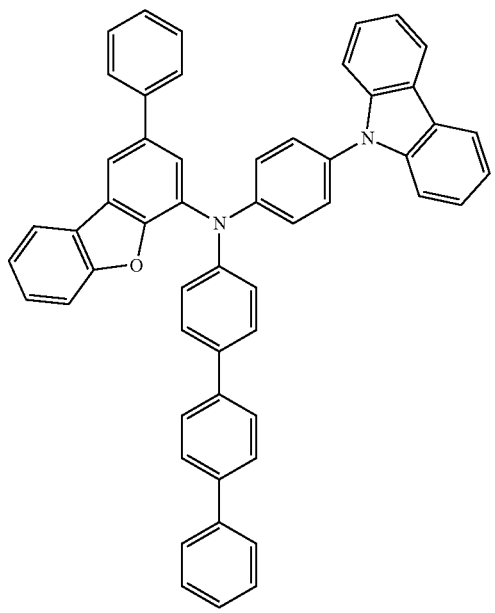
HT44
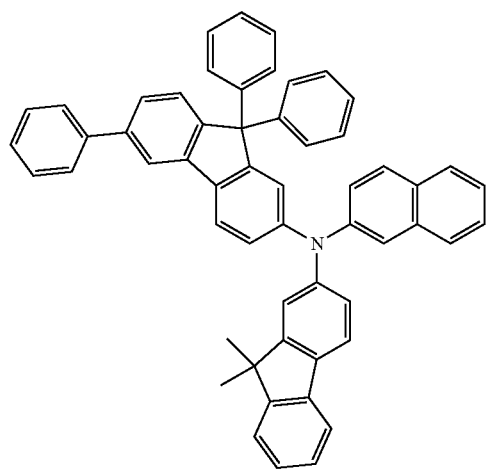
HT45
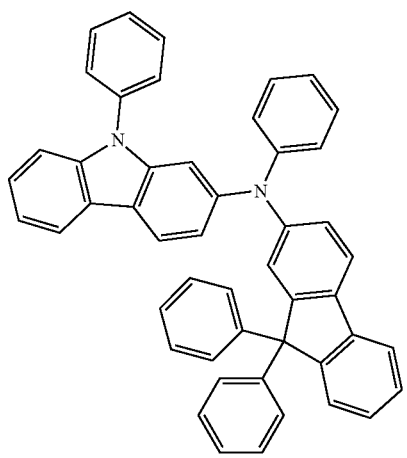

-continued
HT46
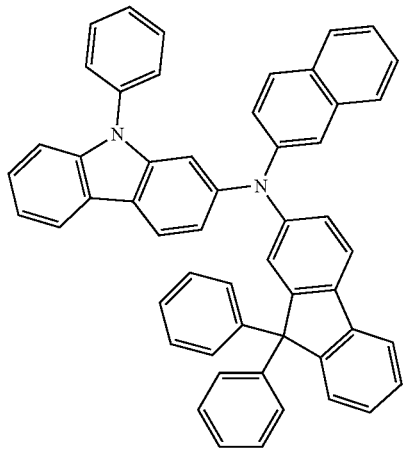
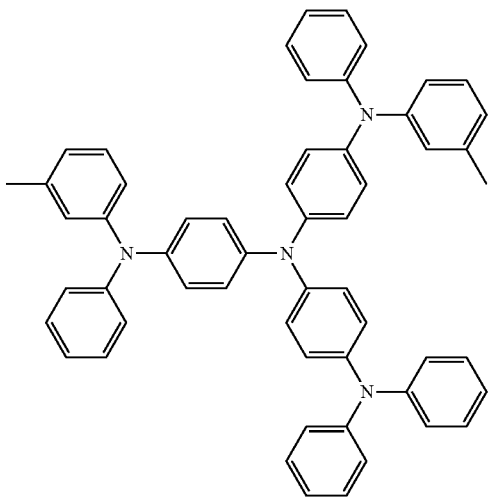
m-MTDATA
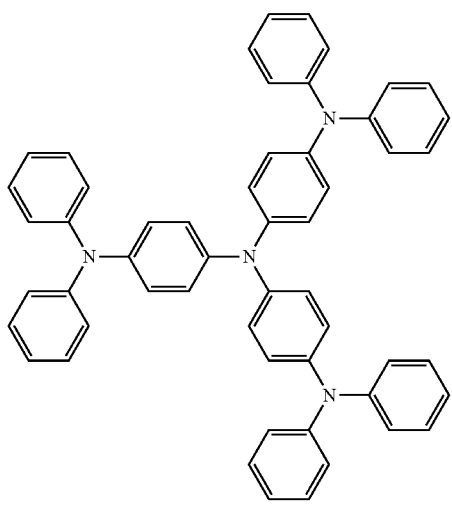
TDATA
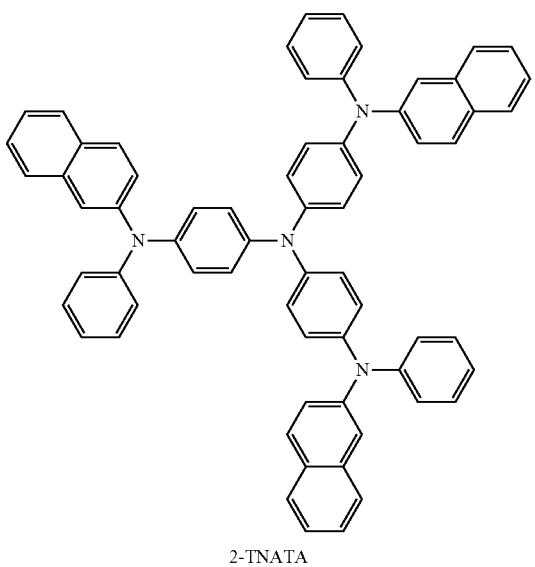
2-TNATA
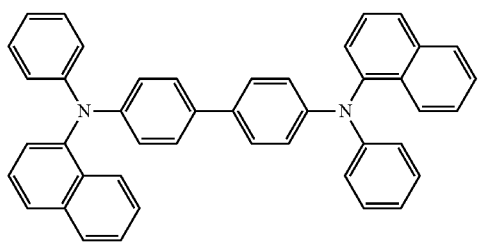
NPB
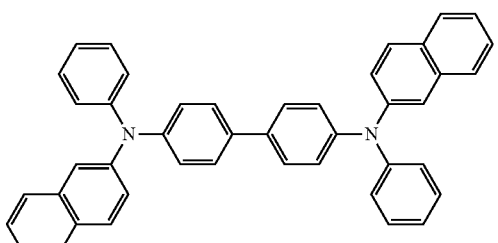
β-NPB
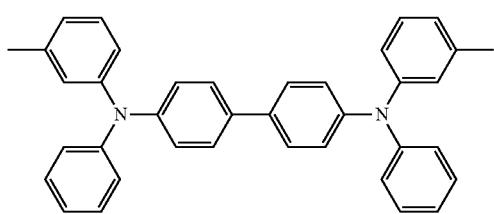
TPD
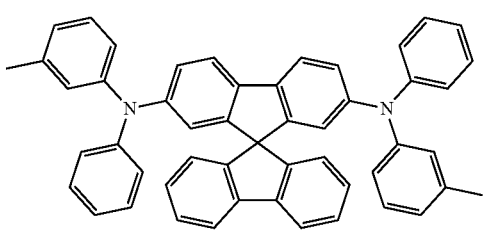
Spiro-TPD -continued

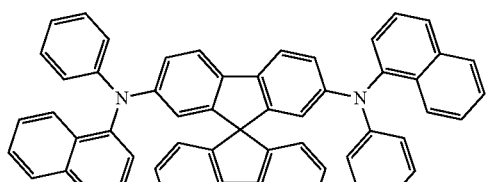
Spiro-TPD

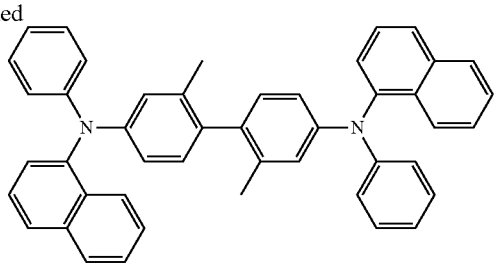
methylated-NPB

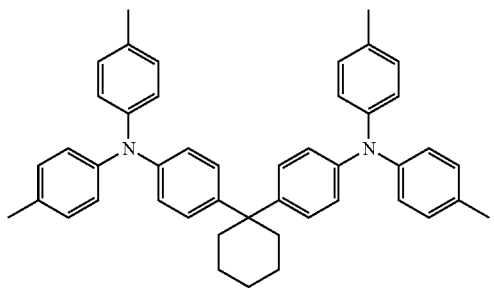
TAPC

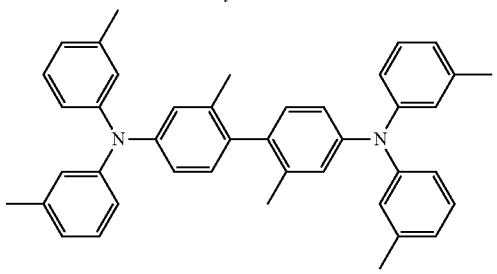
HMTPD

A thickness of the hole transport region may be in a range of about 50 Å to about 10,000 Å. For example, the thickness of the hole transport region may be in a range of about 100 Å to about 4,000 Å. When the hole transport region includes a hole injection layer, a hole transport layer, or any combination thereof, a thickness of the hole injection layer may be in a range of about 100 Å to about 9,000 Å, and a thickness of the hole transport layer may be in a range of about 50 Å to about 2,000 Å. For example, the thickness of the hole injection layer may be in a range of about 100 Å to about 1,000 Å. For example, the thickness of the hole transport layer may be in a range of about 100 Å to about 1,500 Å. When the thicknesses of the hole transport region, the hole injection layer, and the hole transport layer are within these ranges, satisfactory hole transporting characteristics may be obtained without a substantial increase in driving voltage.

The emission auxiliary layer may increase light-emission efficiency by compensating for an optical resonance distance according to the wavelength of light emitted by an emission layer, and the electron blocking layer may block the flow of electrons from an electron transport region. The emission auxiliary layer and the electron blocking layer may include the materials as described above.

[p-Dopant]

The hole transport region may further include, in addition to these materials, a charge-generation material for the improvement of conductive properties. The charge-generation material may be uniformly or non-uniformly dispersed in the hole transport region (for example, in the form of a single layer of a charge-generation material).

The charge-generation material may be, for example, a p-dopant.

In an embodiment, a lowest unoccupied molecular orbital (LUMO) energy level of the p-dopant may be equal to or less than about −3.5 eV.

In an embodiment, the p-dopant may include a quinone derivative, a cyano group-containing compound, a compound containing element EL1 and element EL2, or any combination thereof.

Examples of the quinone derivative may include TCNQ and F4-TCNQ.

Examples of the cyano group-containing compound may include HAT-CN and a compound represented by Formula 221 below.

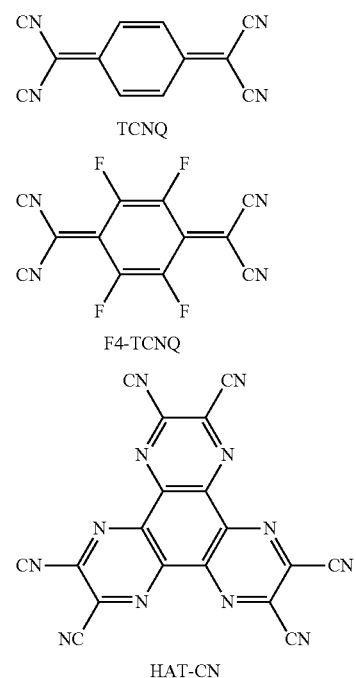

[Formula 221]

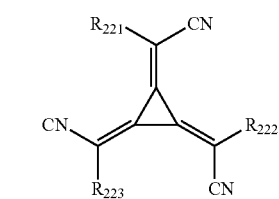

In Formula 221, $R_{221}$ to $R_{223}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, and at least one of $R_{221}$ to $R_{223}$ may each independently be a $C_3$-$C_{60}$ carbocyclic group or a $C_1$-$C_{60}$ heterocyclic group, each substituted with: a cyano group; —F; —Cl; —Br; —I; a $C_1$-$C_{20}$ alkyl group substituted with a cyano group, —F, —Cl, —Br, —I, or any combination thereof; or any combination thereof.

Regarding the compound containing element EL1 and element EL2, element EL1 may be metal, metalloid, or a combination thereof, and element EL2 may be a non-metal, metalloid, or a combination thereof.

Examples of the metal may include: an alkali metal (for example, lithium (Li), sodium (Na), potassium (K), rubidium (Rb), cesium (Cs), or the like); an alkaline earth metal (for example, beryllium (Be), magnesium (Mg), calcium (Ca), strontium (Sr), barium (Ba), or the like); a transition metal (for example, titanium (Ti), zirconium (Zr), hafnium (Hf), vanadium (V), niobium (Nb), tantalum (Ta), chromium (Cr), molybdenum (Mo), tungsten (W), manganese (Mn), technetium (Tc), rhenium (Re), iron (Fe), ruthenium (Ru), osmium (Os), cobalt (Co), rhodium (Rh), iridium (Ir), nickel (Ni), palladium (Pd), platinum (Pt), copper (Cu), silver (Ag), gold (Au), or the like); a post-transition metal (for example, zinc (Zn), indium (In), tin (Sn), or the like); and a lanthanide metal (for example, lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb), lutetium (Lu), or the like).

Examples of the metalloid may include silicon (Si), antimony (Sb), and tellurium (Te).

Examples of the non-metal may include oxygen (O) and a halogen (for example, F, Cl, Br, I, etc.).

In an embodiment, examples of the compound containing element EL1 and element EL2 may include metal oxide, metal halide (for example, metal fluoride, metal chloride, metal bromide, or metal iodide), metalloid halide (for example, metalloid fluoride, metalloid chloride, metalloid bromide, or metalloid iodide), metal telluride, and any combination thereof.

Examples of the metal oxide may include tungsten oxide (for example, WO, $W_2O_3$, $WO_2$, $WO_3$, or $W_2O_5$), vanadium oxide (for example, VO, $V_2O_3$, $VO_2$, or $V_2O_5$), molybdenum oxide (MoO, $Mo_2O_3$, $MoO_2$, $MoO_3$, or $Mo_2O_5$), and rhenium oxide (for example, $ReO_3$).

Examples of the metal halide may include alkali metal halide, alkaline earth metal halide, transition metal halide, post-transition metal halide, and lanthanide metal halide.

Examples of the alkali metal halide may include LiF, NaF, KF, RbF, CsF, LiCl, NaCl, KCl, RbCl, CsCl, LiBr, NaBr, KBr, RbBr, CsBr, LiI, NaI, KI, RbI, and CsI.

Examples of the alkaline earth metal halide may include $BeF_2$, $MgF_2$, $CaF_2$, $SrF_2$, $BaF_2$, $BeCl_2$, $MgCl_2$, $CaCl_2$, $SrCl_2$, $BaCl_2$, $BeBr_2$, $MgBr_2$, $CaBr_2$, $SrBr_2$, $BaBr_2$, $BeI_2$, $Mg_{12}$, $CaI_2$, $SrI_2$, and $BaI_2$.

Examples of the transition metal halide may include titanium halide (for example, $TiF_4$, $TiCl_4$, $TiBr_4$, or $TiI_4$), zirconium halide (for example, $ZrF_4$, $ZrCl_4$, $ZrBr_4$, or $ZrI_4$), hafnium halide (for example, $HfF_4$, $HfCl_4$, $HfBr_4$, or $HfI_4$), vanadium halide (for example, $VF_3$, $VCl_3$, $VBr_3$, or $VI_3$), niobium halide (for example, $NbF_3$, $NbCl_3$, $NbBr_3$, or $NbI_3$), tantalum halide (for example, $TaF_3$, $TaCl_3$, $TaBr_3$, or Tab), chromium halide (for example, $CrF_3$, $CrCl_3$, $CrBr_3$, or $CrI_3$), molybdenum halide (for example, $MoF_3$, $MoCl_3$, $MoBr_3$, or Mola), tungsten halide (for example, $WF_3$, $WCl_3$, $WBr_3$, or $WI_3$), manganese halide (for example, $MnF_2$, $MnCl_2$, $MnBr_2$, or $MnI_2$), technetium halide (for example, $TcF_2$, $TcCl_2$, $TcBr_2$, or $TcI_2$), rhenium halide (for example, $ReF_2$, $ReCl_2$, $ReBr_2$, or $ReI_2$), iron halide (for example, $FeF_2$, $FeCl_2$, $FeBr_2$, or $FeI_2$), ruthenium halide (for example, $RuF_2$, $RuCl_2$, $RuBr_2$, or $RuI_2$), osmium halide (for example, $OsF_2$, $OsCl_2$, $OsBr_2$, or $OsI_2$), cobalt halide (for example, $CoF_2$, $CoCl_2$, $CoBr_2$, or $CoI_2$), rhodium halide (for example, $RhF_2$, $RhCl_2$, $RhBr_2$, or $RhI_2$), iridium halide (for example, $IrF_2$, $IrCl_2$, $IrBr_2$, or $IrI_2$), nickel halide (for example, $NiF_2$, $NiCl_2$, $NiBr_2$, or $NiI_2$), palladium halide (for example, $PdF_2$, $PdCl_2$, $PdBr_2$, or $PdI_2$), platinum halide (for example, $PtF_2$, $PtCl_2$, $PtBr_2$, or $PtI_2$), copper halide (for example, CuF, CuCl, CuBr, or CuI), silver halide (for example, AgF, AgCl, AgBr, or AgI), and gold halide (for example, AuF, AuCl, AuBr, or AuI).

Examples of the post-transition metal halide may include zinc halide (for example, $ZnF_2$, $ZnCl_2$, $ZnBr_2$, or $ZnI_2$), indium halide (for example, $InI_3$), and tin halide (for example, $SnI_2$).

Examples of the lanthanide metal halide may include YbF, $YbF_2$, $YbF_3$, $SmF_3$, YbCl, $YbCl_2$, $YbCl_3$ $SmCl_3$, YbBr, $YbBr_2$, $YbBr_3$ $SmBr_3$, YbI, $YbI_2$, $YbI_3$, and $SmI_3$.

Examples of the metalloid halide may include antimony halide (for example, $SbCl_5$).

Examples of the metal telluride may include an alkali metal telluride (for example, $Li_2Te$, $Na_2Te$, $K_2Te$, $Rb_2Te$, or $Cs_2Te$), alkaline earth metal telluride (for example, BeTe, MgTe, CaTe, SrTe, or BaTe), transition metal telluride (for example, $TiTe_2$, $ZrTe_2$, $HfTe_2$, $V_2Te_3$, $Nb_2Te_3$, $Ta_2Te_3$, $Cr_2Te_3$, $Mo_2Te_3$, $W_2Te_3$, MnTe, TcTe, ReTe, FeTe, RuTe, OsTe, CoTe, RhTe, IrTe, NiTe, PdTe, PtTe, $Cu_2Te$, CuTe, $Ag_2Te$, AgTe, or $Au_2Te$), post-transition metal telluride (for example, or ZnTe), and lanthanide metal telluride (for example, LaTe, CeTe, PrTe, NdTe, PmTe, EuTe, GdTe, TbTe, DyTe, HoTe, ErTe, TmTe, YbTe, or LuTe).

[Emission Layer in Interlayer 130]

When the light-emitting device 10 is a full-color light-emitting device, the emission layer may be patterned into a red emission layer, a green emission layer, and/or a blue emission layer, according to a sub-pixel. In embodiments, the emission layer may have a stacked structure of two or more layers of a red emission layer, a green emission layer, and a blue emission layer, in which the two or more layers contact each other or are separated from each other to emit white light. In embodiments, the emission layer may include two or more materials of a red light-emitting material, a green light-emitting material, and a blue light-emitting material, in which the two or more materials are mixed with each other in a single layer to emit white light.

The emission layer may include a host and a dopant. The dopant may include a phosphorescent dopant, a fluorescent dopant, or any combination thereof.

An amount of the dopant in the emission layer may be in a range of about 0.01 parts by weight to about 15 parts by weight, based on 100 parts by weight of the host.

In embodiments, the emission layer may include a quantum dot.

In an embodiment, the emission layer may include a delayed fluorescence material. The delayed fluorescence material may act as a host or a dopant in the emission layer.

A thickness of the emission layer may be in a range of about 100 Å to about 1,000 Å. For example, the thickness of the emission layer may be in a range of about 200 Å to about 600 Å. When the thickness of the emission layer is within this range, excellent luminescence characteristics may be obtained without a substantial increase in driving voltage.

[Host]

The host may include a compound represented by Formula 301 below:

$$[Ar_{301}]_{xb11}\text{-}[(L_{301})_{xb1}\text{-}R_{301}]_{xb21} \quad \text{[Formula 301]}$$

In Formula 301, $Ar_{301}$ and $L_{301}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, xb11 may be 1, 2, or 3, xb1 may be an integer from 0 to 5, $R_{301}$ may be hydrogen, deuterium, —F, —Cl, —Br, —I, a hydroxyl group, a cyano group, a nitro group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, —Si($Q_{301}$)($Q_{302}$)($Q_{303}$), —N($Q_{301}$)($Q_{302}$), —B($Q_{301}$)($Q_{302}$), —C(=O)($Q_{301}$), —S(=O)$_2$($Q_{301}$), or —P(=O)($Q_{301}$)($Q_{302}$), xb21 may be an integer from 1 to 5, and $Q_{301}$ to $Q_{303}$ are the same as described in connection with $Q_1$.

In an embodiment, when xb11 in Formula 301 is 2 or more, two or more of $Ar_{301}$(s) may be linked to each other via a single bond.

In an embodiment, the host may include a compound represented by Formula 301-1, a compound represented by Formula 301-2, or any combination embodiment:

In Formulae 301-1 and 301-2, ring $A_{301}$ to ring $A_{304}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, $X_{301}$ may be O, S, N-[(L304)$_{xb4}$-$R_{304}$], C($R_{304}$)($R_{305}$), or Si($R_{304}$)($R_{305}$), xb22 and xb23 may each independently be 0, 1, or 2, $L_{301}$, xb1, and $R_{301}$ are the same as described in the specification, $L_{302}$ to $L_{304}$ are each independently the same as described in connection with L301, xb2 to xb4 are each independently the same as described in connection with xb1, and $R_{302}$ to $R_{305}$ and $R_{311}$ to $R_{314}$ are the same as described in connection with $R_{301}$.

In an embodiment, the host may include an alkaline earth-metal complex. In an embodiment, the host may include a Be complex (for example, Compound H55), a Mg complex, a Zn complex, or any combination thereof.

In an embodiment, the host may include one of Compounds H1 to H124, 9,10-di(2-naphthyl)anthracene (ADN), 2-methyl-9,10-bis(naphthalen-2-yl)anthracene (MADN), 9,10-di-(2-naphthyl)-2-t-butyl-anthracene (TBADN), 4,4'-bis(N-carbazolyl)-1,1'-biphenyl (CBP), 1,3-di-9-carbazolyl-benzene (mCP), 1,3,5-tri(carbazol-9-yl)benzene (TCP), or any combination thereof:

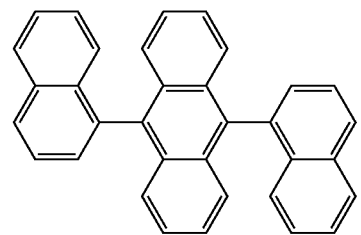

H1

[Formula 301-1]

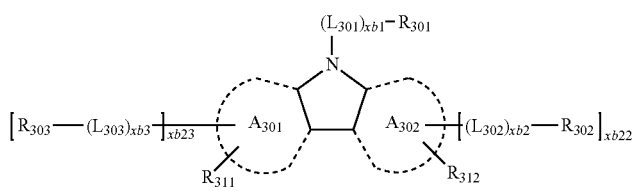

[Formula 301-2]

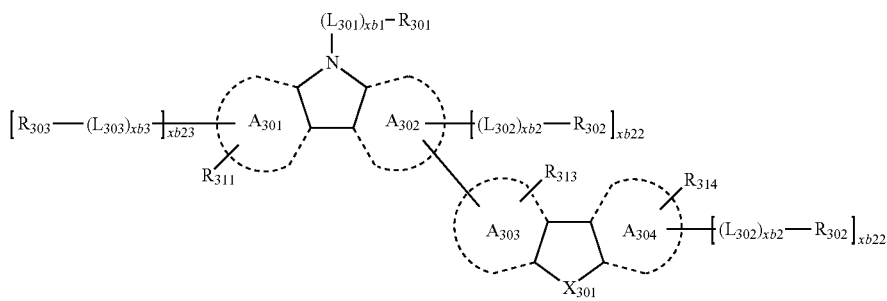

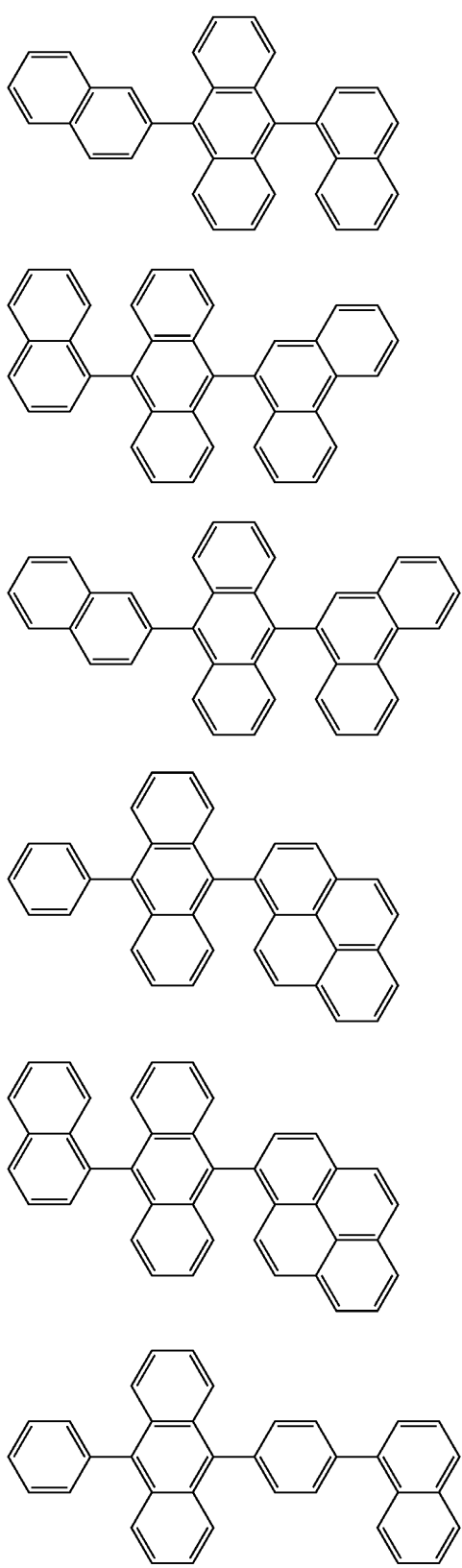

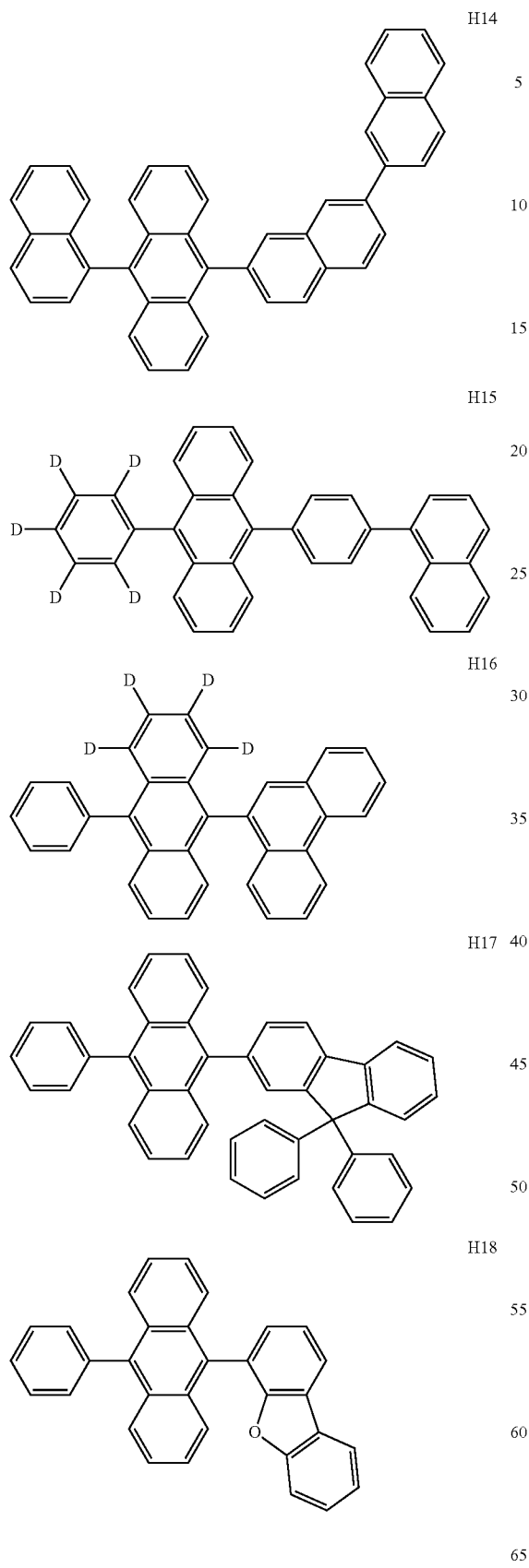
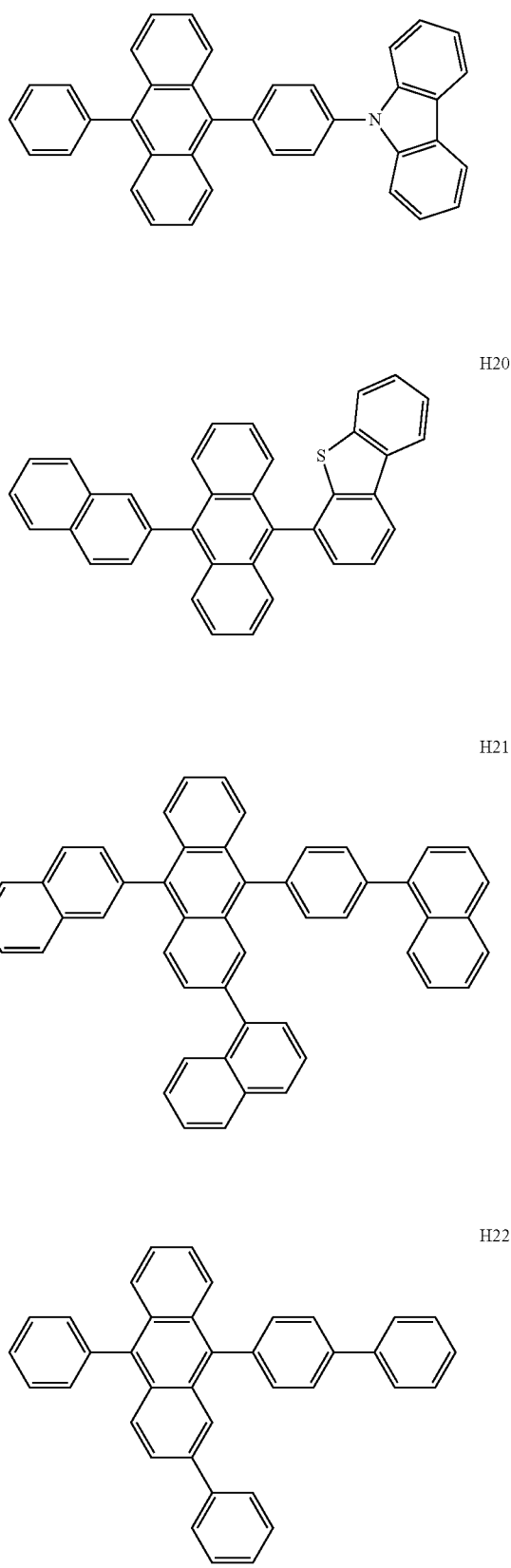

H23
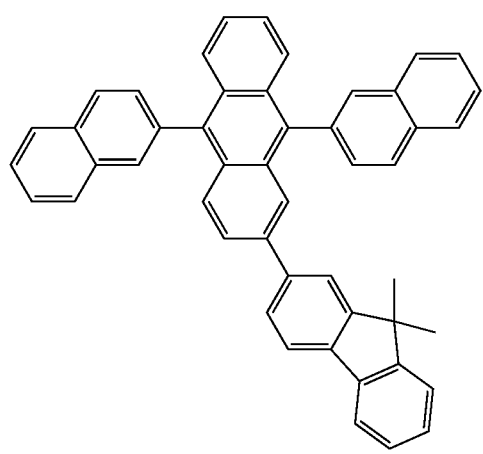
H24
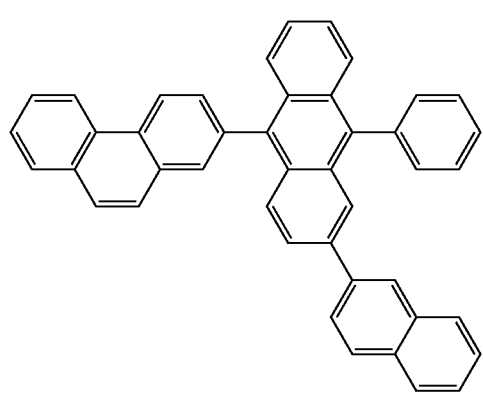
H25
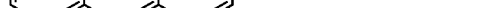
H26
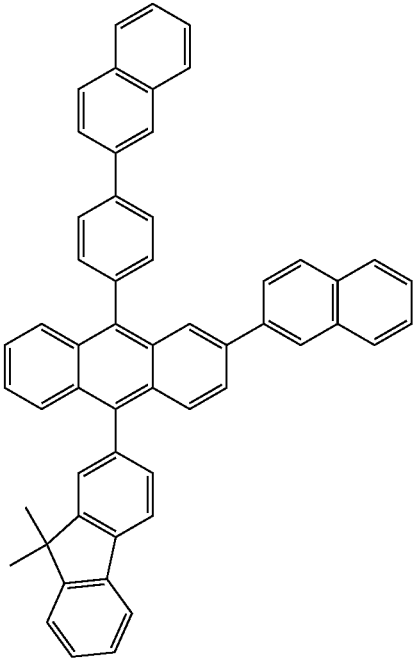
H27
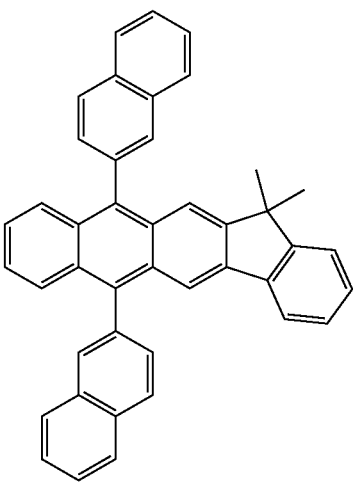
H28
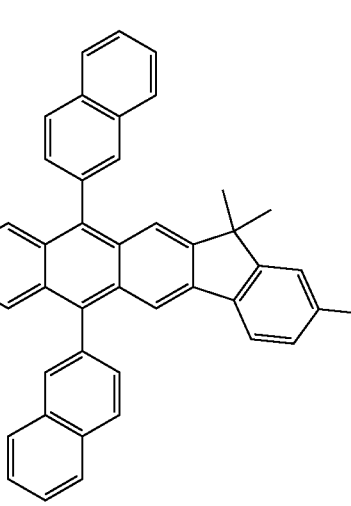

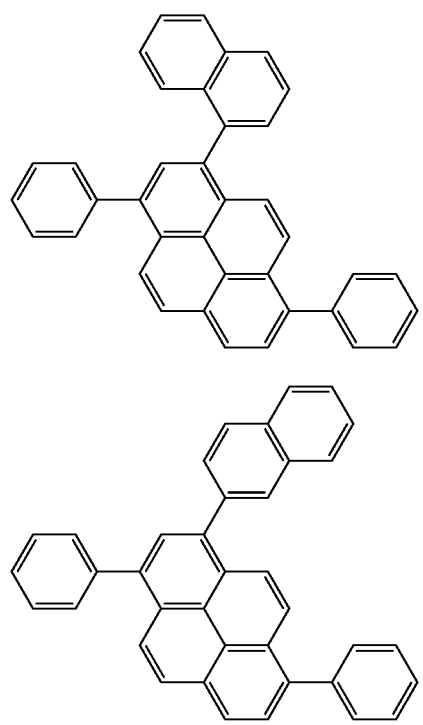
H29
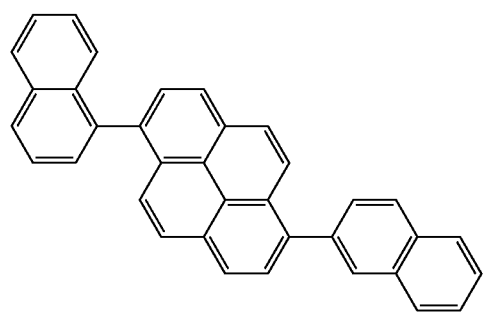
H30
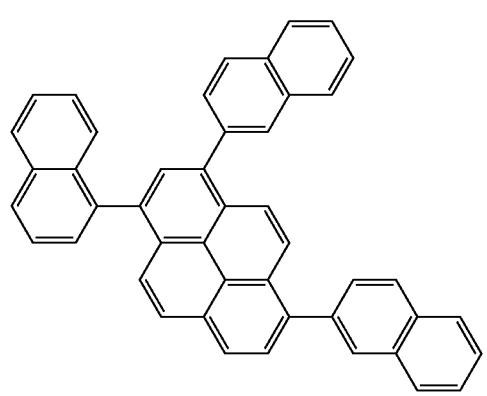
H31
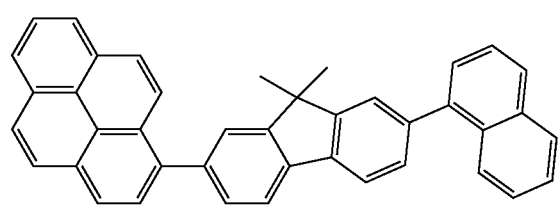
H32
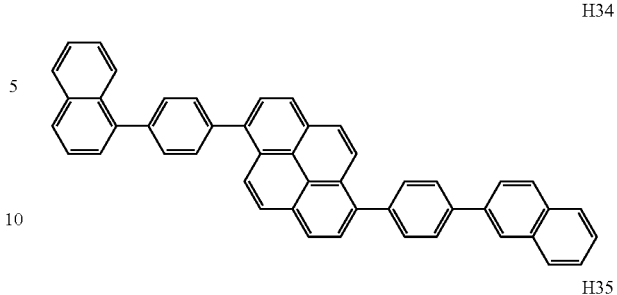
H33
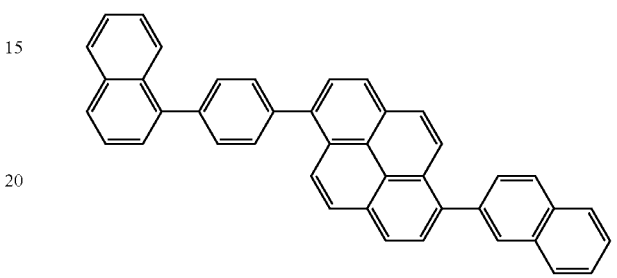
H34
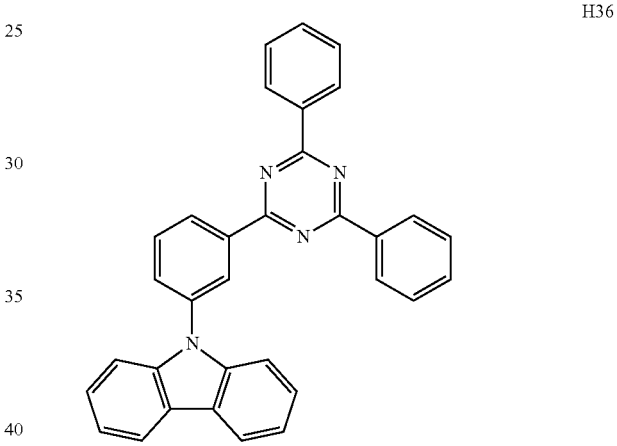
H35
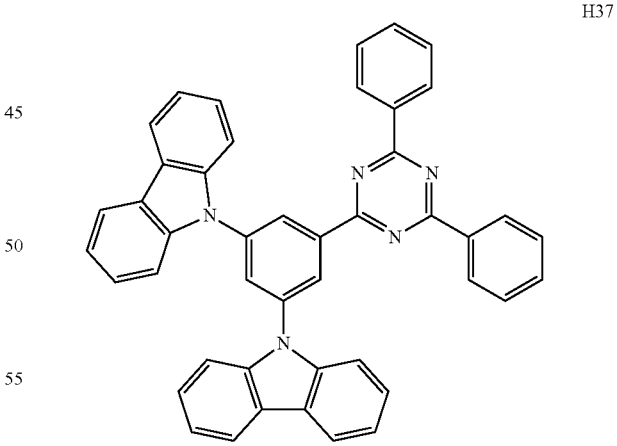
H36
H37
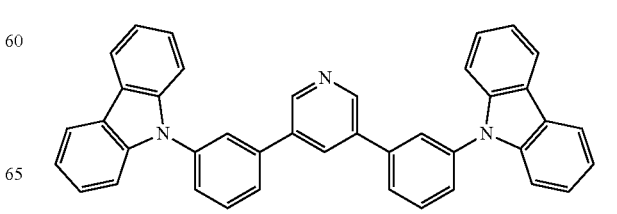
H38

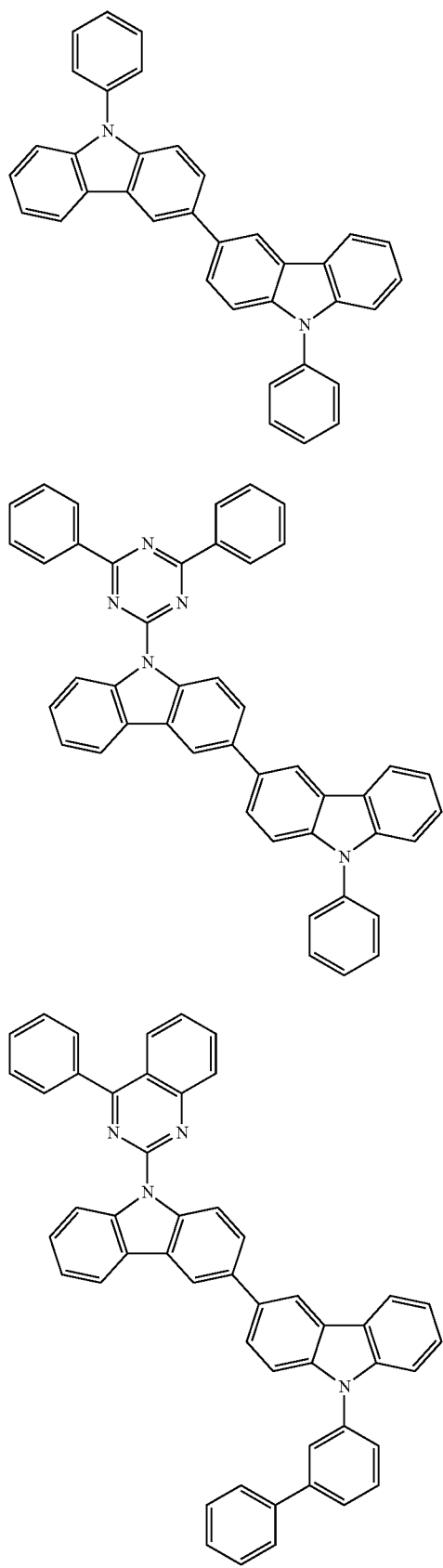
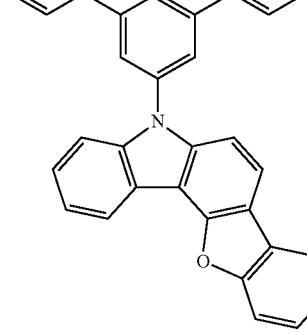
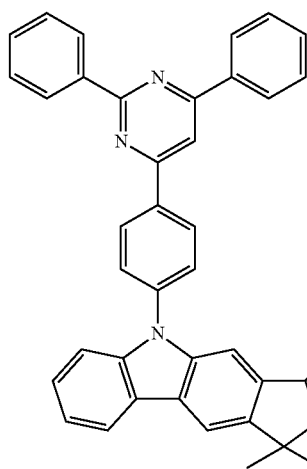
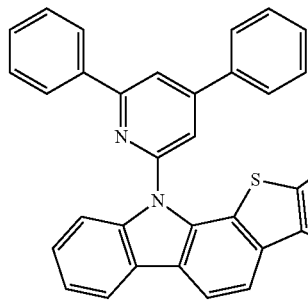

H46
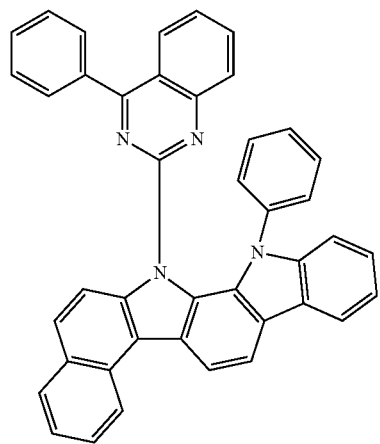
H47
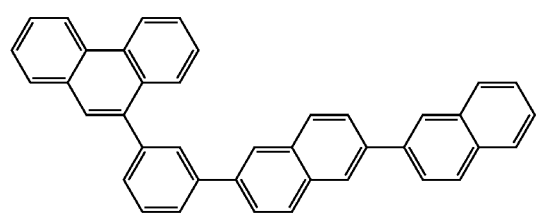
H48
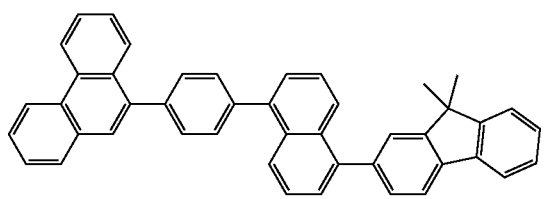
H49
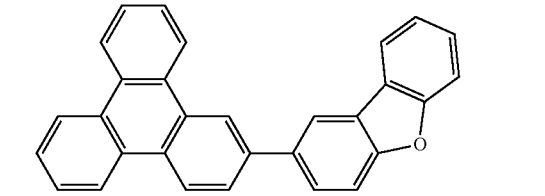
H50
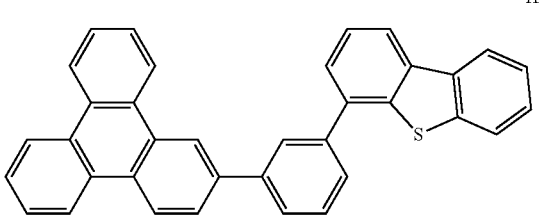
H51
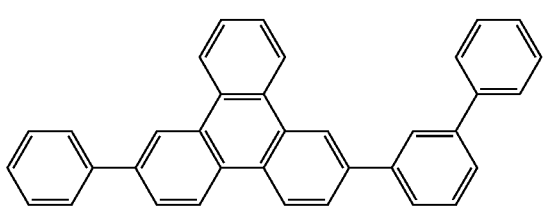
H52
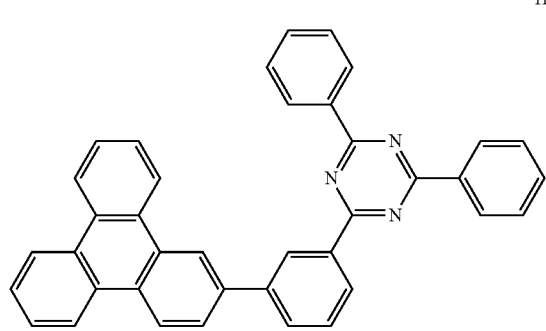
H53
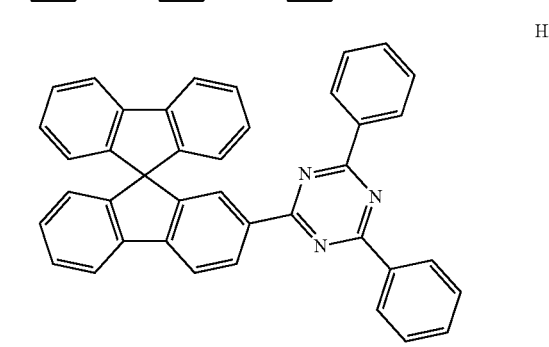
H54
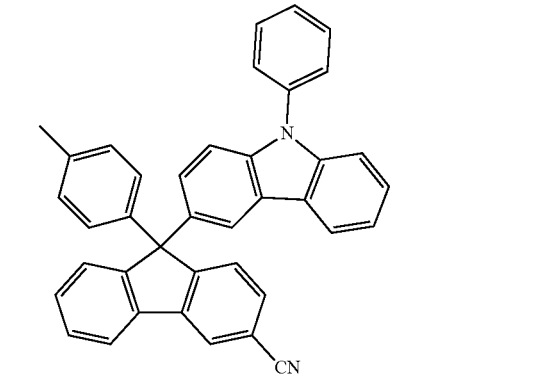
H55
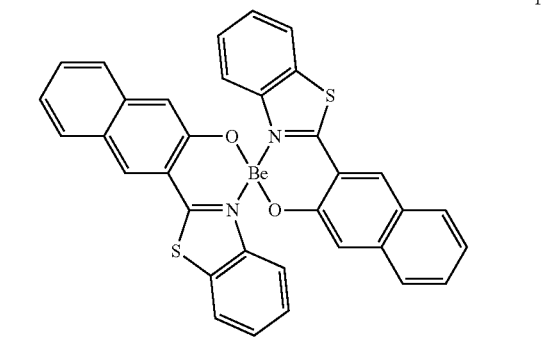

H56
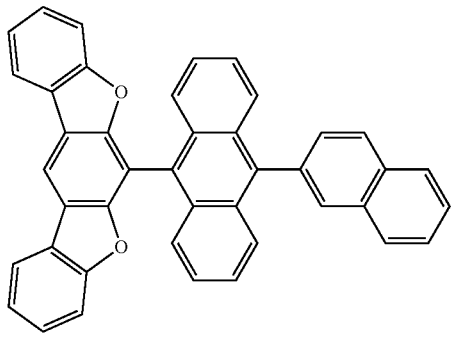
H57
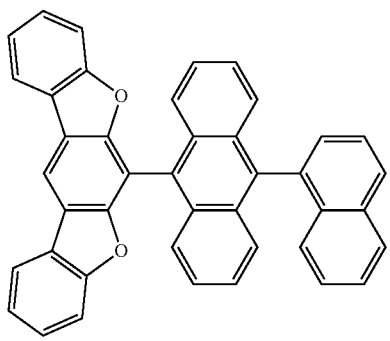
H58
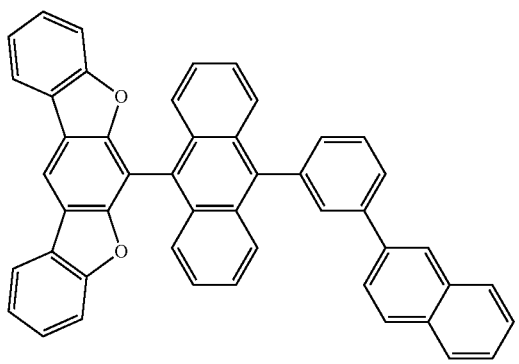
H59
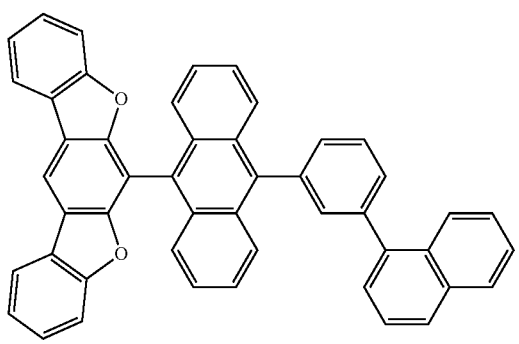
H60
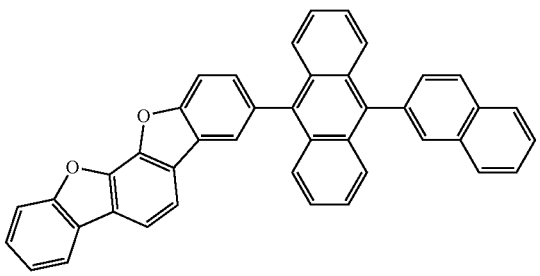
H61
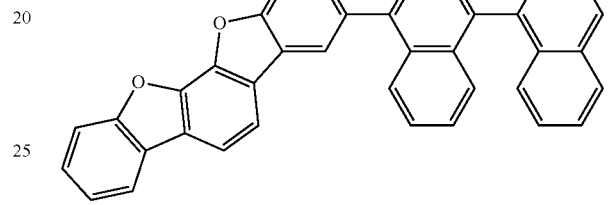
H62
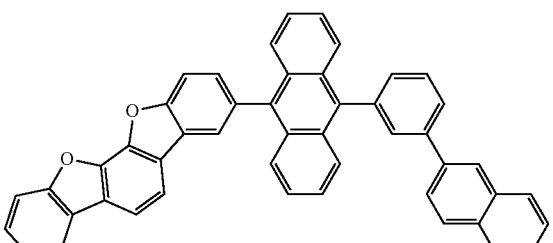
H63
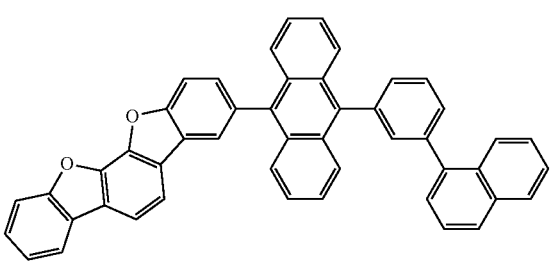
H64
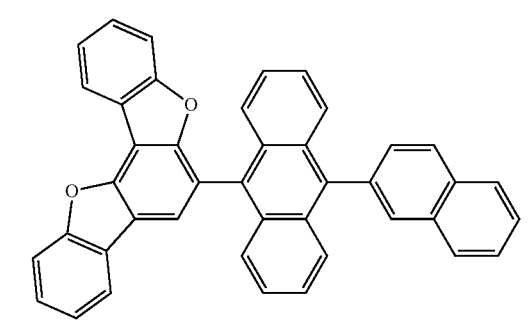

H65
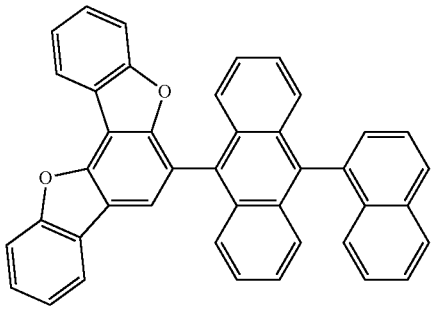
H66
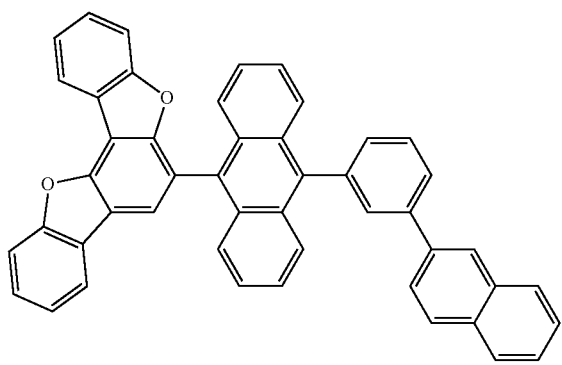
H67
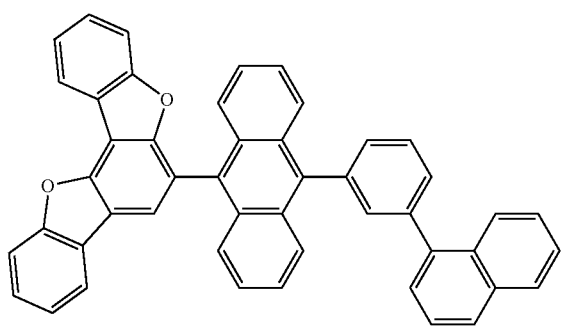
H68
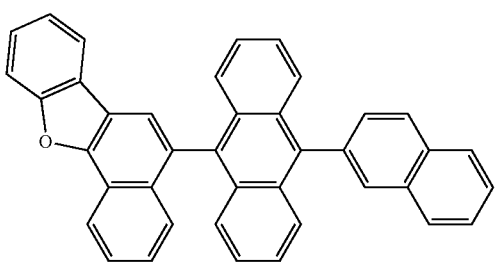
H69
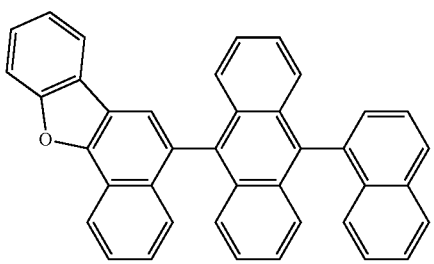
H70
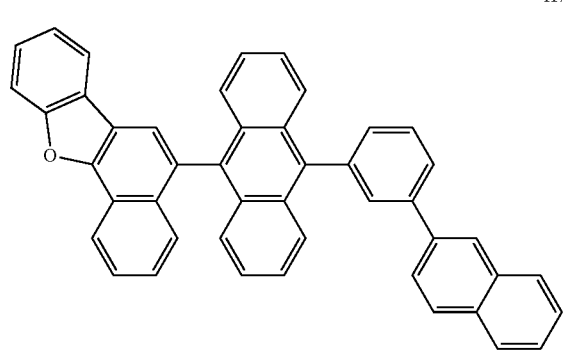
H71
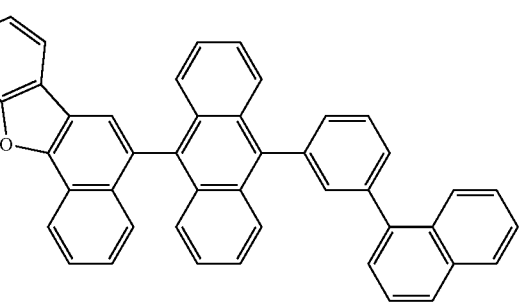
H72
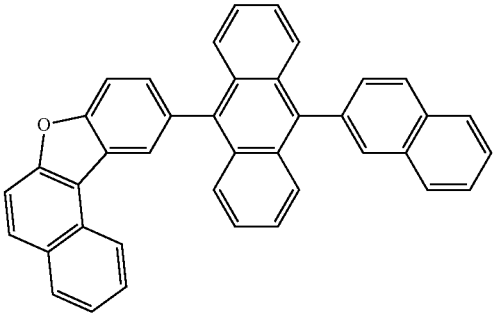
H73
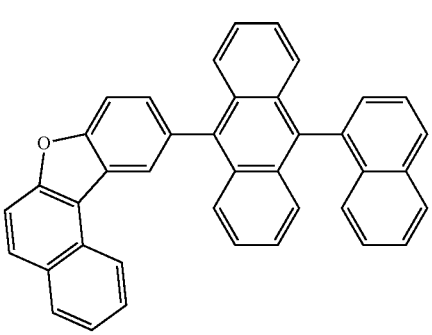

H74
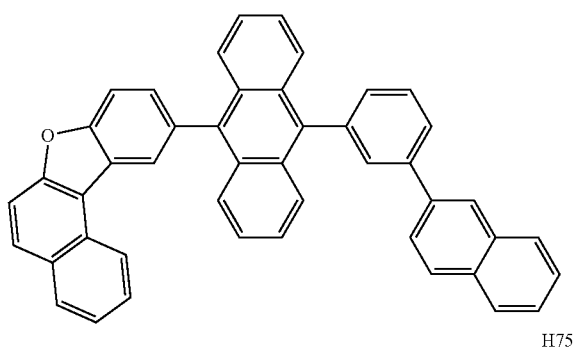
H75
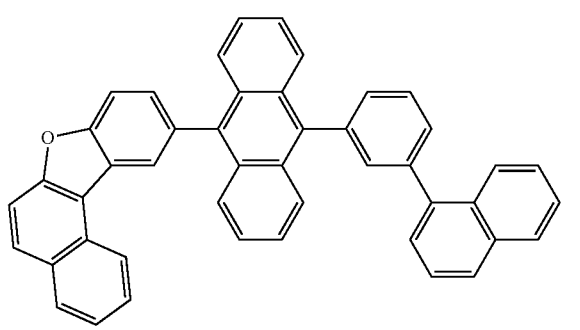
H76
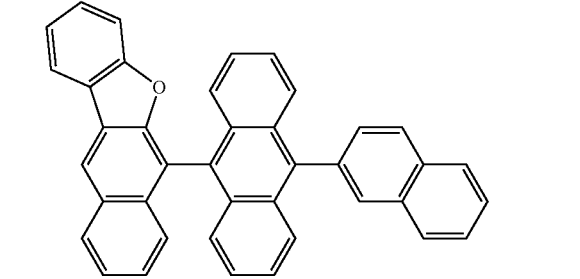
H77
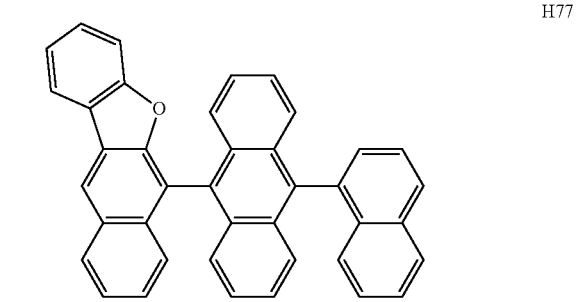
H78
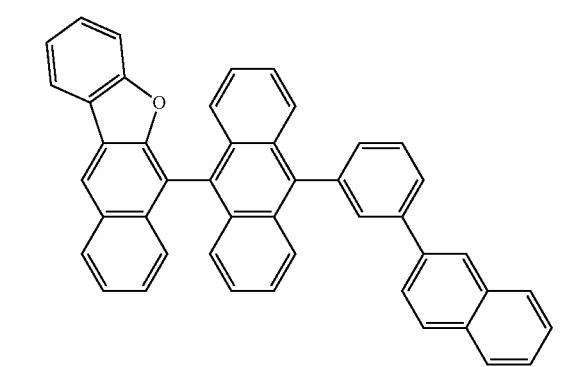
H79
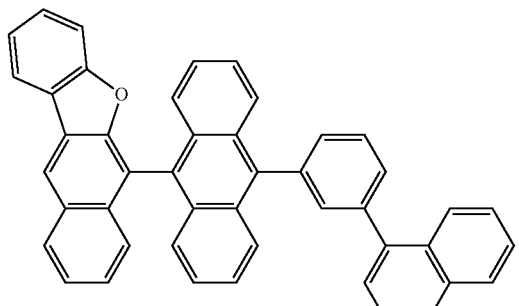
H80
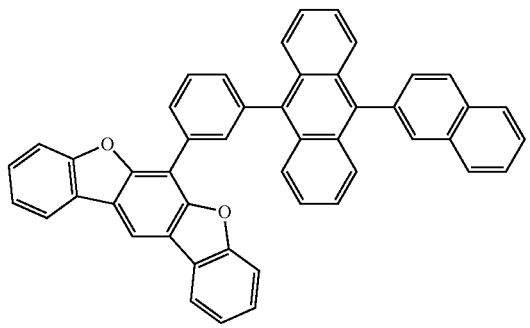
H81
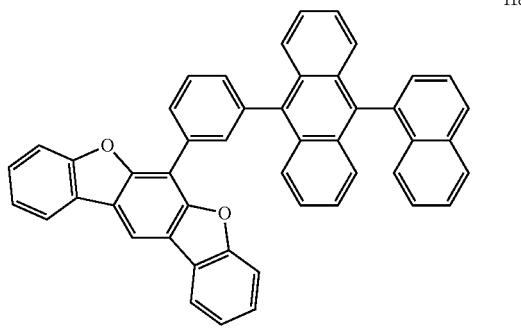
H82
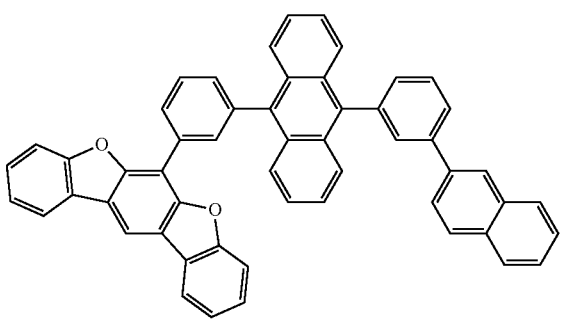

H83
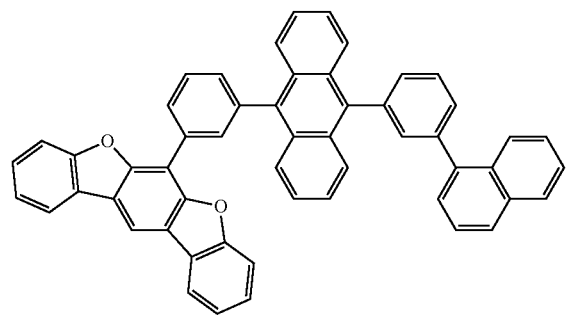
H84
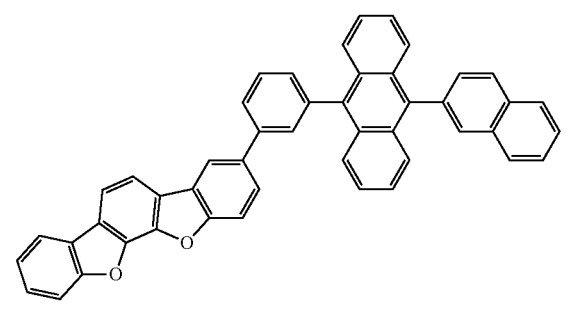
H85
H86
H87
H88
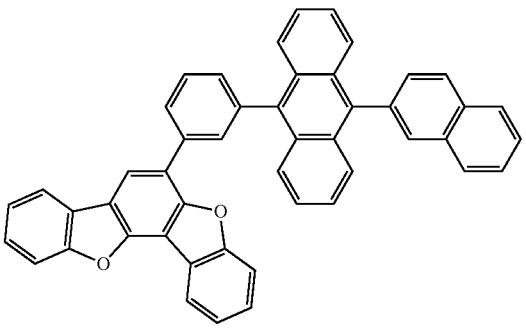
H89
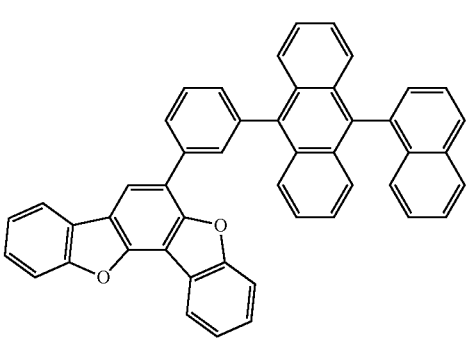
H90
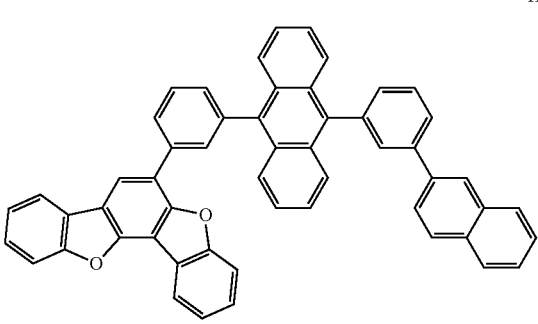
H91
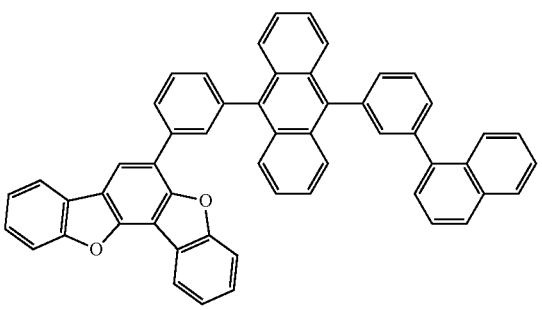

H92 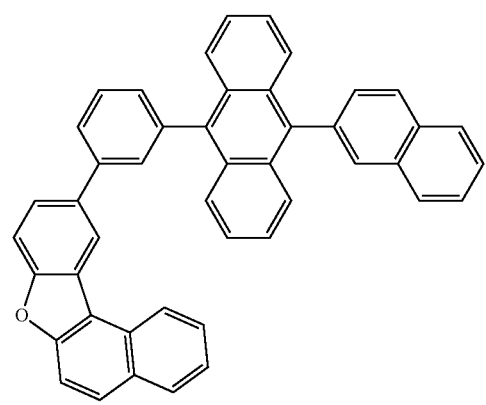
H93 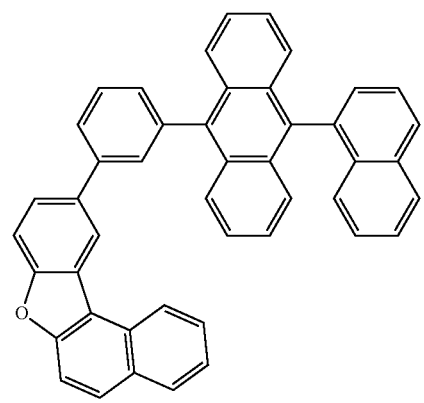
H94 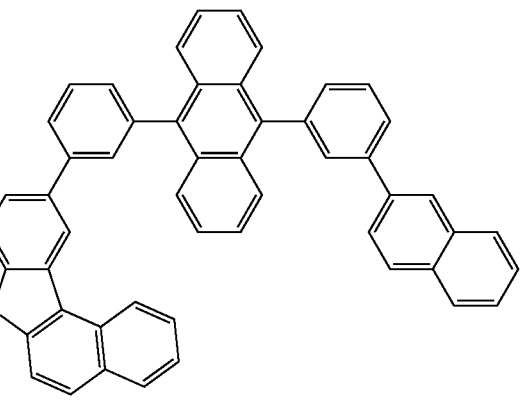
H95 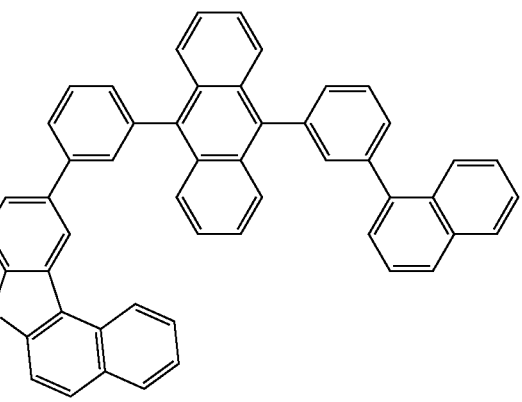
H96 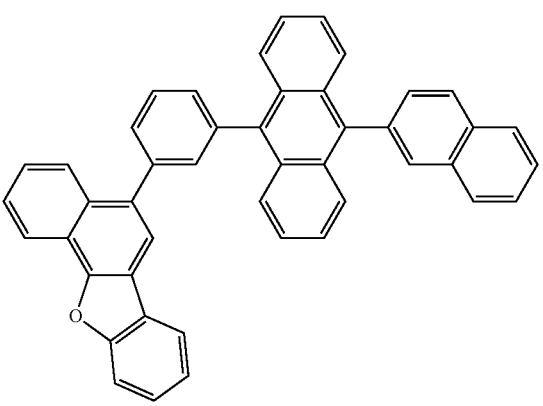
H97 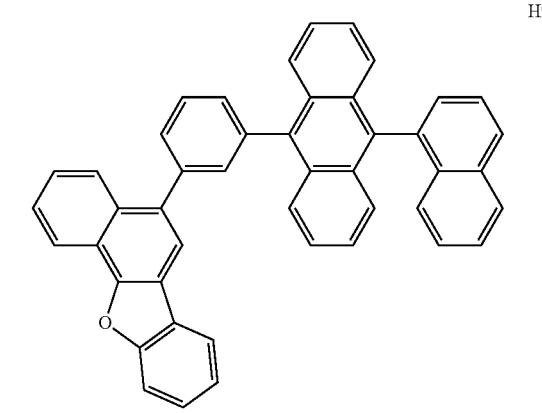
H98 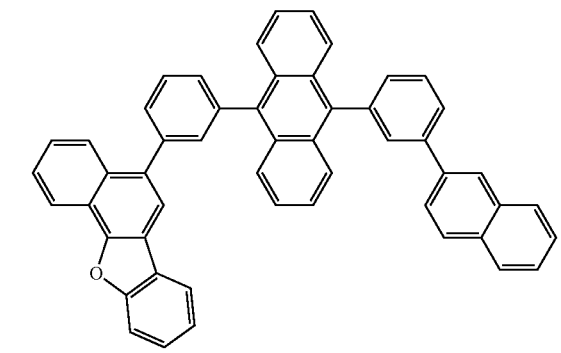
H99 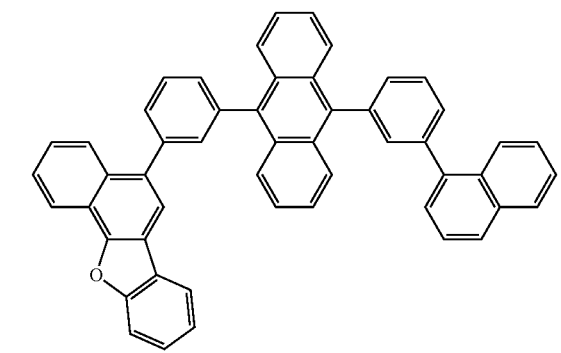

-continued
H100
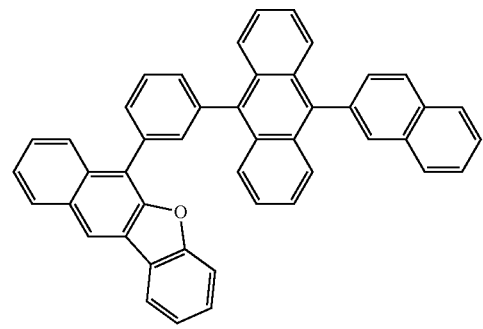
H101
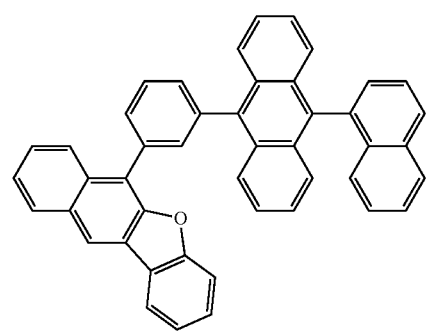
H102
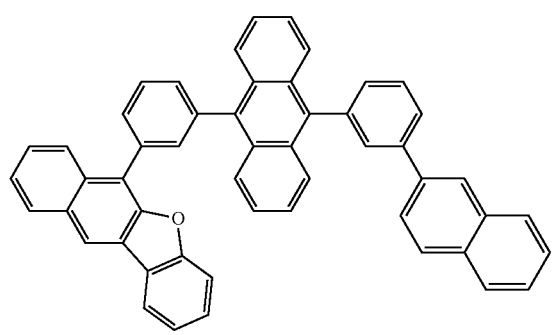
H103
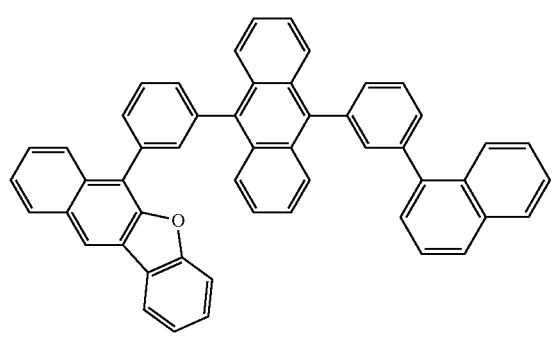
-continued
H104
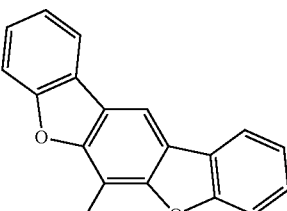
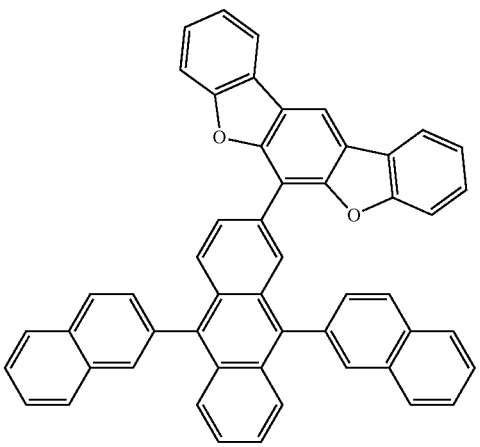
H105
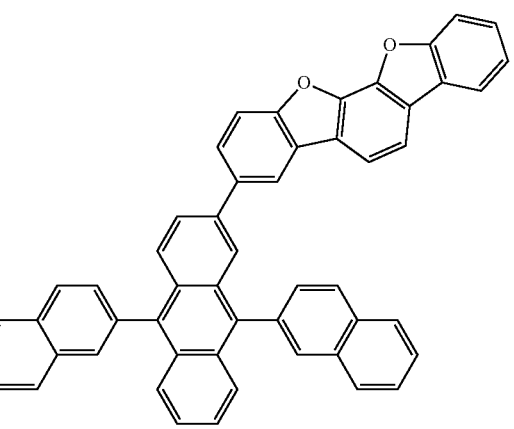
H106

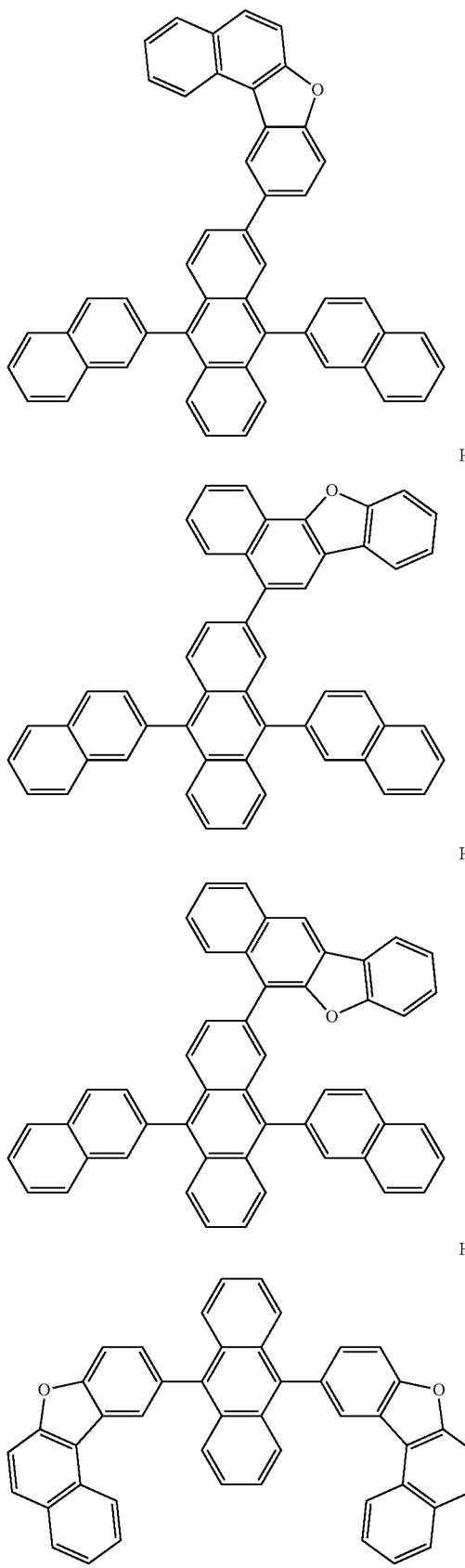
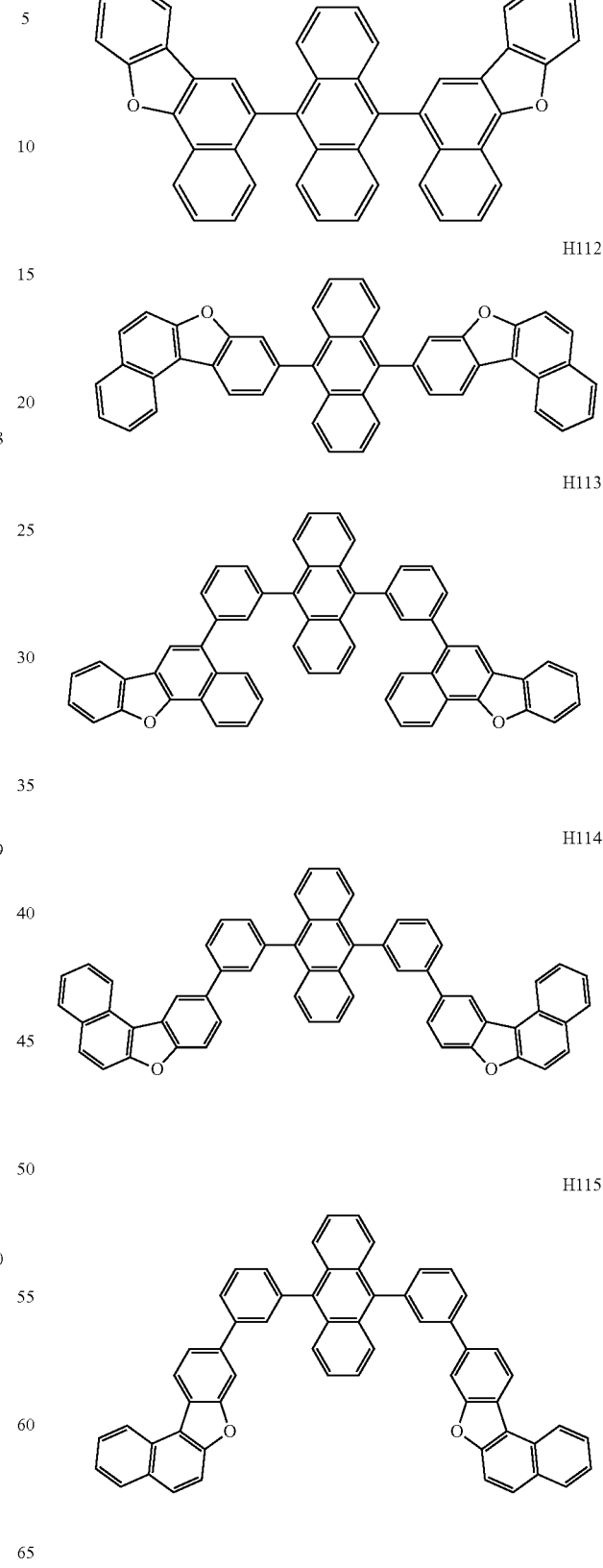

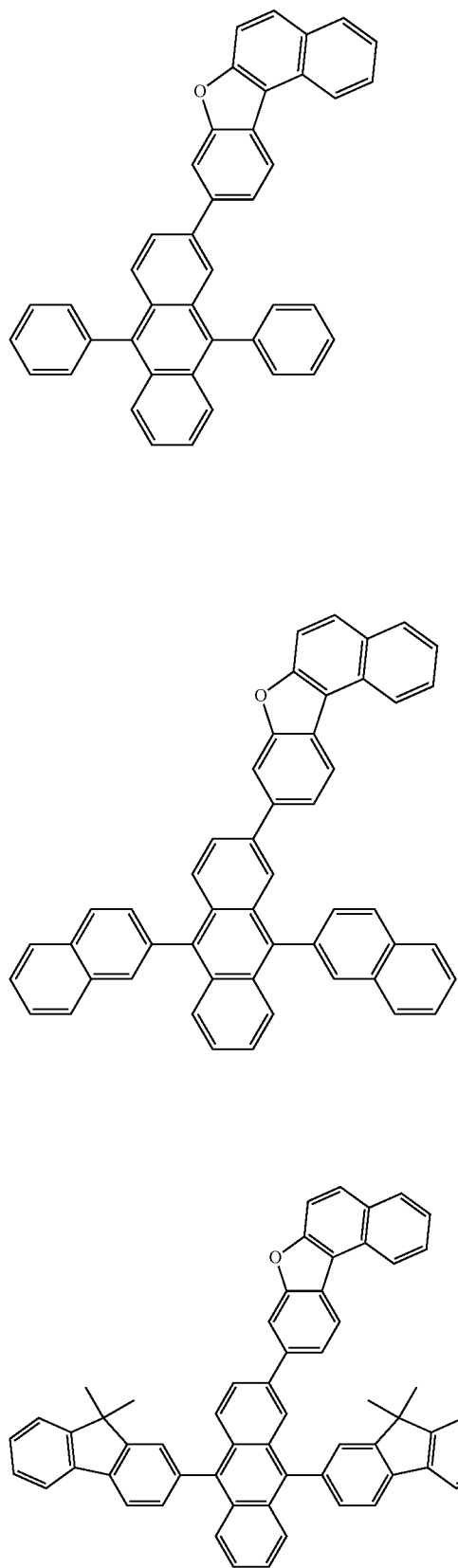
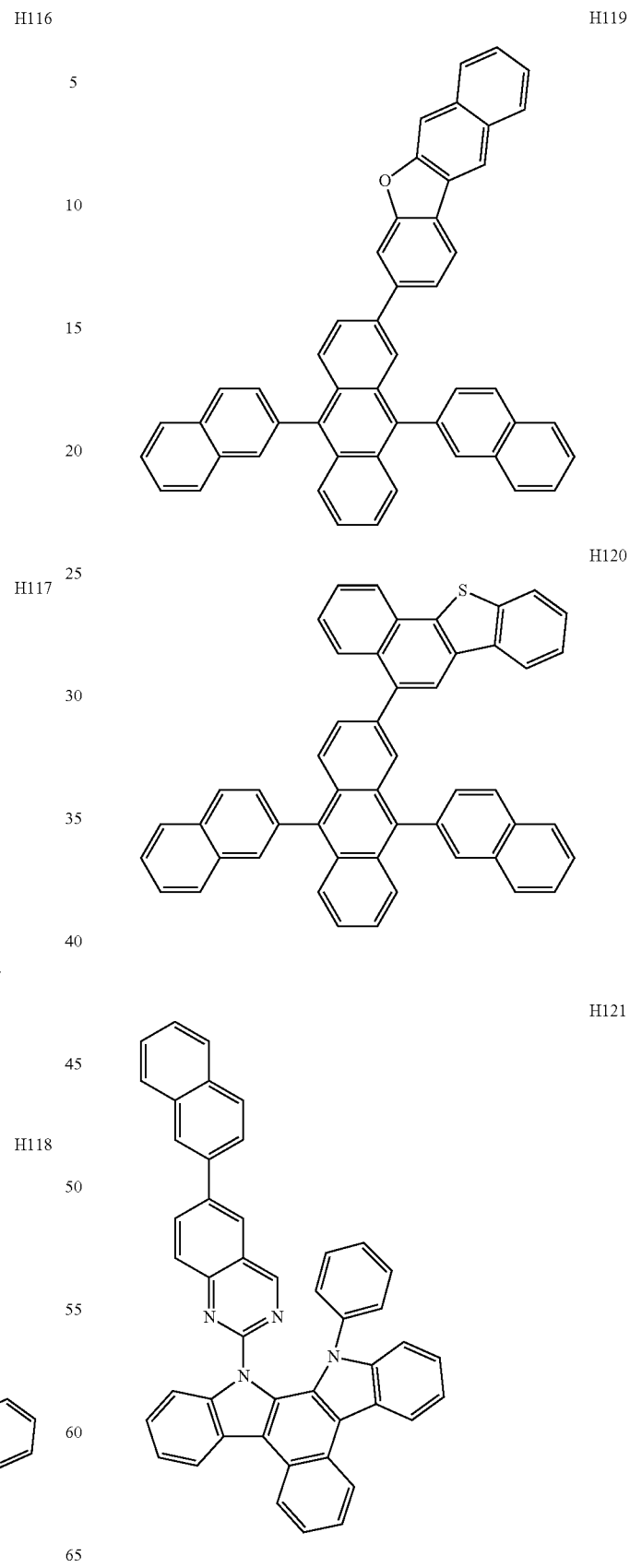

H122

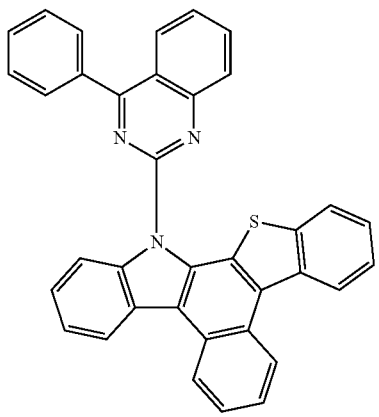

H123

H124

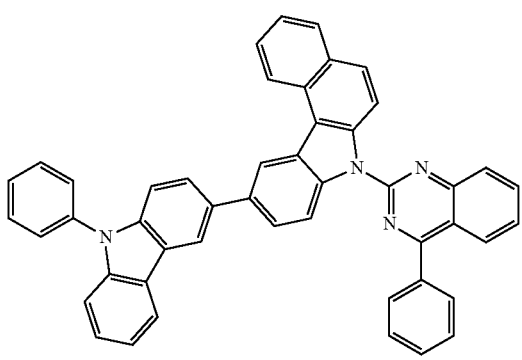

[Phosphorescent Dopant]

The emission layer may include, as a phosphorescent dopant, the organometallic compound represented by Formula 1 as described in the specification.

[Fluorescent Dopant]

The fluorescent dopant may include an amine group-containing compound, a styryl group-containing compound, or any combination thereof.

In an embodiment, the fluorescent dopant may include a compound represented by Formula 501:

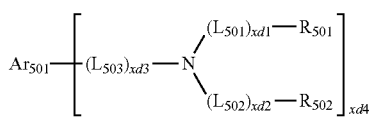

[Formula 501]

In Formula 501, $Ar_{501}$, $L_{501}$ to $L_{503}$, $R_{501}$, and $R_{502}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, xd1 to xd3 may each independently be 0, 1, 2, or 3, and xd4 may be 1, 2, 3, 4, 5, or 6.

In an embodiment, $Ar_{501}$ in Formula 501 may include a condensed cyclic group (for example, an anthracene group, a chrysene group, or a pyrene group) in which three or more monocyclic groups are condensed with each other.

In an embodiment, xd4 in Formula 501 may be 2.

In an embodiment, the fluorescent dopant may include one of following Compounds FD1 to FD36, DPVBi, DPAVBi, or any combination thereof:

135 136
FD1 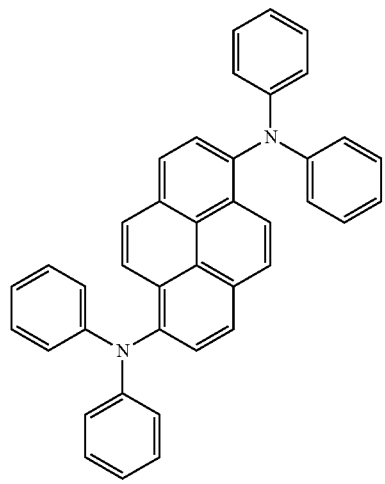 FD2 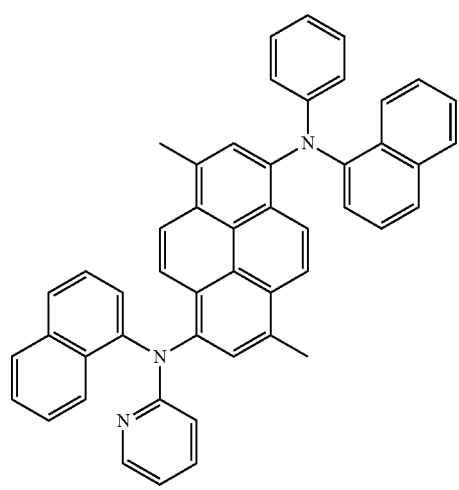
FD3 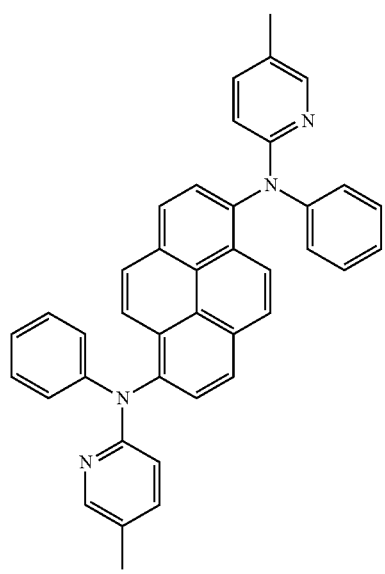 FD4 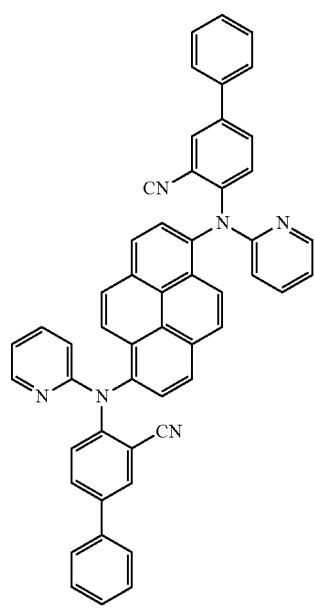
FD5 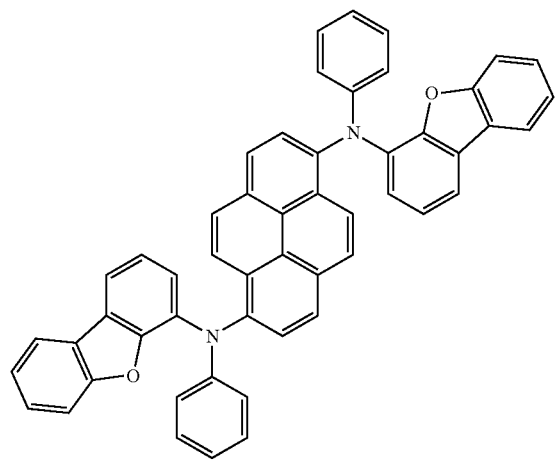 FD6 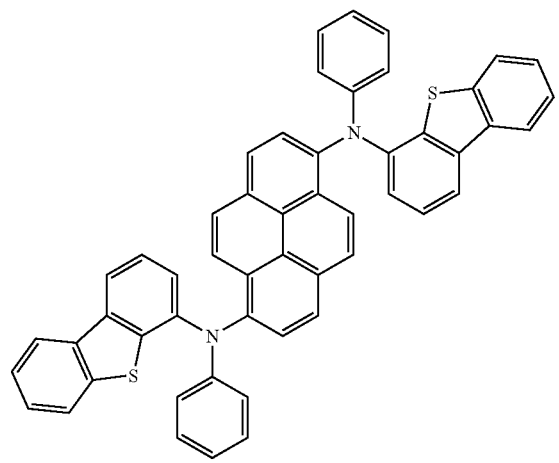

-continued
FD7
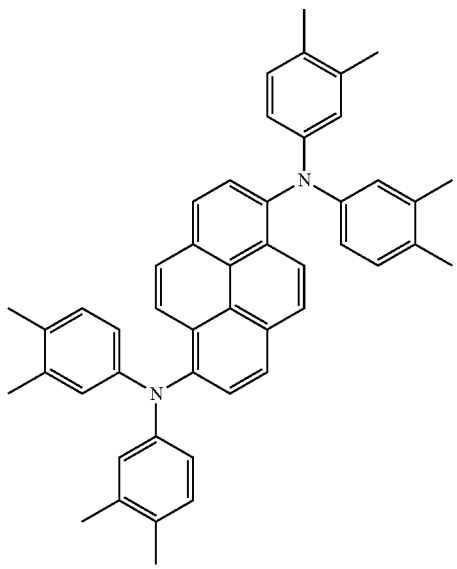
FD8
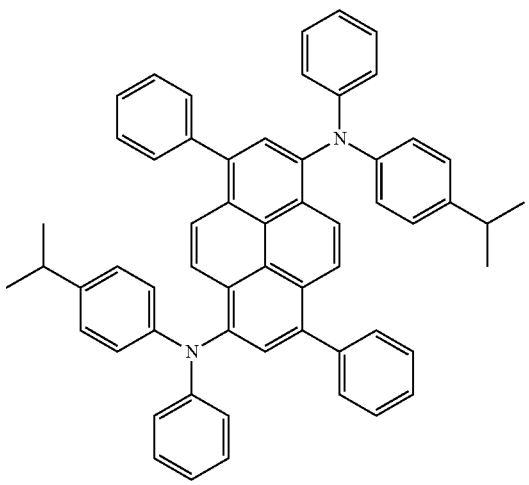
FD9
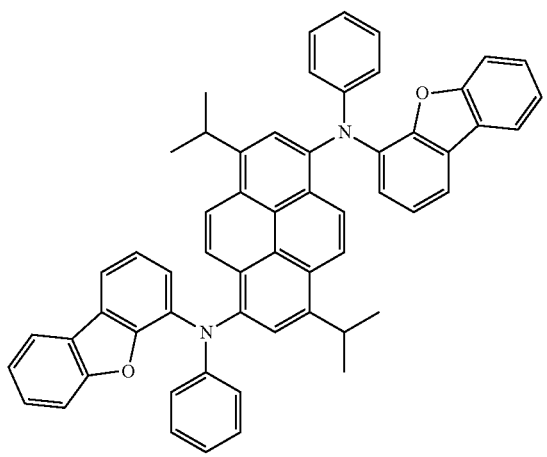
FD10
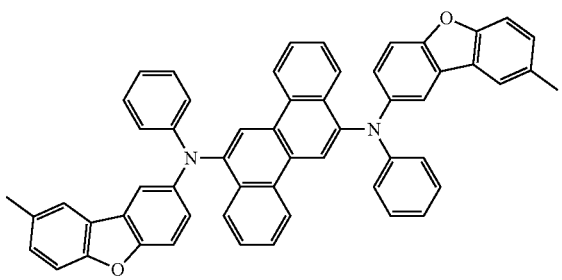
FD11
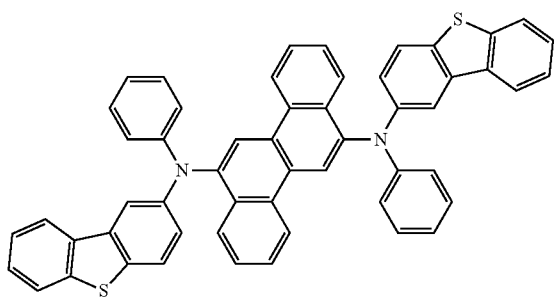
FD12
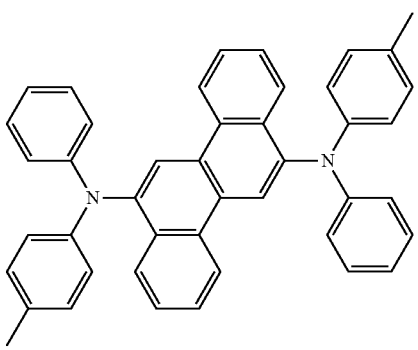

-continued
FD13
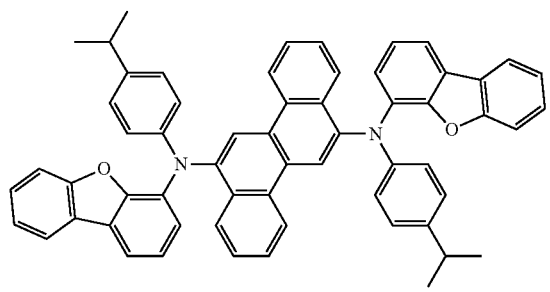
FD14
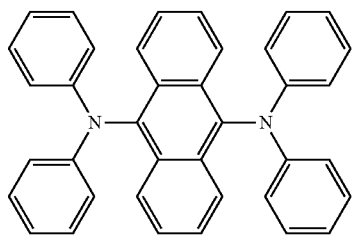
FD15
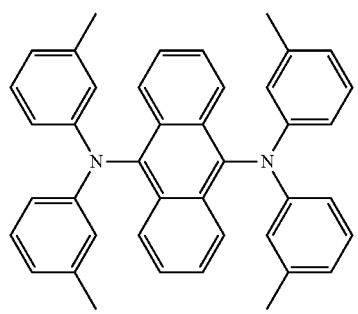
FD16
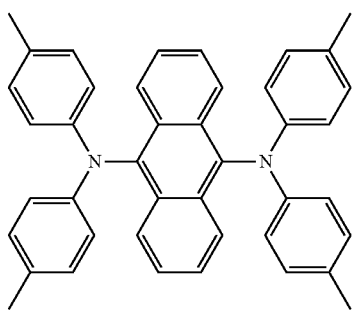
FD17
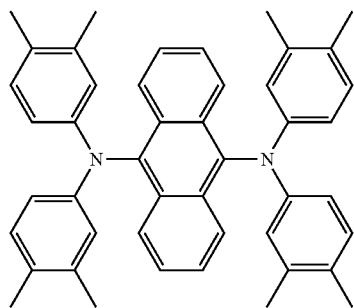
FD18
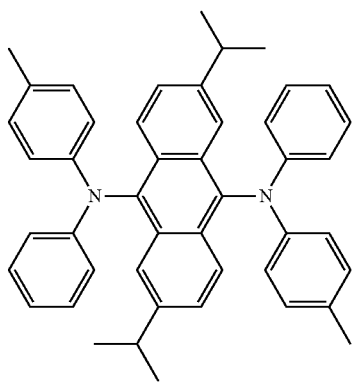
FD19
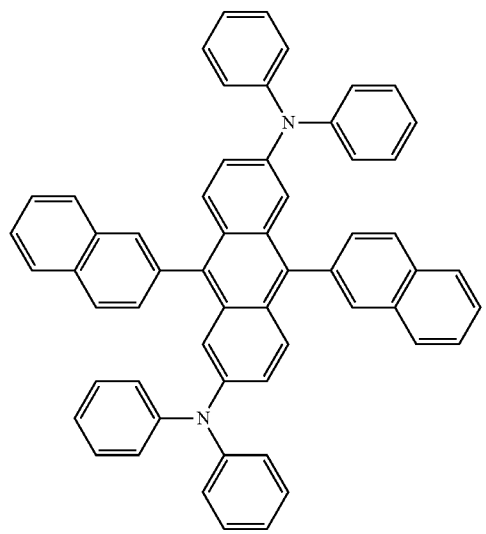
FD20
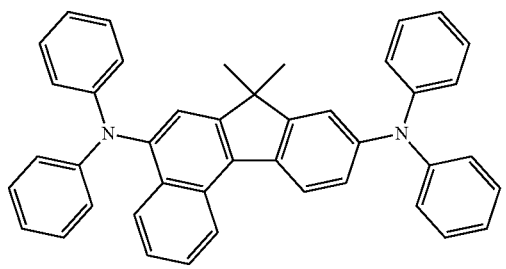

-continued
FD21
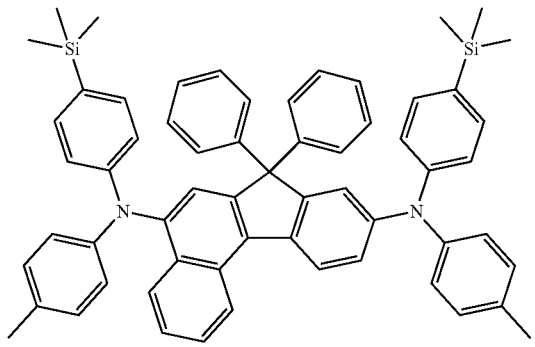
FD22
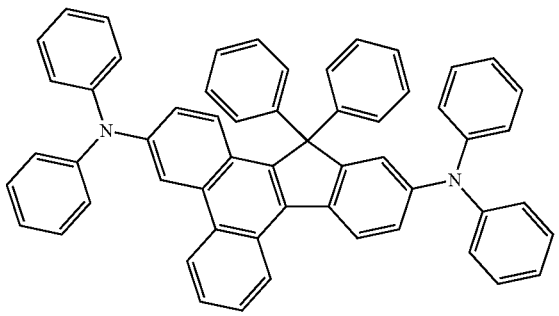
FD23
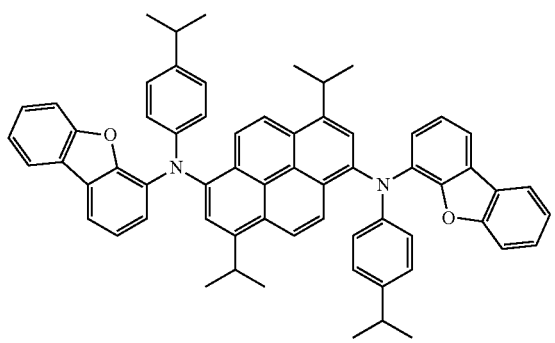
FD24
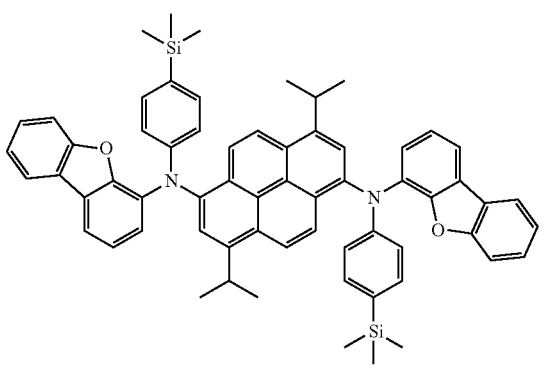
FD26
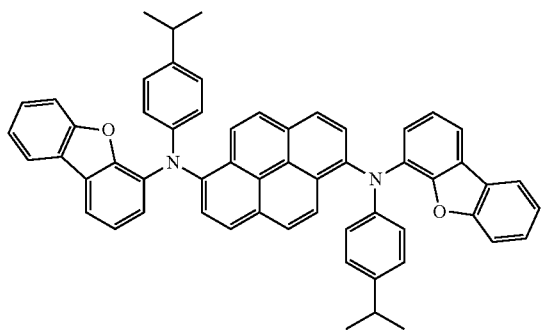
FD26
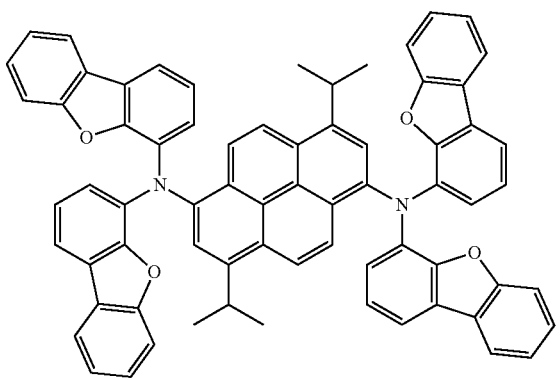
FD27
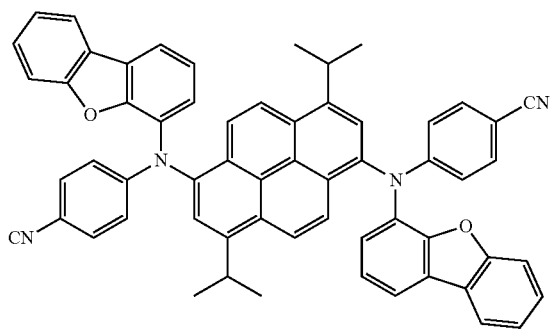
FD28
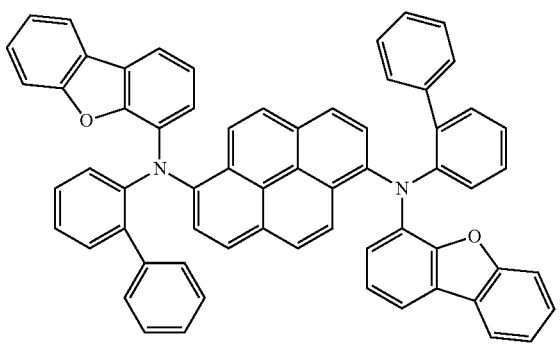

-continued
FD29
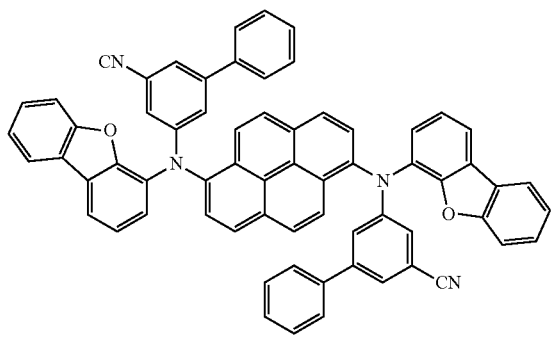
FD30
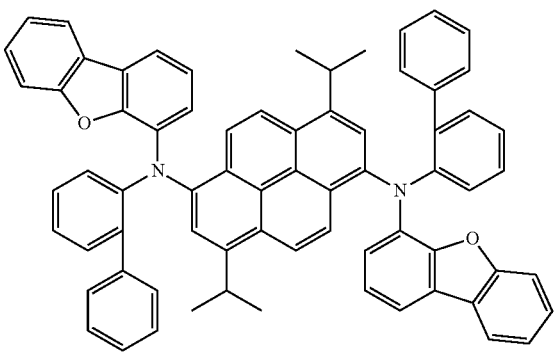
FD31
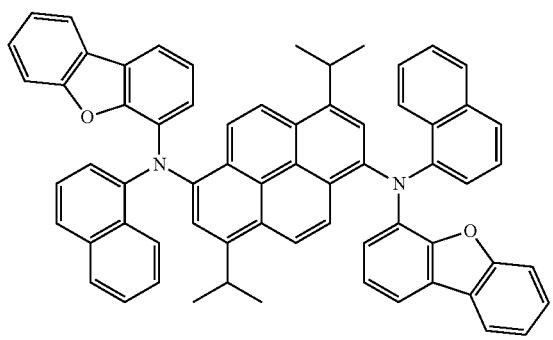
FD32
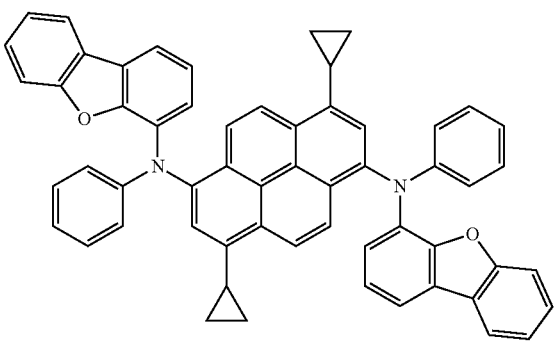
FD33
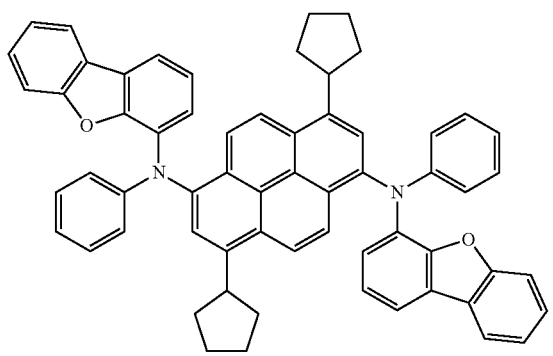
FD34
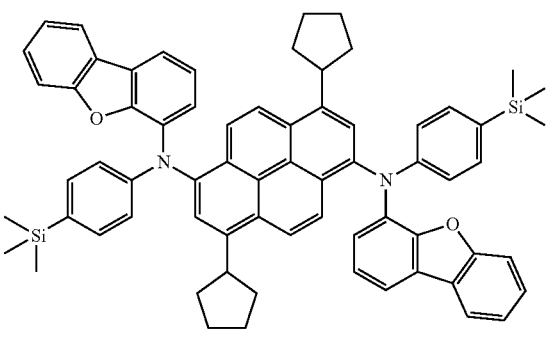
FD35
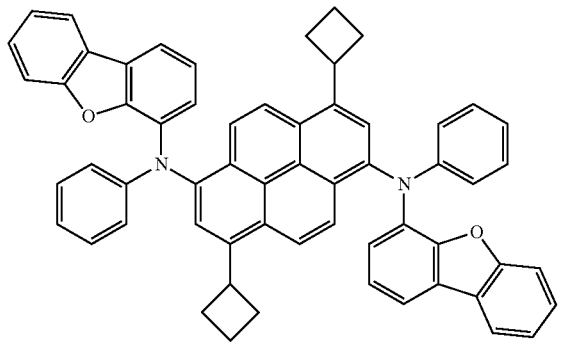
FD36
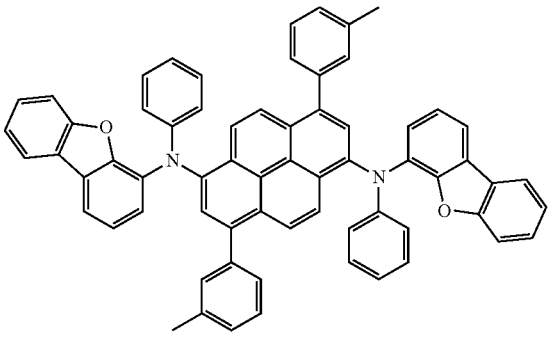

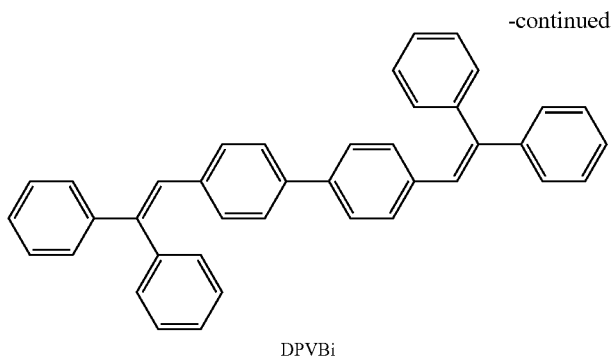
DPVBi

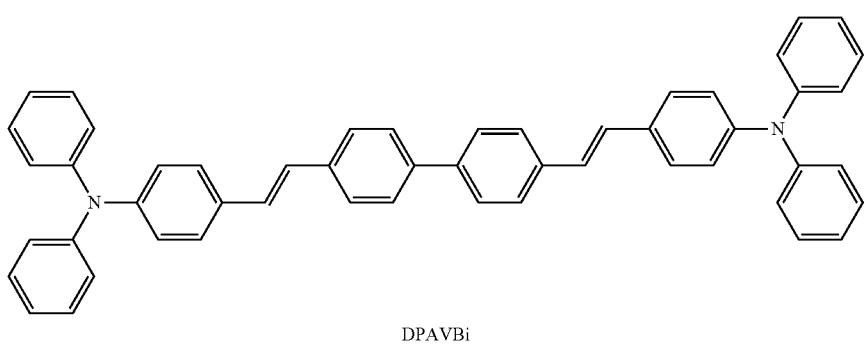
DPAVBi

[Delayed Fluorescence Material]

The emission layer may include a delayed fluorescence material.

The delayed fluorescence material used herein may be selected from any compound that is capable of emitting delayed fluorescent light based on a delayed fluorescent emission mechanism.

The delayed fluorescence material included in the emission layer may act as a host or a dopant depending on the type of other materials included in the emission layer.

In an embodiment, the difference between the triplet energy level (eV) of the delayed fluorescence material and the singlet energy level (eV) of the delayed fluorescence material may be in a range of about 0 eV to about 0.5 eV. When the difference between the triplet energy level (eV) of the delayed fluorescence material and the singlet energy level (eV) of the delayed fluorescence material satisfies the above-described range, up-conversion from the triplet state to the singlet state of the delayed fluorescence materials may effectively occur, and thus, the luminescence efficiency of the light-emitting device 10 may be improved.

In an embodiment, the delayed fluorescence material may include i) a material that includes at least one electron donor (for example, a π electron-rich $C_3$-$C_{60}$ cyclic group, such as a carbazole group) and at least one electron acceptor (for example, a sulfoxide group, a cyano group, or a π-electron-deficient nitrogen-containing $C_1$-$C_{60}$ cyclic group), ii) a material including a $C_8$-$C_{60}$ polycyclic group in which two or more cyclic groups share boron (B) and are condensed with each other.

The delayed fluorescence material may include at least one of Compounds DF1 to DF9:

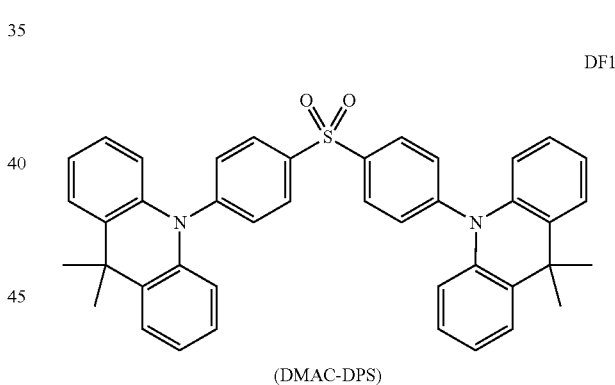
(DMAC-DPS)

DF1

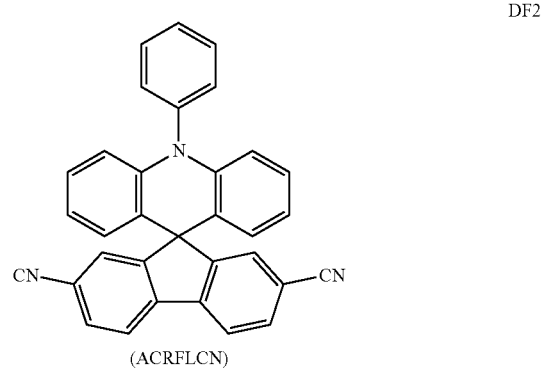
(ACRFLCN)

DF2

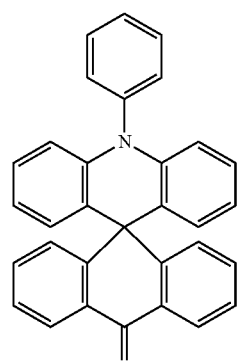
(ACRSA)

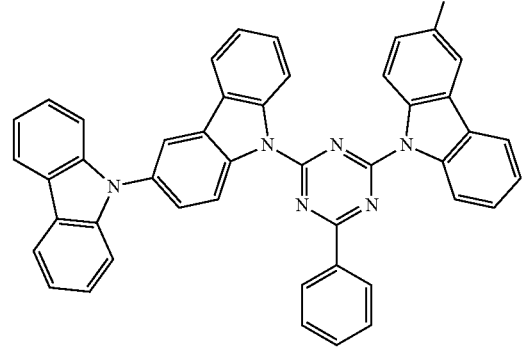
(CC2TA)

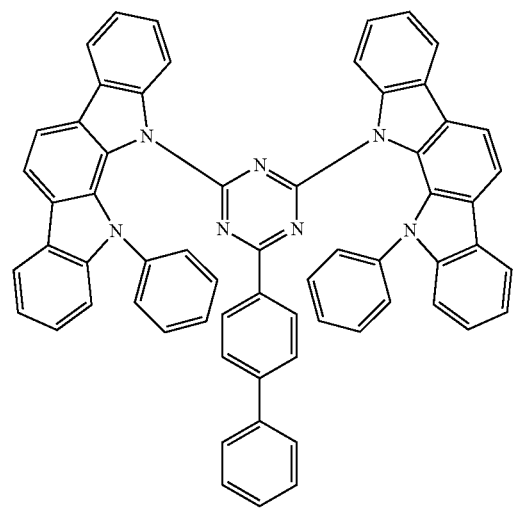
(PIC-TRZ)

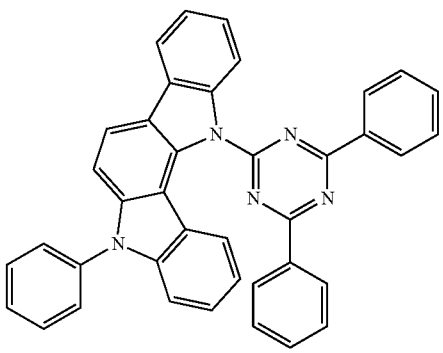
(PIC-TRZ2)

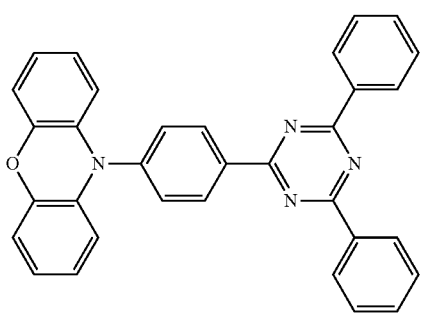
(PXZ-TRZ)

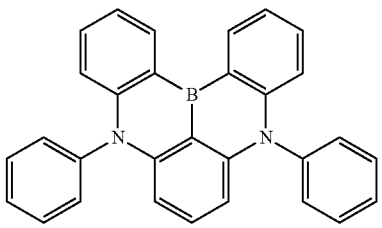
(DABNA-1)

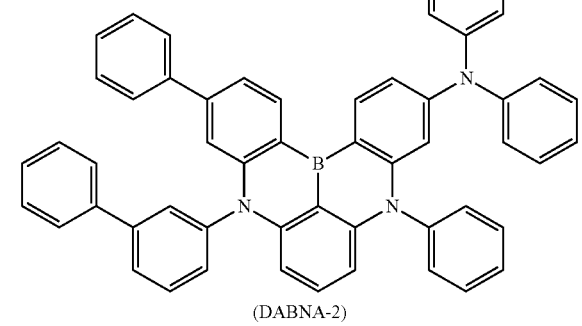
(DABNA-2)

[Quantum Dot]

The emission layer may include a quantum dot.

The quantum dot used herein refers to a crystal of a semiconductor compound, and may include any material that is capable of emitting light of various emission wavelengths depending on a size of the crystal.

A diameter of the quantum dot may be, for example, in a range of about 1 nm to about 10 nm.

The quantum dot may be synthesized by a wet chemical process, an organometallic chemical vapor deposition process, a molecular beam epitaxy process, or a similar process.

The wet chemical process refers to a method in which an organic solvent and a precursor material are mixed, and a quantum dot particle crystal is grown. When the crystal grows, the organic solvent acts as a dispersant naturally coordinated on the surface of the quantum dot crystal and controls the growth of the crystal. Accordingly, by using a process that is easily performed at low costs compared to a vapor deposition process, such as a metal organic chemical vapor deposition (MOCVD) process and a molecular beam epitaxy (MBE) process, the growth of quantum dot particles may be controlled.

The quantum dot may include a Groups III-VI semiconductor compound, a Groups II-VI semiconductor compound, a Groups III-V semiconductor compound, a Group I-III-VI semiconductor compound, a Groups IV-VI semiconductor compound, a Group IV element or compound, or any combination thereof.

Examples of the Groups III-VI semiconductor compound may include a binary compound, such as $In_2S_3$.

Examples of the Groups II-VI semiconductor compound may include: a binary compound, such as CdS, CdSe, CdTe, ZnS, ZnSe, ZnTe, ZnO, HgS, HgSe, HgTe, MgSe, or MgS; a ternary compound, such as CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, or MgZnS; a quaternary compound, such as CdZnSeS, CdZnSeTe, CdZnSTe, CdHgSeS, CdHgSeTe, CdHgSTe, HgZnSeS, HgZnSeTe, or HgZnSTe; or any combination thereof.

Examples of the Groups III-V semiconductor compound may include: a binary compound, such as GaN, GaP, GaAs, GaSb, AlN, AlP, AlAs, AlSb, InN, InP, InAs, or InSb; a ternary compound, such as GaNP, GaNAs, GaNSb, GaPAs, GaPSb, AlNP, AlNAs, AlNSb, AlPAs, AlPSb, InGaP, InNP, InAlP, InNAs, InNSb, InPAs, or InPSb; a quaternary compound, such as GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, or InAlPSb; or any combination thereof. In an embodiment, the Groups III-V semiconductor compound may further include a Group II element. Examples of the Groups III-V semiconductor compound further including a Group II element may include InZnP, InGaZnP, or InAlZnP.

Examples of the Groups III-VI semiconductor compound may include: a binary compound, such as GaS, GaSe, $Ga_2Se_3$, GaTe, InS, InSe, $In_2Se_3$, or InTe; a ternary compound, such as $InGaS_3$ or $InGaSe_3$; or any combination thereof.

Examples of the Groups I-III-VI semiconductor compound may include: a ternary compound such as AgInS, $AgInS_2$, CuInS, $CuInS_2$, $CuGaO_2$, $AgGaO_2$, or $AgAlO_2$; or any combination thereof.

Examples of the Group IV-VI semiconductor compound may include: a binary compound, such as SnS, SnSe, SnTe, PbS, PbSe, or PbTe; a ternary compound, such as SnSeS, SnSeTe, SnSTe, PbSeS, PbSeTe, PbSTe, SnPbS, SnPbSe, or SnPbTe; a quaternary compound, such as SnPbSSe, SnPbSeTe, or SnPbSTe; or any combination thereof.

The Group IV element or compound may include a single element compound, such as Si or Ge; a binary compound, such as SiC or SiGe; or any combination thereof.

Each element included in the multi-element compound such as the binary compound, the ternary compound, and the quaternary compound may be present in a particle at a uniform concentration or a non-uniform concentration.

The quantum dot may have a single structure having a uniform concentration of each element included in the corresponding quantum dot or a dual structure of a core-shell. In an embodiment, a material included in the core may be different from a material included in the shell.

The shell of the quantum dot may function as a protective layer for maintaining semiconductor characteristics by preventing chemical degeneration of the core and/or may function as a charging layer for imparting electrophoretic characteristics to the quantum dot. The shell may be a single layer or a multilayer. An interface between the core and the shell may have a concentration gradient in which the concentration of elements existing in the shell decreases toward the center.

Examples of the shell of the quantum dot are an oxide of a metal or a non-metal, a semiconductor compound, or any combination thereof. Examples of the oxide of metal or non-metal may include a binary compound, such as $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $CO_3O_4$, or NiO; a ternary compound, such as $MgAl_2O_4$, $CoFe_2O_4$, $NiFe_2O_4$, or $CoMn_2O_4$; or any combination thereof. Examples of the semiconductor compound are, as described herein, a Groups III-VI semiconductor compound, a Groups II-VI semiconductor compound, a Groups III-V semiconductor compound, a Groups I-III-VI semiconductor compound, a Groups IV-VI semiconductor compound, or any combination thereof. In an embodiment, the semiconductor compound may include CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, AlSb, or any combination thereof.

A full width at half maximum (FWHM) of an emission wavelength spectrum of the quantum dot may be equal to or less than about 45 nm. For example, a FWHM of an emission wavelength spectrum of the quantum dot may be equal to or less than about 40 nm. For example, a FWHM of an emission wavelength spectrum of the quantum dot may be equal to or less than about 30 nm. When the FWHM of the emission wavelength spectrum of the quantum dot is within this range, color purity or color reproduction may be improved. Light emitted through such a quantum dot may be irradiated omnidirectionally. Accordingly, a wide viewing angle may be increased.

The quantum dot may be a spherical nanoparticle, a pyramidal nanoparticle, a multi-arm nanoparticle, a cubic nanoparticle, a nanotube particle, a nanowire particle, a nanofiber particle, or a nanoplate particle.

By adjusting a size of the quantum dot, the energy band gap may also be adjusted, and thus the quantum dot emission layer may obtain light of various wavelengths. Therefore, by using quantum dots of different sizes, a light-emitting device that emits light of various wavelengths may be implemented. In an embodiment, the size of the quantum dot may be selected to emit red, green and/or blue light. The size of the quantum dot may be adjusted such that light of various colors are combined to emit white light.

[Electron Transport Region in Interlayer 130]

The electron transport region may have: i) a single-layered structure consisting of a single layer consisting of a single material, ii) a single-layered structure consisting of a single layer including different materials, or iii) a multi-layered structure including multiple layers including different materials.

The electron transport region may include a buffer layer, a hole blocking layer, an electron control layer, an electron transport layer, an electron injection layer, or any combination thereof.

For example, the electron transport region may have an electron transport layer/electron injection layer structure, a hole blocking layer/electron transport layer/electron injection layer structure, an electron control layer/electron transport layer/electron injection layer structure, or a buffer layer/electron transport layer/electron injection layer structure, wherein, for each structure, constituting layers are sequentially stacked from an emission layer.

The electron transport region (for example, the buffer layer, the hole blocking layer, the electron control layer, or the electron transport layer in the electron transport region) may include a metal-free compound including at least one π-electron-deficient nitrogen-containing $C_1$-$C_{60}$ cyclic group.

In an embodiment, the electron transport region may include a compound represented by Formula 601.

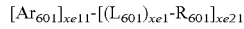

[Formula 601]

In Formula 601,

Ar$_{601}$ and L$_{601}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, xe11 may be 1, 2, or 3, xe1 may be 0, 1, 2, 3, 4, or 5, R$_{601}$ may be a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, —Si(Q$_{601}$)(Q$_{602}$)(Q$_{603}$), —C(=O)(Q$_{601}$), —S(=O)$_2$(Q$_{601}$), or —P(=O)(Q$_{601}$)(Q$_{602}$), Q$_{601}$ to Q$_{603}$ are the same as described in connection with Q$_1$ in the specification, xe21 may be 1, 2, 3, 4, or 5, and at least one of Ar$_{601}$, L$_{601}$, and R$_{601}$ may each independently be a π electron-deficient nitrogen-containing $C_1$-$C_{60}$ cyclic group unsubstituted or substituted with at least one $R_{10a}$.

In an embodiment, when xe11 in Formula 601 is 2 or more, two or more of Ar$_{601}$(s) may be linked to each other via a single bond.

In an embodiment, Ar$_{601}$ in Formula 601 may be a substituted or unsubstituted anthracene group.

In an embodiment, the electron transport region may include a compound represented by Formula 601-1:

[Formula 601-1]

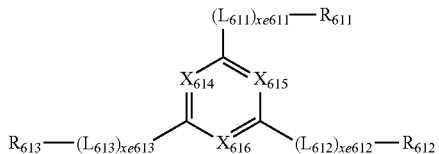

In Formula 601-1,

X$_{614}$ may be N or C(R$_{614}$), X$_{615}$ may be N or C(R$_{615}$), X$_{616}$ may be N or C(R$_{616}$), at least one of X$_{614}$ to X$_{616}$ may be N, L$_{611}$ to L$_{613}$ are the same as described in connection with L$_{601}$, xe611 to xe613 are the same as described in connection with xe1, R$_{611}$ to R$_{613}$ are the same as described in connection with R$_{601}$, and R$_{614}$ to R$_{616}$ may each independently be hydrogen, deuterium, —F, —Cl, —Br, —I, a hydroxyl group, a cyano group, a nitro group, a $C_1$-$C_{20}$ alkyl group, a $C_1$-$C_{20}$ alkoxy group, a $C_3$-$C_{60}$ carbocyclic group unsubstituted or substituted with at least one $R_{10a}$, or a $C_1$-$C_{60}$ heterocyclic group unsubstituted or substituted with at least one $R_{10a}$.

In an embodiment, xe1 and xe611 to xe613 in Formulae 601 and 601-1 may each independently be 0, 1, or 2.

The electron transport region may include one of following Compounds ET1 to ET45, 2,9-dimethyl-4,7-diphenyl-1,10-phenanthroline (BCP), 4,7-diphenyl-1,10-phenanthroline (Bphen), Alq$_3$, BAlq, TAZ, NTAZ, or any combination thereof:

ET1

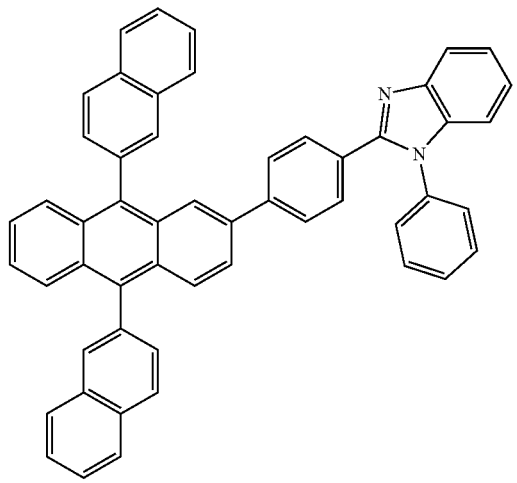

ET2

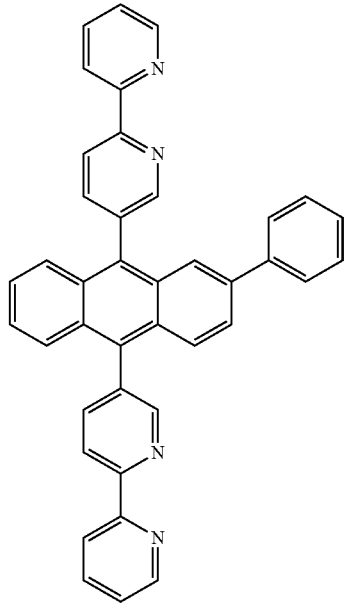

ET3
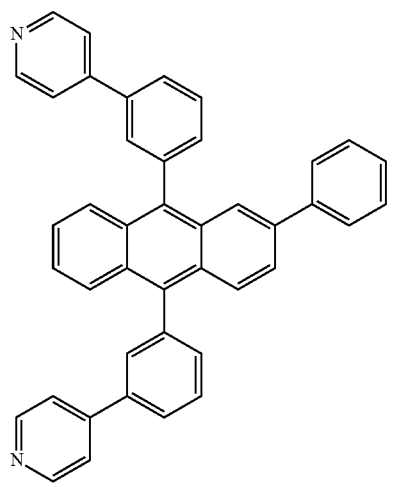
ET4
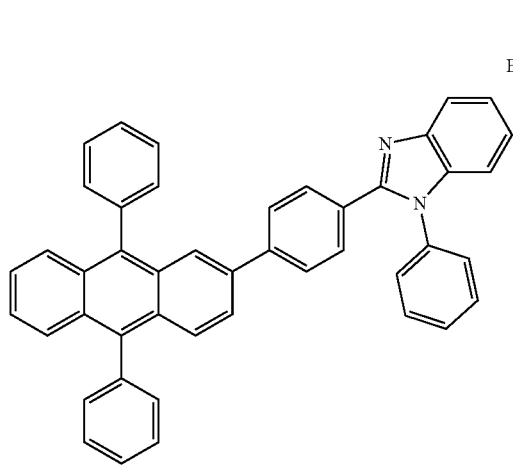
ET5
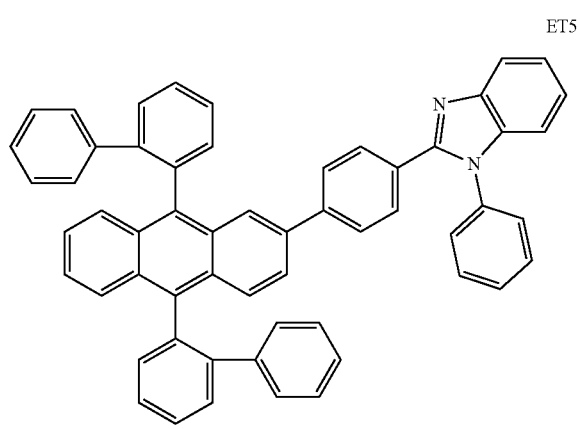
ET6
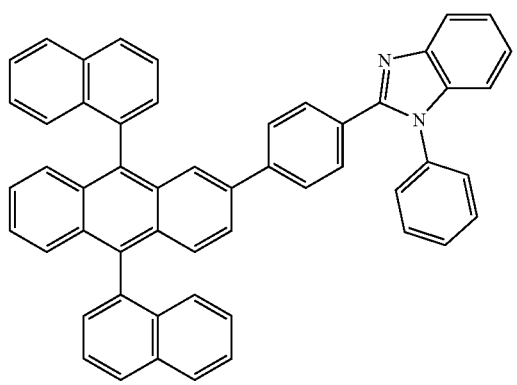
ET7
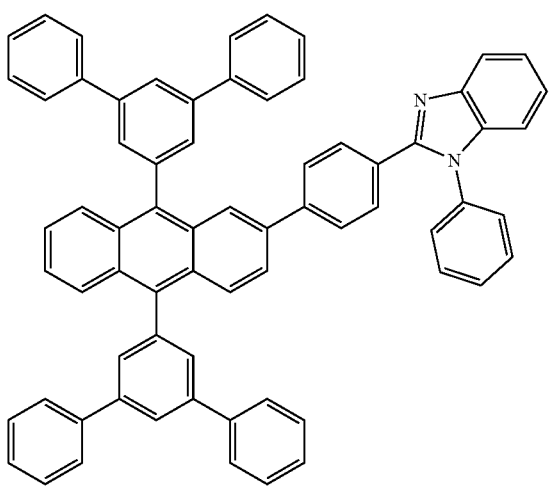
ET8
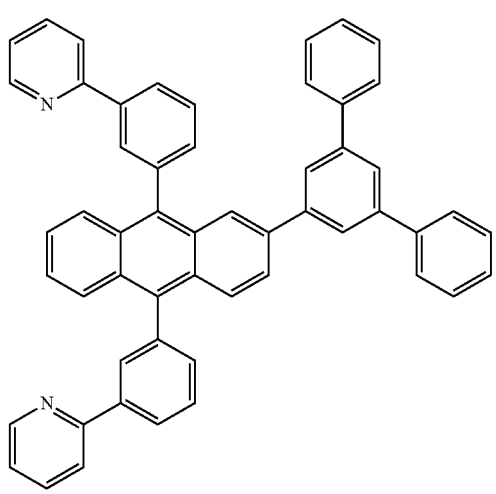

ET9
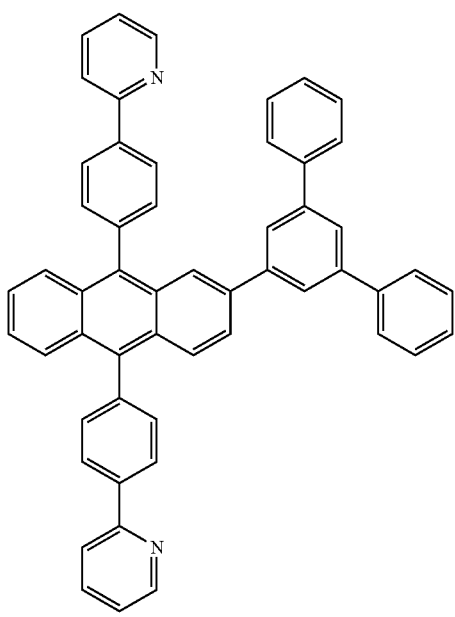
ET11
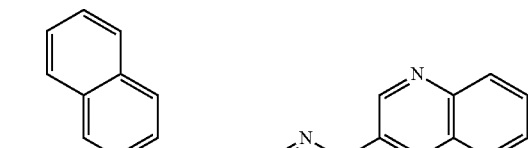
ET12
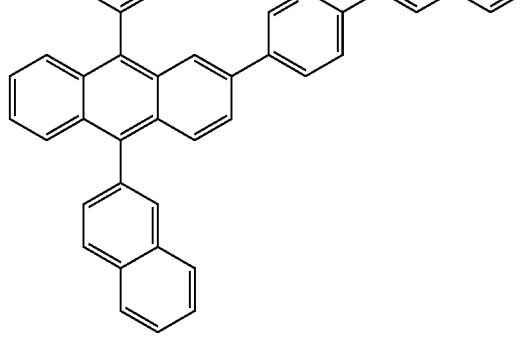
ET10
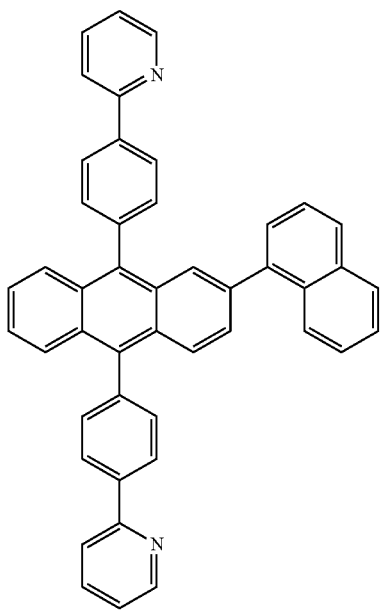
ET13
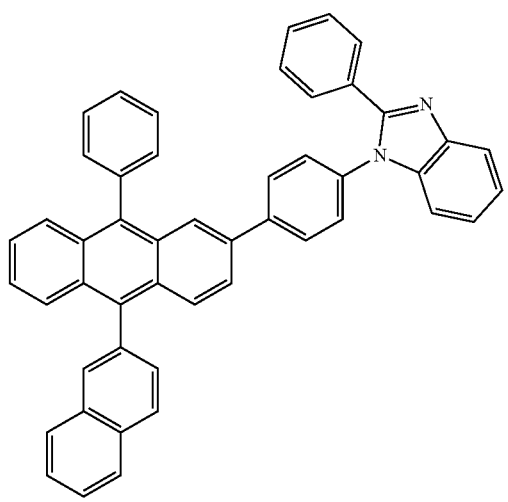

-continued
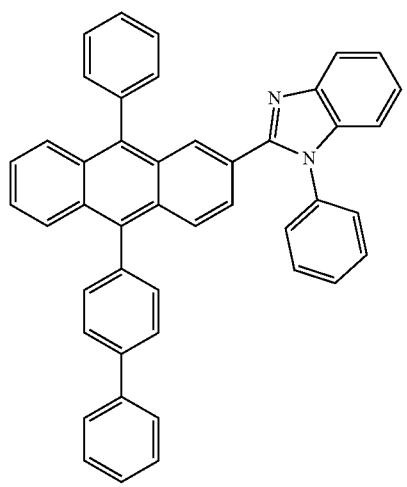
ET14
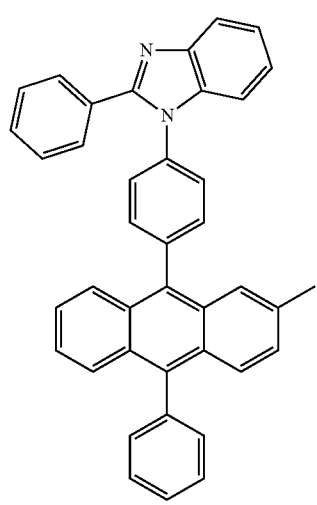
ET15
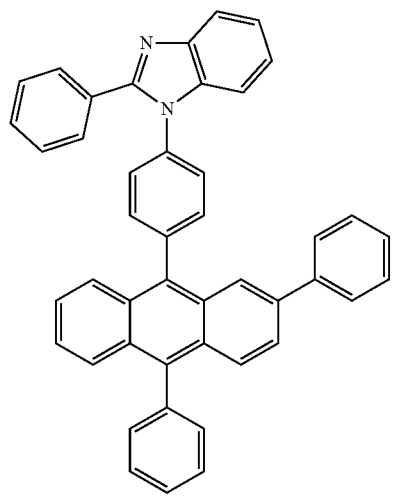
ET16
-continued
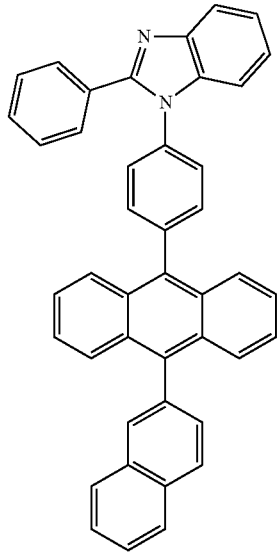
ET17
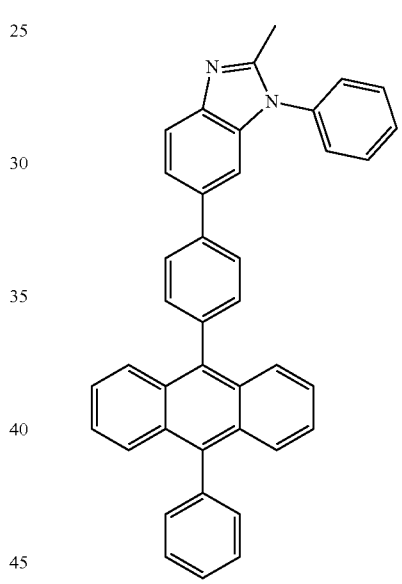
ET18
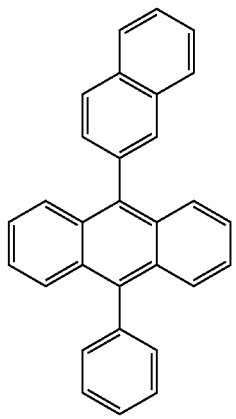
ET19

ET20
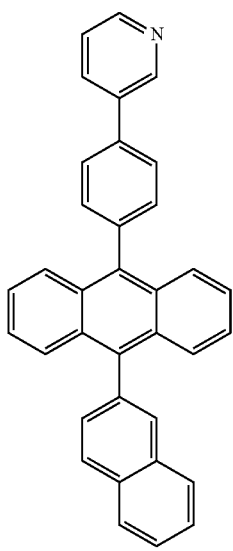
ET21
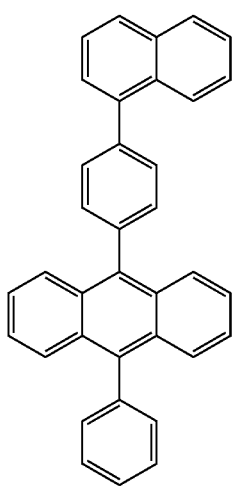
ET22
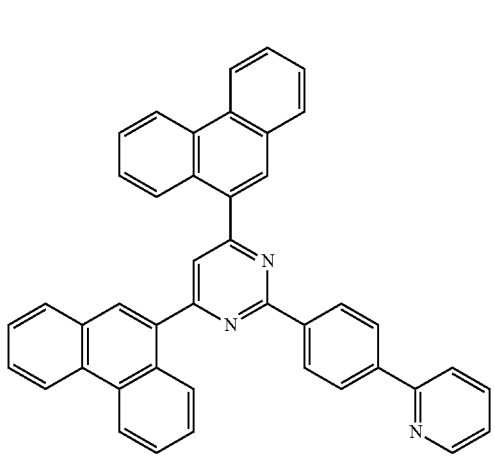
ET23
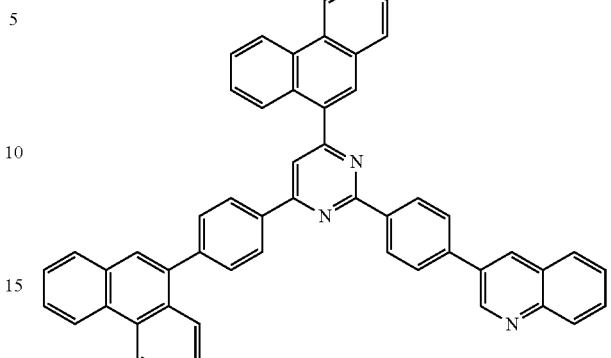
ET24
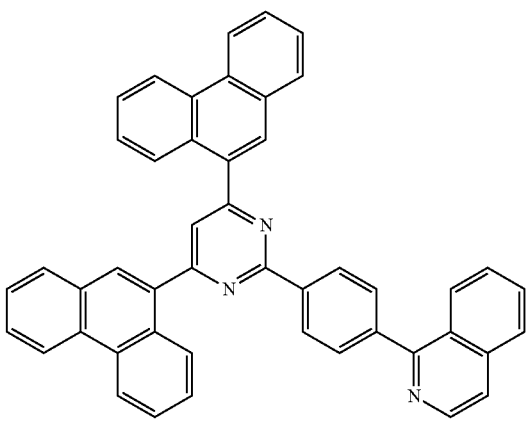
ET25
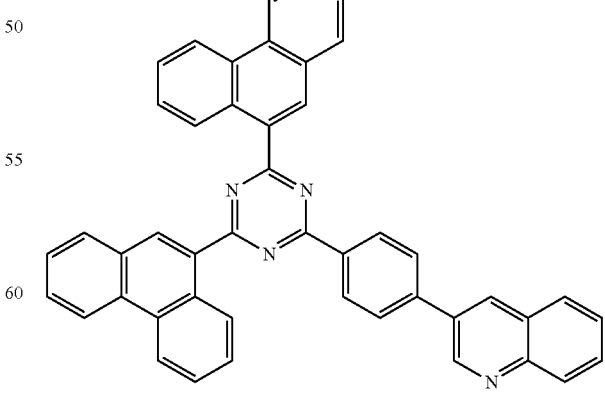

ET26
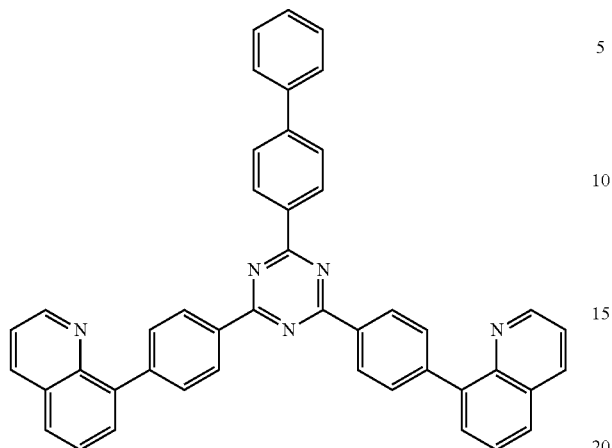
ET27
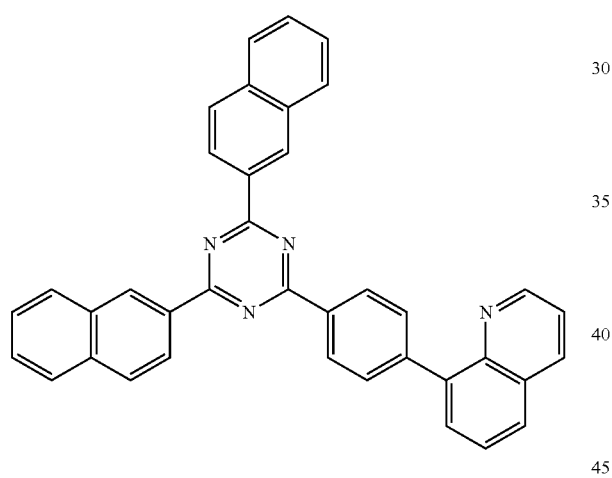
ET28
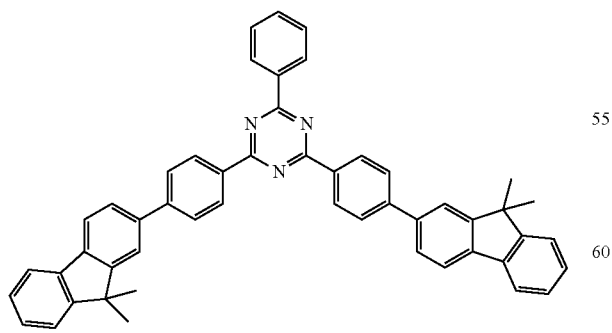
ET29
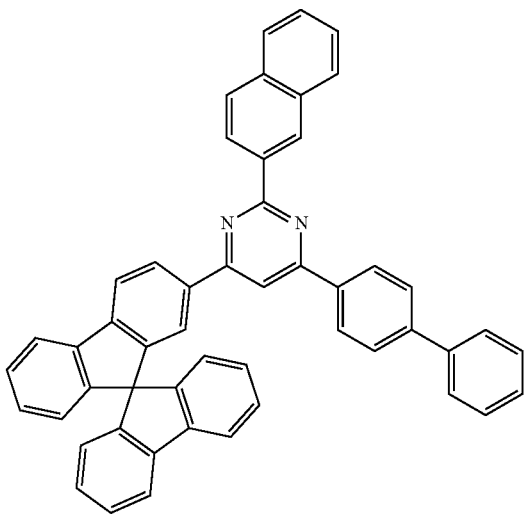
ET30
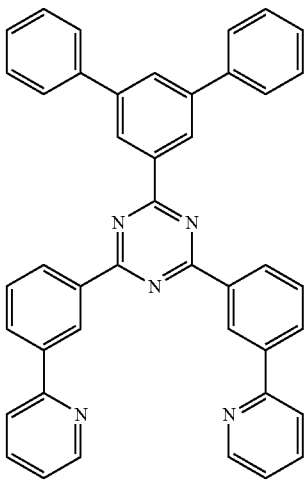
ET31
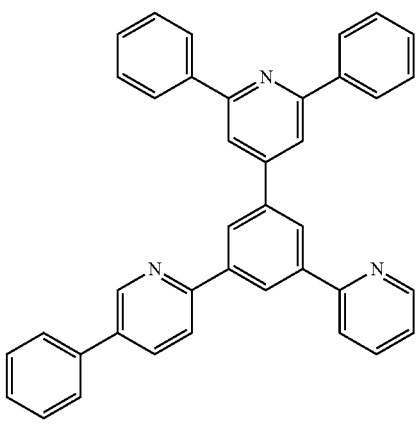

ET32
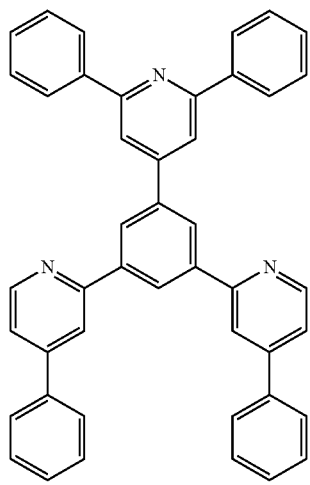
ET33
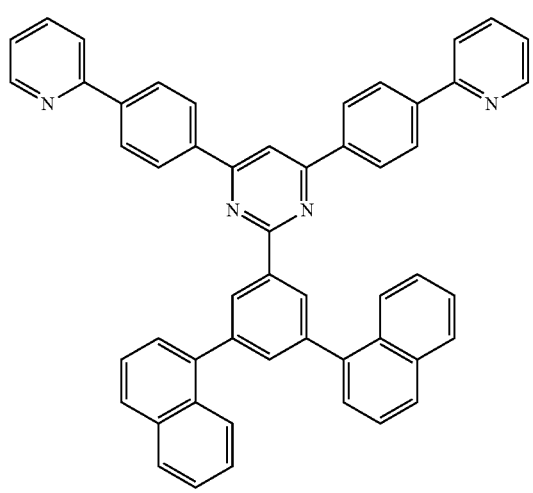
ET34
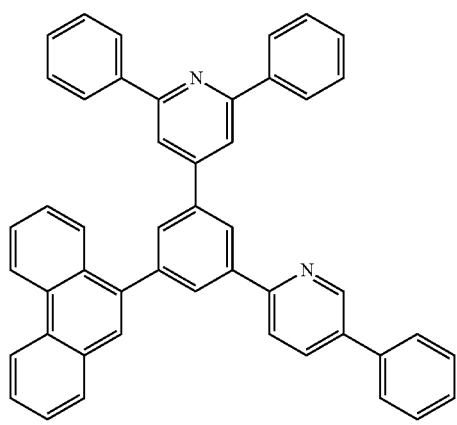
ET35
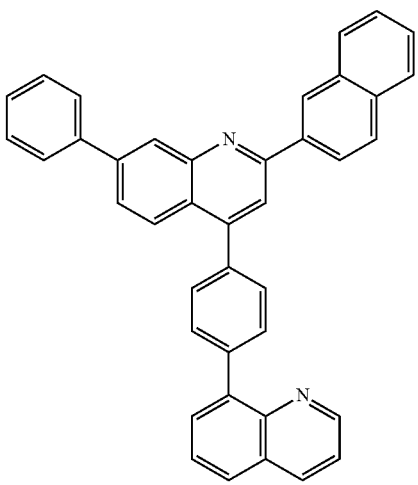
ET36
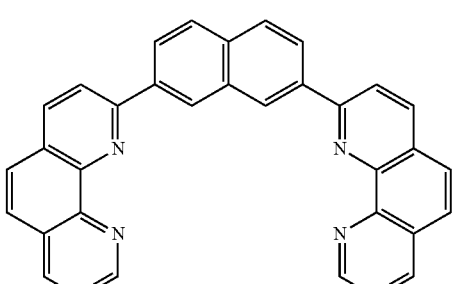
ET37
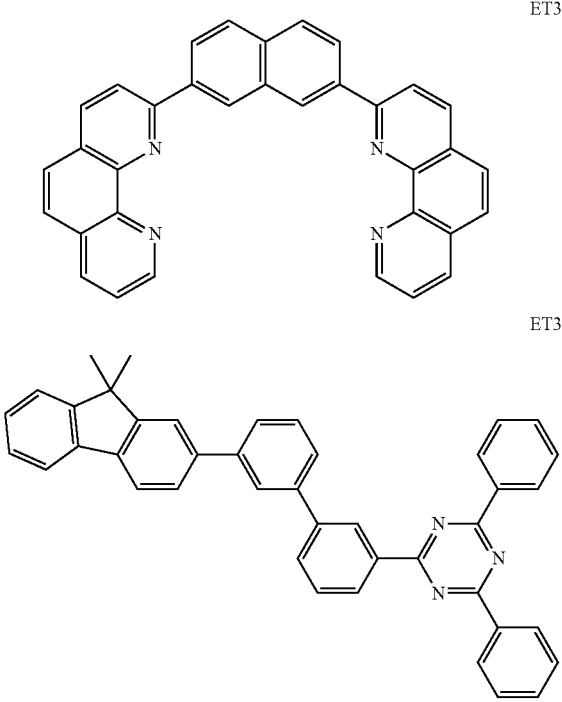
ET38
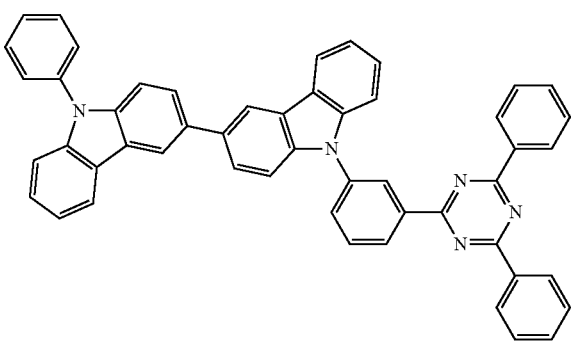

ET39
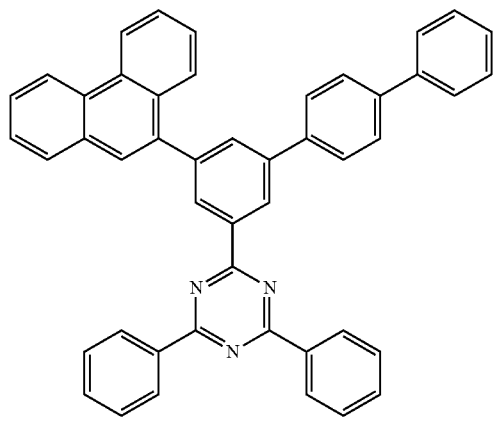
ET40
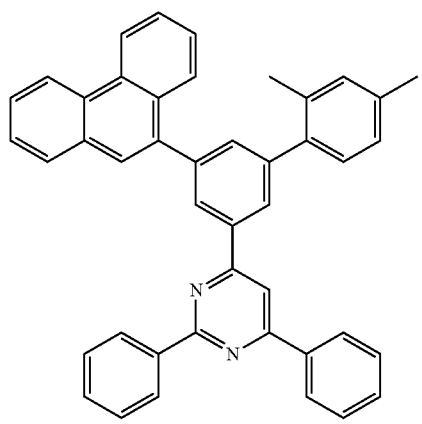
ET41
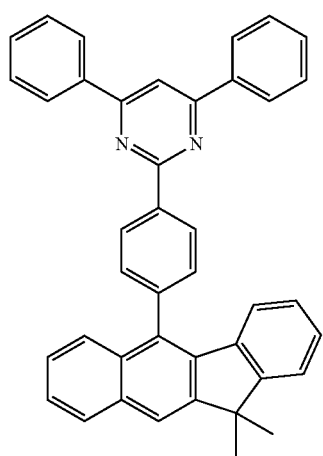
ET42
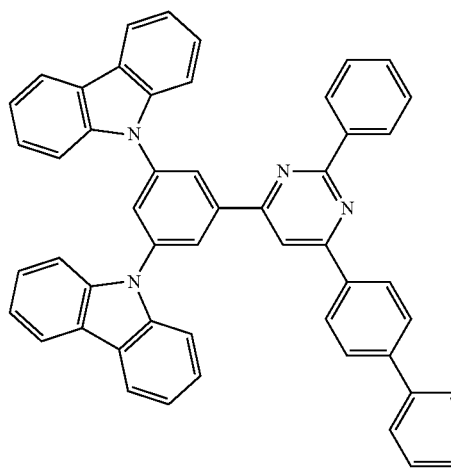
ET43
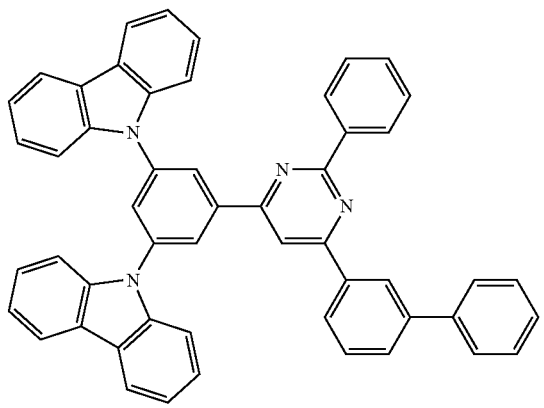
ET44
ET45
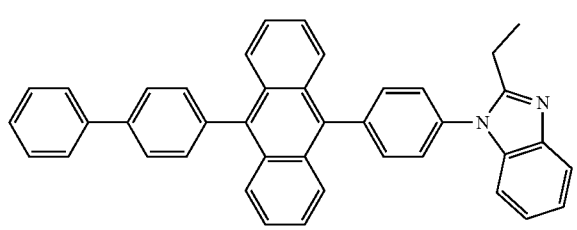

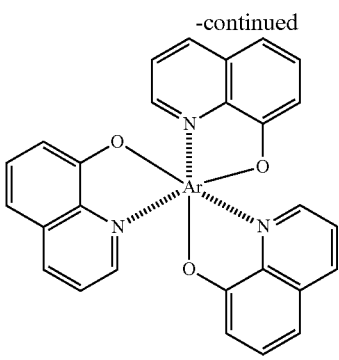

Alq₃

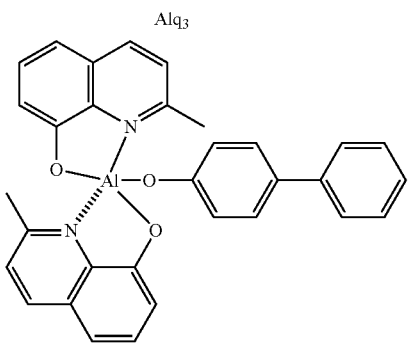

BAlq

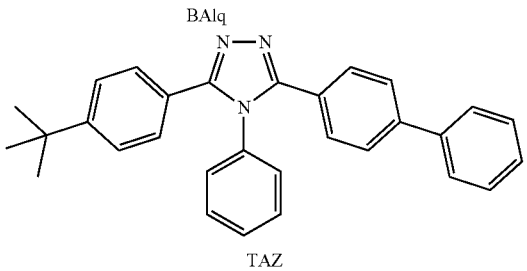

TAZ

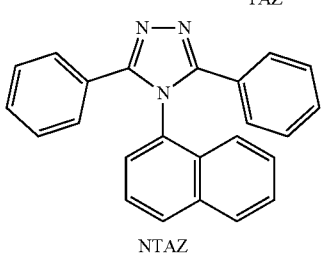

NTAZ

A thickness of the electron transport region may be in a range of about 50 Å to about 5,000 Å. For example, the thickness of the electron transport region may be in a range of about 100 Å to about 4,000 Å. When the electron transport region includes a buffer layer, a hole blocking layer, an electron control layer, an electron transport layer, or any combination thereof, a thickness of the buffer layer, the hole blocking layer, or the electron control layer may each independently be in a range about 20 Å to about 1,000 Å, and a thickness of the electron transport layer may be in a range of about 100 Å to about 1,000 Å. For example, the thickness of the buffer layer, the hole blocking layer, or the electron control layer may each independently be in a range of about 30 Å to about 300 Å. For example, the thickness of the electron transport layer may be in a range of about 150 Å to about 500 Å. When the thickness of the buffer layer, the hole blocking layer, the electron control layer, the electron transport layer, and/or the electron transport layer are within these ranges, satisfactory hole transporting characteristics may be obtained without a substantial increase in driving voltage.

The electron transport region (for example, the electron transport layer in the electron transport region) may further include, in addition to the materials described above, a metal-containing material.

The metal-containing material may include an alkali metal complex, an alkaline earth-metal complex, or any combination thereof. A metal ion of the alkali metal complex may be a Li ion, a Na ion, a K ion, a Rb ion, or a Cs ion, and a metal ion of the alkaline earth-metal complex may be a Be ion, a Mg ion, a Ca ion, a Sr ion, or a Ba ion. A ligand coordinated with the metal ion of the alkali metal complex or the alkaline earth-metal complex may be a hydroxy quinoline, a hydroxy isoquinoline, a hydroxy benzoquinoline, a hydroxy acridine, a hydroxy phenanthridine, a hydroxy phenyloxazole, a hydroxy phenylthiazole, a hydroxy diphenyloxadiazole, a hydroxy diphenylthiadiazole, a hydroxy phenylpyridine, a hydroxy phenylbenzimidazole, a hydroxy phenylbenzothiazole, a bipyridine, a phenanthroline, a cyclopentadiene, or any combination thereof.

In an embodiment, the metal-containing material may include a Li complex. The Li complex may include, for example, Compound ET-D1 (LiQ) or ET-D2:

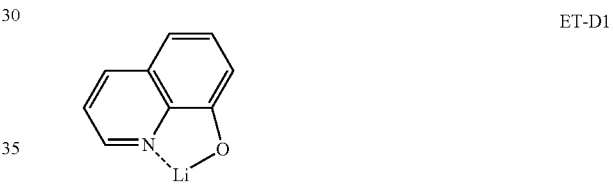

ET-D1

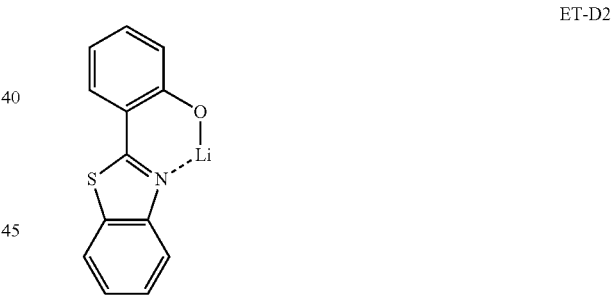

ET-D2

The electron transport region may include an electron injection layer that facilitates the injection of electrons from the second electrode 150. The electron injection layer may directly contact the second electrode 150.

The electron injection layer may have: i) a single-layered structure consisting of a single layer consisting of a single material, ii) a single-layered structure consisting of a single layer including different materials, or iii) a multi-layered structure including multiple layers including different materials.

The electron injection layer may include an alkali metal, an alkaline earth metal, a rare earth metal, an alkali metal-containing compound, an alkaline earth metal-containing compound, a rare earth metal-containing compound, an alkali metal complex, an alkaline earth-metal complex, a rare earth metal complex, or any combination thereof.

The alkali metal may include Li, Na, K, Rb, Cs, or any combination thereof. The alkaline earth metal may include Mg, Ca, Sr, Ba, or any combination thereof. The rare earth metal may include Sc, Y, Ce, Tb, Yb, Gd, or any combination thereof.

The alkali metal-containing compound, the alkaline earth metal-containing compound, and the rare earth metal-containing compound may include oxides and halides (for example, fluorides, chlorides, bromides, or iodides) of the alkali metal, the alkaline earth metal, and the rare earth metal, telluride, or any combination thereof.

The alkali metal-containing compound may include alkali metal oxides, such as $Li_2O$, $Cs_2O$, or $K_2O$, and alkali metal halides, such as LiF, NaF, CsF, KF, LiI, NaI, CsI, or KI, or any combination thereof. The alkaline earth metal-containing compound may include an alkaline earth metal oxide, such as BaO, SrO, CaO, $Ba_xSr_{1-x}O$ (x is a real number that satisfies the condition of 0<x<1), or $Ba_xCa_{1-x}O$ (x is a real number that satisfies the condition of 0<x<1). The rare earth metal-containing compound may include $YbF_3$, $ScF_3$, $Sc_2O_3$, $Y_2O_3$, $Ce_2O_3$, $GdF_3$, $TbF_3$, $YbI_3$, $ScI_3$, $TbI_3$, or any combination thereof. In an embodiment, the rare earth metal-containing compound may include lanthanide metal telluride. Examples of the lanthanide metal telluride may include LaTe, CeTe, PrTe, NdTe, PmTe, SmTe, EuTe, GdTe, TbTe, DyTe, HoTe, ErTe, TmTe, YbTe, LuTe, $La_2Te_3$, $Ce_2Te_3$, $Pr_2Te_3$, $Nd_2Te_3$, $Pm_2Te_3$, $Sm_2Te_3$, $Eu_2Te_3$, $Gd_2Te_3$, $Tb_2Te_3$, $Dy_2Te_3$, $Ho_2Te_3$, $Er_2Te_3$, $Tm_2Te_3$, $Yb_2Te_3$, and $Lu_2Te_3$.

The alkali metal complex, the alkaline earth-metal complex, and the rare earth metal complex may include i) one of ions of the alkali metal, the alkaline earth metal, and the rare earth metal and ii) as a ligand linked to the metal ion, for example, hydroxyquinoline, hydroxyan isoquinoline, hydroxybenzoquinoline, hydroxyacridine, hydroxyphenanthridine, hydroxyphenyloxazole, hydroxyphenylthiazole, hydroxydiphenyloxadiazole, hydroxydiphenylthiadiazole, hydroxyphenylpyridine, hydroxyphenyl benzimidazole, hydroxyphenylbenzothiazole, bipyridine, phenanthroline, cyclopentadiene, or any combination thereof.

The electron injection layer may consist of an alkali metal, an alkaline earth metal, a rare earth metal, an alkali metal-containing compound, an alkaline earth metal-containing compound, a rare earth metal-containing compound, an alkali metal complex, an alkaline earth-metal complex, a rare earth metal complex, or any combination thereof, or may further include an organic material (for example, a compound represented by Formula 601).

In an embodiment, the electron injection layer may consist of i) an alkali metal-containing compound (for example, an alkali metal halide), or ii) a) an alkali metal-containing compound (for example, an alkali metal halide); and b) an alkali metal, an alkaline earth metal, a rare earth metal, or any combination thereof. In an embodiment, the electron injection layer may be a KI:Yb co-deposited layer or a RbI:Yb co-deposited layer.

When the electron injection layer further includes an organic material, an alkali metal, an alkaline earth metal, a rare earth metal, an alkali metal-containing compound, an alkaline earth metal-containing compound, a rare earth metal-containing compound, an alkali metal complex, an alkaline earth-metal complex, a rare earth metal complex, or any combination thereof may be homogeneously or non-homogeneously dispersed in a matrix including the organic material.

A thickness of the electron injection layer may be in a range of about 1 Å to about 100 Å. For example, the thickness of the electron injection layer may be in a range of about 3 Å to about 90 Å. When the thickness of the electron injection layer is within the range described above, the electron injection layer may have satisfactory electron injection characteristics without a substantial increase in driving voltage.

[Second electrode 150]

The second electrode 150 may be located on the interlayer 130 having such a structure. The second electrode 150 may be a cathode, which is an electron injection electrode, and as the material for forming the second electrode 150, a metal, an alloy, an electrically conductive compound, or any combination thereof, each having a low work function, may be used.

The second electrode 150 may include lithium (Li), silver (Ag), magnesium (Mg), aluminum (Al), aluminum-lithium (Al—Li), calcium (Ca), magnesium-indium (Mg—In), magnesium-silver (Mg—Ag), ytterbium (Yb), silver-ytterbium (Ag—Yb), ITO, IZO, or any combination thereof. The second electrode 150 may be a transmissive electrode, a semi-transmissive electrode, or a reflective electrode.

The second electrode 150 may have a single-layered structure or a multi-layered structure including two or more layers.

[Capping Layer]

A first capping layer may be located outside the first electrode 110, and/or a second capping layer may be located outside the second electrode 150. The light-emitting device 10 may have a structure in which the first capping layer, the first electrode 110, the interlayer 130, and the second electrode 150 are sequentially stacked in this stated order, a structure in which the first electrode 110, the interlayer 130, the second electrode 150, and the second capping layer are sequentially stacked in this stated order, or a structure in which the first capping layer, the first electrode 110, the interlayer 130, the second electrode 150, and the second capping layer are sequentially stacked in this stated order.

Light generated in an emission layer of the interlayer 130 of the light-emitting device 10 may be extracted toward the outside through the first electrode 110, which is a semi-transmissive electrode or a transmissive electrode, and the first capping layer, and light generated in an emission layer of the interlayer 130 of the light-emitting device 10 may be extracted toward the outside through the second electrode 150, which is a semi-transmissive electrode or a transmissive electrode, and the second capping layer.

The first capping layer and the second capping layer may increase external luminescence efficiency according to the principle of constructive interference. Accordingly, light extraction efficiency of the light-emitting device 10 is increased, so that the luminescence efficiency of the light-emitting device 10 may be improved.

Each of the first capping layer and the second capping layer may include a material having a refractive index equal to or greater than about 1.6 at a wavelength of about 589 nm.

The first capping layer and the second capping layer may each independently be an organic capping layer including an organic material, an inorganic capping layer including an inorganic material, or a composite capping layer including an organic material and an inorganic material.

At least one of the first capping layer and the second capping layer may each independently include a carbocyclic compound, a heterocyclic compound, an amine group-containing compound, a porphyrin derivative, a phthalocyanine derivative, a naphthalocyanine derivative, an alkali metal complex, an alkaline earth-metal complex, or any combination thereof. The carbocyclic compound, the heterocyclic compound, and the amine group-containing compound may be optionally substituted with a substituent containing O, N, S, Se, Si, F, Cl, Br, I, or any combination thereof. In an embodiment, at least one of the first capping layer and the second capping layer may each independently include an amine group-containing compound.

In an embodiment, at least one of the first capping layer and second capping layer may each independently include a compound represented by Formula 201, a compound represented by Formula 202, or any combination thereof.

In an embodiment, at least one of the first capping layer and the second capping layer may each independently include one of Compounds HT28 to HT33, one of Compounds CP1 to CP6, R—NPB, or any combination thereof:

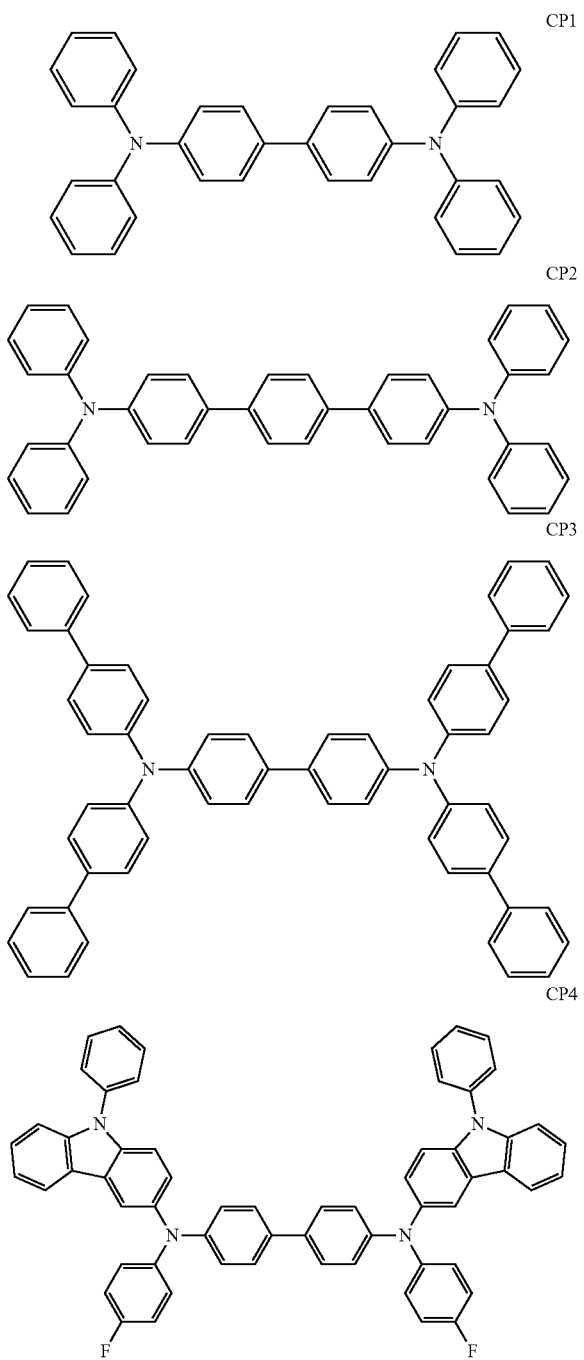

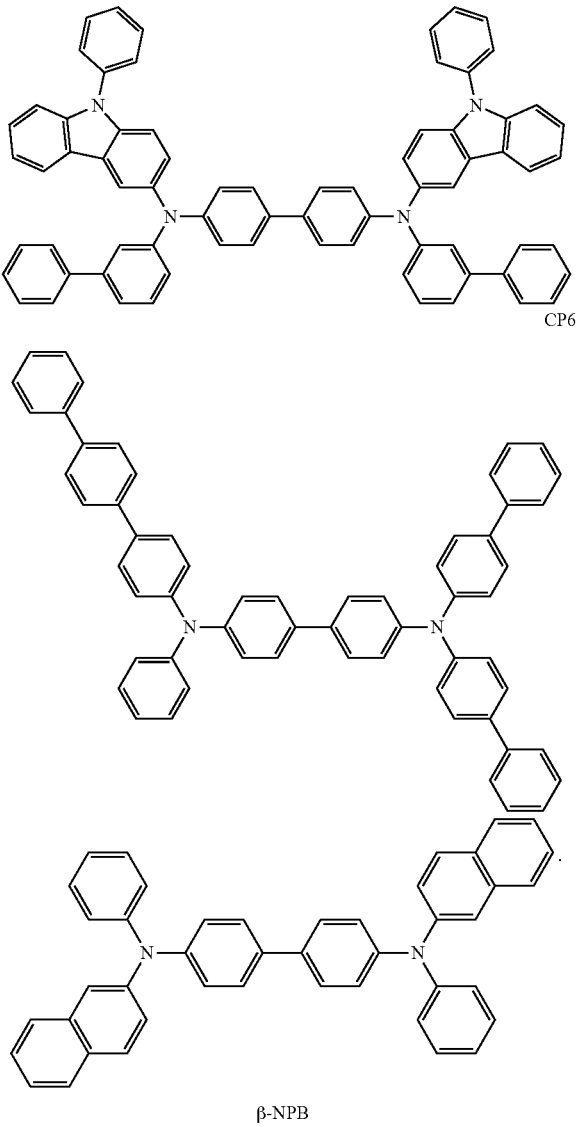

Figure 2:
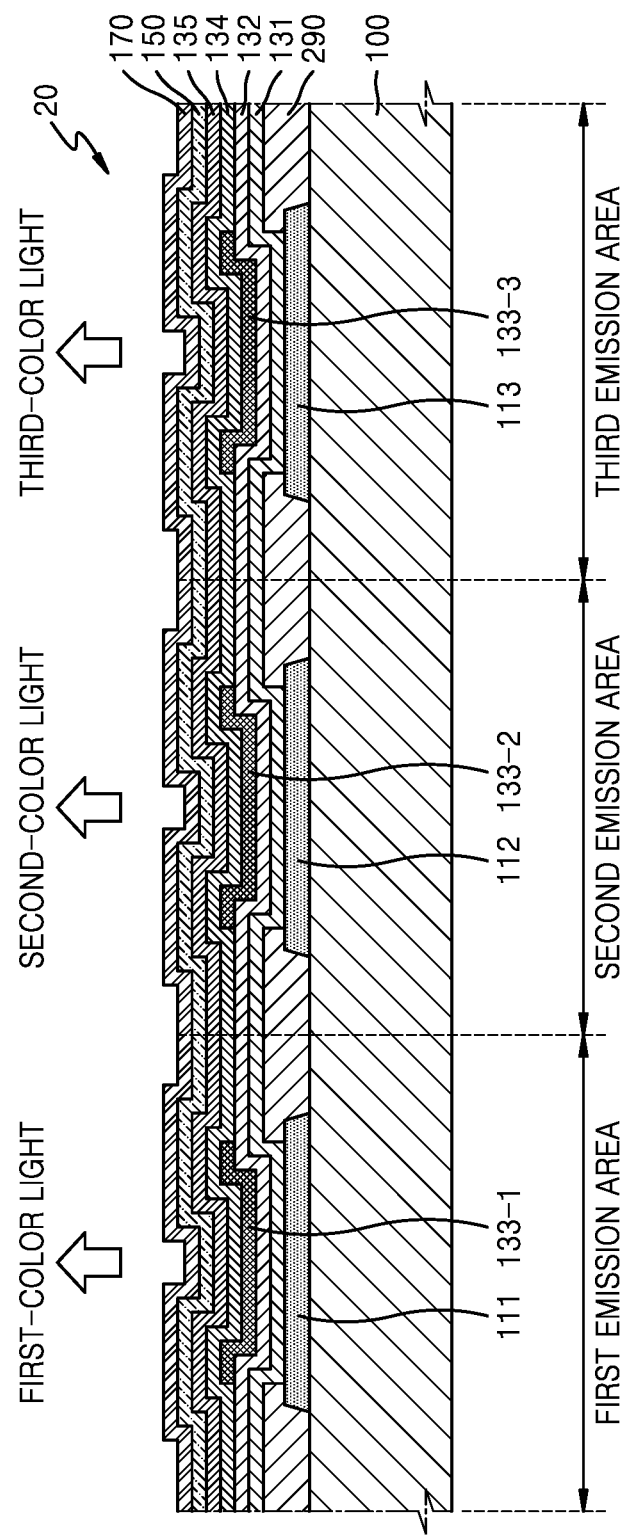
FIG. 2 is a schematic cross-sectional view illustrating a light-emitting device according to an embodiment.

[Description of FIG. 2]

FIG. 2 is a schematic cross-sectional view of a light-emitting device 20 according to an embodiment.

As the substrate 100, the substrate as described above may be used. Although not shown in FIG. 2, the light-emitting device 20 may further include, between the substrate 100 and pixel electrodes 111, 112, and 113, a thin-film transistor including a source electrode, a drain electrode, an active layer, a buffer layer, and an organic insulating layer.

The light-emitting device 20 of FIG. 2 includes a first emission area, a second emission area, and a third emission area.

The light-emitting device 20 includes the first pixel electrode 111, the second pixel electrode 112, and the third pixel electrode 113 respectively disposed in the first emission area, the second emission area, and the third emission area.

The first pixel electrode 111, the second pixel electrode 112, and the third pixel electrode 113 are the same as described in connection with the first electrode 110 in the specification.

The first pixel electrode 111, the second pixel electrode 112, and the third pixel electrode 113 may each be electrically connected to any one of the source electrode and the drain electrode of the thin-film transistor.

The light-emitting device 20 includes an opposite electrode 150 facing the first pixel electrode 111, the second pixel electrode 112, and the third pixel electrode 113.

An interlayer is located between the opposite electrode 150 and the first pixel electrode 111, the second pixel electrode 112, and the third pixel electrode 113. The interlayer includes a hole injection layer 131, a hole transport layer 132, emission layers 133-1, 133-2, and 133-3, an electron transport layer 134, and an electron injection layer 135. Although not shown in FIG. 2, an emission auxiliary layer may be located between the hole transport layer 132 and the first emission layer 133-1, between the hole transport layer 132 and the second emission layer 133-2, and/or between the hole transport layer 132 and the third emission layer 133-3.

A pixel defining film 290 is formed at an edge portion of the first pixel electrode 111, the second pixel electrode 112, and the third pixel electrode 113. The pixel defining film 290 defines a pixel and may include various organic insulation materials (for example, a silicon-based material), inorganic insulation materials, or organic/inorganic composite insulation materials.

The hole injection layer 131 and the hole transport layer 132 are sequentially formed as common layers on the first pixel electrode 111, the second pixel electrode 112, and the third pixel electrode 113.

Descriptions about the hole injection layer 131 and the hole transport layer 132 are the same as described in the specification.

The first emission layer 133-1 disposed to correspond to the first emission area and emitting first-color light, the second emission layer 133-2 disposed to correspond to the second emission area and emitting second-color light, and the third emission layer 133-3 disposed to correspond to the third emission area and emitting third-color light are formed on the hole transport layer 132.

The electron transport layer 134, the electron injection layer 135, and the opposite electrode 150 are sequentially formed, on the hole transport layer 132, as common layers for all of the first emission area, the second emission area, and the third emission area.

The electron transport layer 134 and the electron injection layer 135 are the same as described in the specification. The opposite electrode 150 is the same as described in connection with the second electrode 150 in the specification.

A capping layer 170 is located on the opposite electrode 150. A material that may be used for the capping layer 170 may include an organic material and/or an inorganic material. In addition to protecting the light-emitting device 20, the capping layer 170 may help light generated from the light-emitting device 20 to be efficiently emitted.

A maximum emission wavelength of the first-color light, a maximum emission wavelength of the second-color light, and a maximum emission wavelength of the third-color light may be different from each other, and the maximum emission wavelength of the first-color light and the maximum emission wavelength of the second-color light may each be greater than the maximum emission wavelength of the third-color light.

In an embodiment, the third emission layer 133-3 may include the organometallic compound represented by Formula 1 described above.

In an embodiment, the first-color light may be red light, the second-color light may be green light, and the third-color light may be blue light, but embodiments of the disclosure are not limited thereto.

In an embodiment, the maximum emission wavelength of the third-color light may be in a range of about 410 nm to about 500 nm, but embodiments of the disclosure are not limited thereto.

[Electronic Apparatus]

The light-emitting device may be included in various electronic apparatuses. In an embodiment, an electronic apparatus including the light-emitting device may be a light-emitting apparatus, an authentication apparatus, or the like.

The electronic apparatus (for example, light-emitting apparatus) may further include, in addition to the light-emitting device, i) a color filter, ii) a color conversion layer, or iii) a color filter and a color conversion layer. The color filter and/or the color conversion layer may be located in at least one traveling direction of light emitted from the light-emitting device. In an embodiment, light emitted from the light-emitting device may be blue light or white light. The light-emitting device may be the same as described above. In an embodiment, the color conversion layer may include a quantum dot. The quantum dot may be, for example, a quantum dot as described herein.

The electronic apparatus may include a first substrate. The first substrate may include subpixels, the color filter may include color filter areas respectively corresponding to the subpixels, and the color conversion layer may include color conversion areas respectively corresponding to the subpixels.

A pixel-defining film may be between the subpixels to define each of the subpixels.

The color filter may further include color filter areas and light-blocking patterns between the color filter areas, and the color conversion layer may further include color conversion areas and light-blocking patterns between the color conversion areas.

The color filter areas (or the color conversion areas) may include a first area emitting first-color light, a second area emitting second-color light, and/or a third area emitting third-color light, and the first-color light, the second-color light, and/or the third-color light may have different maximum emission wavelengths from one another. In an embodiment, the first-color light may be red light, the second-color light may be green light, and the third-color light may be blue light. In an embodiment, the color filter areas (or the color conversion areas) may include quantum dots. The first area may include a red quantum dot, the second area may include a green quantum dot, and the third area may not include a quantum dot. The quantum dot is the same as described in the specification. Each of the first area, the second area, and/or the third area may further include a scattering body.

In an embodiment, the light-emitting device may emit first light, the first area may absorb the first light to emit first first-color light, the second area may absorb the first light to emit second first-color light, and the third area may absorb the first light to emit third first-color light. In this regard, the first first-color light, the second first-color light, and the third first-color light may have different maximum emission wavelengths from one another. In detail, the first light may be blue light, the first first-color light may be red light, the second first-color light may be green light, and the third first-color light may be blue light.

The electronic apparatus may further include a thin-film transistor in addition to the light-emitting device as described above. The thin-film transistor may include a source electrode, a drain electrode, and an active layer, wherein any one of the source electrode and the drain electrode may be electrically connected to any one of the first electrode and the second electrode of the light-emitting device.

The thin-film transistor may further include a gate electrode, a gate insulation layer, or the like.

The active layer may include crystalline silicon, amorphous silicon, an organic semiconductor, an oxide semiconductor, or the like.

The electronic apparatus may further include a sealing portion for sealing the light-emitting device. The sealing portion may be between the color filter and/or the color conversion layer and the light-emitting device. The sealing portion allows light from the light-emitting device to be extracted to the outside, while simultaneously preventing ambient air and moisture from penetrating into the light-emitting device. The sealing portion may be a sealing substrate including a transparent glass substrate or a plastic substrate. The sealing portion may be a thin film encapsulation layer including one or more organic layers and/or one or more inorganic layers. When the sealing portion is a thin film encapsulation layer, the electronic apparatus may be flexible.

On the sealing portion, in addition to the color filter and/or the color conversion layer, various functional layers may be further located according to the use of the electronic apparatus. Examples of the functional layers may include a touch screen layer, a polarizing layer, an authentication apparatus, and the like. The touch screen layer may be a pressure-sensitive touch screen layer, a capacitive touch screen layer, or an infrared touch screen layer. The authentication apparatus may be, for example, a biometric authentication apparatus for authenticating an individual by using biometric information of a biometric body (for example, a fingertip, a pupil, or the like).

The authentication apparatus may further include, in addition to the light-emitting device, a biometric information collector.

The electronic apparatus may be applied to various displays, light sources, lighting, personal computers (for example, a mobile personal computer), mobile phones, digital cameras, electronic organizers, electronic dictionaries, electronic game machines, medical instruments (for example, electronic thermometers, sphygmomanometers, blood glucose meters, pulse measurement devices, pulse wave measurement devices, electrocardiogram displays, ultrasonic diagnostic devices, or endoscope displays), fish finders, various measuring instruments, meters (for example, meters for a vehicle, an aircraft, and a vessel), projectors, and the like.

Figure 3:
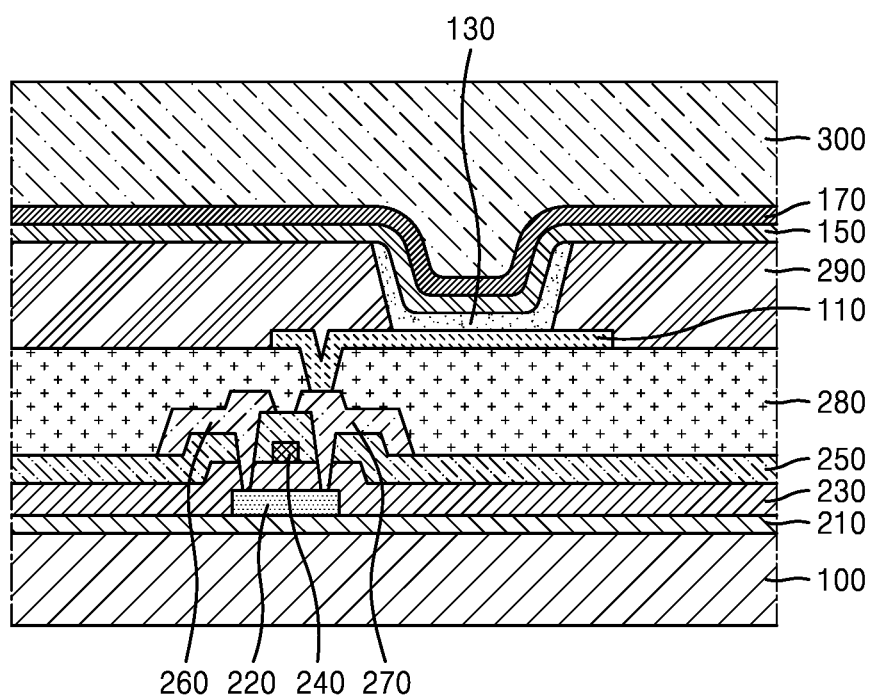
FIG. 3 is a schematic cross-sectional view illustrating a structure of an electronic apparatus according to an embodiment.
Figure 4:
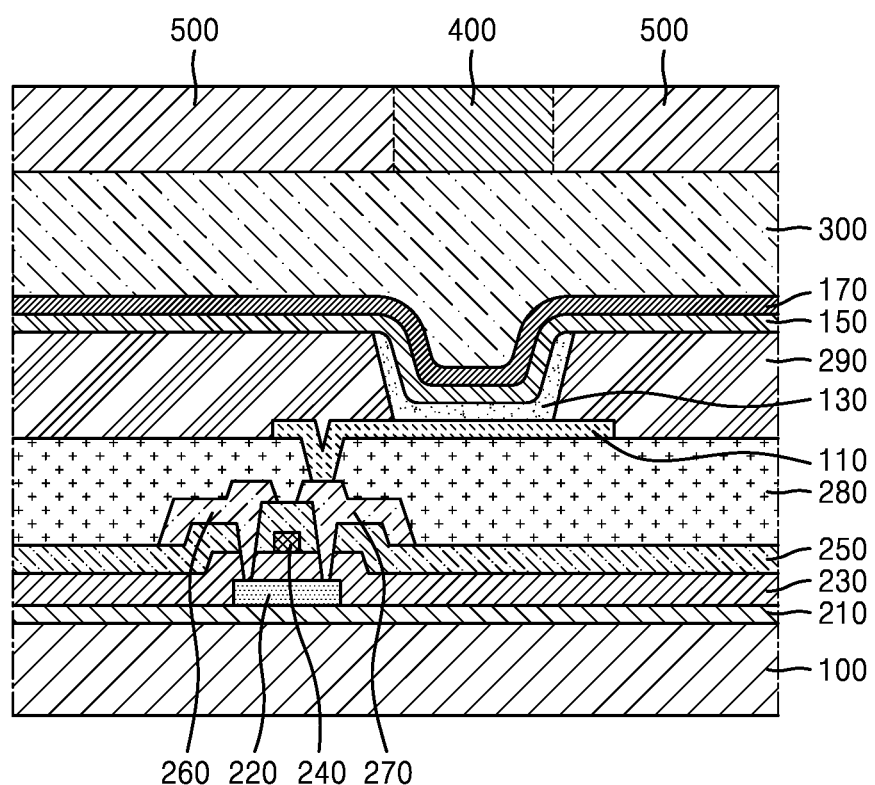
FIG. 4 is a schematic cross-sectional view illustrating a structure of an electronic apparatus according to another embodiment.

[Description of FIGS. 3 and 4]

FIG. 3 is a schematic cross-sectional view showing a light-emitting apparatus according to another embodiment of the disclosure.

The light-emitting apparatus of FIG. 3 includes a substrate 100, a thin-film transistor (TFT), a light-emitting device, and an encapsulation portion 300 that seals the light-emitting device.

The substrate 100 may be a flexible substrate, a glass substrate, or a metal substrate. A buffer layer 210 may be on the substrate 100. The buffer layer 210 prevents penetration of impurities through the substrate 100 and may provide a flat surface on the substrate 100.

The TFT may be on the buffer layer 210. The TFT may include an active layer 220, a gate electrode 240, a source electrode 260, and a drain electrode 270.

The active layer 220 may include an inorganic semiconductor such as silicon or polysilicon, an organic semiconductor, or an oxide semiconductor, and may include a source region, a drain region, and a channel region.

A gate insulating film 230 for insulating the active layer 220 from the gate electrode 240 may be on the active layer 220, and the gate electrode 240 may be on the gate insulating film 230.

An interlayer insulating film 250 may be on the gate electrode 240. The interlayer insulating film 250 is located between the gate electrode 240 and the source electrode 260 to insulate the gate electrode 240 from the source electrode 260 and between the gate electrode 240 and the drain electrode 270 to insulate the gate electrode 240 from the drain electrode 270.

The source electrode 260 and the drain electrode 270 may be on the interlayer insulating film 250. The interlayer insulating film 250 and the gate insulating film 230 may be formed to expose the source region and the drain region of the active layer 220, and the source electrode 260 and the drain electrode 270 may be located to be in contact with the exposed portions of the source region and the drain region of the active layer 220.

The TFT may be electrically connected to the light-emitting device to drive the light-emitting device and may be protected by being covered with a passivation layer 280. The passivation layer 280 may include an inorganic insulating film, an organic insulating film, or a combination thereof. The light-emitting device is provided on the passivation layer 280. The light-emitting device includes the first electrode 110, the interlayer 130, and the second electrode 150.

The first electrode 110 may be on the passivation layer 280. The passivation layer 280 does not completely cover the drain electrode 270 and exposes a certain portion of the drain electrode 270, and the first electrode 110 may be connected to the exposed portion of the drain electrode 270.

A pixel defining layer 290 including an insulating material may be located on the first electrode 110. The pixel defining layer 290 may expose a certain region of the first electrode 110, and the interlayer 130 may be formed in the exposed region of the first electrode 110. The pixel defining layer 290 may include various organic insulation materials, organic insulation materials, or organic/inorganic composite insulation materials. In an embodiment, the pixel defining layer 290 may be a polyimide or polyacryl-based organic film. Although not shown in FIG. 3, at least some layers of the interlayer 130 may extend beyond the upper portion of the pixel defining layer 290 and may thus be located in the form of a common layer.

The second electrode 150 may be located on the interlayer 130, and a capping layer 170 may be additionally formed on the second electrode 150. The capping layer 170 may be formed to cover the second electrode 150.

The encapsulation portion 300 may be located on the capping layer 170. The encapsulation portion 300 may be located on the light-emitting device and protects the light-emitting device from moisture or oxygen. The encapsulation portion 300 may include: an inorganic film including silicon nitride ($SiN_x$), silicon oxide ($SiO_x$), indium tin oxide, indium zinc oxide, or a combination thereof; an organic film including polyethylene terephthalate, polyethylene naphthalate, polycarbonate, polyimide, polyethylene sulfonate, polyoxymethylene, polyarylate, hexamethyldisiloxane, an acrylic resin (for example, polymethyl methacrylate or polyacrylic acid), an epoxy-based resin (for example, aliphatic glycidyl ether (AGE), or any combination thereof; or a combination of an inorganic film and an organic film.

FIG. 4 is a schematic cross-sectional view showing a light-emitting apparatus according to another embodiment of the disclosure.

The light-emitting apparatus of FIG. 4 is the same as the light-emitting apparatus of FIG. 3, except that a light-blocking pattern 500 and a functional region 400 are additionally located on the encapsulation portion 300. The functional region 400 may be i) a color filter area, ii) a color conversion area, or iii) a combination of the color filter area and the color conversion area. In an embodiment, the light-emitting device included in the light-emitting apparatus of FIG. 4 may be a tandem light-emitting device.

[Preparation Method]

Layers constituting the hole transport region, an emission layer, and layers constituting the electron transport region may be formed in a certain region by using one or more suitable methods selected from vacuum deposition, spin coating, casting, Langmuir-Blodgett (LB) deposition, ink-jet printing, laser-printing, and laser-induced thermal imaging.

When layers constituting the hole transport region, the emission layer, and layers constituting the electron transport region are formed by vacuum deposition, the deposition may be performed at a deposition temperature in a range of about 100° C. to about 500° C., a vacuum degree in a range of about $10^{-8}$ torr to about $10^{-3}$ torr, and a deposition speed in a range of about 0.01 Å/sec to about 100 Å/sec by taking into account a material to be included in a layer to be formed and the structure of a layer to be formed.

[Definition of Terms]

The term "$C_3$-$C_{60}$ carbocyclic group" as used herein refers to a cyclic group that consists of carbon only and has three to sixty carbon atoms, and the term "$C_1$-$C_{60}$ heterocyclic group" as used herein refers to a cyclic group that has one to sixty carbon atoms and further includes, in addition to carbon, a heteroatom. The $C_3$-$C_{60}$ carbocyclic group and the $C_1$-$C_{60}$ heterocyclic group may each be a monocyclic group that consists of one ring or a polycyclic group in which two or more rings are condensed with each other. In an embodiment, the number of ring-forming atoms of the $C_1$-$C_{60}$ heterocyclic group may be from 3 to 61.

The term "cyclic group" as used herein includes the $C_3$-$C_{60}$ carbocyclic group and the $C_1$-$C_{60}$ heterocyclic group.

The term "π electron-rich $C_3$-$C_{60}$ cyclic group" as used herein refers to a cyclic group that has three to sixty carbon atoms and does not include *—N=*' as a ring-forming moiety, and the term "π-electron-deficient nitrogen-containing $C_1$-$C_{60}$ cyclic group" as used herein refers to a heterocyclic group that has one to sixty carbon atoms and includes *—N=*' as a ring-forming moiety.

In an embodiment, the $C_3$-$C_{60}$ carbocyclic group may be i) a group T1 or ii) a condensed cyclic group in which two or more groups T1 are condensed with each other (for example, a cyclopentadiene group, an adamantane group, a norbornane group, a benzene group, a pentalene group, a naphthalene group, an azulene group, an indacene group, acenaphthylene group, a phenalene group, a phenanthrene group, an anthracene group, a fluoranthene group, a triphenylene group, a pyrene group, a chrysene group, a perylene group, a pentaphene group, a heptalene group, a naphthacene group, a picene group, a hexacene group, a pentacene group, a rubicene group, a coronene group, an ovalene group, an indene group, a fluorene group, a spiro-bifluorene group, a benzofluorene group, an indenophenanthrene group, or an indenoanthracene group), the $C_1$-$C_{60}$ heterocyclic group may be i) a group T2, ii) a condensed cyclic group in which two or more groups T2 are condensed with each other, or iii) a condensed cyclic group in which at least one group T2 and at least one group T1 are condensed with each other (for example, a pyrrole group, a thiophene group, a furan group, an indole group, a benzoindole group, a naphthoindole group, an isoindole group, a benzoisoindole group, a naphthoisoindole group, a benzosilole group, a benzothiophene group, a benzofuran group, a carbazole group, a dibenzosilole group, a dibenzothiophene group, a dibenzofuran group, an indenocarbazole group, an indolocarbazole group, a benzofurocarbazole group, a benzothienocarbazole group, a benzosilolocarbazole group, a benzoindolocarbazole group, a benzocarbazole group, a benzonaphthofuran group, a benzonaphthothiophene group, a benzonaphthosilole group, a benzofurodibenzofuran group, a benzofurodibenzothiophene group, a benzothieno dibenzothiophene group, a pyrazole group, an imidazole group, a triazole group, an oxazole group, an isoxazole group, an oxadiazole group, a thiazole group, an isothiazole group, a thiadiazole group, a benzopyrazole group, a benzimidazole group, a benzoxazole group, a benzoisoxazole group, a benzothiazole group, a benzoisothiazole group, a pyridine group, a pyrimidine group, a pyrazine group, a pyridazine group, a triazine group, a quinoline group, an isoquinoline group, a benzoquinoline group, a benzoisoquinoline group, a quinoxaline group, a benzoquinoxaline group, a quinazoline group, a benzoquinazoline group, a phenanthroline group, a cinnoline group, a phthalazine group, a naphthyridine group, an imidazopyridine group, an imidazopyrimidine group, an imidazotriazine group, an imidazopyrazine group, an imidazopyridazine group, an azacarbazole group, an azafluorene group, an azadibenzosilole group, an azadibenzothiophene group, or an azadibenzofuran group), the π electron-rich $C_3$-$C_{60}$ cyclic group may be i) a group T1, ii) a condensed cyclic group in which two or more groups T1 are condensed with each other, iii) a group T3, iv) a condensed cyclic group in which two or more groups T3 are condensed with each other, or v) a condensed cyclic group in which at least one group T3 and at least one group T1 are condensed with each other (for example, a $C_3$-$C_{60}$ carbocyclic group, a pyrrole group, a thiophene group, a furan group, an indole group, a benzoindole group, a naphthoindole group, an isoindole group, a benzoisoindole group, a naphthoisoindole group, a benzosilole group, a benzothiophene group, a benzofuran group, a carbazole group, a dibenzosilole group, a dibenzothiophene group, a dibenzofuran group, an indenocarbazole group, an indolocarbazole group, a benzofurocarbazole group, a benzothienocarbazole group, a benzosilolocarbazole group, a benzoindolocarbazole group, a benzocarbazole group, a benzonaphthofuran group, a benzonaphthothiophene group, a benzonaphthosilole group, a benzofurodibenzofuran group, a benzofurodibenzothiophene group, or a benzothienodibenzothiophene group), the π-electron-deficient nitrogen-containing $C_1$-$C_{60}$ cyclic group may be i) a group T4, ii) a condensed cyclic group in which two or more groups T4 are condensed with each other, iii) a condensed cyclic group in which at least one group T4 and at least one group T1 are condensed with each other, iv) a condensed cyclic group in which at least one group T4 and at least one group T3 are condensed with each other, or v) a condensed cyclic group in which at least one group T4, at least one group T1, and at least one group T3 are condensed with each other (for example, a pyrazole group, an imidazole group, a triazole group, an oxazole group, an isoxazole group, an oxadiazole group, a thiazole group, an isothiazole group, a thiadiazole group, a benzopyrazole group, a benzimidazole group, a benzoxazole group, a benzoisoxazole group, a benzothiazole group, a benzoisothiazole group, a pyridine group, a pyrimidine group, a pyrazine group, a pyridazine group, a triazine group, a quinoline group, an isoquinoline group, a benzoquinoline group, a benzoisoquinoline group, a quinoxaline group, a benzoquinoxaline group, a quinazoline group, a benzoquinazoline group, a phenanthroline group, a cinnoline group, a phthalazine group, a naphthyridine group, an imidazopyridine group, an imidazopyrimidine group, an imidazotriazine group, an imidazopyrazine group, an imidazopyridazine group, an azacarbazole group, an azafluorene group, an azadibenzosilole group, an azadibenzothiophene group, or an azadibenzofuran group), the group T1 may be a cyclopropane group, a cyclobutane group, a cyclopentane group, a cyclohexane group, a cycloheptane group, a cyclooctane group, a cyclobutene group, a cyclopentene group, a cyclopentadiene group, a cyclohexene group, a cyclohexadiene group, a cycloheptene group, an adamantane group, a norbornane group (or, a bicyclo[2.2.1]heptane group), a norbornene group, a bicyclo[1.1.1]pentane group, a bicyclo[2.1.1]hexane group, a bicyclo[2.2.2]octane group, or a benzene group, the group T2 may be a furan group, a thiophene group, a 1H-pyrrole group, a silole group, a borole group, a 2H-pyrrole group, a 3H-pyrrole group, an imidazole group, a pyrazole group, a triazole group, a tetrazole group, an oxazole group, an isoxazole group, an oxadiazole group, a thiazole group, an isothiazole group, a thiadiazole group, an azasilole group, an azaborole group, a pyridine group, a pyrimidine group, a pyrazine group, a pyridazine group, a triazine group, or a tetrazine group, the group T3 may be a furan group, a thiophene group, a 1H-pyrrole group, a silole group, or a borole group, and the group T4 may be a 2H-pyrrole group, a 3H-pyrrole group, an imidazole group, a pyrazole group, a triazole group, a tetrazole group, an oxazole group, an isoxazole group, an oxadiazole group, a thiazole group, an isothiazole group, a thiadiazole group, an azasilole group, an azaborole group, a pyridine group, a pyrimidine group, a pyrazine group, a pyridazine group, a triazine group, or a tetrazine group.

The term "the cyclic group, the $C_3$-$C_{60}$ carbocyclic group, the $C_1$-$C_{60}$ heterocyclic group, the π electron-rich $C_3$-$C_{60}$ cyclic group, or the π-electron-deficient nitrogen-containing $C_1$-$C_{60}$ cyclic group" as used herein refer to a group that is condensed with a cyclic group, a monovalent group, a polyvalent group (for example, a divalent group, a trivalent group, a tetravalent group, or the like), according to the structure of a formula described with corresponding terms. In an embodiment, "a benzene group" may be a benzo group, a phenyl group, a phenylene group, or the like, which may be easily understand by one of ordinary skill in the art according to the structure of a formula including the "benzene group."

In an embodiment, examples of the monovalent $C_3$-$C_{60}$ carbocyclic group and the monovalent $C_1$-$C_{60}$ heterocyclic group are a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_1$-$C_{60}$ heteroaryl group, a monovalent non-aromatic condensed polycyclic group, and a monovalent non-aromatic condensed heteropolycyclic group, and examples of the divalent $C_3$-$C_{60}$ carbocyclic group and the monovalent $C_1$-$C_{60}$ heterocyclic group are a $C_3$-$C_{10}$ cycloalkylene group, a $C_1$-$C_{10}$ heterocycloalkylene group, a $C_3$-$C_{10}$ cycloalkenylene group, a $C_1$-$C_{10}$ heterocycloalkenylene group, a $C_6$-$C_{00}$ arylene group, a $C_1$-$C_{60}$ heteroarylene group, a divalent non-aromatic condensed polycyclic group, and a substituted or unsubstituted divalent non-aromatic condensed heteropolycyclic group.

The term "$C_1$-$C_{60}$ alkyl group" as used herein refers to a linear or branched aliphatic hydrocarbon monovalent group having 1 to 60 carbon atoms, and examples thereof includes a methyl group, an ethyl group, an n-propyl group, an isopropyl group, an n-butyl group, a sec-butyl group, an isobutyl group, a tert-butyl group, an n-pentyl group, a tert-pentyl group, a neopentyl group, an isopentyl group, a sec-pentyl group, a 3-pentyl group, a sec-isopentyl group, an n-hexyl group, an isohexyl group, a sec-hexyl group, a tert-hexyl group, an n-heptyl group, an isoheptyl group, a sec-heptyl group, a tert-heptyl group, an n-octyl group, an isooctyl group, a sec-octyl group, a tert-octyl group, an n-nonyl group, an isononyl group, a sec-nonyl group, a tert-nonyl group, an n-decyl group, an isodecyl group, a sec-decyl group, and a tert-decyl group. The term "$C_1$-$C_{60}$ alkylene group" as used herein refers to a divalent group having the same structure as the $C_1$-$C_{60}$ alkyl group.

The term "$C_2$-$C_{60}$ alkenyl group" as used herein refers to a monovalent hydrocarbon group having at least one carbon-carbon double bond in the middle or at the terminus of a $C_2$-$C_{60}$ alkyl group, and examples thereof include an ethenyl group, a propenyl group, and a butenyl group. The term "$C_2$-$C_{60}$ alkenylene group" as used herein refers to a divalent group having the same structure as the $C_2$-$C_{60}$ alkenyl group.

The term "$C_2$-$C_{60}$ alkynyl group" as used herein refers to a monovalent hydrocarbon group having at least one carbon-carbon triple bond in the middle or at the terminus of a $C_2$-$C_{60}$ alkyl group, and examples thereof include an ethynyl group and a propynyl group. The term "$C_2$-$C_{60}$ alkynylene group" as used herein refers to a divalent group having the same structure as the $C_2$-$C_{60}$ alkynyl group.

The term "$C_1$-$C_{60}$ alkoxy group" as used herein refers to a monovalent group represented by —$OA_{101}$ (wherein $A_{101}$ is the $C_1$-$C_{60}$ alkyl group), and examples thereof include a methoxy group, an ethoxy group, and an isopropyloxy group.

The term "$C_3$-$C_{10}$ cycloalkyl group" as used herein refers to a monovalent saturated hydrocarbon cyclic group having 3 to 10 carbon atoms, and examples thereof are a cyclopropyl group, a cyclobutyl group, a cyclopentyl group, a cyclohexyl group, a cycloheptyl group, a cyclooctyl group, an adamantyl group, a norbornyl group (or a bicyclo[2.2.1]heptyl group), a bicyclo[1.1.1]pentyl group, a bicyclo[2.1.1]hexyl group, and a bicyclo[2.2.2]octyl group. The term "$C_3$-$C_{10}$ cycloalkylene group" as used herein refers to a divalent group having the same structure as the $C_3$-$C_{10}$ cycloalkyl group.

The term "$C_1$-$C_{10}$ heterocycloalkyl group" as used herein refers to a monovalent cyclic group that further includes, in addition to a carbon atom, at least one heteroatom as a ring-forming atom and has 1 to 10 carbon atoms, and examples thereof include a1,2,3,4-oxatriazolidinyl group, a tetrahydrofuranyl group, and a tetrahydrothiophenyl group. The term "$C_1$-$C_{10}$ heterocycloalkylene group" as used herein refers to a divalent group having the same structure as the $C_1$-$C_{10}$ heterocycloalkyl group.

The term "$C_3$-$C_{10}$ cycloalkenyl group" as used herein refers to a monovalent cyclic group that has 3 to 10 carbon atoms and at least one carbon-carbon double bond in the ring thereof and no aromaticity, and examples thereof include a cyclopentenyl group, a cyclohexenyl group, and a cycloheptenyl group. The term "$C_3$-$C_{10}$ cycloalkenylene group" as used herein refers to a divalent group having the same structure as the $C_3$-$C_{10}$ cycloalkenyl group.

The term "$C_1$-$C_{10}$ heterocycloalkenyl group" as used herein refers to a monovalent cyclic group that has, in addition to a carbon atom, at least one heteroatom as a ring-forming atom, 1 to 10 carbon atoms, and at least one carbon-carbon double bond in the cyclic structure thereof. Examples of the $C_1$-$C_{10}$ heterocycloalkenyl group include a 4,5-dihydro-1,2,3,4-oxatriazolyl group, a 2,3-dihydrofuranyl group, and a 2,3-dihydrothiophenyl group. The term "$C_1$-$C_{10}$ heterocycloalkenylene group" as used herein refers to a divalent group having the same structure as the $C_1$-$C_{10}$ heterocycloalkenyl group.

The term "$C_6$-$C_{60}$ aryl group" as used herein refers to a monovalent group having a carbocyclic aromatic system having 6 to 60 carbon atoms, and the term "$C_6$-$C_{00}$ arylene group" as used herein refers to a divalent group having a carbocyclic aromatic system having 6 to 60 carbon atoms. Examples of the $C_6$-$C_{60}$ aryl group include a phenyl group, a pentalenyl group, a naphthyl group, an azulenyl group, an indacenyl group, an acenaphthyl group, a phenalenyl group, a phenanthrenyl group, an anthracenyl group, a fluoranthenyl group, a triphenylenyl group, a pyrenyl group, a chrysenyl group, a perylenyl group, a pentaphenyl group, a heptalenyl group, a naphthacenyl group, a picenyl group, a hexacenyl group, a pentacenyl group, a rubicenyl group, a coronenyl group, and an ovalenyl group. When the $C_6$-$C_{60}$ aryl group and the $C_6$-$C_{60}$ arylene group each include two or more rings, the two or more rings may be condensed to each other.

The term "$C_1$-$C_{60}$ heteroaryl group" as used herein refers to a monovalent group having a heterocyclic aromatic system that has, in addition to a carbon atom, at least one heteroatom as a ring-forming atom, and 1 to 60 carbon atoms. The term "$C_1$-$C_{00}$ heteroarylene group" as used herein refers to a divalent group having a heterocyclic aromatic system that has, in addition to a carbon atom, at least one heteroatom as a ring-forming atom, and 1 to 60 carbon atoms. Examples of the $C_1$-$C_{60}$ heteroaryl group include a pyridinyl group, a pyrimidinyl group, a pyrazinyl group, a pyridazinyl group, a triazinyl group, a quinolinyl group, a benzoquinolinyl group, an isoquinolinyl group, a benzoisoquinolinyl group, a quinoxalinyl group, a benzoquinoxalinyl group, a quinazolinyl group, a benzoquinazolinyl group, a cinnolinyl group, a phenanthrolinyl group, a phthalazinyl group, and a naphthyridinyl group. When the $C_1$-$C_{60}$ heteroaryl group and the $C_1$-$C_{60}$ heteroarylene group each include two or more rings, the two or more rings may be condensed with each other.

The term "monovalent non-aromatic condensed polycyclic group" as used herein refers to a monovalent group having two or more rings condensed with each other, only carbon atoms (for example, having 8 to 60 carbon atoms) as ring-forming atoms, and non-aromaticity in its molecular structure when considered as a whole. Examples of the monovalent non-aromatic condensed polycyclic group include an indenyl group, a fluorenyl group, a spiro-bifluorenyl group, a benzofluorenyl group, an indenophenanthrenyl group, and an indenoanthracenyl group. The term "divalent non-aromatic condensed polycyclic group" as used herein refers to a divalent group having the same structure as the monovalent non-aromatic condensed polycyclic group.

The term "monovalent non-aromatic condensed heteropolycyclic group" as used herein refers to a monovalent group having two or more rings condensed to each other, at least one heteroatom other than carbon atoms (for example, having 1 to 60 carbon atoms), as a ring-forming atom, and non-aromaticity in its molecular structure when considered as a whole. Examples of the monovalent non-aromatic condensed heteropolycyclic group includes a 9,10-dihydroacridinyl group and a 9H-xanthenyl group. The term "divalent non-aromatic condensed heteropolycyclic group" as used herein refers to a divalent group having the same structure as the monovalent non-aromatic condensed heteropolycyclic group.

The term "$C_6$-$C_{60}$ aryloxy group" as used herein refers to —$OA_{102}$(wherein $A_{102}$ is the $C_6$-$C_{60}$ aryl group), and the term "$C_6$-$C_{60}$ arylthio group" as used herein refers to —$SA_{103}$ (wherein $A_{103}$ is the $C_6$-$C_{60}$ aryl group).

The term "$R_{10a}$" as used herein refers to:

deuterium (-D), —F, —Cl, —Br, —I, a hydroxyl group, a cyano group, or a nitro group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each unsubstituted or substituted with deuterium, —F, —Cl, —Br, —I, a hydroxyl group, a cyano group, a nitro group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, —Si($Q_{11}$)($Q_{12}$)($Q_{13}$), —N($Q_{11}$)($Q_{12}$), —B($Q_{11}$)($Q_{12}$), —C(=O)($Q_{11}$), —S(=O)$_2$($Q_{11}$), —P(=O)($Q_{11}$)($Q_{12}$), or any combination thereof;

a $C_3$-$C_{60}$ carbocyclic group, a $C_1$-$C_{60}$ heterocyclic group, a $C_6$-$C_{60}$ aryloxy group, or a $C_6$-$C_{60}$ arylthio group, each unsubstituted or substituted with deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, —Si($Q_{21}$)($Q_{22}$)($Q_{23}$), —N($Q_{21}$)($Q_{22}$), —B($Q_{21}$)($Q_{22}$), —C(=O)($Q_{21}$), —S(=O)$_2$($Q_{21}$), —P(=O)($Q_{21}$)($Q_{22}$), or any combination thereof; or —Si($Q_{31}$)($Q_{32}$)($Q_{33}$), —N($Q_{31}$)($Q_{32}$), —B($Q_{31}$)($Q_{32}$), —C(=O)($Q_{31}$), —S(=O)$_2$($Q_{31}$), or —P(=O)($Q_{31}$)($Q_{32}$).

$Q_1$ to $Q_3$, $Q_{11}$ to $Q_{13}$, $Q_{21}$ to $Q_{23}$ and $Q_{31}$ to $Q_{33}$ used herein may each independently be: hydrogen; deuterium; —F; —Cl; —Br; —I; a hydroxyl group; a cyano group; a nitro group; a $C_1$-$C_{60}$ alkyl group; a $C_2$-$C_{60}$ alkenyl group; a $C_2$-$C_{60}$ alkynyl group; a $C_1$-$C_{60}$ alkoxy group; or a $C_3$-$C_{60}$ carbocyclic group or a $C_1$-$C_{60}$ heterocyclic group, each unsubstituted or substituted with deuterium, —F, a cyano group, a $C_1$-$C_{60}$ alkyl group, a $C_1$-$C_{60}$ alkoxy group, a phenyl group, a biphenyl group, or any combination thereof.

The term "heteroatom" as used herein refers to any atom other than a carbon atom. Examples of the heteroatom include O, S, N, P, Si, B, Ge, Se, or any combination thereof.

The term "Ph" as used herein refers to a phenyl group, the term "Me" as used herein refers to a methyl group, the term "Et" as used herein refers to an ethyl group, the term "ter-Bu" or "Bu$^t$" as used herein refers to a tert-butyl group, and the term "OMe" as used herein refers to a methoxy group.

The term "biphenyl group" as used herein refers to "a phenyl group substituted with a phenyl group." In other words, the "biphenyl group" is a substituted phenyl group having a $C_6$-$C_{60}$ aryl group as a substituent.

The term "terphenyl group" as used herein refers to "a phenyl group substituted with a biphenyl group". In other words, the "terphenyl group" is a substituted phenyl group having, as a substituent, a $C_6$-$C_{60}$ aryl group substituted with a $C_6$-$C_{60}$ aryl group.

\* and \*' as used herein, unless defined otherwise, each refer to a binding site to a neighboring atom in a corresponding formula.

Hereinafter, a compound according to embodiments and a light-emitting device according to embodiments will be described in detail with reference to Synthesis Examples and Examples. The wording "B was used instead of A" used in describing Synthesis Examples refers to that an identical molar equivalent of B was used in place of A.

SYNTHESIS EXAMPLE

Synthesis Example 1: Synthesis of Compound 1

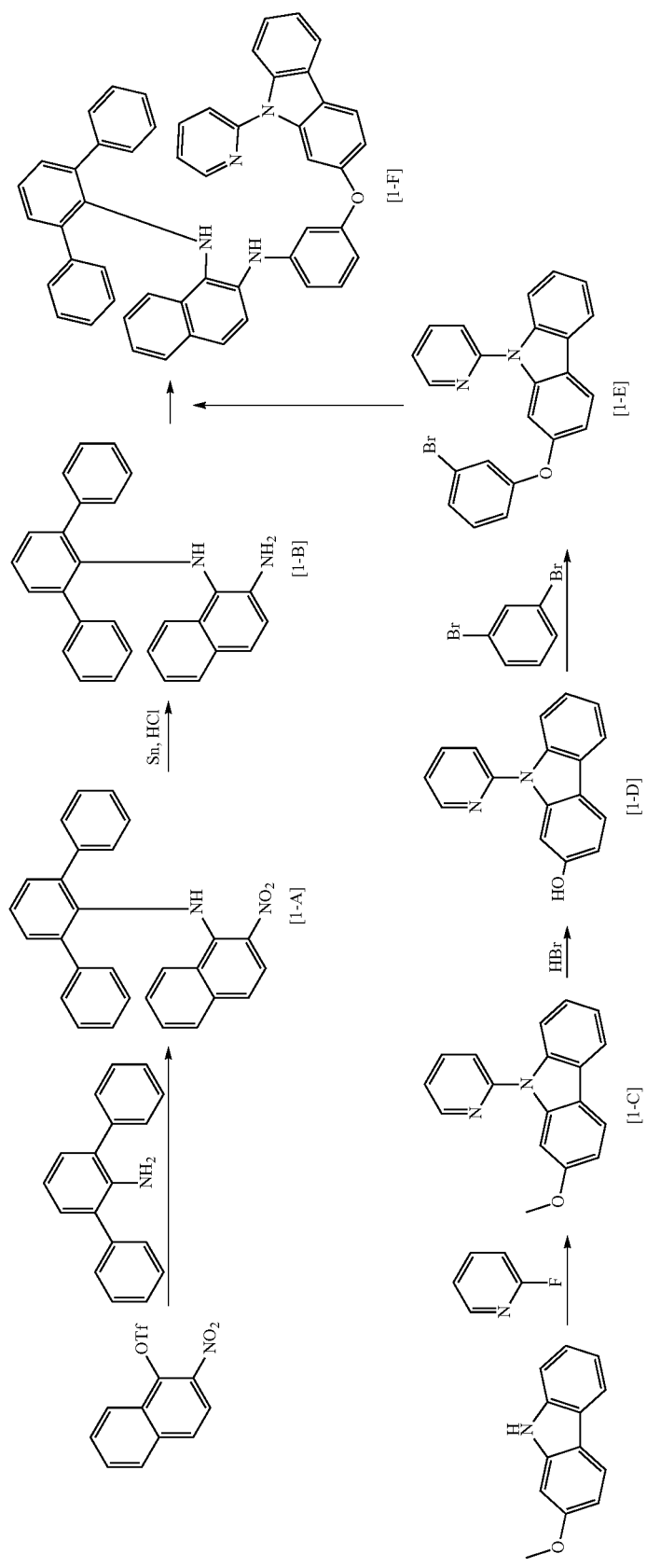

-continued
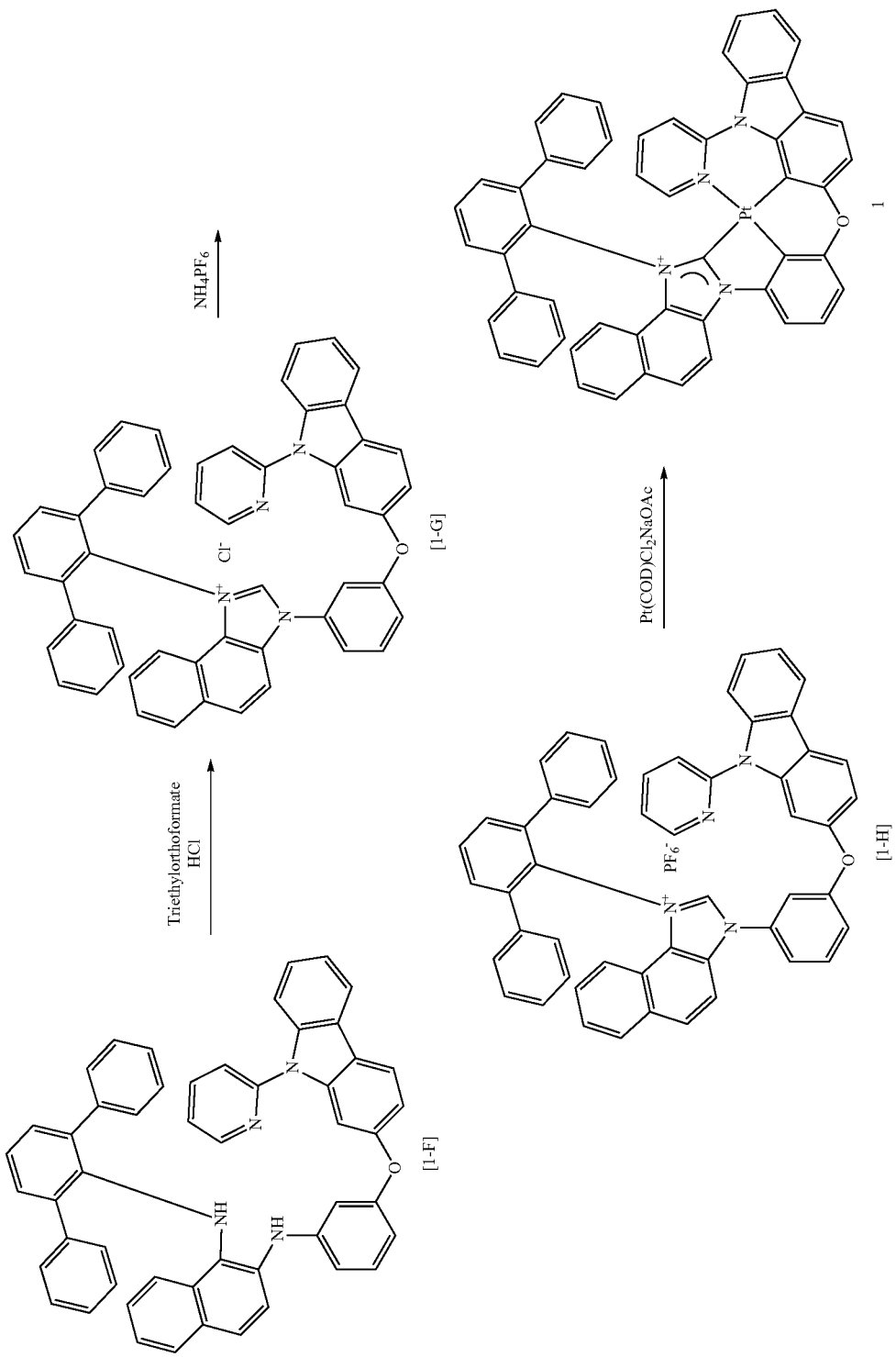

1) Synthesis of Intermediate [1-A]

12.3 g (50 mmol) of [1,1':3',1''-terphenyl]-2'-amine, 24.1 g (75 mmol) of 2-nitronaphthalen-1-yl trifluoromethanesulfonate, 2.9 g (2.5 mmol) of tetrakis(triphenylphosphine) palladium (0), and 13.8 g (100 mmol) of potassium carbonate were added to a reaction vessel and suspended in 500 ml of toluene. The reaction temperature was raised to 110° C. and stirred for 48 hours. After completion of the reaction, the mixture was cooled at room temperature, and a solvent was removed therefrom, to thereby obtain 13.3 g (32 mmol) of Intermediate [1-A].

2) Synthesis of Intermediate [1-B]

13.3 g (32 mmol) of Intermediate [1-A], 13.3 g (112 mmol) of tin, and 18.4 g (176 mmol) of HCl 35 wt % solution were added to a reaction vessel and suspended in 320 ml of ethanol. The reaction temperature was raised to 80° C. and stirred for 12 hours. After completion of the reaction, the mixture was cooled at room temperature and neutralized using saturated aqueous sodium hydrogen carbonate solution. Extraction was performed using ethylacetate, and an extracted organic layer was washed with a saturated aqueous sodium chloride solution and dried using sodium sulfate. A residue from which a solvent was removed was separated using column chromatography to thereby obtain 9.3 g (24 mmol) of Intermediate [1-B].

3) Synthesis of Intermediate [1-C]

11.8 g (60 mmol) of 2-methoxy-9H-carbazole, 11.7 g (120 mmol) of 2-fluoropyridine, and 38.2 g (180 mmol) of tripotassium phosphate were added to a reaction vessel and suspended in 600 ml of dimethylformamide. The reaction temperature was raised to 160° C. and stirred for 12 hours. After completion of the reaction, the mixture was cooled at room temperature, and extraction was performed using ethylacetate. An extracted organic layer was washed with a saturated aqueous sodium chloride solution and dried using sodium sulfate. A residue from which a solvent was removed was separated using column chromatography to thereby obtain 13.4 g (49 mmol) of Intermediate [1-C].

4) Synthesis of Intermediate [1-D]

13.4 g (49 mmol) of Intermediate [1-C] was added to a reaction vessel and suspended in an excess of bromic acid. The reaction temperature was raised to 80° C. and stirred for 12 hours. After completion of the reaction, the mixture was cooled at room temperature and neutralized using saturated aqueous sodium hydrogen carbonate solution. Extraction was performed using ethylacetate, and an extracted organic layer was washed with a saturated aqueous sodium chloride solution and dried using sodium sulfate. A residue from which a solvent was removed was separated using column chromatography to thereby obtain 10.2 g (39 mmol) of Intermediate [1-D].

5) Synthesis of Intermediate [1-E]

10.2 g (39 mmol) of Intermediate [1-D], 13.9 g (59 mmol) of 1,3-dibromobenzene, 16.6 g (78 mmol) of tripotassium phosphate, 0.7 g (3.9 mmol) of iodo copper, and 0.4 g (3.9 mmol) of picolinic acid were added to a reaction vessel and suspended in 390 ml of dimethylsulfoxide. The reaction mixture was heated and stirred at 160° C. for 12 hours. After completion of the reaction, the mixture was cooled at room temperature, and extraction was performed using ethylacetate. An extracted organic layer was washed with a saturated aqueous sodium chloride solution and dried using sodium sulfate. A residue from which a solvent was removed was separated using column chromatography to thereby obtain 12.5 g (30 mmol) of Intermediate [1-E].

6) Synthesis of Intermediate [1-F]

9.3 g (24 mmol) of Intermediate [1-B], 12.5 g (30 mmol) of Intermediate [1-E], 1.1 g (1.2 mmol) of tris(dibenzylideneacetone)dipalladium (0), 490 mg (1.2 mmol) of 2-dicyclohexylphosphino-2',6'-dimethoxybiphenyl, and 4.6 g (48 mmol) of sodium tert-butoxide were added to a reaction vessel and suspended in 240 ml of toluene. The reaction mixture was heated and stirred at 110° C. for 3 hours. After completion of the reaction, the mixture was cooled at room temperature, and extraction was performed using ethylacetate. An extracted organic layer was washed with a saturated aqueous sodium chloride solution and dried using sodium sulfate. A residue from which a solvent was removed was separated using column chromatography to thereby obtain 10.8 g (15 mmol) of Intermediate [1-F].

7) Synthesis of Intermediate [1-G]

10.8 g (15 mmol) of Intermediate [1-F], 110 mL (750 mmol) of triethyl orthoformate, and 8.6 g (83 mmol) of a HCl 35 wt % solution were added to a reaction vessel, heated, and stirred at 80° C. for 12 hours. After completion of the reaction, the mixture was cooled at room temperature, and a residue from which a solvent was removed was separated using column chromatography to thereby obtain 8.4 g (11 mmol) of Intermediate [1-G].

8) Synthesis of Intermediate [1-H]

8.4 g (11 mmol) of Intermediate [1-G] and 3.6 g (22 mmol) of ammonium hexafluorophosphate were added to a reaction vessel and suspended in a solution containing methanol and water in a ratio of 2:1. The reaction mixture was stirred at room temperature for 12 hours. A generated solid was filtered and separated using column chromatography to thereby obtain 7.9 g (9.0 mmol) of Intermediate [1-H].

9) Synthesis of Compound 1

7.9 g (9.0 mmol) of Intermediate [1-H], 3.7 g (9.9 mmol) of dichloro (1,5-cyclooctadiene)platinum, and 1.5 g (18 mmol) of sodium acetate were suspended in 180 ml of dioxane. The reaction mixture was heated and stirred at 110° C. for 72 hours. After completion of the reaction, the mixture was cooled at room temperature, and extraction was performed using ethylacetate. An extracted organic layer was washed with a saturated aqueous sodium chloride solution and dried using sodium sulfate. A residue from which a solvent was removed was separated using column chromatography to thereby obtain 2.8 g (3.0 mmol) of Compound 1.

Synthesis Example 2: Synthesis of Compound 2

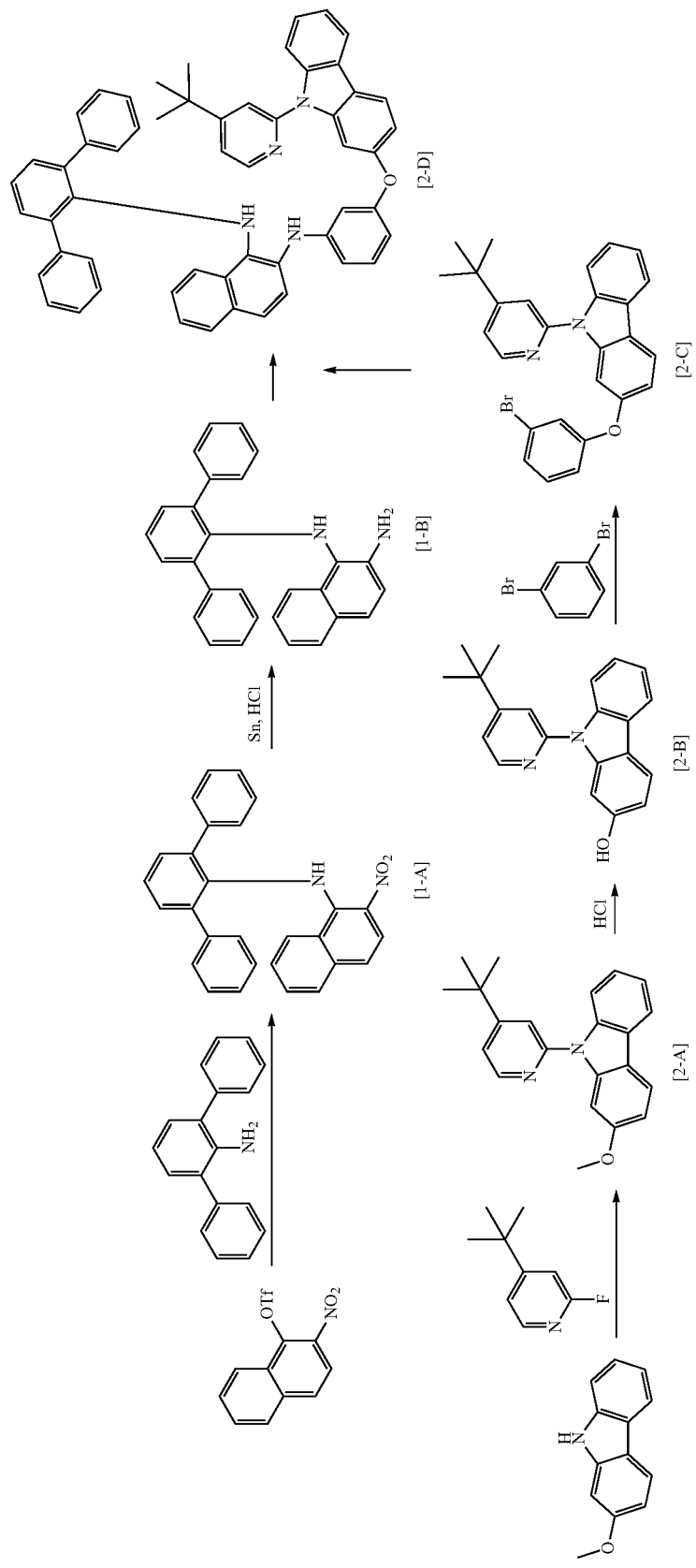

-continued
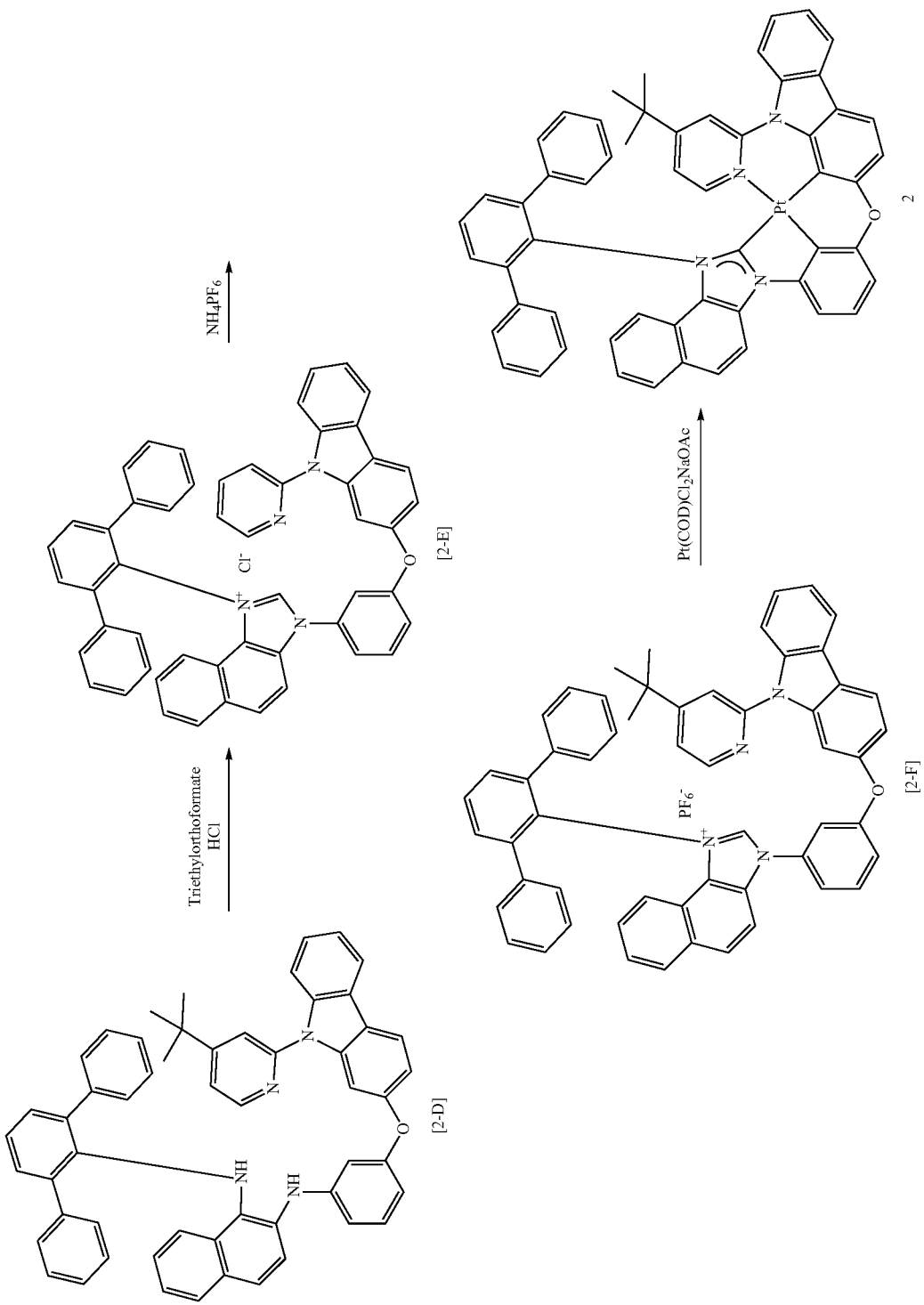

2.5 g (2.5 mmol) of Compound 2 was obtained in the same manner as in Synthesis Example 1, except that 2-fluoro-4-tert-butylpyridine was used instead of 2-fluoropyridine.

Synthesis Example 3: Synthesis of Compound 12

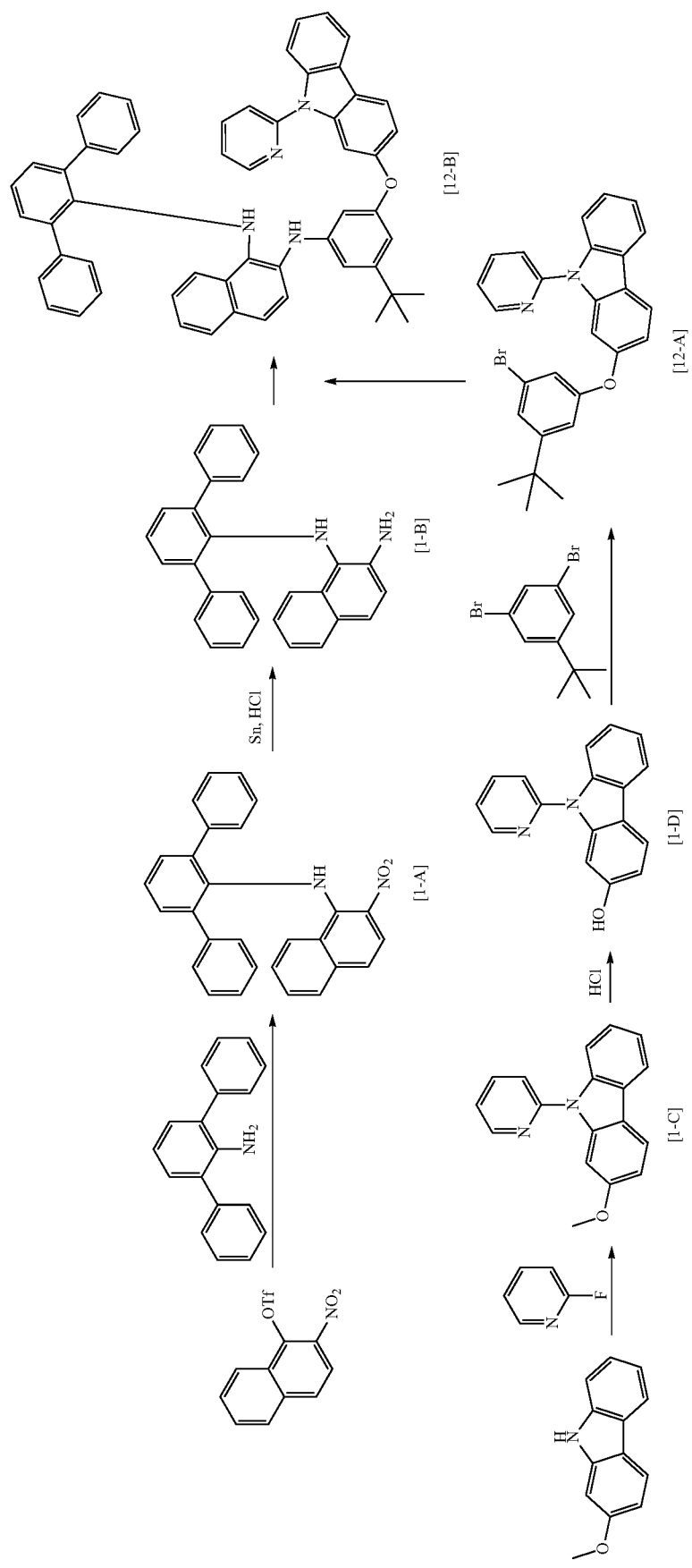

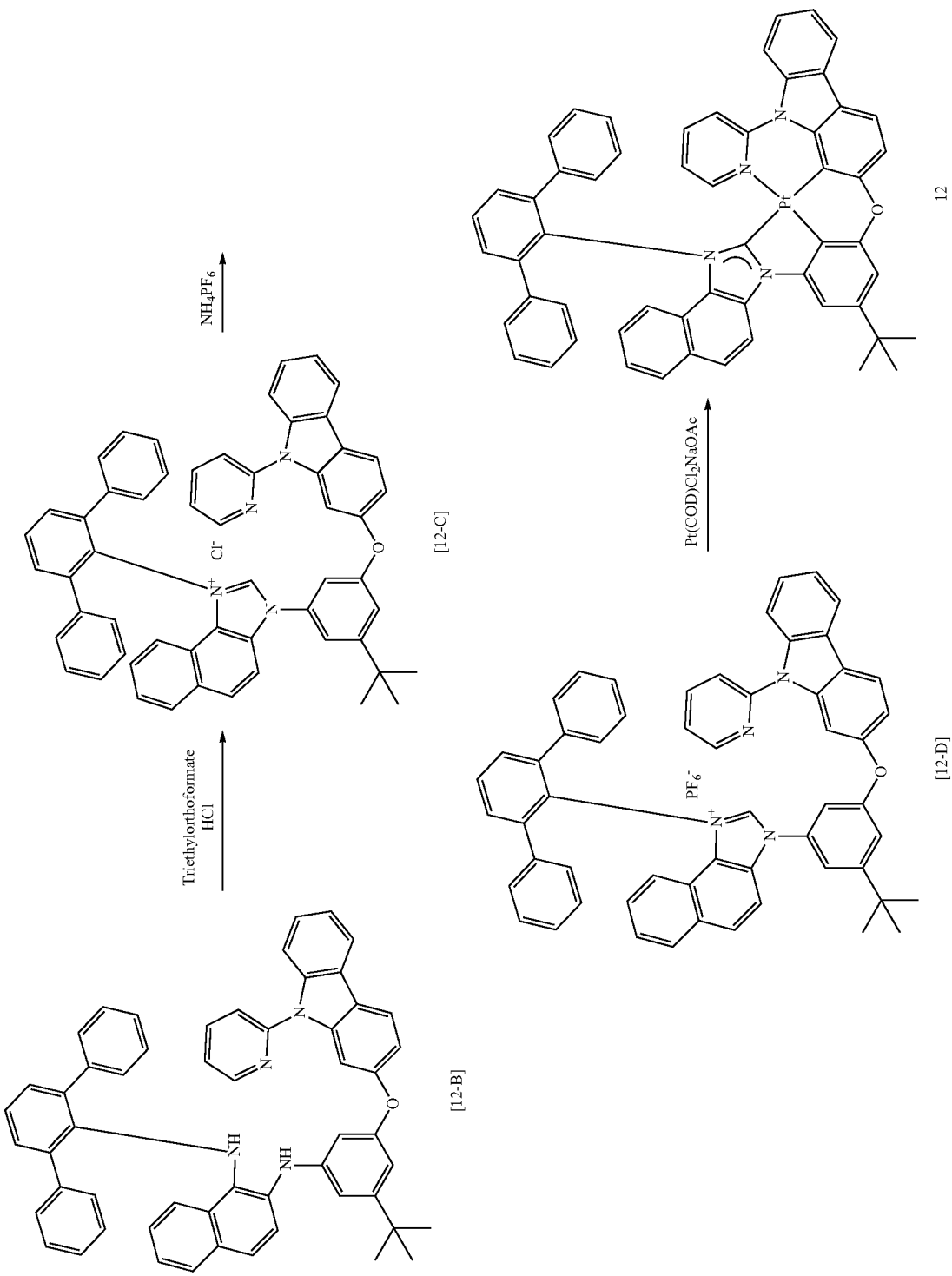

2.6 g (2.7 mmol) of Compound 12 was obtained in the same manner as in Synthesis Example 1, except that 1,3-dibromo-5-tertbutylbenzene was used instead of 1,3-dibromobenzene.

Synthesis Example 4: Synthesis of Compound 26

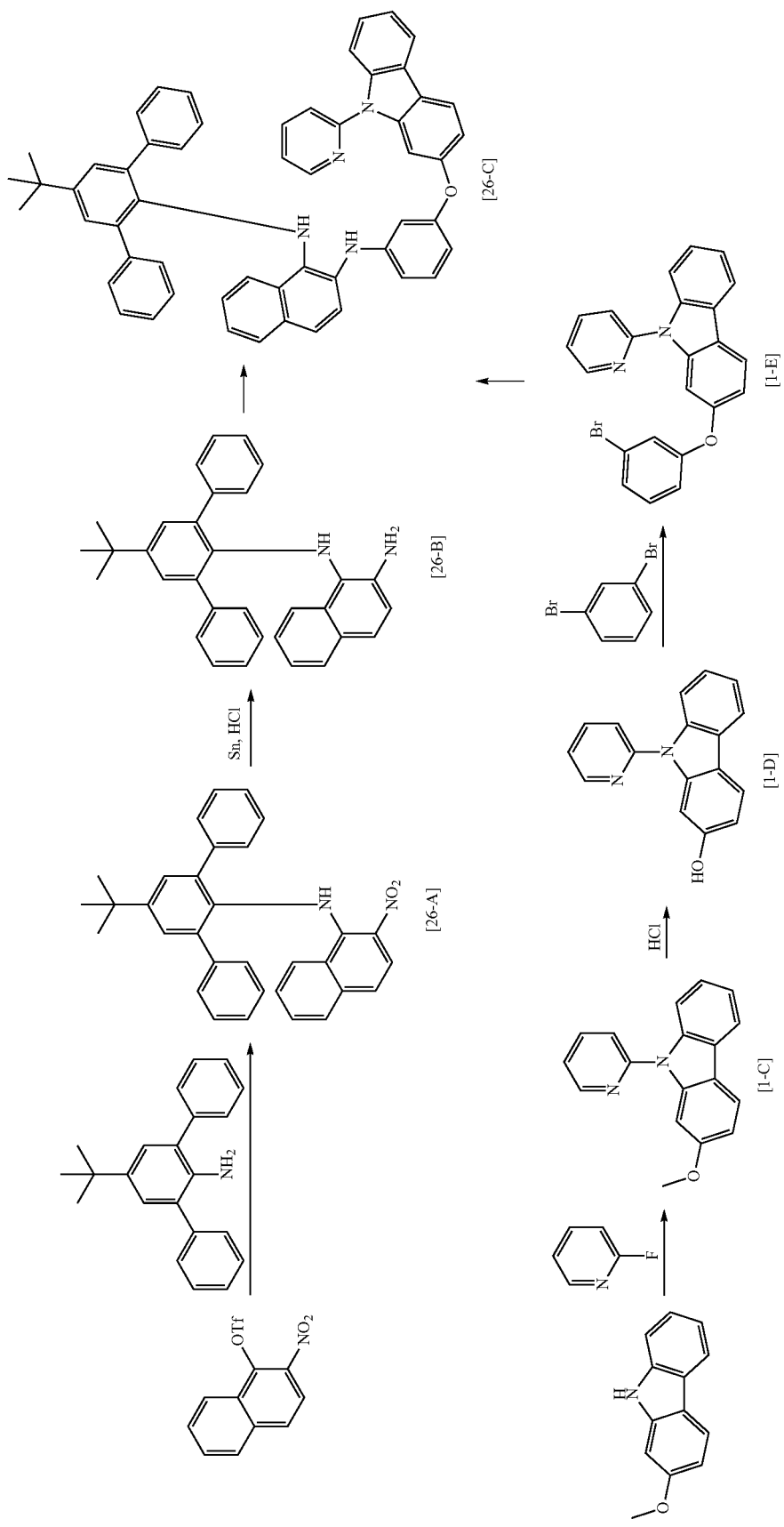

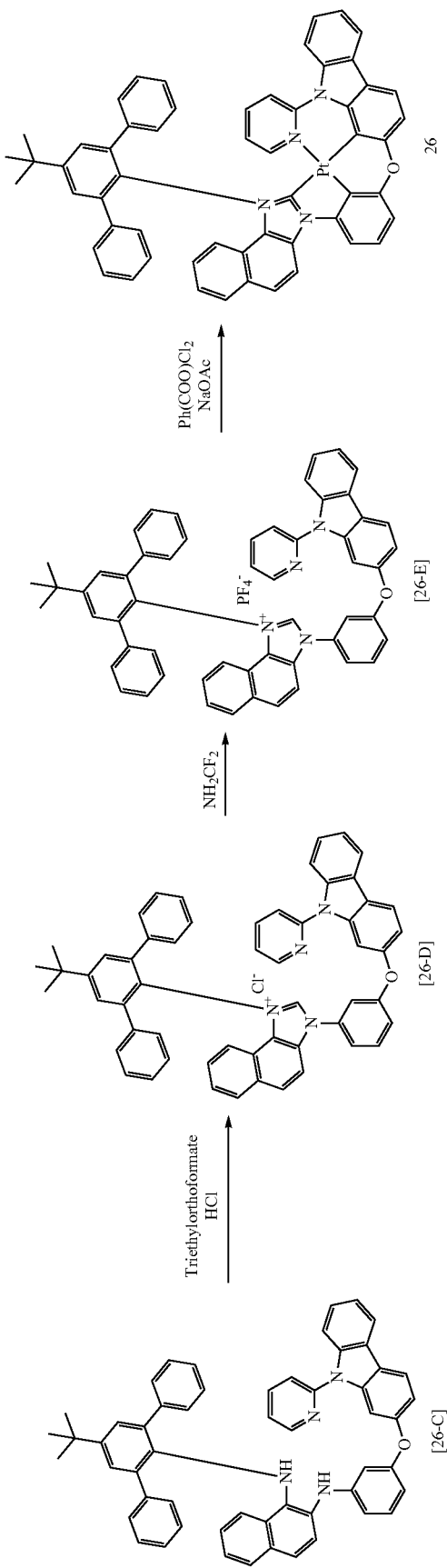

2.0 g (2.0 mmol) of Compound 26 was obtained in the same manner as in Synthesis Example 1, except that 5'-(tert-butyl)-[1,1':3',1''-terphenyl]-2'-amine was used instead of [1,1':3',1''-terphenyl]-2'-amine.

Synthesis Example 5: Synthesis of Compound 36

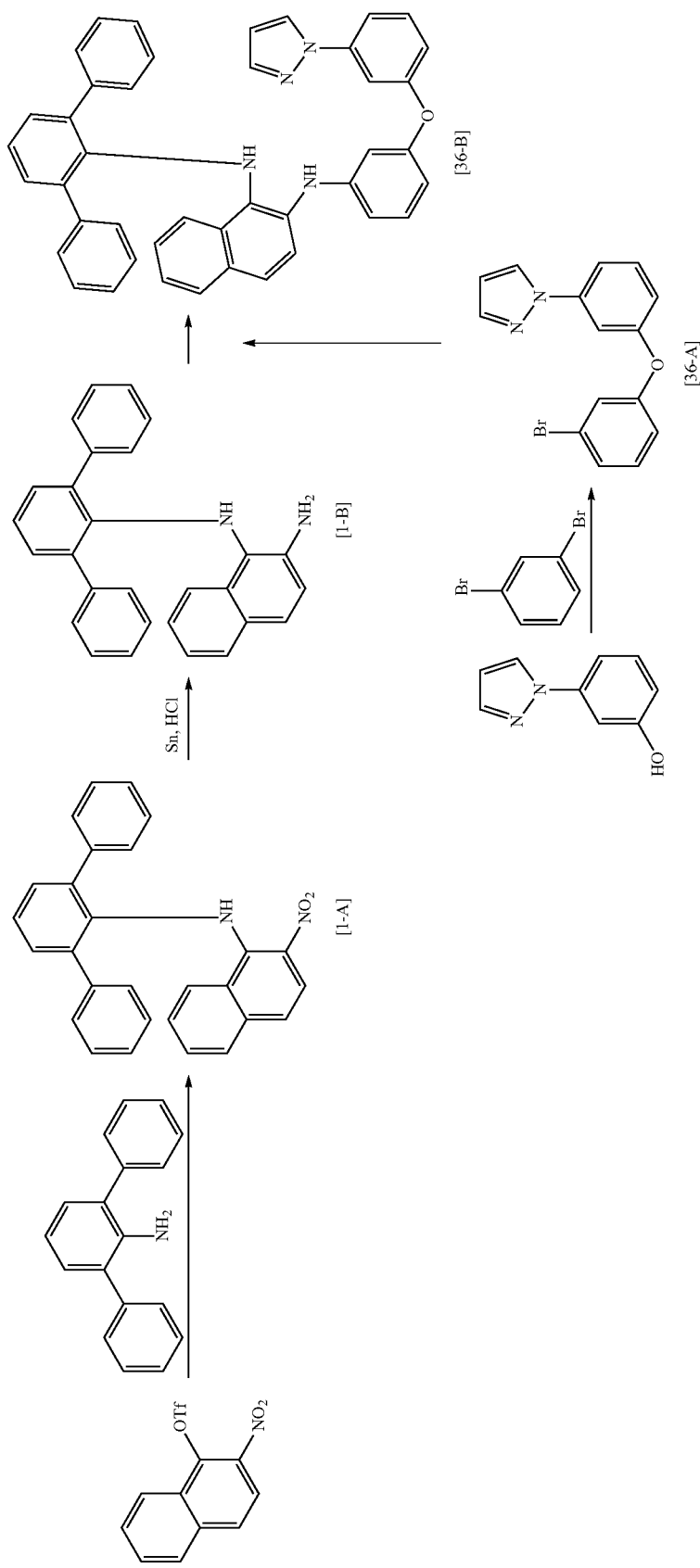

-continued
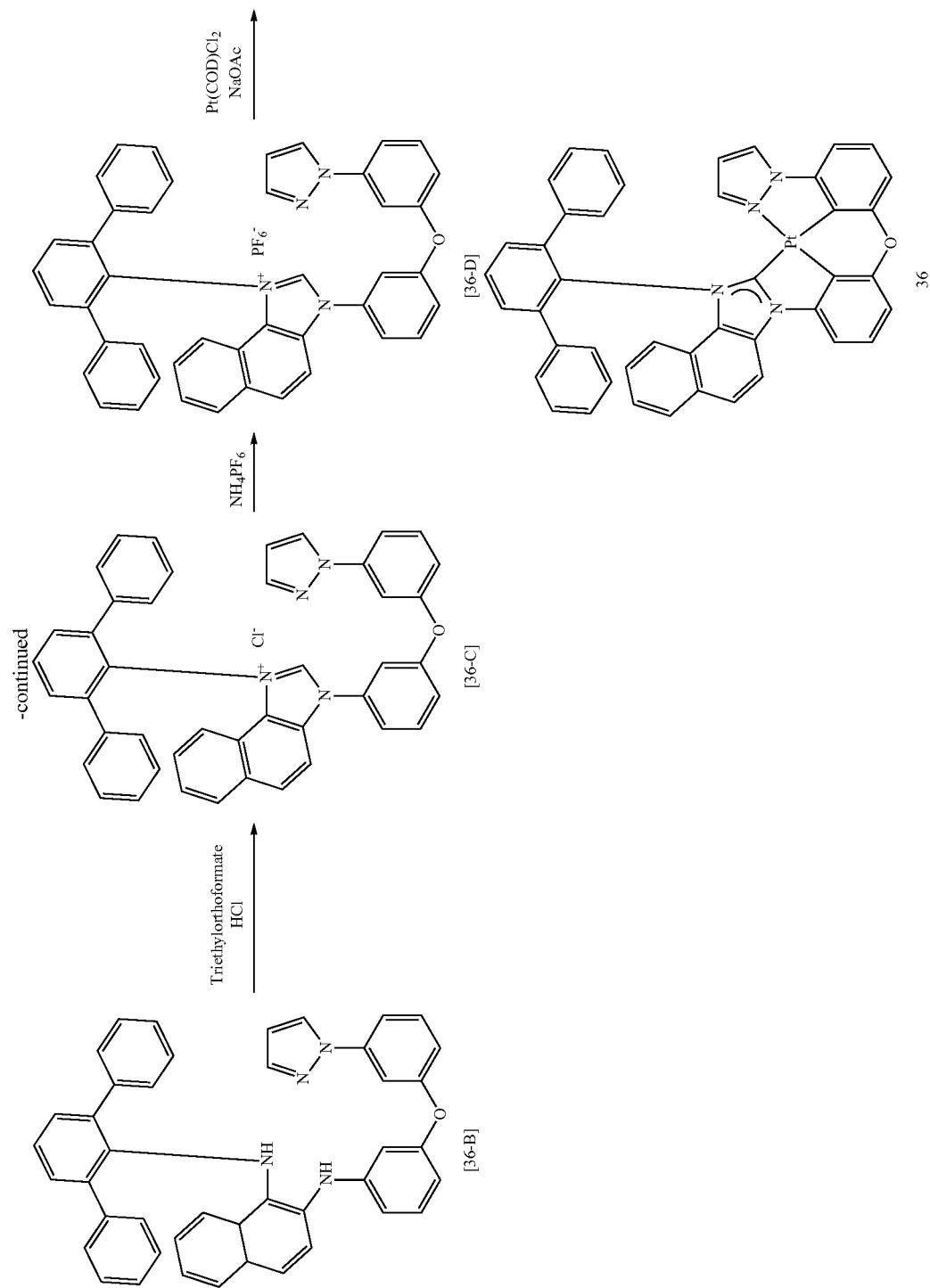

1) Synthesis of Intermediate [36-A]

6.4 g (40 mmol) of 3-(1H-pyrazol-1-yl)phenol, 14.1 g (60 mmol) of 1,3-dibromobenzene, 17.1 g (80 mmol) of tripotassium phosphate, 0.7 g (4.0 mmol) of iodo copper, and 0.4 g (4.0 mmol) of picolinic acid were added to a reaction vessel and suspended in 400 ml of dimethylsulfoxide. The reaction mixture was heated and stirred at 160° C. for 12 hours. After completion of the reaction, the mixture was cooled at room temperature, and extraction was performed using ethylacetate. An extracted organic layer was washed with a saturated aqueous sodium chloride solution and dried using sodium sulfate. A residue from which a solvent was removed was separated using column chromatography to thereby obtain 9.5 g (30 mmol) of Intermediate [36-A].

2) Synthesis of Intermediate [36-B]

9.3 g (24 mmol) of Intermediate [1-B], 9.5 g (30 mmol) of Intermediate [36-A], 1.1 g (1.2 mmol) of tris(dibenzylideneacetone)dipalladium (0), 490 mg (1.2 mmol) of 2-dicyclohexylphosphino-2',6'-dimethoxybiphenyl, and 4.6 g (48 mmol) of sodium tert-butoxide were added to a reaction vessel and suspended in 240 ml of toluene. The reaction mixture was heated and stirred at 110° C. for 3 hours. After completion of the reaction, the mixture was cooled at room temperature, and extraction was performed using ethylacetate. An extracted organic layer was washed with a saturated aqueous sodium chloride solution and dried using sodium sulfate. A residue from which a solvent was removed was separated using column chromatography to thereby obtain 6.8 g (11 mmol) of Intermediate [36-B].

3) Synthesis of Intermediate [36-C]

6.8 g (11 mmol) of Intermediate [36-B], 80 mL (550 mmol) of triethyl orthoformate, and 6.3 g (61 mmol) of a HCl 35 wt % solution were added to a reaction vessel, heated, and stirred at 80° C. for 12 hours. After completion of the reaction, the mixture was cooled at room temperature, and a residue from which a solvent was removed was separated using column chromatography to thereby obtain 5.7 g (8.6 mmol) of Intermediate [36-C].

4) Synthesis of Intermediate [36-D]

5.7 g (8.6 mmol) of Intermediate [36-C] and 2.8 g (17 mmol) of ammonium hexafluorophosphate were added to a reaction vessel and suspended in a solution containing methanol and water in a ratio of 2:1. The reaction mixture was stirred at room temperature for 12 hours. A generated solid was filtered and separated using column chromatography to thereby obtain 6.0 g (7.7 mmol) of Intermediate [36-D].

5) Synthesis of Compound 36

6.0 g (7.7 mmol) of Intermediate [36-D], 3.2 g (8.5 mmol) of dichloro (1,5-cyclooctadiene)platinum, and 1.3 g (15 mmol) of sodium acetate were suspended in 150 ml of dioxane. The reaction mixture was heated and stirred at 110° C. for 72 hours. After completion of the reaction, the mixture was cooled at room temperature, and extraction was performed using ethylacetate. An extracted organic layer was washed with a saturated aqueous sodium chloride solution and dried using sodium sulfate. A residue from which a solvent was removed was separated using column chromatography to thereby obtain 1.7 g (2.1 mmol) of Compound 36.

Synthesis Example 6: Synthesis of Compound 41

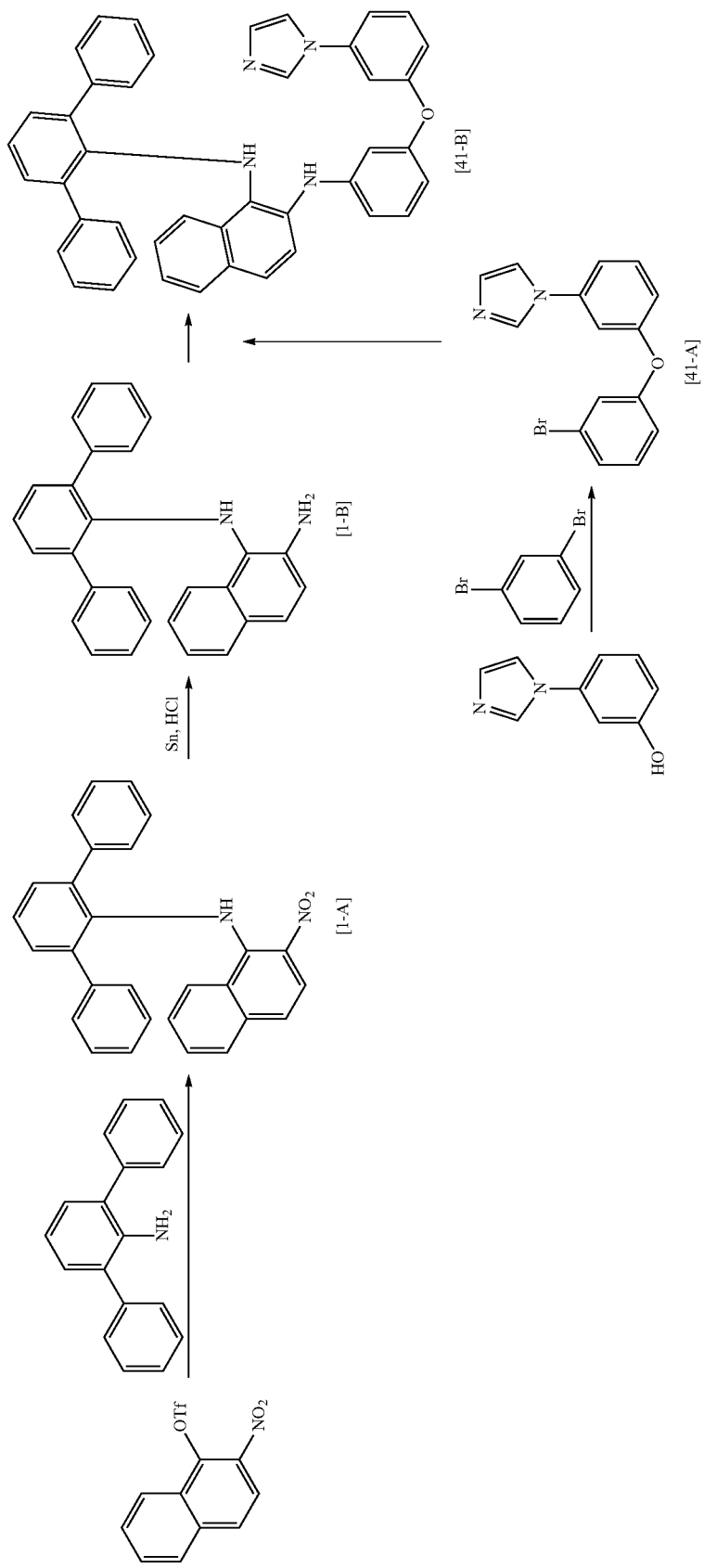

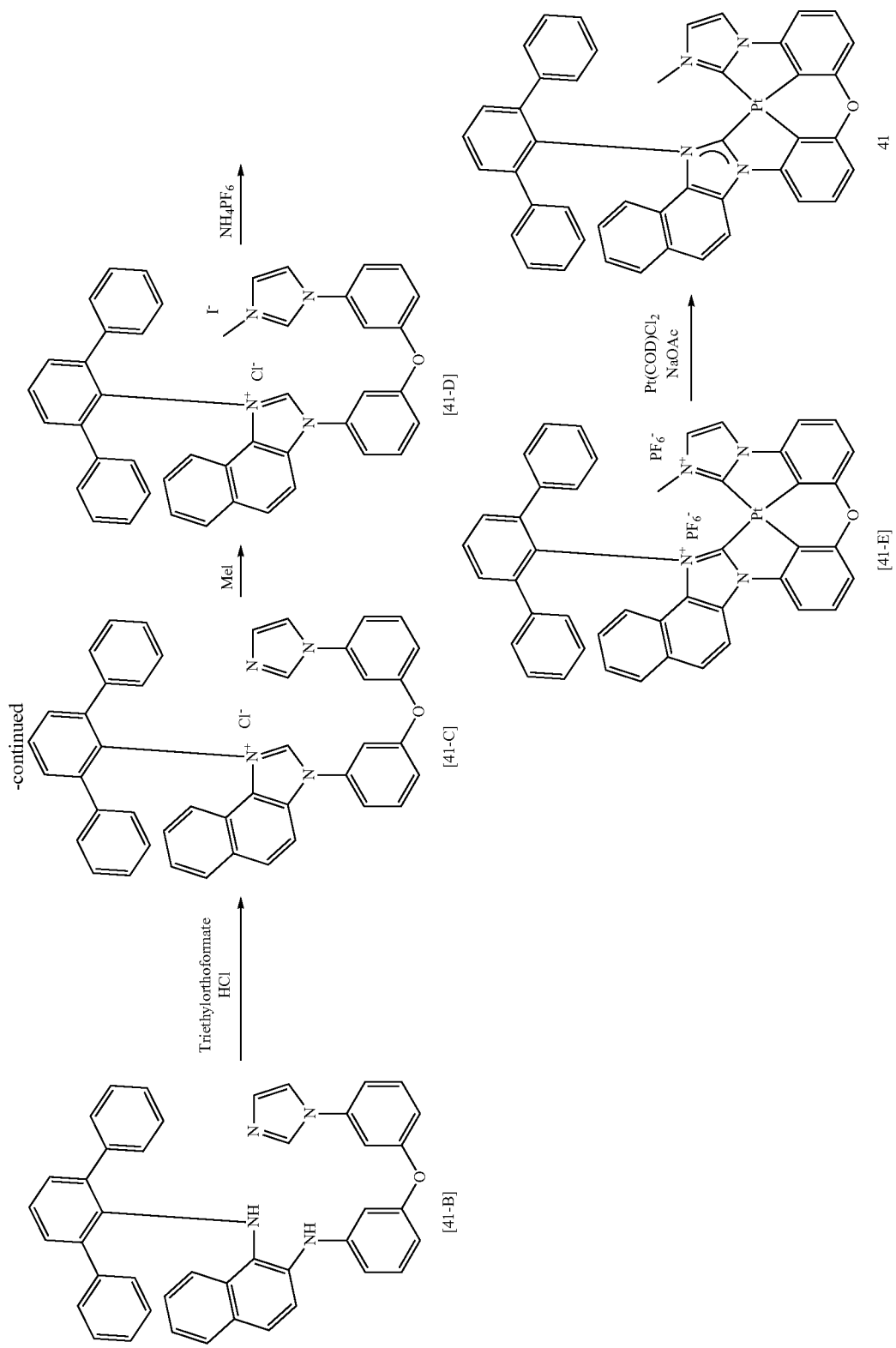

1) Synthesis of Intermediate [41-A]

8.0 g (50 mmol) of 3-(1H-imidazol-1-yl)phenol, 23.5 g (100 mmol) of 1,3-dibromobenzene, 21.4 g (100 mmol) of tripotassium phosphate, 0.9 g (5.0 mmol) of iodo copper, and 0.5 g (5.0 mmol) of picolinic acid were added to a reaction vessel and suspended in 500 ml of dimethylsulfoxide. The reaction mixture was heated and stirred at 160° C. for 12 hours. After completion of the reaction, the mixture was cooled at room temperature, and extraction was performed using ethylacetate. An extracted organic layer was washed with a saturated aqueous sodium chloride solution and dried using sodium sulfate. A residue from which a solvent was removed was separated using column chromatography to thereby obtain 11.0 g (35 mmol) of Intermediate [41-A].

2) Synthesis of Intermediate [41-B]

9.3 g (24 mmol) of Intermediate [1-B], 11.0 g (35 mmol) of Intermediate [41-A], 1.1 g (1.2 mmol) of tris(dibenzylideneacetone)dipalladium (0), 490 mg (1.2 mmol) of 2-dicyclohexylphosphino-2',6'-dimethoxybiphenyl, and 4.6 g (48 mmol) of sodium tert-butoxide were added to a reaction vessel and suspended in 240 ml of toluene. The reaction mixture was heated and stirred at 110° C. for 3 hours. After completion of the reaction, the mixture was cooled at room temperature, and extraction was performed using ethylacetate. An extracted organic layer was washed with a saturated aqueous sodium chloride solution and dried using sodium sulfate. A residue from which a solvent was removed was separated using column chromatography to thereby obtain 6.2 g (10 mmol) of Intermediate [41-B].

3) Synthesis of Intermediate [41-C]

6.2 g (10 mmol) of Intermediate [41-B], 80 mL (550 mmol) of triethyl orthoformate, and 5.7 g (55 mmol) of a HCl 35 wt % solution were added to a reaction vessel, heated, and stirred at 80° C. for 12 hours. After completion of the reaction, the mixture was cooled at room temperature, and a residue from which a solvent was removed was separated using column chromatography to thereby obtain 5.0 g (7.5 mmol) of Intermediate [41-C].

4) Synthesis of Intermediate [41-D]

5.0 g (7.5 mmol) of Intermediate [41-C] and 2.1 g (15 mmol) of iodomethane were added to a reaction vessel and suspended in 75 ml of toluene. The reaction mixture was heated and stirred at 110° C. for 6 hours. After completion of the reaction, the mixture was cooled at room temperature, and a solvent was removed therefrom, to thereby obtain an ivory solid. Purification was performed using a recrystallization method to thereby obtain 3.6 g (4.5 mmol) of Intermediate [41-D].

5) Synthesis of Intermediate [41-E]

3.6 g (4.5 mmol) of Intermediate [41-D] and 3.0 g (18 mmol) of ammonium hexafluorophosphate were added to a reaction vessel and suspended in a solution containing methanol and water in a ratio of 2:1. The reaction mixture was stirred at room temperature for 12 hours. A generated solid was filtered and separated using a recrystallization method to thereby obtain 3.3 g (3.5 mmol) of Intermediate [41-E].

6) Synthesis of Compound 41

3.3 g (3.5 mmol) of Intermediate [41-E], 1.5 g (3.9 mmol) of dichloro (1,5-cyclooctadiene)platinum, and 1.0 g (11 mmol) of sodium acetate were suspended in 110 ml of dioxane. The reaction mixture was heated and stirred at 110° C. for 72 hours. After completion of the reaction, the mixture was cooled at room temperature, and extraction was performed using ethylacetate. An extracted organic layer was washed with a saturated aqueous sodium chloride solution and dried using sodium sulfate. A residue from which a solvent was removed was separated using column chromatography to thereby obtain 750 mg (0.9 mmol) of Compound 41.

$^1$H NMR and MS/FAB of Compounds synthesized in Synthesis Examples 1 to 6 were shown in Table 1.

Even compounds other than the compounds shown in Table 1 may be easily recognized by those skilled in the art by referring to the above synthesis routes and source materials.

TABLE 1

| Compound No. | $^1$H NMR (CDCl$_3$, 400 MHz) | MS/FAB found | MS/FAB calc. |
|---|---|---|---|
| 1 | 8.72 (m, 1H), 8.41 (m, 1H), 8.21-8.18 (m, 3H), 8.14 (m, 1H), 8.05-8.04 (m, 2H), 7.91 (m, 1H), 7.75 (m, 1H), 7.60-7.55 (m, 3H), 7.45-7.43 (m, 4H), 7.40-7.38 (m, 3H), 7.30-7.28 (m, 2H), 7.20-7.15 (m, 3H), 7.10-7.07 (m, 4H), 6.91 (m, 1H), 6.69-6.67 (m, 2H) | 923.2222 | 923.2224 |
| 2 | 8.75 (m, 1H), 8.39 (m, 1H), 8.21-8.18 (m, 3H), 8.05 (m, 1H), 7.91 (m, 1H), 7.75 (m, 1H), 7.60-7.58 (m, 2H), 7.54 (m, 1H), 7.45-7.44 (m, 4H), 7.41-7.39 (m, 5H), 7.31 (m, 1H), 7.22-7.18 (m, 3H), 7.08-7.05 (m, 4H), 6.94 (m, 1H), 6.68-6.68 (m, 2H), 1.35 (s, 9H) | 979.2848 | 979.2850 |
| 12 | 8.73 (m, 1H), 8.40 (m, 1H), 8.21-8.18 (m, 3H), 8.14 (m, 1H), 8.05-8.03 (m, 2H), 7.94 (m, 1H), 7.75 (m, 1H), 7.60-7.57 (m, 2H), 7.45-7.40 (m, 5H), 7.39-7.37 (m, 3H), 7.30 (m, 2H), 7.23-7.15 (m, 3H), 7.10-7.07 (m, 4H), 6.70-6.66 (m, 2H), 1.31 (s, 9H) | 979.2849 | 979.2850 |
| 26 | 8.77 (m, 1H), 8.44 (m, 1H), 8.21 (m, 1H), 8.13 (m, 1H), 8.05 (m, 1H), 8.01-7.95 (m, 4H), 7.75 (m, 1H), 7.59-7.55 (m, 3H), 7.45-7.40 (m, 6H), 7.32-7.29 (m, 2H), 7.22-7.18 (m, 3H), 7.11-7.05 (m, 4H), 6.91 (m, 1H), 6.65-6.64 (m, 2H), 1.37 (s, 9H) | 979.2852 | 979.2850 |

TABLE 1-continued

| Compound No. | $^1$H NMR (CDCl$_3$, 400 MHz) | MS/FAB found | MS/FAB calc. |
|---|---|---|---|
| 36 | 8.48 (m, 1H), 8.33 (m, 1H), 8.20-8.19 (m, 2H), 8.05 (m, 1H), 7.90 (m, 1H), 7.74 (m, 1H), 7.59 (m, 1H), 7.45-7.39 (m, 7H), 7.35-7.32 (m, 3H), 7.20-7.18 (m, 2H), 7.10-7.05 (m, 4H), 6.95-6.89 (m, 3H), 6.65 (m, 1H) | 823.1908 | 823.1911 |
| 41 | 8.66 (m, 1H), 8.21-8.19 (m, 2H), 8.05 (m, 1H), 7.95 (m, 1H), 7.74 (m, 1H), 7.59 (m, 1H), 7.44-7.39 (m, 7H), 7.29 (m, 1H), 7.22-7.19 (m, 2H), 7.11-7.06 (m, 5H), 6.89 (m, 1H), 6.64 (m, 1H), 6.49-6.44 (m, 3H), 3.66 (s, 3H) | 837.2566 | 837.2067 |

EXAMPLES

Example 1

As an anode, a 15 S2 cm$^2$ (1,200 Å) ITO glass substrate available from Corning Inc. was cut to a size of 50 mm×50 mm×0.7 mm, sonicated by using isopropyl alcohol and pure water for 5 minutes each, and cleaned by irradiation of ultraviolet rays and exposure of ozone thereto for 30 minutes. The resultant glass substrate was loaded onto a vacuum deposition apparatus. 2-TNATA was vacuum-deposited on the substrate to form a hole injection layer having a thickness of 600 Å, and 4,4'-bis[N-(1-naphthyl)-N-phenylamino-biphenyl (hereinafter, NPB) was vacuum-deposited thereon to form a hole transport layer having a thickness of 300 Å. 3,3-di(9H-carbazol-9-yl)biphenyl (mCBP) as a host and Compound 1 (amount of dopant: 10 wt %) as a dopant were used to be co-deposited on the hole transport layer to form an emission layer having a thickness of 300 Å. Diphenyl (4-(triphenylsilyl)phenyl)-phosphine oxide (TSPO1) was vacuum-deposited thereon to form a hole blocking layer having a thickness of 50 Å. Alq$_3$ was deposited on the hole blocking layer to form an electron transport layer having a thickness of 300 Å, and Yb was deposited on the electron transport layer to form an electron injection layer having a thickness of 10 Å and AgMg was vacuum-deposited to form a cathode electrode having a thickness of 3000 Å to thereby form a Yb/AgMg electrode, thereby completing the manufacture of a light-emitting device.

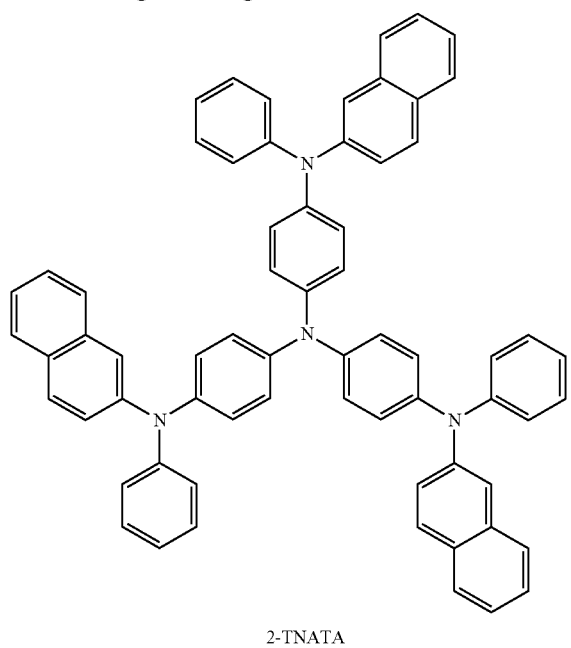

2-TNATA

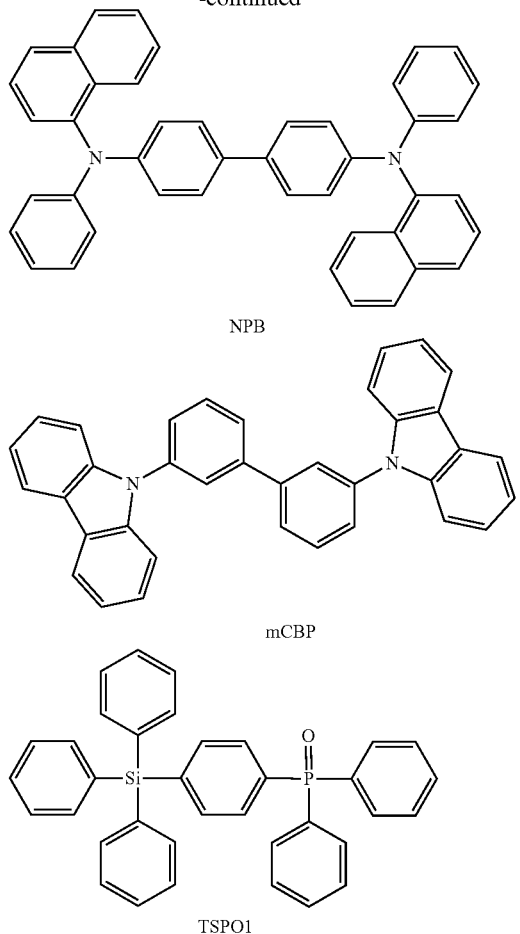

NPB mCBP

TSPO1

Example 2

A light-emitting device was manufactured in the same manner as in Example 1, except that Compound 2 was used instead of Compound 1 as a dopant in forming an emission layer.

Example 3

A light-emitting device was manufactured in the same manner as in Example 1, except that Compound 12 was used instead of Compound 1 as a dopant in forming an emission layer.

Example 4

A light-emitting device was manufactured in the same manner as in Example 1, except that Compound 26 was used instead of Compound 1 as a dopant in forming an emission layer.

Example 5

A light-emitting device was manufactured in the same manner as in Example 1, except that Compound 36 was used instead of Compound 1 as a dopant in forming an emission layer.

Example 6

A light-emitting device was manufactured in the same manner as in Example 1, except that Compound 41 was used instead of Compound 1 as a dopant in forming an emission layer.

Comparative Example 1

A light-emitting device was manufactured in the same manner as in Example 1, except that CE1 was used instead of Compound 1 as a dopant in forming an emission layer.

CE1

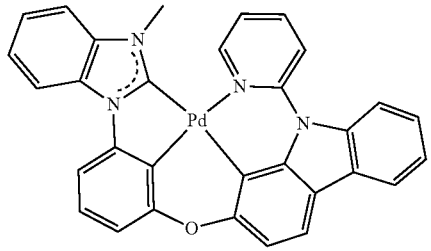

Comparative Example 2

A light-emitting device was manufactured in the same manner as in Example 1, except that CE2 was used instead of Compound 1 as a dopant in forming an emission layer.

CE2

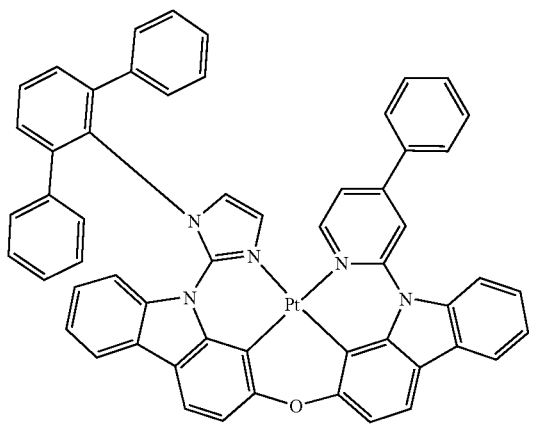

Comparative Example 3

A light-emitting device was manufactured in the same manner as in Example 1, except that CE3 was used instead of Compound 1 as a dopant in forming an emission layer.

CE3

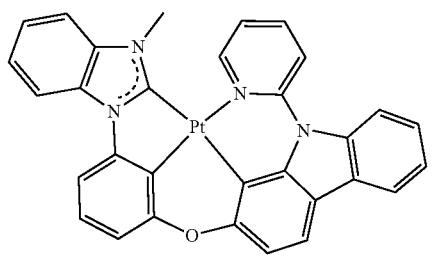

Comparative Example 4

A light-emitting device was manufactured in the same manner as in Example 1, except that CE4 was used instead of Compound 1 as a dopant in forming an emission layer.

CE4

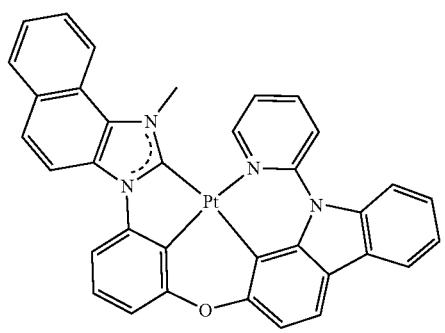

With respect to the light-emitting devices manufactured in Examples 1 to 6 and Comparative Examples to 4, driving voltage, current density, luminance, luminescence efficiency, and maximum emission wavelength were measured using Keithley SMU 236 and luminance meter PR650, and results thereof are shown in Table 2.

TABLE 2

| | Emission layer | Driving voltage (V) | Current density (mA/cm$^2$) | Luminance (cd/m$^2$) | Efficiency (cd/A) | Emission color | Emission wavelength (nm) |
|---|---|---|---|---|---|---|---|
| Example 1 | 1 | 5.09 | 50 | 3943 | 7.89 | Blue | 456 |
| Example 2 | 2 | 5.11 | 50 | 4012 | 8.02 | Blue | 454 |
| Example 3 | 12 | 5.08 | 50 | 3998 | 8.00 | Blue | 457 |
| Example 4 | 26 | 5.10 | 50 | 4001 | 8.00 | Blue | 455 |
| Example 5 | 36 | 5.14 | 50 | 3907 | 7.81 | Blue | 451 |
| Example 6 | 41 | 5.07 | 50 | 4024 | 8.05 | Blue | 464 |
| Comparative Example 1 | CE1 | 5.15 | 50 | 3863 | 7.73 | Blue | 465 |
| Comparative Example 2 | CE2 | 4.95 | 50 | 3987 | 7.97 | Green | 550 |
| Comparative Example 3 | CE3 | 5.21 | 50 | 3874 | 7.75 | Blue | 465 |
| Comparative Example 4 | CE4 | 5.23 | 50 | 3979 | 7.96 | Blue-green | 491 |

From Table 2, it was confirmed that, in cases of Examples 1 to 6 using a compound according to an embodiment of the disclosure as a dopant in an emission layer, compared to Comparative Examples 1 to 4, driving voltage is low and luminescence efficiency is improved. It was confirmed that, compared to the light-emitting devices of Comparative Examples 1 to 4, the light-emitting devices of Examples 1 to 6 emit deep-blue, and thus color purity is significantly improved.

For example, in a case where a compound according to an embodiment of the disclosure is used in a light-emitting device, the light-emitting device may have excellent characteristics in terms of driving voltage, embodiment, color purity, and/or lifespan.

A light-emitting device including the organometallic compound may have low driving voltage, high efficiency, and long lifespan.

Embodiments have been disclosed herein, and although terms are employed, they are used and are to be interpreted in a generic and descriptive sense only and not for purpose of limitation. In some instances, as would be apparent by one of ordinary skill in the art, features, characteristics, and/or elements described in connection with an embodiment may be used singly or in combination with features, characteristics, and/or elements described in connection with other embodiments unless otherwise specifically indicated. Accordingly, it will be understood by those of ordinary skill in the art that various changes in form and details may be made without departing from the spirit and scope of the disclosure as set forth in the following claims.

What is claimed is:

1. A light-emitting device comprising:
   a first electrode;
   a second electrode facing the first electrode; and
   an interlayer disposed between the first electrode and the second electrode and including an emission layer, wherein
   the emission layer comprises an organometallic compound represented by Formula 1:

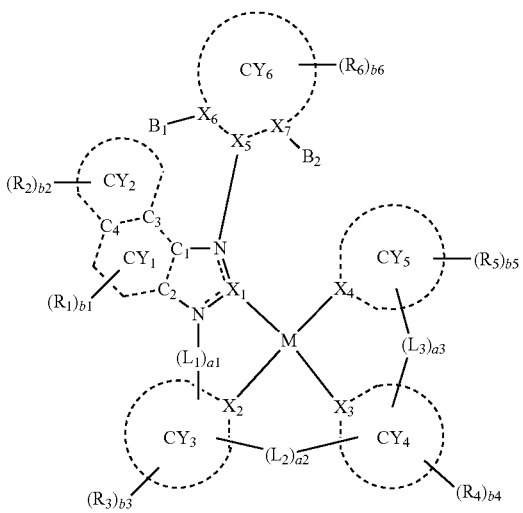

[Formula 1]

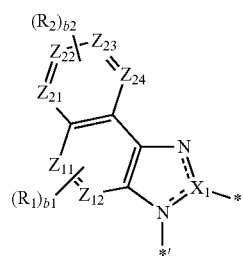

2-1

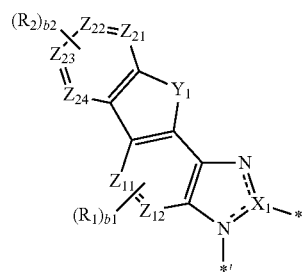

2-2

-continued 2-3

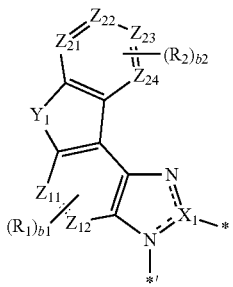

wherein in Formulae 1 and 2-1 to 2-3,
M is platinum (Pt), palladium (Pd), copper (Cu), silver (Ag), gold (Au), rhodium (Rh), iridium (Ir), ruthenium (Ru), osmium (Os), titanium (Ti), zirconium (Zr), hafnium (Hf), europium (Eu), terbium (Tb), or thulium (Tm),
$X_1$ is C,
$X_2$ to $X_7$ are each independently C or N,
$C_1$ to $C_4$ each indicate a carbon atom,
a moiety represented by

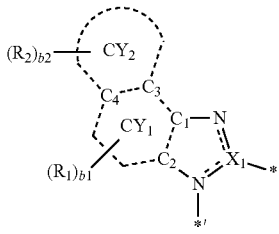

in Formula 1 is a group represented by one of Formulae 2-1 to 2-3,
$CY_3$ to $CY_6$ are each independently a $C_3$-$C_{60}$ carbocyclic group or a $C_1$-$C_{60}$ heterocyclic group,
$Y_1$ is O, S, $N(R_{21})$, $C(R_{21})(R_{22})$, or $Si(R_{21})(R_{22})$,
$Z_{11}$, $Z_{12}$, and $Z_{21}$ to $Z_{24}$ are each independently C or N,
$L_1$ is a single bond, *—O—*', *—S—*', *—Se—*', *—S(=O)$_2$—*', *—C($R_7$)($R_8$)—*', *—C($R_7$)=*', *=C($R_7$)—*', *—C($R_7$)=C($R_8$)—*', *—C(=O)—*', *—C(=S)—*', *—C≡C—*', *—B($R_7$)—*', *—N($R_7$)—*', *—P($R_7$)—*', *—Si($R_7$)($R_8$)—*', *—P(=O)($R_7$)—*', or *—Ge($R_7$)($R_8$)—*',
$L_2$ is a single bond, *—O—*', *—S—*', *—Se—*', *—S(=O)$_2$—*', *—C($R_9$)($R_{10}$)—*', *—C($R_9$)=*', *=C($R_9$)—*', *—C($R_9$)=C($R_{10}$)—*', *—C(=O)—*', *—C(=S)—*', *—C≡C—*', *—B($R_9$)—*', *—N($R_9$)—*', *—P($R_9$)—*', *—Si($R_9$)($R_{10}$)—*', *—P(=O)($R_9$)—*', or *—Ge($R_9$)($R_{10}$)—*',
$L_3$ is a single bond, *—O—*', *—S—*', *—Se—*', *—S(=O)$_2$—*', *—C($R_{11}$)($R_{12}$)—*', *—C($R_{11}$)=*', *=C($R_{11}$)*', *—C($R_{11}$)=C($R_{12}$)—*', *—C(=O)—*', *—C(=S)—*', *—C≡C—*', *—B($R_{11}$)—*', *—N($R_{11}$)—*', *—P($R_{11}$)—*', *—Si($R_{11}$)($R_{12}$)—*', *—P(=O)($R_{11}$)—*', or *—Ge($R_{11}$)($R_{12}$)—*',
a1 to a3 are each independently an integer from 1 to 3,
$B_1$ and $B_2$ are each independently a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_3$-$C_{60}$ carbocyclic group unsubstituted or substituted with at least one $R_{10a}$, or a $C_1$-$C_{60}$ heterocyclic group unsubstituted or substituted with at least one $R_{10a}$,
$R_1$ to $R_{12}$, $R_{21}$, and $R_{22}$ are each independently hydrogen, deuterium, —F, —Cl, —Br, —I, a hydroxyl group, a cyano group, a nitro group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, a $C_6$-$C_{60}$ aryloxy group unsubstituted or substituted with at least one $R_{10a}$, a $C_6$-$C_{60}$ arylthio group unsubstituted or substituted with at least one $R_{10a}$, —Si($Q_1$)($Q_2$)($Q_3$), —N($Q_1$)($Q_2$), —B($Q_1$)($Q_2$), —C(=O)($Q_1$), —S(=O)$_2$($Q_1$), or —P(=O)($Q_1$)($Q_2$),
b1 is 1 or 2,
b2 is an integer from 1 to 4,
b3 to b6 are each independently an integer from 1 to 10,
two or more groups of $R_1$ to $R_{12}$ are optionally bonded to each other to form a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$,
* and *' each indicate a binding site to a neighboring atom,
$R_{10a}$ is:
deuterium, —F, —Cl, —Br, —I, a hydroxyl group, a cyano group, or a nitro group;
a $C_1$-$C_{00}$ alkyl group, a $C_2$-$C_{60}$ alkenyl group, a $C_2$-$C_{60}$ alkynyl group, or a $C_1$-$C_{60}$ alkoxy group, each unsubstituted or substituted with deuterium, —F, —Cl, —Br, —I, a hydroxyl group, a cyano group, a nitro group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, —Si($Q_{11}$)($Q_{12}$)($Q_{13}$), —N($Q_{11}$)($Q_{12}$), —B($Q_{11}$)($Q_{12}$), —C(=O)($Q_{11}$), —S(=O)$_2$($Q_{11}$), —P(=O)($Q_{11}$)($Q_{12}$), or a combination thereof;
a $C_3$-$C_{60}$ carbocyclic group, a $C_1$-$C_{60}$ heterocyclic group, a $C_6$-$C_{60}$ aryloxy group, or a $C_6$-$C_{60}$ arylthio group, each unsubstituted or substituted with deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, —Si($Q_{21}$)($Q_{22}$)($Q_{23}$), —N($Q_{21}$)($Q_{22}$), —B($Q_{21}$)($Q_{22}$), —C(=O)($Q_{21}$), —S(=O)$_2$($Q_{21}$), —P(=O)($Q_{21}$)($Q_{22}$), or a combination thereof; or
—Si($Q_{31}$)($Q_{32}$)($Q_{33}$), —N($Q_{31}$)($Q_{32}$), —B($Q_{31}$)($Q_{32}$), —C(=O)($Q_{31}$), —S(=O)$_2$($Q_{31}$), or —P(=O)($Q_{31}$)($Q_{32}$),
wherein $Q_1$ to $Q_3$, $Q_{11}$ to $Q_{13}$, $Q_{21}$ to $Q_{23}$, and $Q_{31}$ to $Q_{33}$ are each independently: hydrogen; deuterium; —F; —Cl; —Br; —I; a hydroxyl group; a cyano group; a nitro group; a $C_1$-$C_{60}$ alkyl group; a $C_2$-$C_{60}$ alkenyl group; a $C_2$-$C_{60}$ alkynyl group; a $C_1$-$C_{60}$ alkoxy group; or a $C_3$-$C_{60}$ carbocyclic group or a $C_1$-$C_{60}$ heterocyclic group, each unsubstituted or substituted with deuterium, —F, a cyano group, a $C_1$-$C_{60}$ alkyl group, a $C_1$-$C_{60}$ alkoxy group, a phenyl group, a biphenyl group, or a combination thereof, and in Formulae 2-1 to 2-3, * indicates a binding site to M, and *' indicates a binding site to a neighboring atom.

2. The light-emitting device of claim 1, wherein
the first electrode is an anode,
the second electrode is a cathode,
the interlayer further comprises:
a hole transport region disposed between the first electrode and the emission layer; and
an electron transport region disposed between the emission layer and the second electrode,
the hole transport region comprises a hole injection layer, a hole transport layer, an emission auxiliary layer, an electron blocking layer, or a combination thereof, and
the electron transport region comprises a buffer layer, a hole blocking layer, an electron control layer, an electron transport layer, an electron injection layer, or a combination thereof.

3. The light-emitting device of claim 1, wherein
the emission layer comprises a host and a dopant, and
the dopant comprises the organometallic compound represented by Formula 1.

4. The light-emitting device of claim 2, wherein the buffer layer, the hole blocking layer, the electron control layer, the electron transport layer, the electron injection layer, or a combination thereof comprises a silicon-containing compound, a phosphine oxide-containing compound, or a combination thereof.

5. The light-emitting device of claim 1, wherein the emission layer emits blue light having a maximum emission wavelength in a range of about 410 nm to about 500 nm.

6. The light-emitting device of claim 1, further comprising at least one of a first capping layer disposed outside the first electrode and a second capping layer disposed outside the second electrode,
wherein the at least one of the first capping layer and the second capping layer has a refractive index equal to or greater than about 1.6 at a wavelength of about 589 nm.

7. A light-emitting device comprising:
a first pixel electrode, a second pixel electrode, and a third pixel electrode, respectively disposed in a first emission area, a second emission area, and a third emission area;
an opposite electrode facing the first pixel electrode, the second pixel electrode, and the third pixel electrode; and
an interlayer disposed between the opposite electrode and the first pixel electrode, the second pixel electrode, and the third pixel electrode and including an emission layer, wherein
the emission layer comprises:
a first emission layer disposed to correspond to the first emission area and emitting first-color light;
a second emission layer disposed to correspond to the second emission area and emitting second-color light; and
a third emission layer disposed to correspond to the third emission area and emitting third-color light,
a maximum emission wavelength of the first-color light, a maximum emission wavelength of the second-color light, and a maximum emission wavelength of the third-color light are different from each other,
a maximum emission wavelength of the first-color light and a maximum emission wavelength of the second-color light are each greater than a maximum emission wavelength of the third-color light, and
the third emission layer comprises an organometallic compound represented by Formula 1:

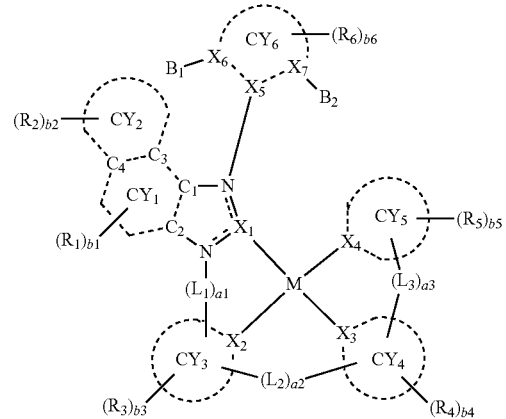

[Formula 1]

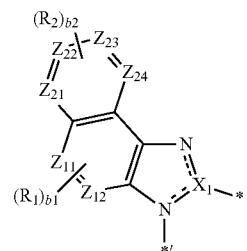

2-1

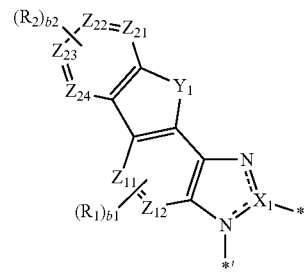

2-2

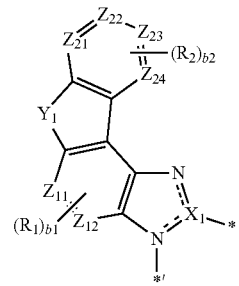

2-3 wherein in Formulae 1 and 2-1 to 2-3,

M is platinum (Pt), palladium (Pd), copper (Cu), silver (Ag), gold (Au), rhodium (Rh), iridium (Ir), ruthenium (Ru), osmium (Os), titanium (Ti), zirconium (Zr), hafnium (Hf), europium (Eu), terbium (Tb), or thulium (Tm), $X_1$ is C, $X_2$ to $X_7$ are each independently C or N, $C_1$ to $C_4$ each indicate a carbon atom, a moiety represented by

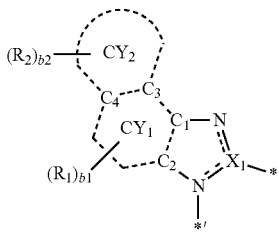

in Formula 1 is a group represented by one of Formulae 2-1 to 2-3, $CY_3$ to $CY_6$ are each independently a $C_3$-$C_{60}$ carbocyclic group or a $C_1$-$C_{60}$ heterocyclic group, $Y_1$ is O, S, $N(R_{21})$, $C(R_{21})(R_{22})$, or $Si(R_{21})(R_{22})$, $Z_{11}$, $Z_{12}$, and $Z_{21}$ to $Z_{24}$ are each independently C or N, $L_1$ is a single bond, *—O—*', *—S—*', *—Se—*', *—S(=O)$_2$—*', *—C($R_7$)($R_8$)—*', *—C($R_7$)=*', *=C($R_7$)—*', *—C($R_7$)=C($R_8$)—*', *—C(=O)—*', *—C(=S)—*', *—C≡C—*', *—B($R_7$)—*', *—N($R_7$)—*', *—P($R_7$)—*', *—Si($R_7$)($R_8$)—*', *—P(=O)($R_7$)—*', or *—Ge($R_7$)($R_8$)—*', $L_2$ is a single bond, *—O—*', *—S—*', *—Se—*', *—S(=O)$_2$—*', *—C($R_9$)($R_{10}$)—*', *—C($R_9$)=*', *=C($R_9$)—*', *—C($R_9$)=C($R_{10}$)—*', *—C(=O)—*', *—C(=S)—*', *—C≡C—*', *—B($R_9$)—*', *—N($R_9$)—*', *—P($R_9$)—*', *—Si($R_9$)($R_{10}$)—*', *—P(=O)($R_9$)—*', or *—Ge($R_9$)($R_{10}$)—*', $L_3$ is a single bond, *—O—*', *—S—*', *—Se—*', *—S(=O)$_2$—*', *—C($R_{11}$)($R_{12}$)—*', *—C($R_{11}$)=*', *=C($R_{11}$)*', *—C($R_{11}$)=C($R_{12}$)—*', *—C(=O)—*', *—C(=S)—*', *—C≡C—*', *—B($R_{11}$)—*', *—N($R_{11}$)—*', *—P($R_{11}$)—*', *—Si($R_{11}$)($R_{12}$)—*', *—P(=O)($R_{11}$)—*', or *—Ge($R_{11}$)($R_{12}$)—*', a1 to a3 are each independently an integer from 1 to 3, $B_1$ and $B_2$ are each independently a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_3$-$C_{60}$ carbocyclic group unsubstituted or substituted with at least one $R_{10a}$, or a $C_1$-$C_{60}$ heterocyclic group unsubstituted or substituted with at least one $R_{10a}$, $R_1$ to $R_{12}$, $R_{21}$, and $R_{22}$ are each independently hydrogen, deuterium, —F, —Cl, —Br, —I, a hydroxyl group, a cyano group, a nitro group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, a $C_6$-$C_{60}$ aryloxy group unsubstituted or substituted with at least one $R_{10a}$, a $C_6$-$C_{60}$ arylthio group unsubstituted or substituted with at least one $R_{10a}$, —Si($Q_1$)($Q_2$)($Q_3$), —N($Q_1$)($Q_2$), —B($Q_1$)($Q_2$), —C(=O)($Q_1$), —S(=O)$_2$($Q_1$), or —P(=O)($Q_1$)($Q_2$), b1 is 1 or 2, b2 is an integer from 1 to 4, b3 to b6 are each independently an integer from 1 to 10, two or more groups of $R_1$ to $R_{12}$ are optionally bonded to each other to form a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$,

* and *' each indicate a binding site to a neighboring atom, $R_{10a}$ is:

deuterium, —F, —Cl, —Br, —I, a hydroxyl group, a cyano group, or a nitro group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each unsubstituted or substituted with deuterium, —F, —Cl, —Br, —I, a hydroxyl group, a cyano group, a nitro group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, —Si($Q_{11}$)($Q_{12}$)($Q_{13}$), —N($Q_{11}$)($Q_{12}$), —B($Q_{11}$)($Q_{12}$), —C(=O)($Q_{11}$), —S(=O)$_2$($Q_{11}$), —P(=O)($Q_{11}$)($Q_{12}$), or a combination thereof;

a $C_3$-$C_{60}$ carbocyclic group, a $C_1$-$C_{60}$ heterocyclic group, a $C_6$-$C_{60}$ aryloxy group, or a $C_6$-$C_{60}$ arylthio group, each unsubstituted or substituted with deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, —Si($Q_{21}$)($Q_{22}$)($Q_{23}$), —N($Q_{21}$)($Q_{22}$), —B($Q_{21}$)($Q_{22}$), —C(=O)($Q_{21}$), —S(=O)$_2$($Q_{21}$), —P(=O)($Q_{21}$)($Q_{22}$), or a combination thereof; or —Si($Q_{31}$)($Q_{32}$)($Q_{33}$), —N($Q_{31}$)($Q_{32}$), —B($Q_{31}$)($Q_{32}$), —C(=O)($Q_{31}$), —S(=O)$_2$($Q_{31}$), or —P(=O)($Q_{31}$)($Q_{32}$), wherein $Q_1$ to $Q_3$, $Q_{11}$ to $Q_{13}$, $Q_{21}$ to $Q_{23}$, and $Q_{31}$ to $Q_{33}$ are each independently: hydrogen; deuterium; —F; —Cl; —Br; —I; a hydroxyl group; a cyano group; a nitro group; a $C_1$-$C_{60}$ alkyl group; a $C_2$-$C_{60}$ alkenyl group; a $C_2$-$C_{60}$ alkynyl group; a $C_1$-$C_{60}$ alkoxy group; or a $C_3$-$C_{60}$ carbocyclic group or a $C_1$-$C_{60}$ heterocyclic group, each unsubstituted or substituted with deuterium, —F, a cyano group, a $C_1$-$C_{60}$ alkyl group, a $C_1$-$C_{60}$ alkoxy group, a phenyl group, a biphenyl group, or a combination thereof, and in Formulae 2-1 to 2-3, * indicates a binding site to M, and *' indicates a binding site to a neighboring atom.

8. An electronic apparatus comprising the light-emitting device of claim 1.

9. The electronic apparatus of claim 8, further comprising a color filter, a color conversion layer, a touch screen layer, a polarizing layer, or a combination thereof.

10. An organometallic compound represented by Formula 1:

[Formula 1]

a moiety represented by in Formula 1 is a group represented by one of Formulae 2-1 to 2-3, $CY_3$ to $CY_6$ are each independently a $C_3$-$C_{60}$ carbocyclic group or a $C_1$-$C_{60}$ heterocyclic group, $Y_1$ is O, S, $N(R_{21})$, $C(R_{21})(R_{22})$, or $Si(R_{21})(R_{22})$, $Z_{11}$, $Z_{12}$, and $Z_{21}$ to $Z_{24}$ are each independently C or N, $L_1$ is a single bond, *—O—*', *—S—*', *—Se—*', *—S(=O)$_2$—*', *—C($R_7$)($R_8$)—*', *—C($R_7$)=*', *=C($R_7$)—*', *—C($R_7$)=C($R_8$)—*', *—C(=O)—*', *—C(=S)—*', *—C≡C—*', *—B($R_7$)—*', *—N($R_7$)—*', *—P($R_7$)—*', *—Si($R_7$)($R_8$)—*', *—P(=O)($R_7$)—*', or *—Ge($R_7$)($R_8$)—*, $L_2$ is a single bond, *—O—*', *—S—*', *—Se—*', *—S(=O)$_2$—*', *—C($R_9$)($R_{10}$)—*', *—C($R_9$)=*', *=C($R_9$)—*', *—C($R_9$)=C($R_{10}$)—*', *—C(=O)—*', *—C(=S)—*', *—C≡C—*', *—B($R_9$)—*', *—N($R_9$)—*', *—P($R_9$)—*', *—Si($R_9$)($R_{10}$)—*', *—P(=O)($R_9$)—*', or *—Ge($R_9$)($R_{10}$)—*', $L_3$ is a single bond, *—O—*', *—S—*', *—Se—*', *—S(=O)$_2$—*', *—C($R_{11}$)($R_{12}$)—*', *—C($R_{11}$)=*', *=C($R_{11}$)—*', *—C($R_{11}$)=C($R_{12}$)—*', *—C(=O)—*', *—C(=S)—*', *—C≡C—*', —B($R_{11}$)—*, *—N($R_{11}$)—', *—P($R_{11}$)—*', *—Si($R_{11}$)($R_{12}$)—*', *—P(=O)($R_{11}$)—*', or *—Ge($R_{11}$)($R_{12}$)—*', a1 to a3 are each independently an integer from 1 to 3, $B_1$ and $B_2$ are each independently a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_3$-$C_{60}$ carbocyclic group unsubstituted or substituted with at least one $R_{10a}$, or a $C_1$-$C_{60}$ heterocyclic group unsubstituted or substituted with at least one $R_{10a}$, $R_1$ to $R_{12}$, $R_{21}$, and $R_{22}$ are each independently hydrogen, deuterium, —F, —Cl, —Br, —I, a hydroxyl group, a cyano group, a nitro group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, a $C_6$-$C_{60}$ aryloxy group unsubstituted or substituted with at least one $R_{10a}$, a $C_6$-$C_{60}$ arylthio group unsubstituted or substituted with at least one $R_{10a}$, —Si($Q_1$)($Q_2$)($Q_3$), —N($Q_1$)($Q_2$), —B($Q_1$)($Q_2$), —C(=O)($Q_1$), —S(=O)$_2$($Q_1$), or —P(=O)($Q_1$)($Q_2$), wherein in Formulae 1 and 2-1 to 2-3, M is platinum (Pt), palladium (Pd), copper (Cu), silver (Ag), gold (Au), rhodium (Rh), iridium (Ir), ruthenium (Ru), osmium (Os), titanium (Ti), zirconium (Zr), hafnium (Hf), europium (Eu), terbium (Tb), or thulium (Tm), $X_1$ is C, $X_2$ to $X_7$ are each independently C or N, $C_1$ to $C_4$ each indicate a carbon atom, b1 is 1 or 2, b2 is an integer from 1 to 4, b3 to b6 are each independently an integer from 1 to 10, two or more groups of $R_1$ to $R_{12}$ are optionally bonded to each other to form a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$,

* and *' each indicate a binding site to a neighboring atom, $R_{10a}$ is:

deuterium, —F, —Cl, —Br, —I, a hydroxyl group, a cyano group, or a nitro group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each unsubstituted or substituted with deuterium, —F, —Cl, —Br, —I, a hydroxyl group, a cyano group, a nitro group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, —Si$(Q_{11})(Q_{12})(Q_{13})$, —N$(Q_{11})(Q_{12})$, —B$(Q_{11})(Q_{12})$, —C(=O)$(Q_{11})$, —S(=O)$_2(Q_{11})$, —P(=O)$(Q_{11})(Q_{12})$, or a combination thereof;

a $C_3$-$C_{60}$ carbocyclic group, a $C_1$-$C_{60}$ heterocyclic group, a $C_6$-$C_{60}$ aryloxy group, or a $C_6$-$C_{60}$ arylthio group, each unsubstituted or substituted with deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, —Si$(Q_{21})(Q_{22})(Q_{23})$, —N$(Q_{21})(Q_{22})$, —B$(Q_{21})(Q_{22})$, —C(=O)$(Q_{21})$, —S(=O)$_2(Q_{21})$, —P(=O)$(Q_{21})(Q_{22})$, or a combination thereof; or —Si$(Q_{31})(Q_{32})(Q_{33})$, —N$(Q_{31})(Q_{32})$, —B$(Q_{31})(Q_{32})$, —C(=O)$(Q_{31})$, —S(=O)$_2(Q_{31})$, or —P(=O)$(Q_{31})(Q_{32})$, wherein $Q_1$ to $Q_3$, $Q_{11}$ to $Q_{13}$, $Q_{21}$ to $Q_{23}$, and $Q_{31}$ to $Q_{33}$ are each independently: hydrogen; deuterium; —F; —Cl; —Br; —I; a hydroxyl group; a cyano group; a nitro group; a $C_1$-$C_{60}$ alkyl group; a $C_2$-$C_{60}$ alkenyl group; a $C_2$-$C_{60}$ alkynyl group; a $C_1$-$C_{60}$ alkoxy group; or a $C_3$-$C_{60}$ carbocyclic group or a $C_1$-$C_{60}$ heterocyclic group, each unsubstituted or substituted with deuterium, —F, a cyano group, a $C_1$-$C_{60}$ alkyl group, a $C_1$-$C_{60}$ alkoxy group, a phenyl group, a biphenyl group, or a combination thereof, and in Formulae 2-1 to 2-3, * indicates a binding site to M, and *' indicates a binding site to a neighboring atom.

11. The organometallic compound of claim 10, wherein $X_2$ and $X_3$ are each C and $X_4$ is N, or $X_2$ to $X_4$ are each C.

12. The organometallic compound of claim 10, wherein $X_2$ and $X_3$ are each C and $X_4$ is N, or $X_2$ to $X_4$ are each C, a bond between $X_1$ and M and a bond between $X_4$ and M are each a coordinate bond, and a bond between $X_2$ and M and a bond between $X_3$ and M are each a covalent bond.

13. The organometallic compound of claim 10, wherein $CY_3$ to $CY_6$ are each independently a benzene group, a naphthalene group, an anthracene group, a phenanthrene group, a triphenylene group, a pyrene group, a chrysene group, a cyclopentadiene group, a 1,2,3,4-tetrahydronaphthalene group, a thiophene group, a furan group, an indole group, a benzoborole group, a benzophosphole group, an indene group, a benzosilole group, a benzogermole group, a benzothiophene group, a benzoselenophene group, a benzofuran group, a carbazole group, a dibenzoborole group, a dibenzophosphole group, a fluorene group, a dibenzosilole group, a dibenzogermole group, a dibenzothiophene group, a dibenzoselenophene group, a dibenzofuran group, a dibenzothiophene 5-oxide group, a 9H-fluorene-9-one group, a dibenzothiophene 5,5-dioxide group, an azaindole group, an azabenzoborole group, an azabenzophosphole group, an azaindene group, an azabenzosilole group, an azabenzogermole group, an azabenzothiophene group, an azabenzoselenophene group, an azabenzofuran group, an azacarbazole group, an azadibenzoborole group, an azadibenzophosphole group, an azafluorene group, an azadibenzosilole group, an azadibenzogermole group, an azadibenzothiophene group, an azadibenzoselenophene group, an azadibenzofuran group, an azadibenzothiophene 5-oxide group, an aza-9H-fluorene-9-one group, an azadibenzothiophene 5,5-dioxide group, a pyridine group, a pyrimidine group, a pyrazine group, a pyridazine group, a triazine group, a quinoline group, an isoquinoline group, a quinoxaline group, a quinazoline group, a phenanthroline group, a pyrrole group, a pyrazole group, an imidazole group, a triazole group, an oxazole group, an isoxazole group, a thiazole group, an isothiazole group, an oxadiazole group, a thiadiazole group, a tetrazole group, a benzopyrazole group, a benzimidazole group, a benzotriazole, a benzoxazole group, a benzothiazole group, a benzoxadiazole group, a benzothiadiazole group, an indazole group, an imidazopyridine group, an imidazopyrimidine group, an imidazopyrazine group, an imidazopyridazine group, a pyrazolopyridine group, a pyrazolopyrimidine group, a pyrazolopyrazine group, a pyrazolopyridazine group, a 5,6,7,8-tetrahydroisoquinoline group, or a 5,6,7,8-tetrahydroquinoline group.

14. The organometallic compound of claim 10, wherein a moiety represented by

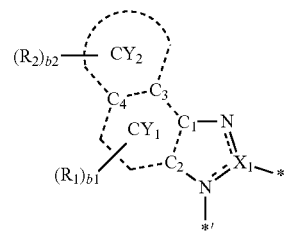

in Formula 1 is a group represented by one of Formulae 2-11 to 2-26:

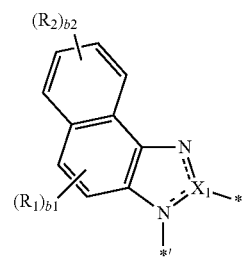

2-11

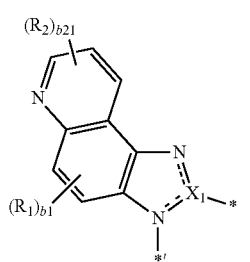
2-12
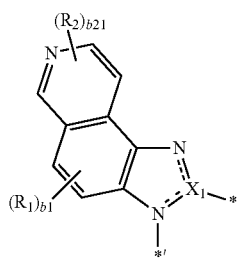
2-13
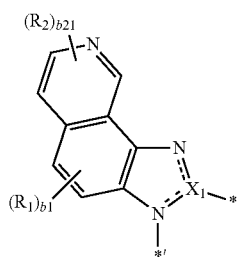
2-14
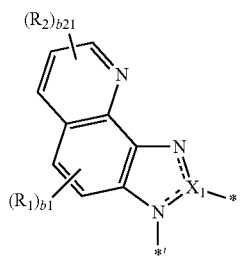
2-15
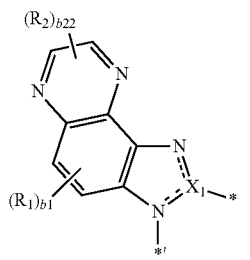
2-16
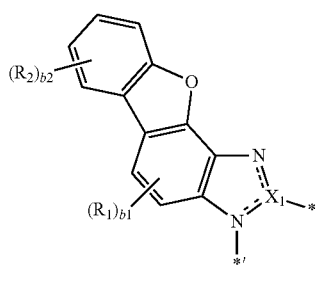
2-17
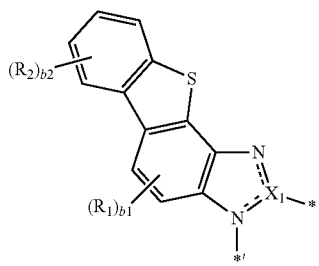
2-18
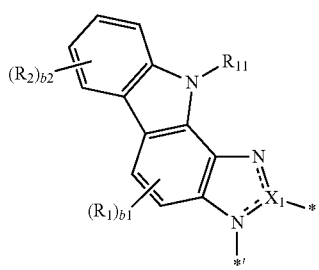
2-19
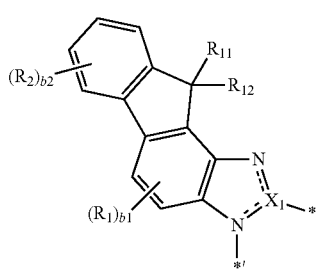
2-20
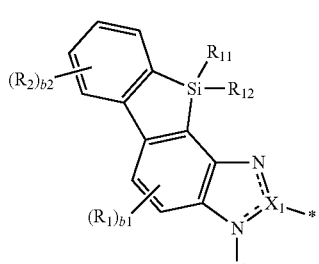
2-21
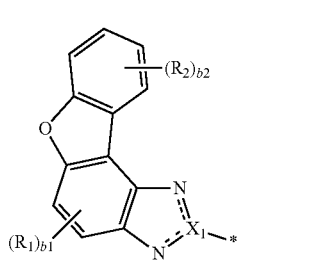
2-22
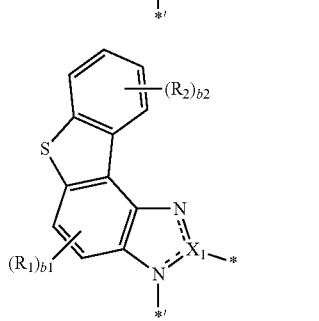
2-23

-continued 2-24

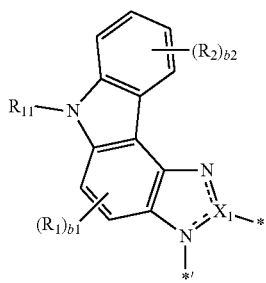

2-25

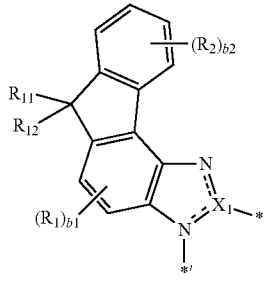

2-26

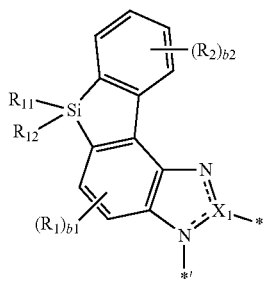

wherein in Formulae 2-11 to 2-26,
b22 is 1 or 2,
b21 is an integer from 1 to 3,
$X_1$, $R_1$, $R_2$, $R_{21}$, b1 and b2 are each the same as described in connection with Formulae 1 and 2-1 to 2-3,
* indicates a binding site to M, and
*' indicates a binding site to a neighboring atom.

15. The organometallic compound of claim 10, wherein $CY_5$ is a group represented by one of Formulae 5-1 to 5-5:

5-1

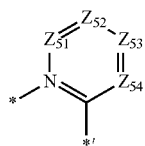

5-2

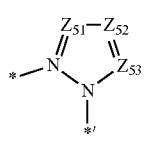

5-3

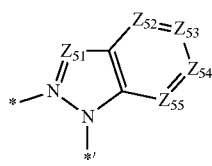

-continued 5-4

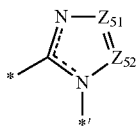

5-5

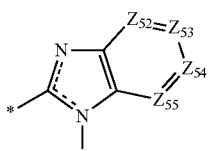

wherein in Formulae 5-1 to 5-5,
$Z_{51}$ to $Z_{55}$ are each independently C or N,
* indicates a binding site to M, and
*' indicates a binding site to a neighboring atom.

16. The organometallic compound of claim 10, wherein in Formula 1, a moiety represented by

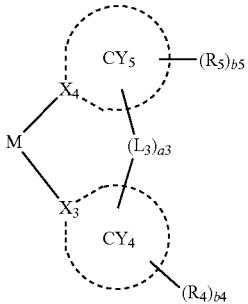

is a group represented by Formula L2-1 or L2-2:

L2-1

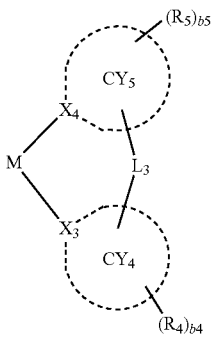

L2-2

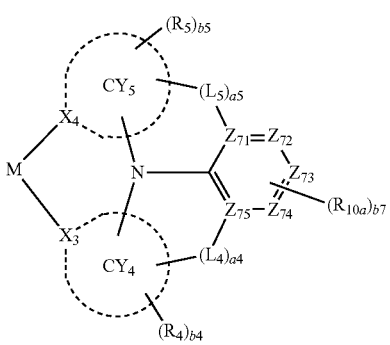

wherein in Formulae L2-1 to L2-2, $L_3$ is a single bond, *—O—*', *—S—*', *—C($R_{11}$)($R_{12}$)—*', *—N($R_{11}$)—*', or *—Si($R_{11}$)($R_{12}$)—*', $Z_{71}$ to $Z_{75}$ are each independently C—*', C, or N, $L_4$ is a single bond or *—C($R_{101}$)($R_{102}$)—*', $L_5$ is a single bond or *—C($R_{103}$)($R_{104}$)—*', a4 and a5 are each independently an integer from 0 to 3, a sum of a4 and a5 is 1 or more, when a4 is 0, -($L_4$)$_{a4}$- is not present, when a4 is 1 or 2, $Z_{75}$ is C—*', when a5 is 0, -($L_5$)$_{a5}$- is not present, when a5 is 1 or 2, $Z_{71}$ is C—*', $R_{101}$ to $R_{104}$ are each independently hydrogen or a $C_1$-$C_{10}$ alkyl group, b7 is an integer from 0 to 5, $X_3$, $X_4$, $CY_4$, $CY_5$, $R_4$, $R_5$, $R_{11}$, $R_{12}$, b4, b5, and $R_{10a}$ are each the same as described in connection with Formula 1, and

* and *' each indicate a binding site to a neighboring atom.

17. The organometallic compound of claim 10, wherein in Formula 1, a moiety represented by

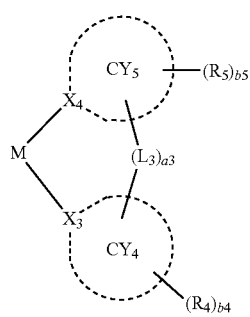

is a group represented by one of Formula L2-11 to L2-22:

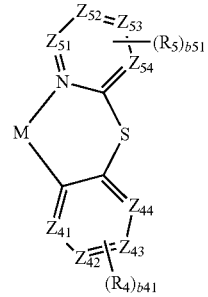

L2-11

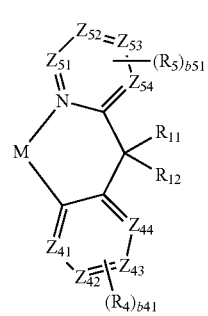

L2-12

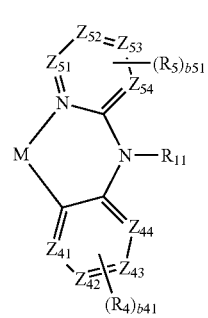

L2-13

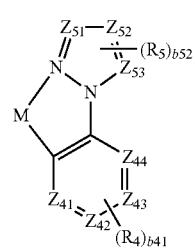

L2-14

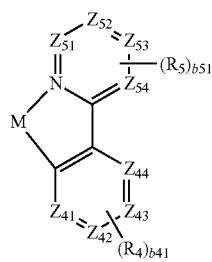

L2-15

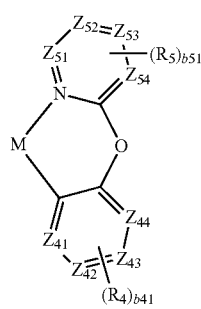

L2-16

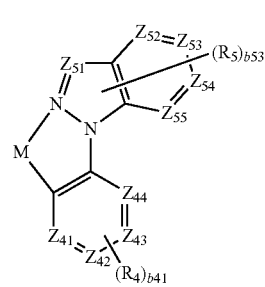

L2-17

-continued

L2-18 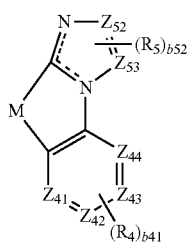

L2-19 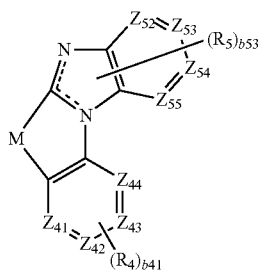

L2-20 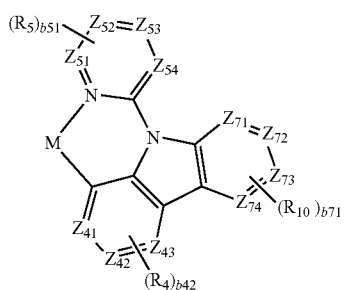

L2-21 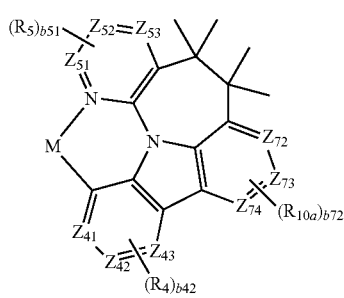

L2-22 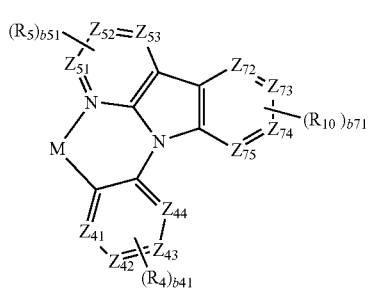

wherein in Formulae L2-11 to L2-22, $Z_{41}$ to $Z_{44}$, $Z_{51}$ to $Z_{54}$, and $Z_{71}$ to $Z_{75}$ are each independently C or N, b41 and b51 are each independently an integer from 1 to 4, b42 and b52 are each independently an integer from 1 to 3, b53 is an integer from 1 to 5, b71 is an integer from 0 to 4, b72 is an integer from 0 to 3, and $R_4$, $R_5$, $R_{11}$, $R_{12}$, and $R_{10a}$ are each the same as described in connection with Formula 1.

18. The organometallic compound of claim 10, wherein in Formula 1, a moiety represented by

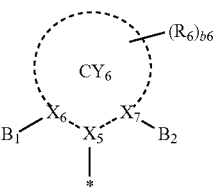

is a group represented by Formula 6-1:

Formula 6-1

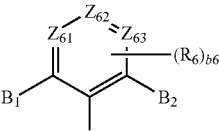

wherein in Formula 6-1, $Z_{61}$ to $Z_{63}$ are each independently C or N, b6 is an integer from 0 to 3, $B_1$, $B_2$, and $R_6$ are each the same as described in connection with Formula 1, and

* indicates a binding site to a neighboring atom.

19. The organometallic compound of claim 10, wherein the organometallic compound is selected from Compounds 1 to 120:

1

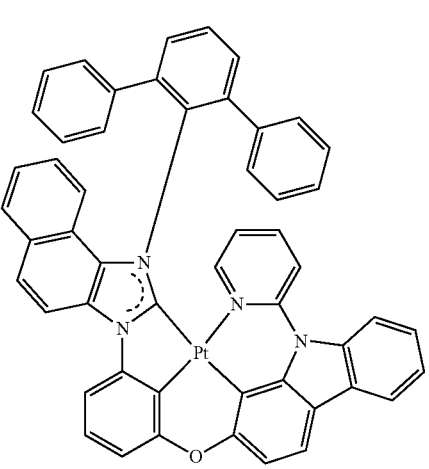

245
-continued
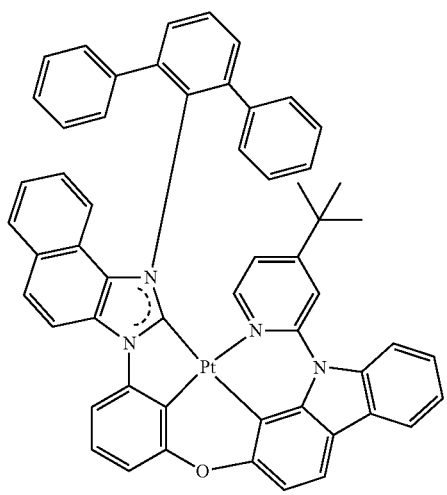
2
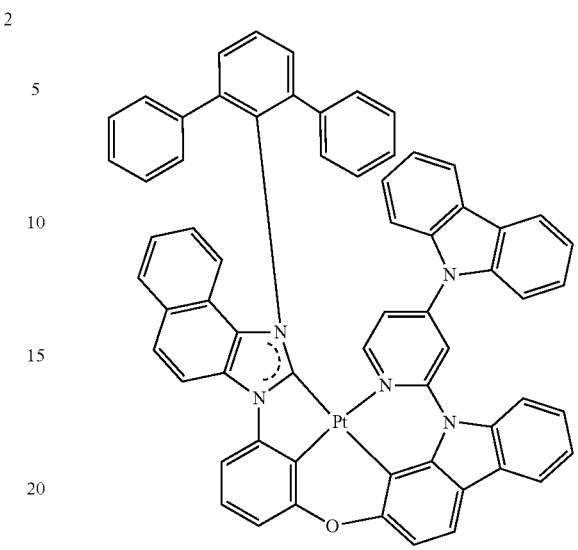
5
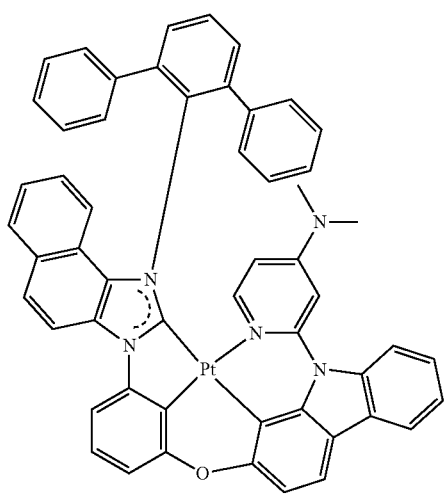
3
246
-continued
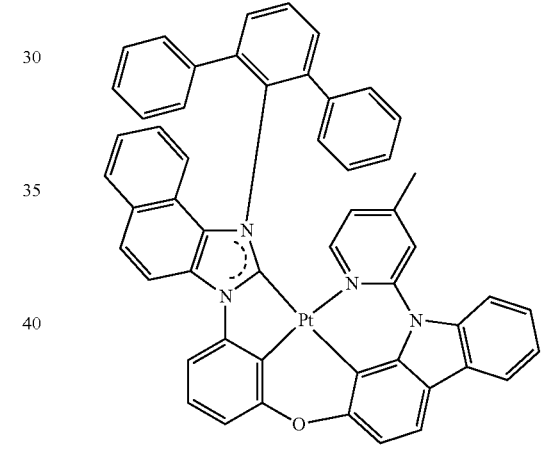
6
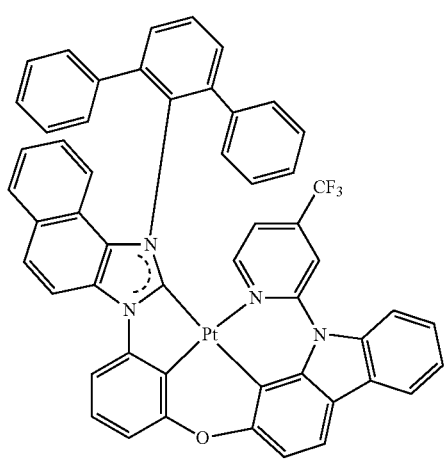
4
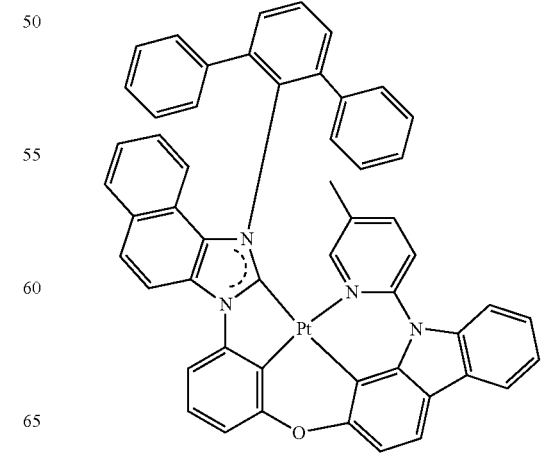
7

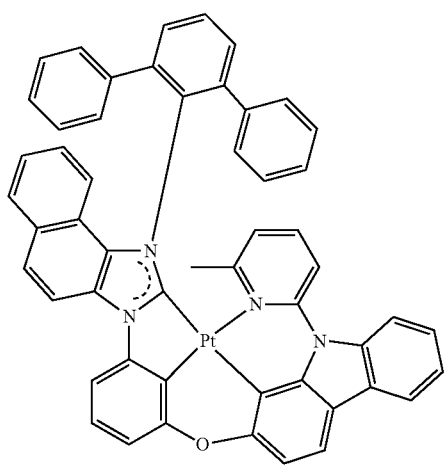
8
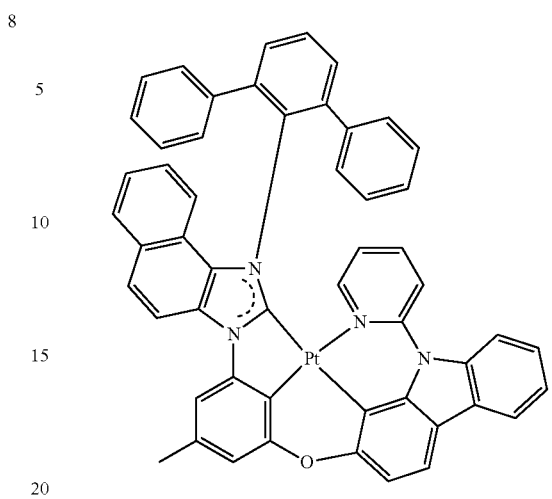
11
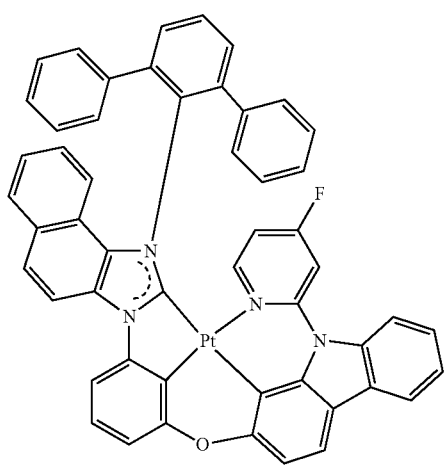
9
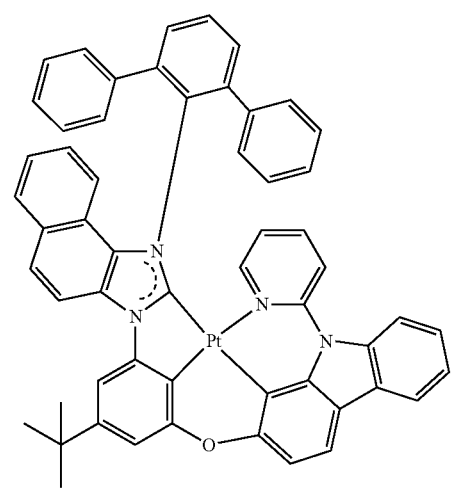
12
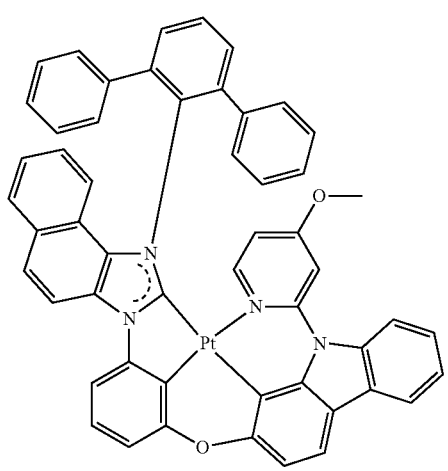
10
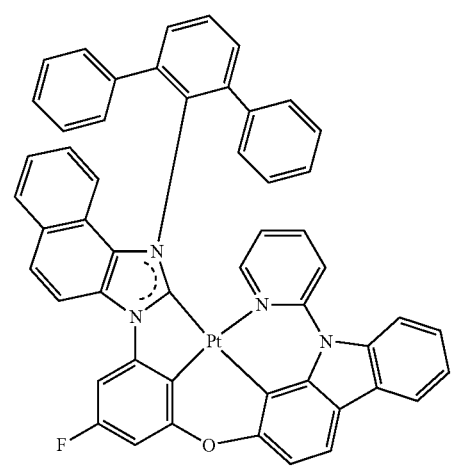
13

14
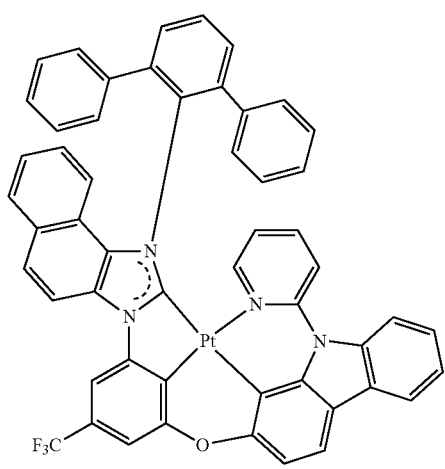
15
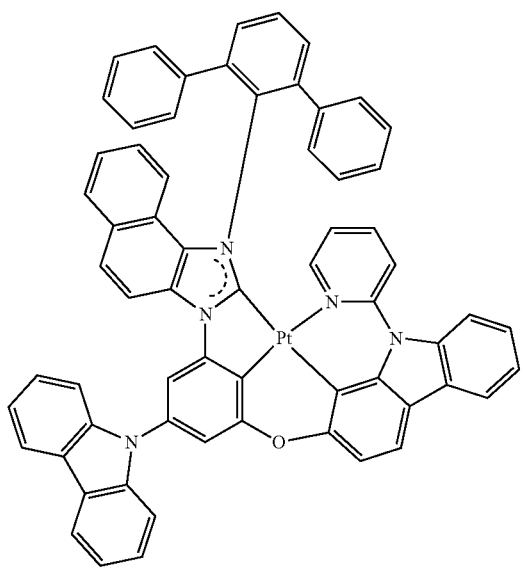
16
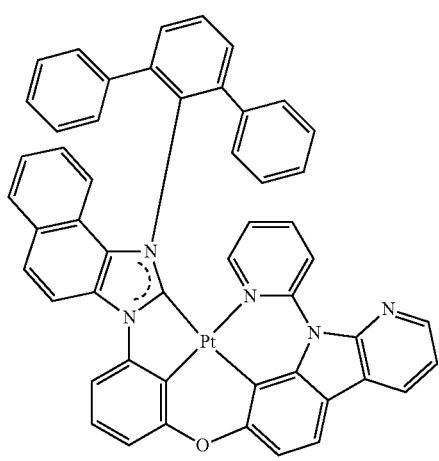
17
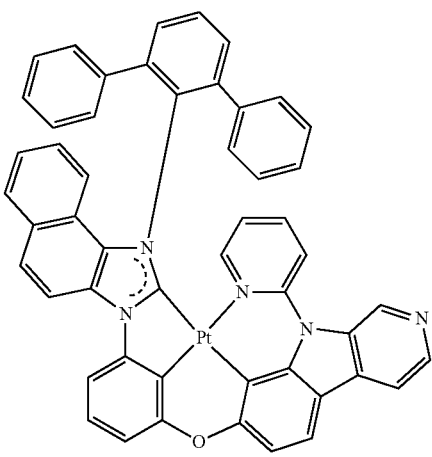
18
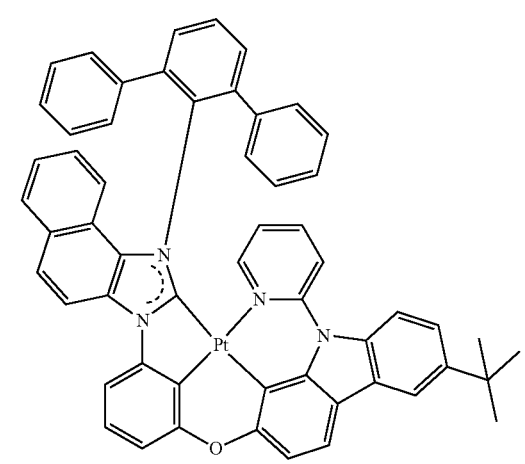
19

251
-continued
20
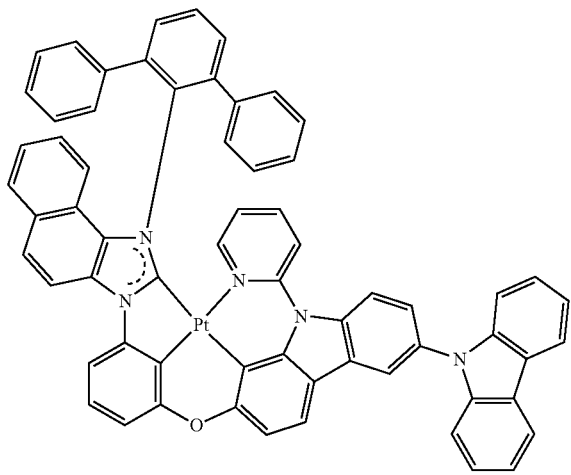
21
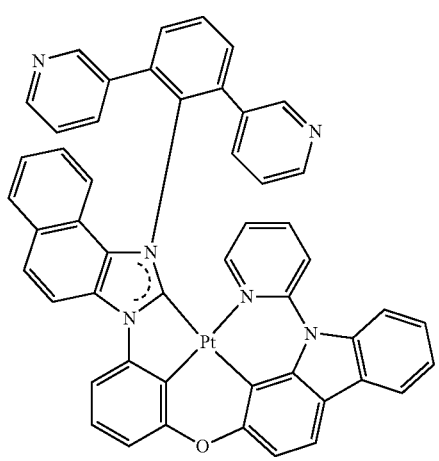
22
252
-continued
23
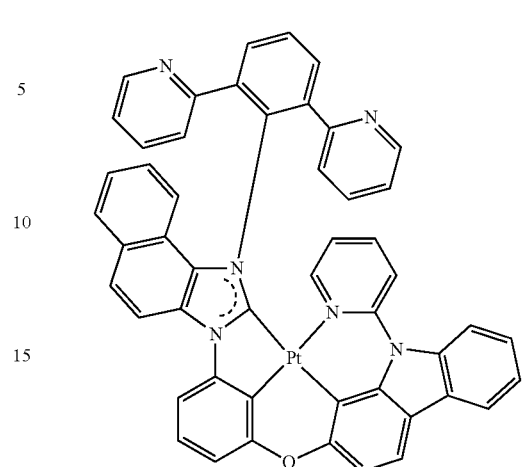
24
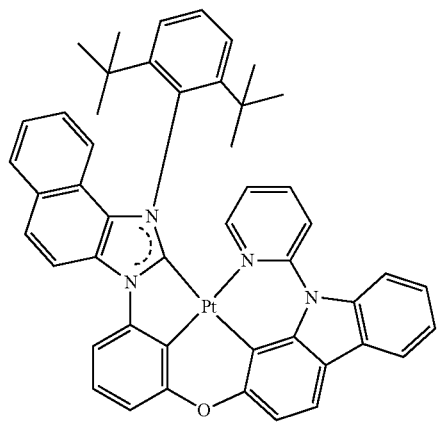
25

26
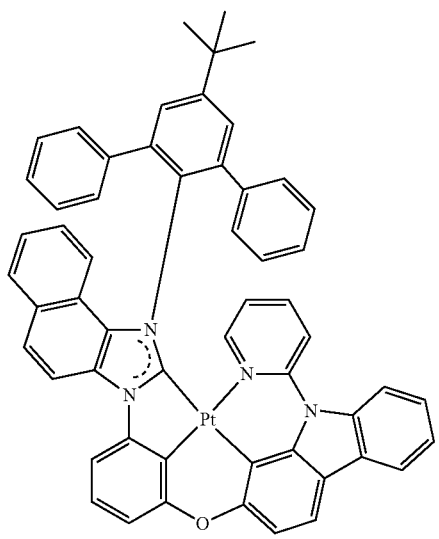
28
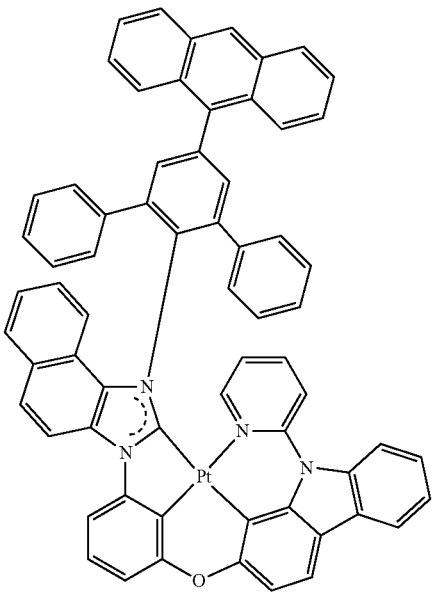
27
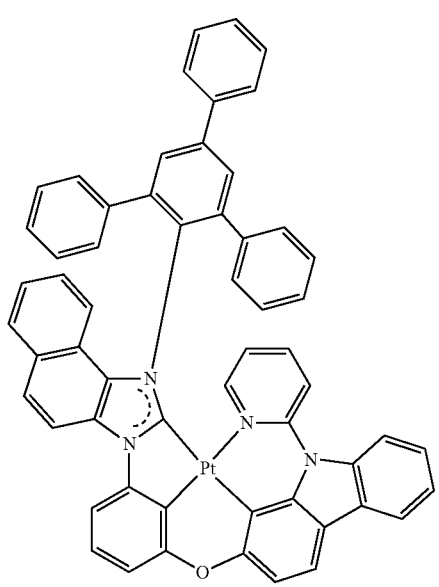
29
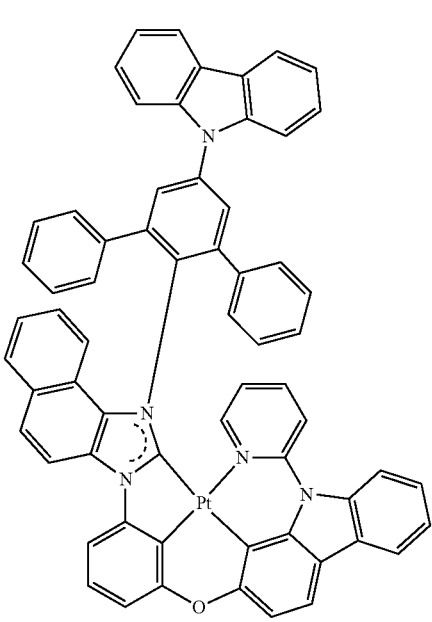

255
-continued
30
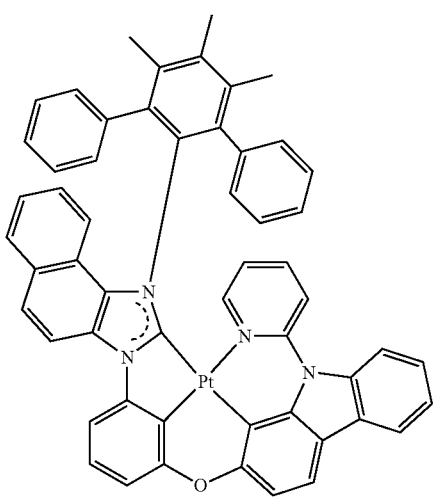
31
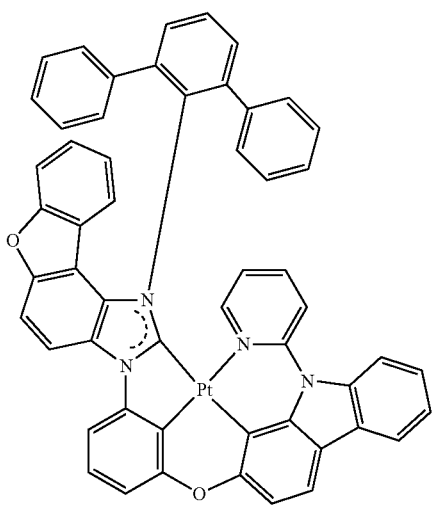
32
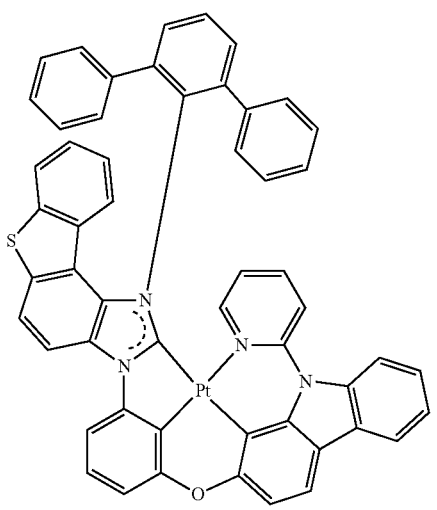
256
-continued
33
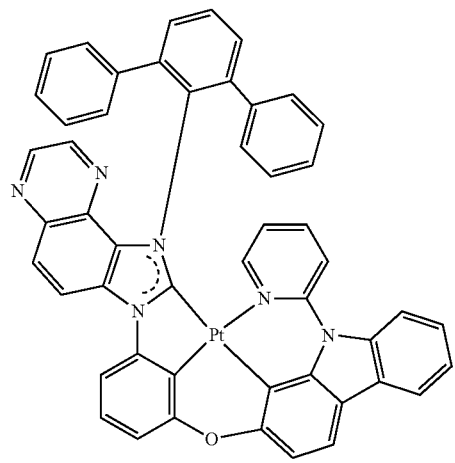
34
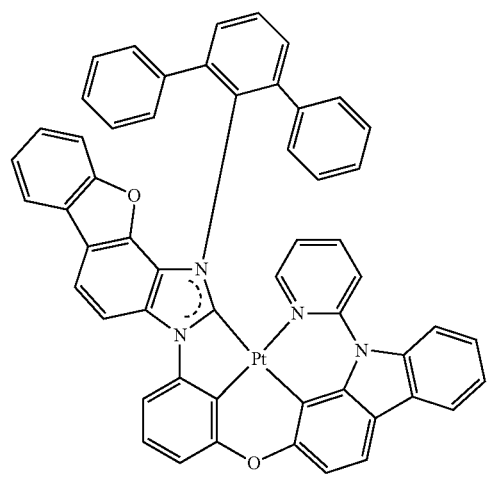
35
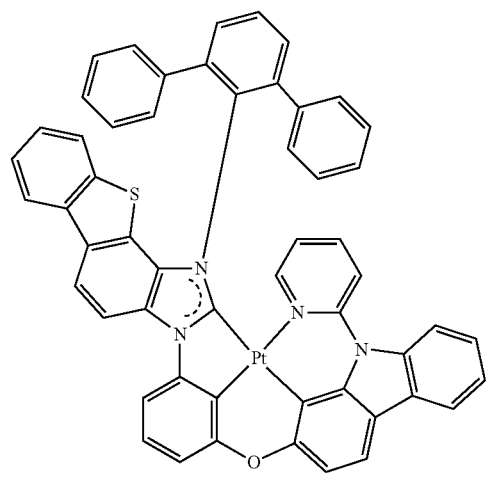

36
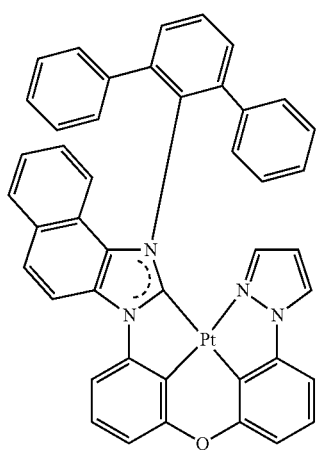
39
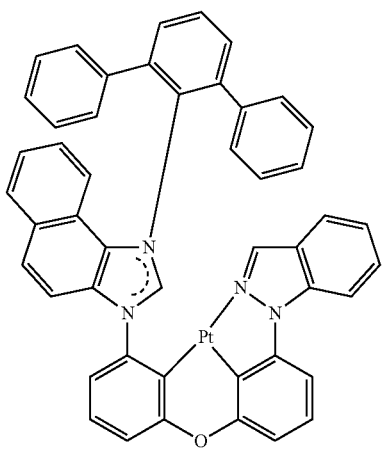
37
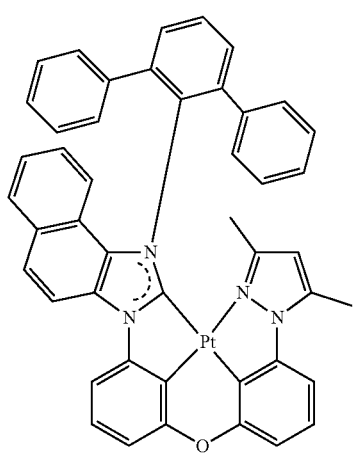
40
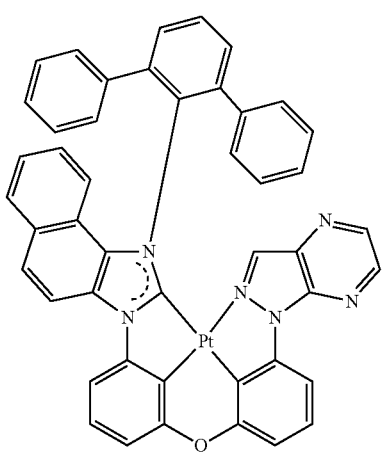
38
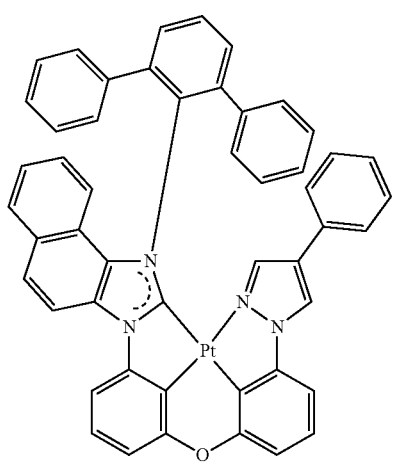
41
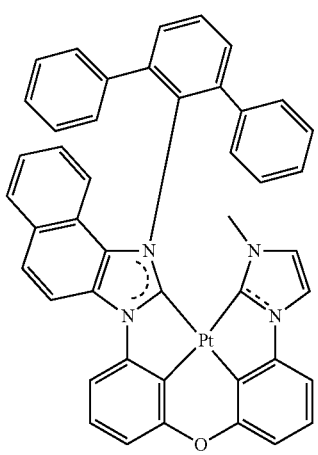

42
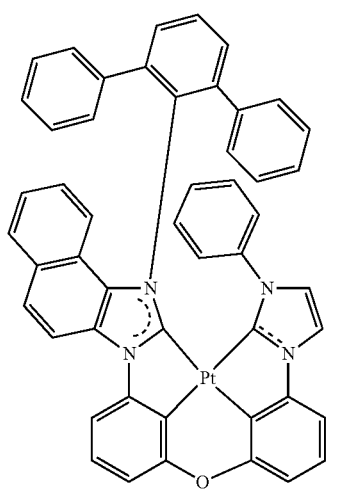
43
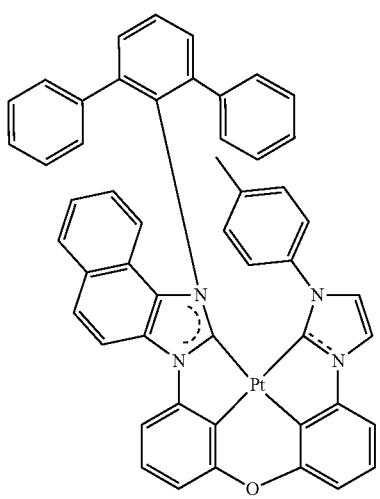
44
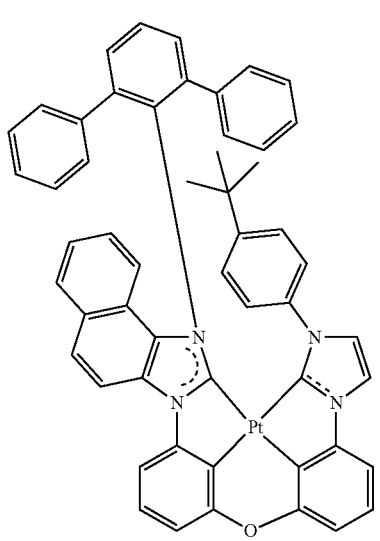
45
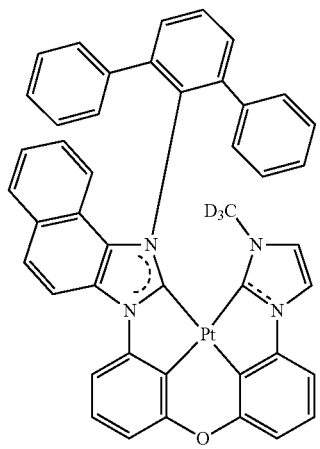
46
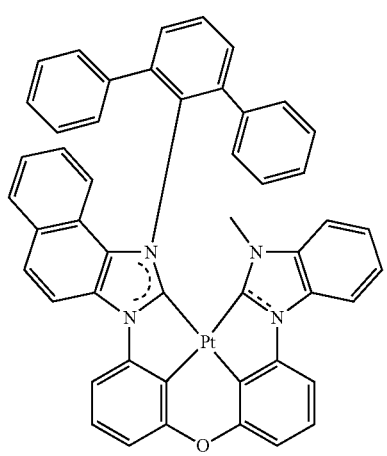
47
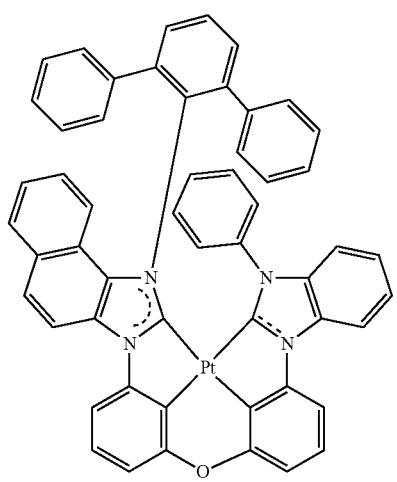

48
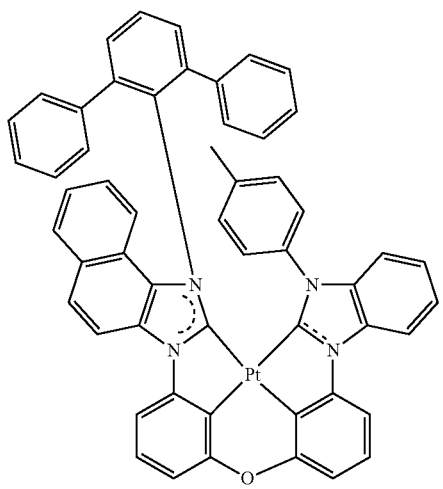
49
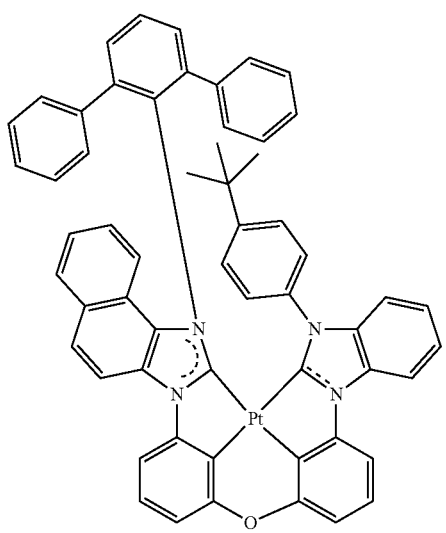
50
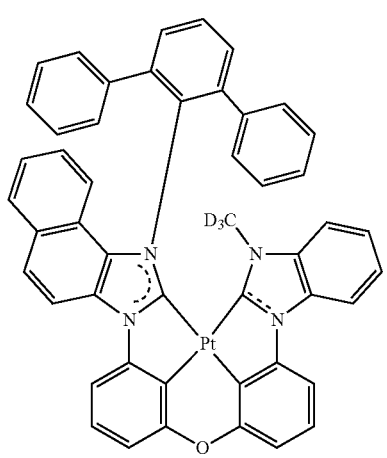
51
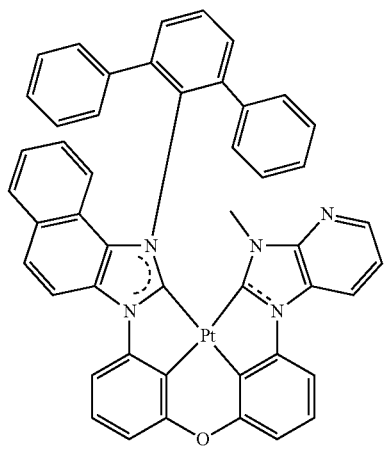
52
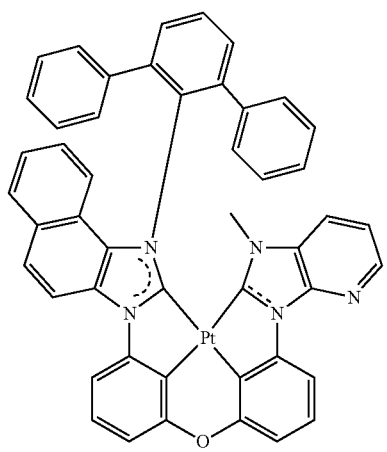
53
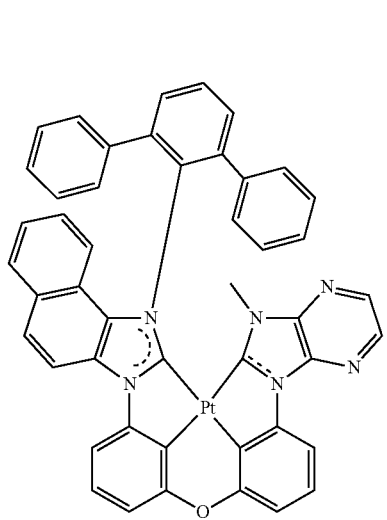

54
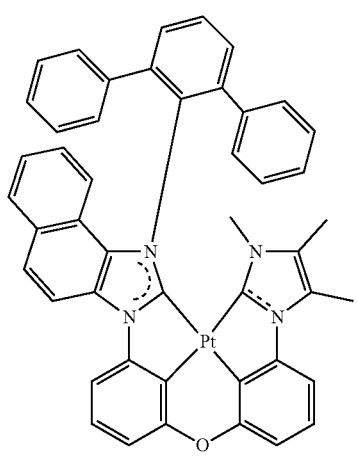
55
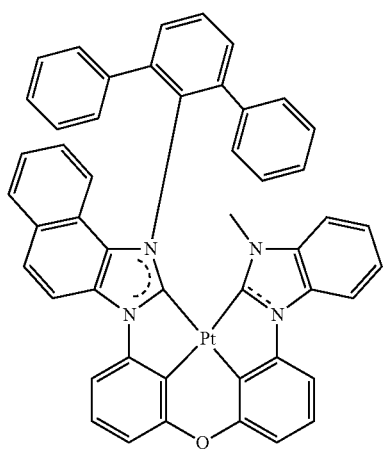
56
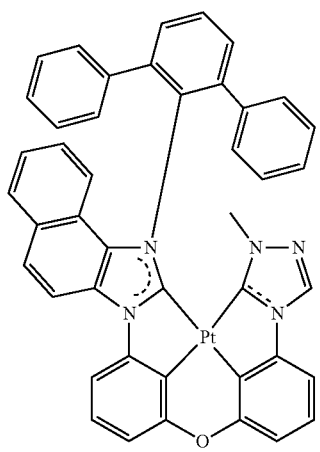
57
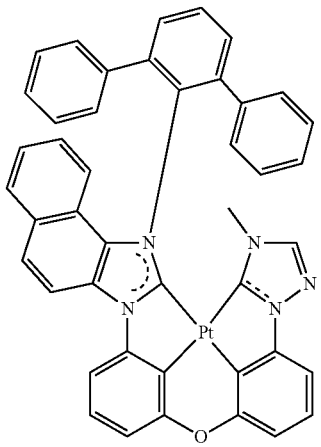
58
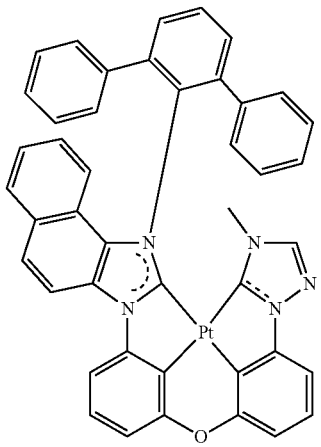
59
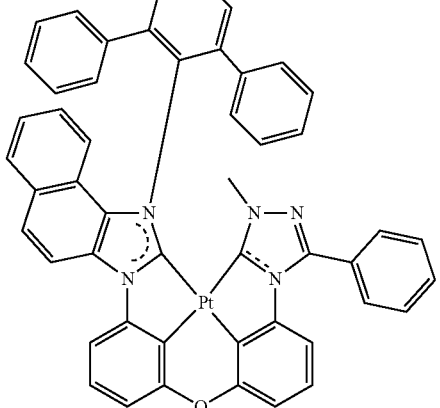

265
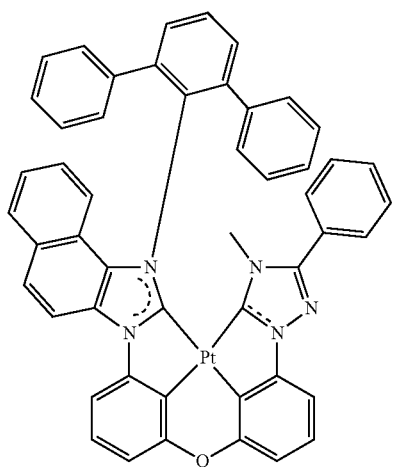
266
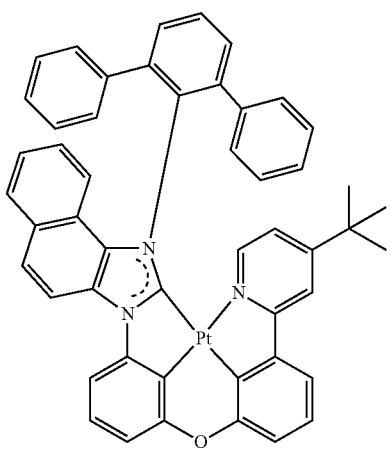
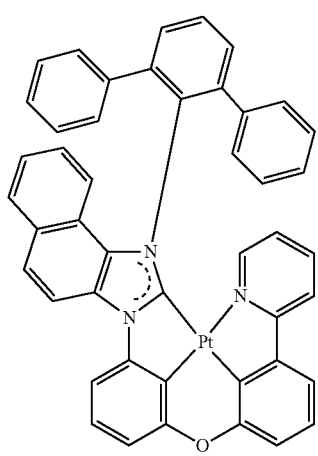
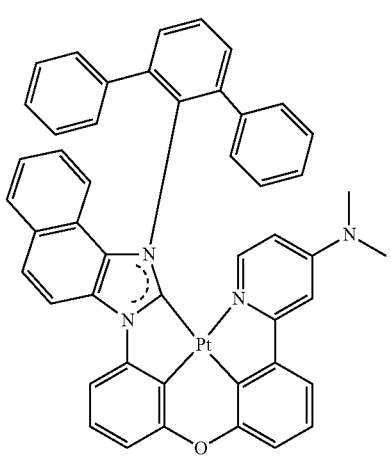
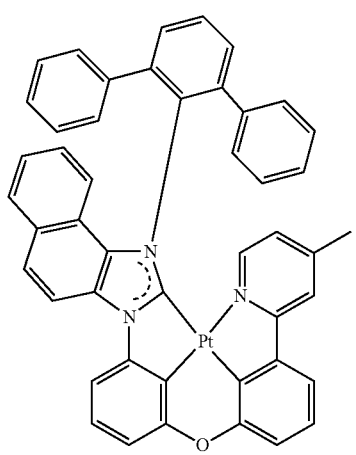
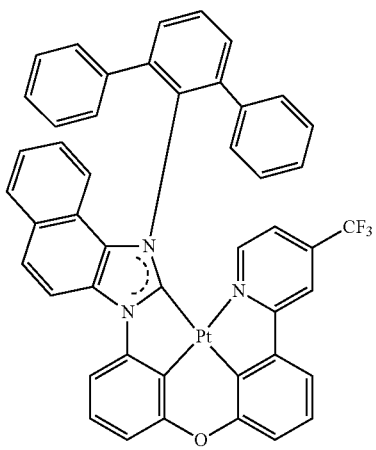

66
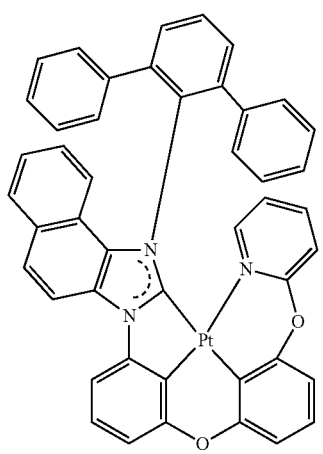
67
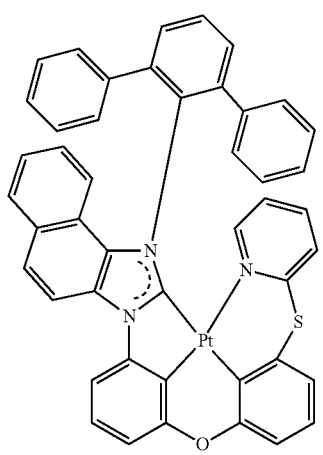
68
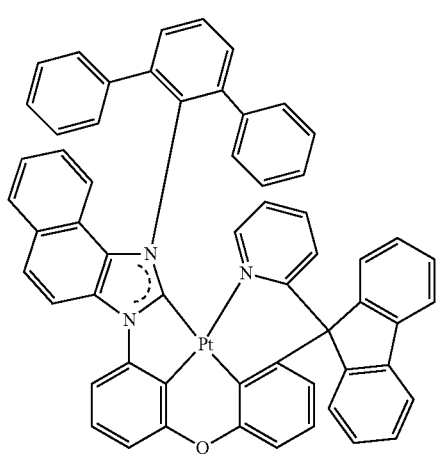
69
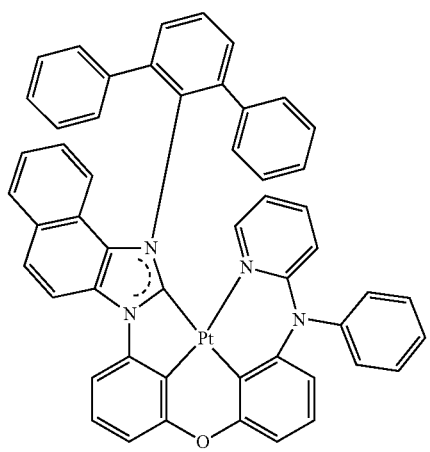
70
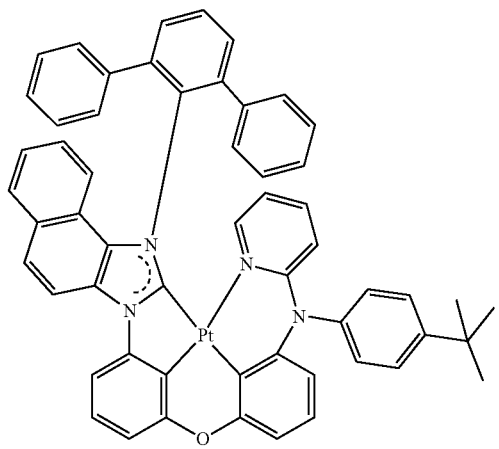
71
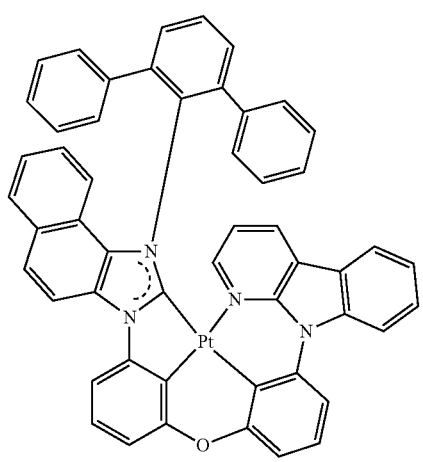

-continued
72
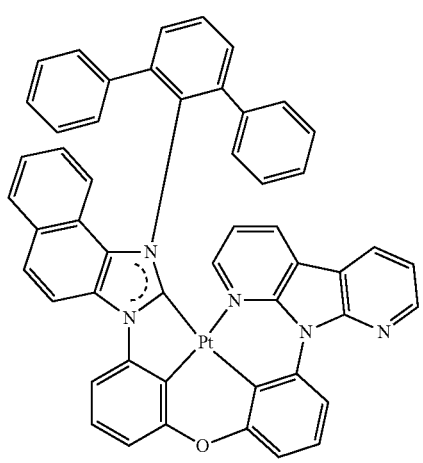
73
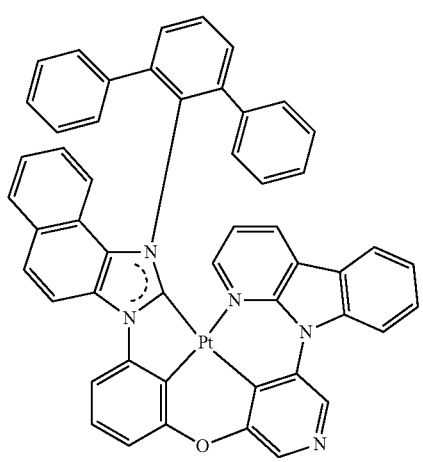
74
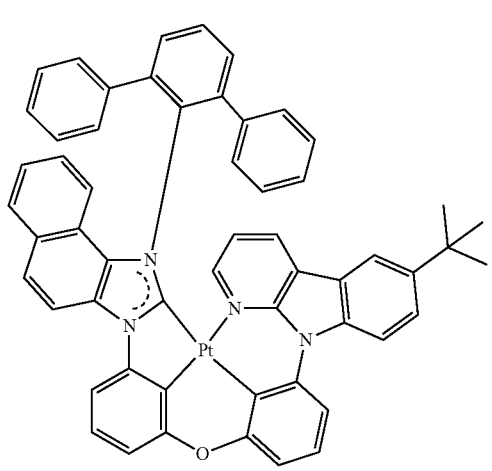
-continued
75
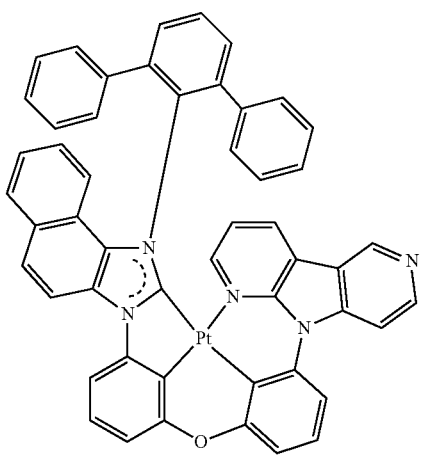
76
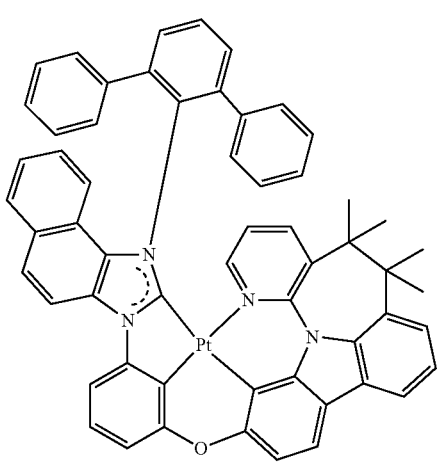
77
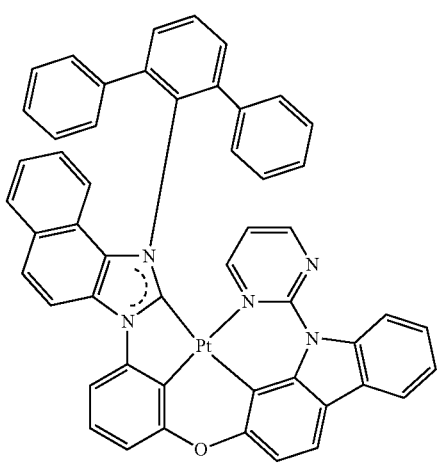

78
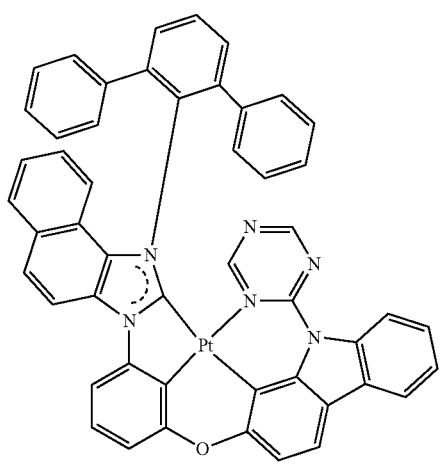
79
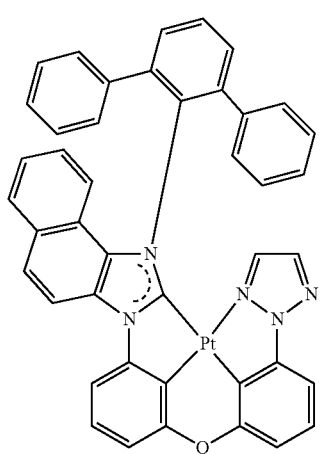
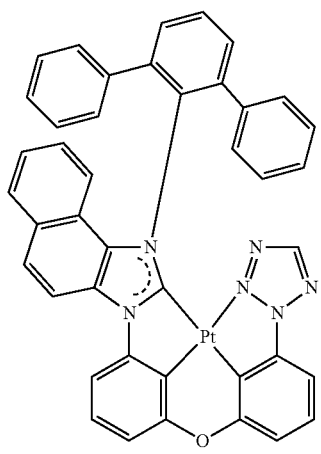
81
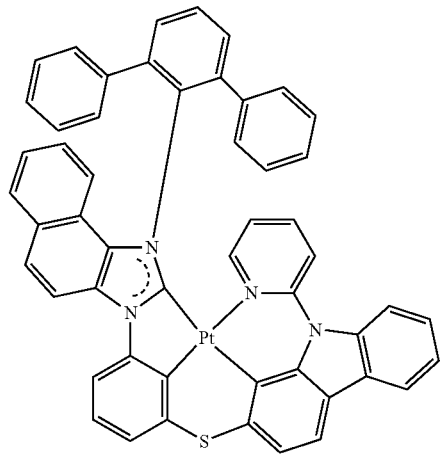
82
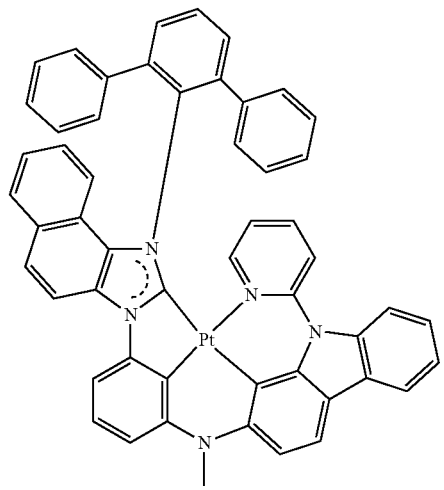
83
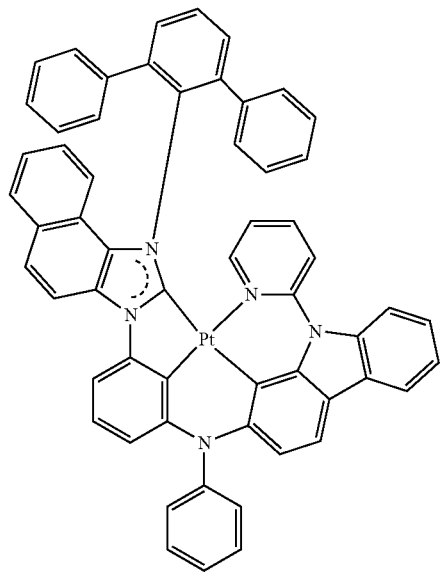

273
-continued
84
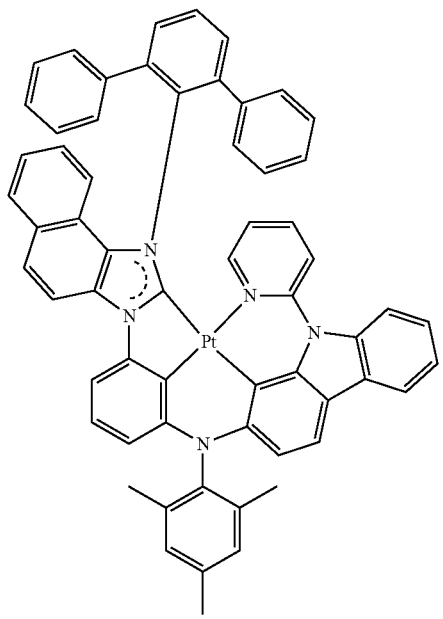
274
-continued
86
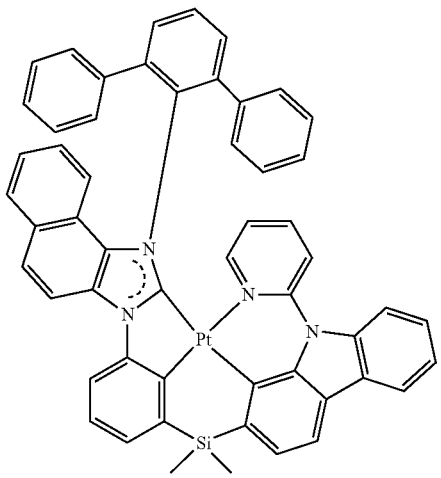
87
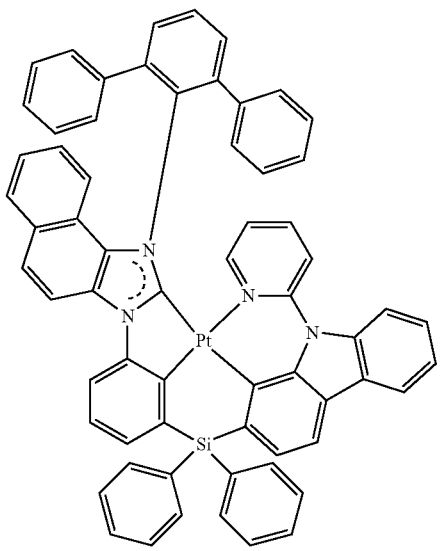
85
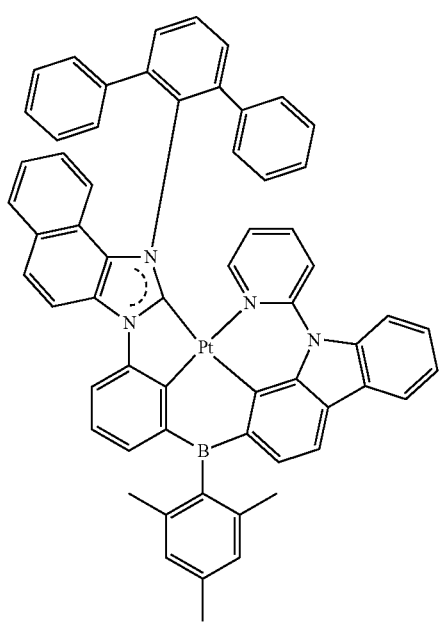
88
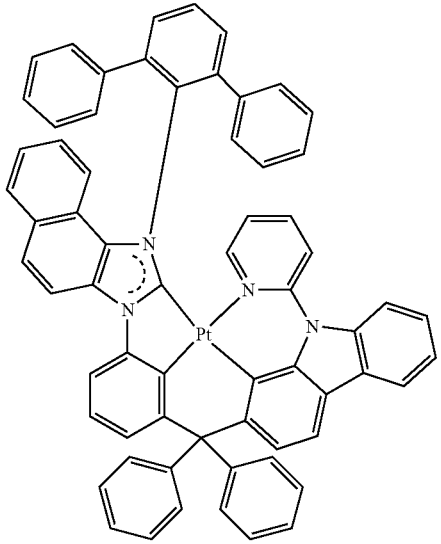

89
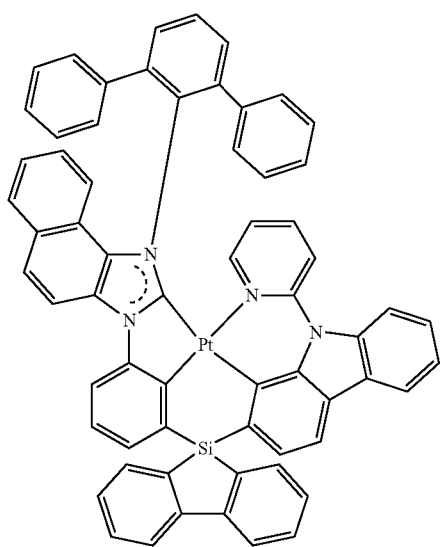
90
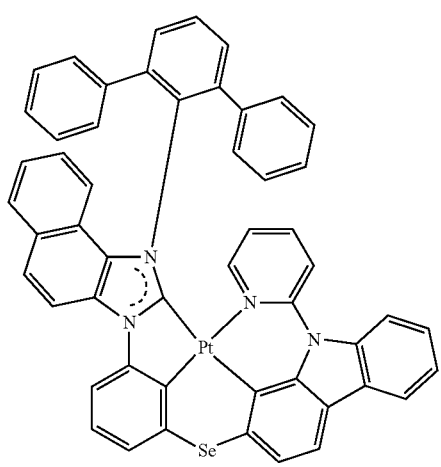
91
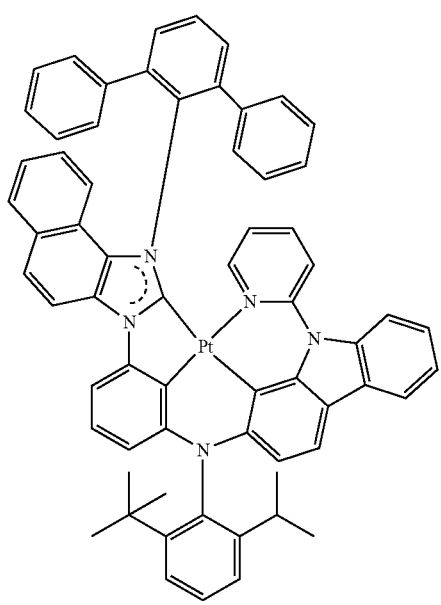
92
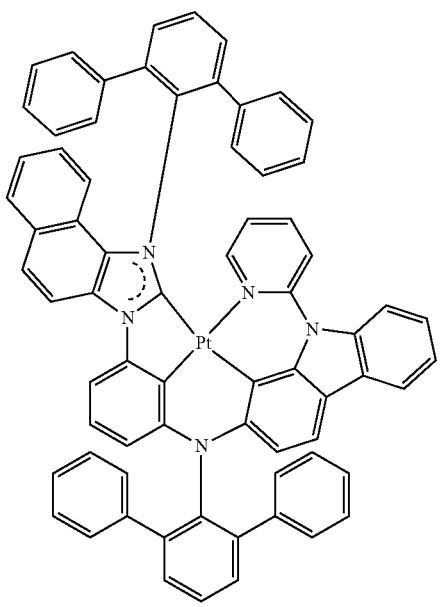
93
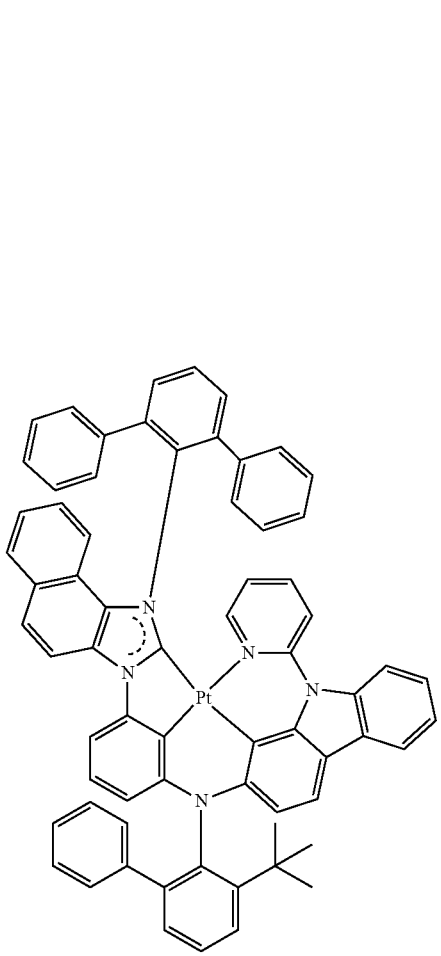

277
-continued
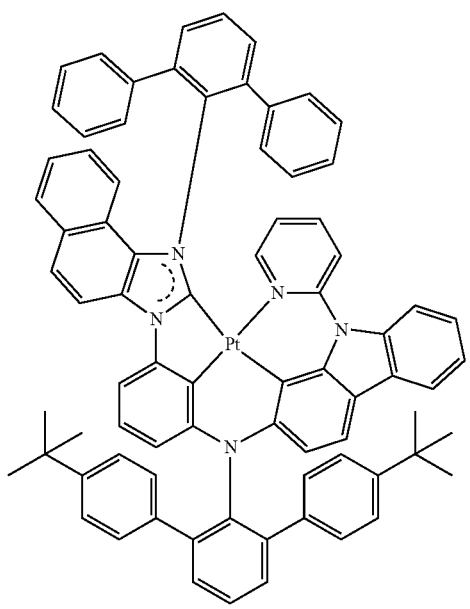
94
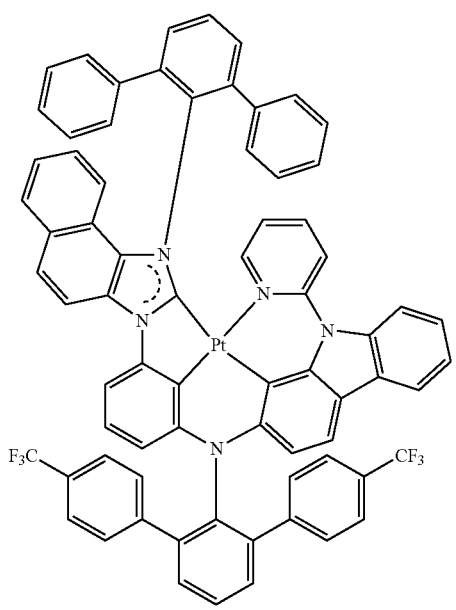
95
278
-continued
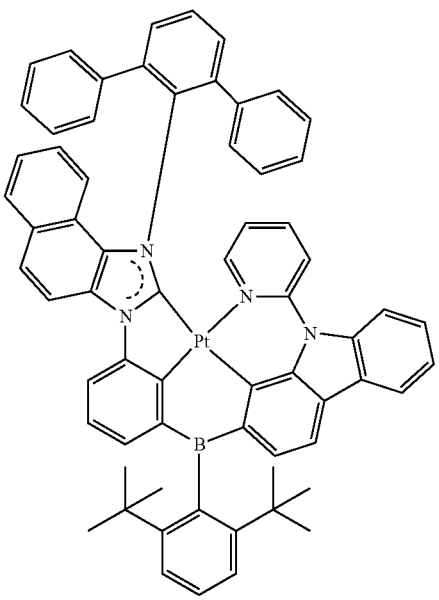
96
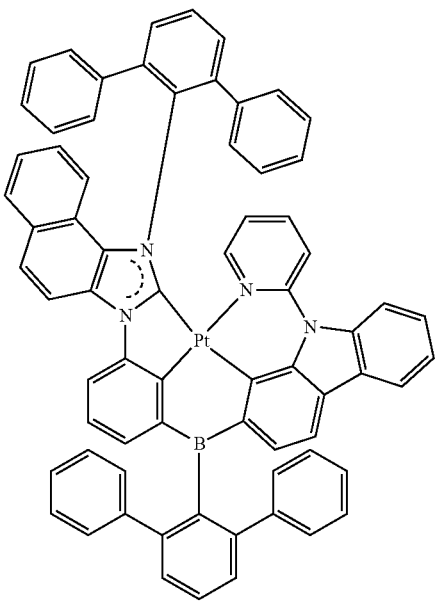
97

98
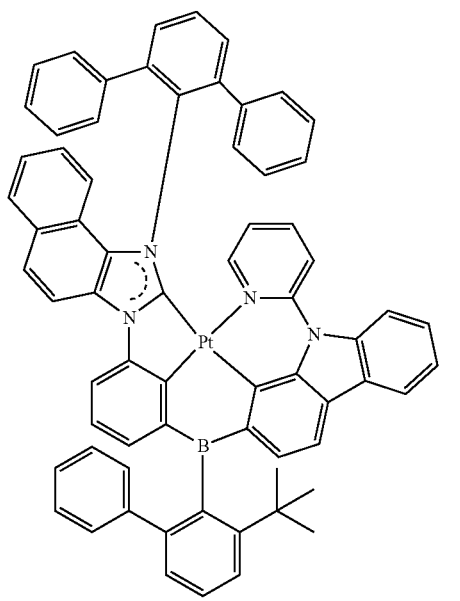
99
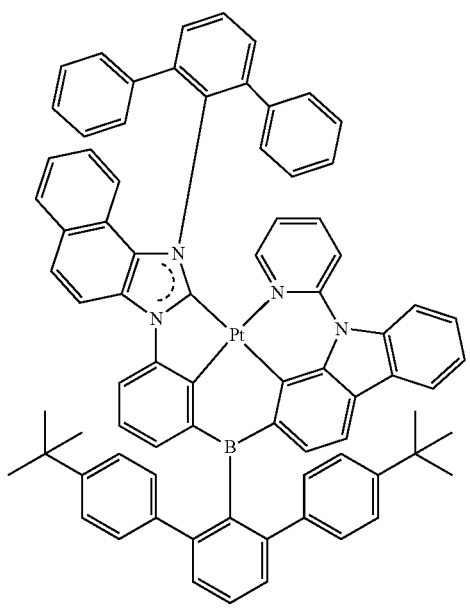
100
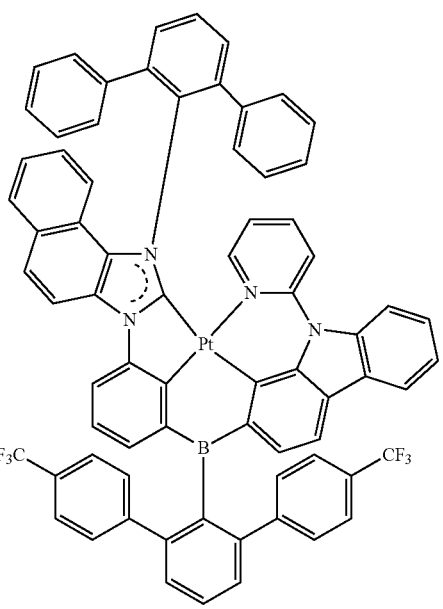
101
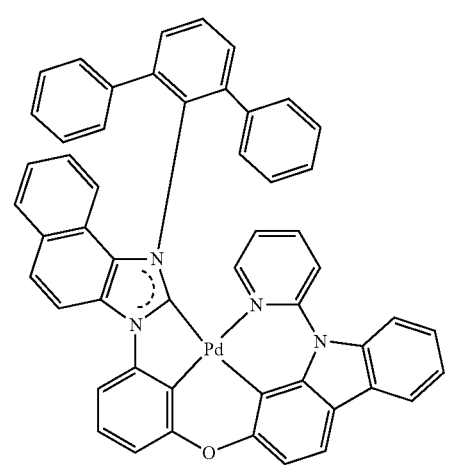
102
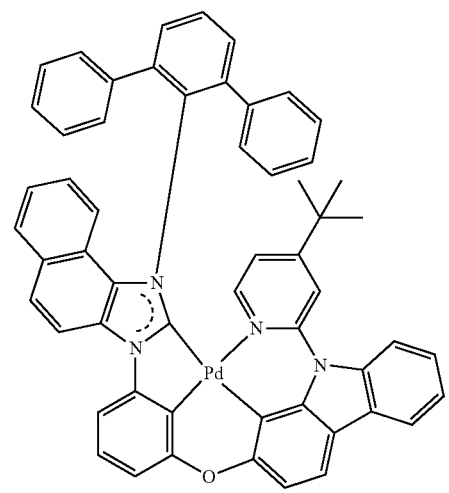

103
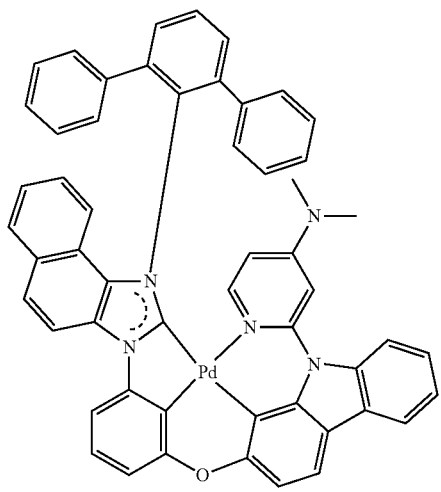
104
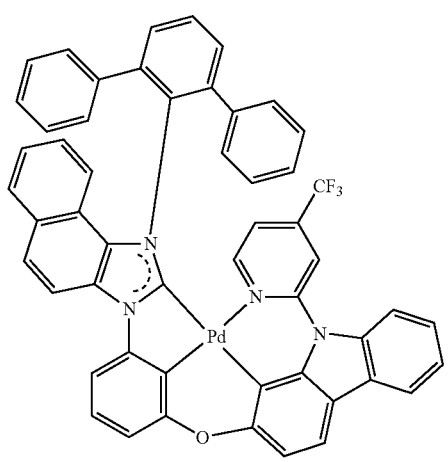
105
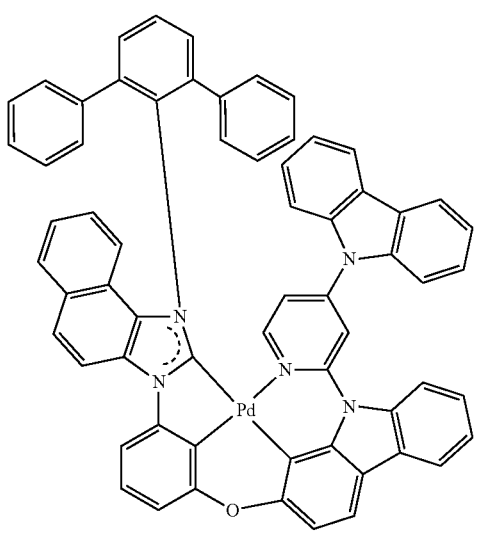
106
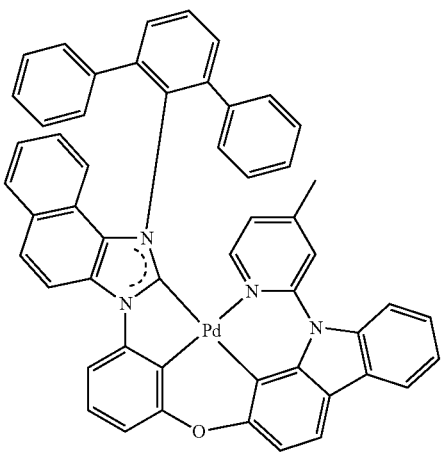
107
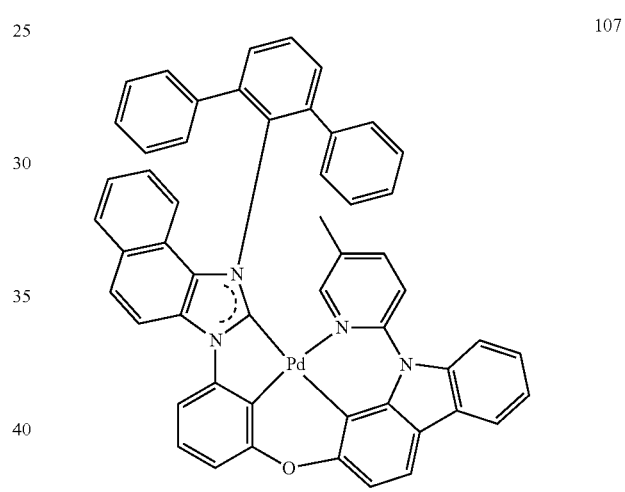
108
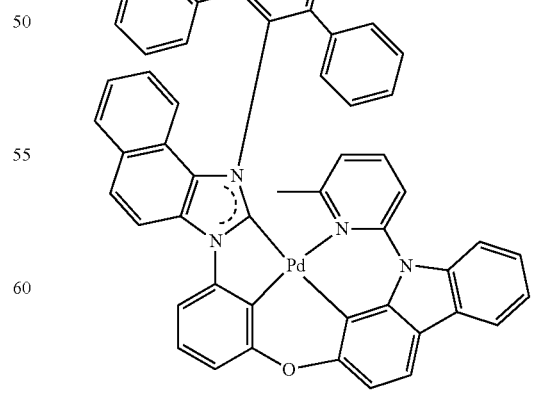

109
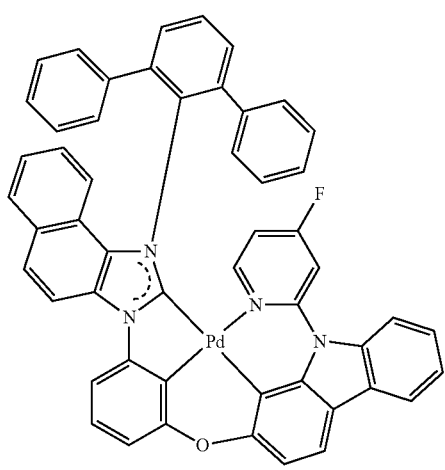
110
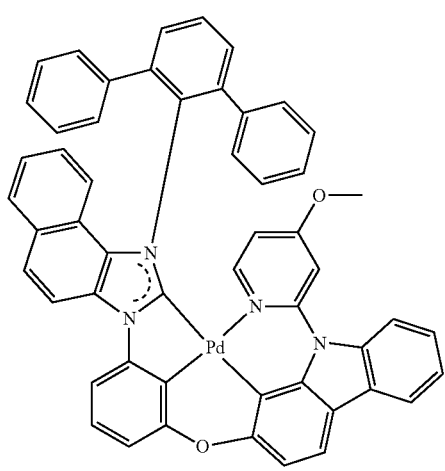
111
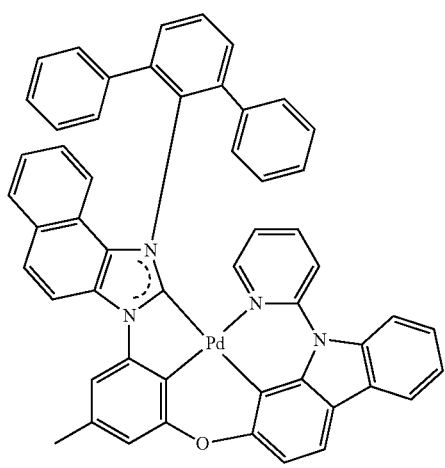
112
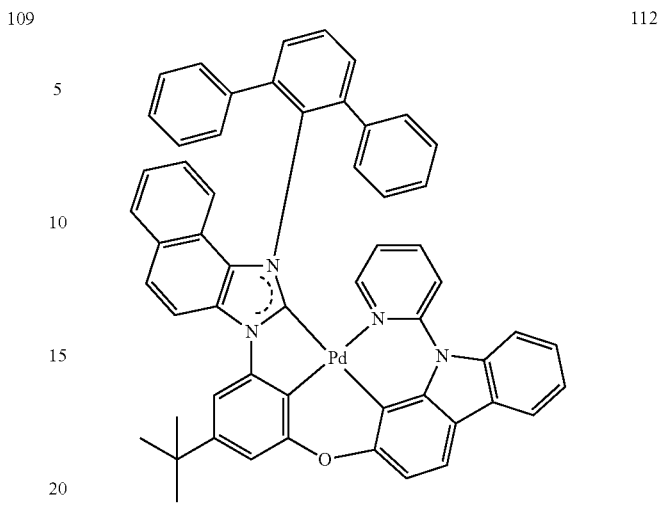
113
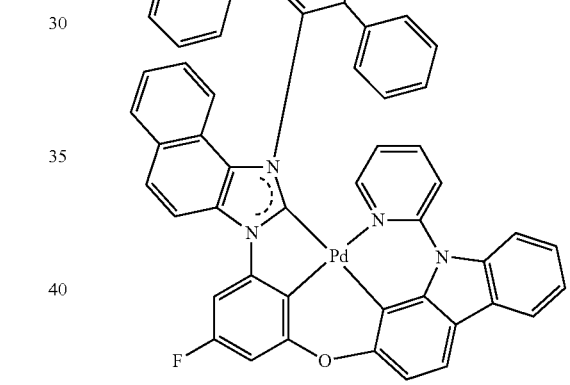
114
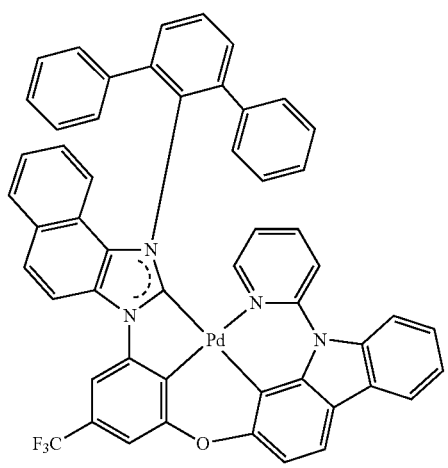

285
-continued

115

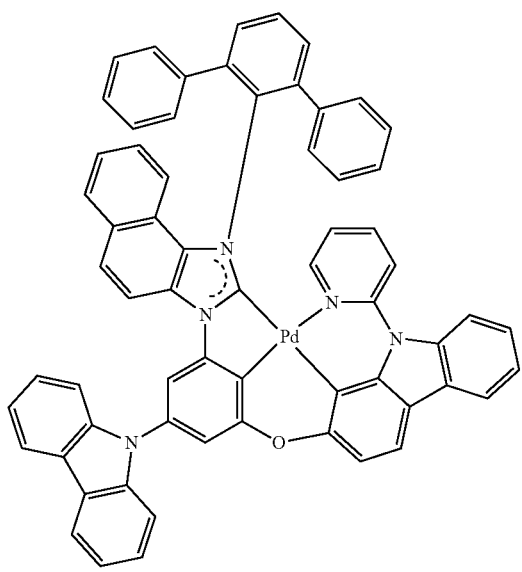

116

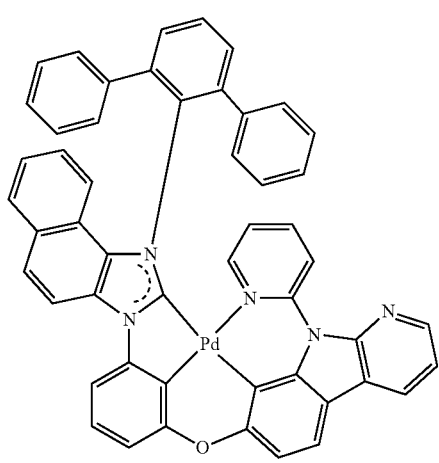

117

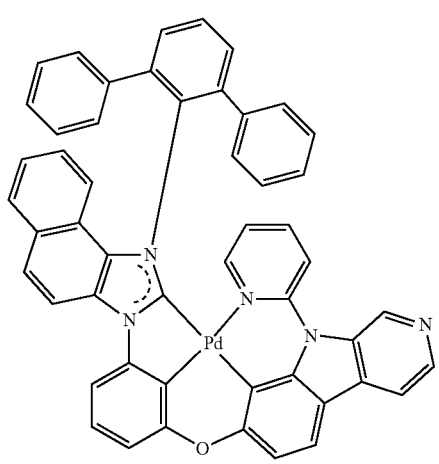

286
-continued

118

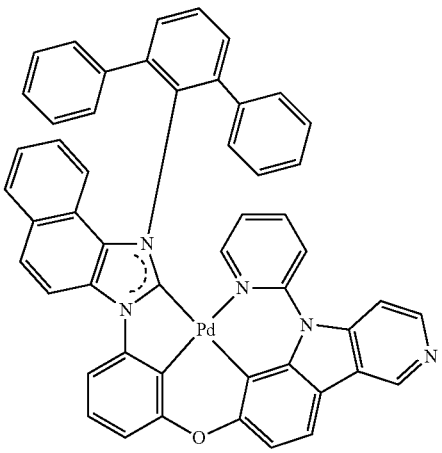

119

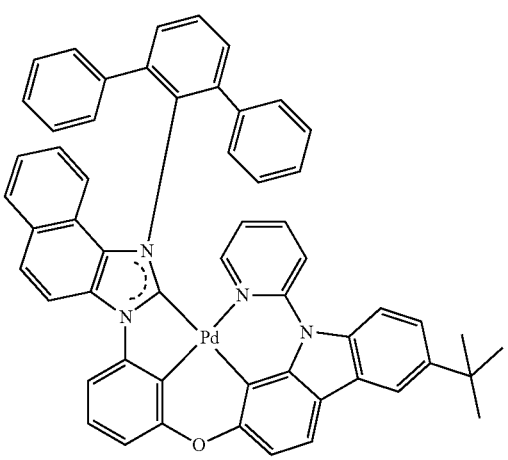

120

20. The electronic apparatus of claim 8, wherein the electronic apparatus is a display, a light source, a lighting, a personal computer, a mobile phones, a digital camera, an electronic organizer, an electronic dictionary, an electronic game machine, a medical instrument, an electronic thermometer, a sphygmomanometer, a blood glucose meter, a pulse measurement device, a pulse wave measurement device, an electrocardiogram display, an ultrasonic diagnostic device, an endoscope display, a fish finder, a measuring instrument, a meter for a vehicle, a meter for an aircraft, a meter for a vessel, or a projector.

* * * * *